(12) United States Patent
Swoboda et al.

(10) Patent No.: US 11,869,810 B2
(45) Date of Patent: Jan. 9, 2024

(54) METHOD FOR REDUCING THE THICKNESS OF SOLID-STATE LAYERS PROVIDED WITH COMPONENTS

(71) Applicant: Siltectra GmbH, Dresden (DE)

(72) Inventors: Marko Swoboda, Dresden (DE); Ralf Rieske, Dresden (DE); Christian Beyer, Freiberg (DE); Jan Richter, Dresden (DE)

(73) Assignee: Siltectra GmbH, Dresden (DE)

( * ) Notice: Subject to any disclaimer, the term of this patent is extended or adjusted under 35 U.S.C. 154(b) by 721 days.

(21) Appl. No.: 16/606,540

(22) PCT Filed: Jan. 15, 2018

(86) PCT No.: PCT/EP2018/050902
§ 371 (c)(1),
(2) Date: Mar. 5, 2021

(87) PCT Pub. No.: WO2018/192691
PCT Pub. Date: Oct. 25, 2018

(65) Prior Publication Data
US 2021/0197314 A1    Jul. 1, 2021

(30) Foreign Application Priority Data

Apr. 20, 2017   (DE) .......................... 102017003830.9
Aug. 11, 2017   (DE) .......................... 102017007585.9

(51) Int. Cl.
*H01L 21/78*      (2006.01)
*B23K 26/0622*    (2014.01)
(Continued)

(52) U.S. Cl.
CPC ...... *H01L 21/7813* (2013.01); *B23K 26/0006* (2013.01); *B23K 26/0624* (2015.10);
(Continued)

(58) Field of Classification Search
CPC ...................... B23K 26/0624; B23K 26/0006; B23K 26/40; B23K 26/53; H01L 21/02005; H01L 21/7813
See application file for complete search history.

(56) References Cited

U.S. PATENT DOCUMENTS 8,440,129 B2    5/2013   Lichtensteiger et al.
2007/0252154 A1   11/2007  Uchiyama et al.
(Continued)

FOREIGN PATENT DOCUMENTS

DE    102012001620 A1   8/2013
DE    112012003902 T5   7/2014
(Continued)

OTHER PUBLICATIONS

Watanabe, Ryosuke, et al., "Optical Properties of Spin-Coated TiO2 Antireflection Films on Textured Single-Crystalline Silicon Substrates", Hindawi Publishing Corporation, International Journal of Photoenergy, 2015, accessed online at https://www.hindawi.com/journals/ijp/2015/147836/ on Apr. 26, 2019.

*Primary Examiner* — Thien S Tran
(74) *Attorney, Agent, or Firm* — Murphy, Bilak & Homiller, PLLC

(57) ABSTRACT

The invention relates to a method for separating at least one solid-state layer (4) from at least one solid (1). The method according to the invention includes the steps of: producing a plurality of modifications (9) by means of laser beams in the interior of the solid (1) in order to form a separation plane (8); producing a composite structure by arranging or producing layers and/or components (150) on or above an initially exposed surface (5) of the solid (1), the exposed surface (5) being part of the solid-state layer (4) to be separated; introducing an external force into the solid (1) in order to create stresses in the solid (1), the external force being so great that the stresses cause a crack to propagate (Continued)

along the separation plane (8), wherein the modifications for forming the separation plane (8) are produced before the composite structure is produced.

18 Claims, 59 Drawing Sheets

(51) Int. Cl.
*B23K 26/00* (2014.01)
*B28D 5/00* (2006.01)
*B23K 26/53* (2014.01)
*B23K 26/40* (2014.01)
*C30B 33/00* (2006.01)
*C30B 31/20* (2006.01)
*B23K 103/00* (2006.01)
*C30B 29/36* (2006.01)
*H01L 29/16* (2006.01)
*H01L 29/78* (2006.01)
*H01L 29/872* (2006.01)
*B23K 101/40* (2006.01)

(52) U.S. Cl.
CPC .............. *B23K 26/40* (2013.01); *B23K 26/53* (2015.10); *B28D 5/0011* (2013.01); *C30B 31/20* (2013.01); *C30B 33/00* (2013.01); *B23K 2101/40* (2018.08); *B23K 2103/56* (2018.08); *C30B 29/36* (2013.01); *H01L 29/1608* (2013.01); *H01L 29/7802* (2013.01); *H01L 29/872* (2013.01)

(56) References Cited

U.S. PATENT DOCUMENTS

| | | | |
|---|---|---|---|
| 2008/0035611 A1* | 2/2008 | Kuno | C03B 33/0222 219/69.1 |
| 2010/0102043 A1 | 4/2010 | Govorkov et al. | |
| 2010/0243617 A1 | 9/2010 | Kosmowski | |
| 2012/0067858 A1 | 3/2012 | Kangastupa et al. | |
| 2014/0038392 A1* | 2/2014 | Yonehara | H01L 33/0093 438/463 |
| 2016/0155629 A1 | 6/2016 | Hawryluk et al. | |
| 2016/0199944 A1 | 7/2016 | Hosseini | |
| 2016/0228984 A1 | 8/2016 | Hirata et al. | |
| 2016/0254232 A1* | 9/2016 | Drescher | H01L 21/268 257/620 |
| 2016/0336233 A1 | 11/2016 | Yonehara et al. | |
| 2016/0354863 A1* | 12/2016 | Hirata | B23K 26/53 |
| 2017/0291254 A1* | 10/2017 | Hirata | B28D 5/0011 |
| 2019/0071552 A1 | 3/2019 | Beyer et al. | |

FOREIGN PATENT DOCUMENTS

| | | |
|---|---|---|
| DE | 102013016682 A1 | 4/2015 |
| DE | 102014002600 A1 | 8/2015 |
| DE | 102016201780 A1 | 8/2016 |
| DE | 102015006971 A1 | 10/2016 |
| DE | 102016209554 A1 | 12/2016 |
| JP | S62206815 A | 9/1987 |
| JP | S6433924 A | 2/1989 |
| JP | H07172990 A | 7/1995 |
| JP | 2005028423 A | 2/2005 |
| JP | 2006245498 A | 9/2006 |
| JP | 2007275920 A | 10/2007 |
| JP | 2008098465 A | 4/2008 |
| JP | 2008290090 A | 12/2008 |
| JP | 2009140959 A | 6/2009 |
| JP | 2009295973 A | 12/2009 |
| JP | 2010120084 A | 6/2010 |
| JP | 2010267639 A | 11/2010 |
| JP | 2011051011 A | 3/2011 |
| JP | 2011060862 A | 3/2011 |
| JP | 2012036012 A | 2/2012 |
| JP | 2012094698 A | 5/2012 |
| JP | 2013049161 A | 3/2013 |
| JP | 2013063891 A | 4/2013 |
| JP | 2013157452 A | 8/2013 |
| JP | 2013211415 A | 10/2013 |
| JP | 2014014825 A | 1/2014 |
| JP | 2015074002 A | 4/2015 |
| JP | 2016021464 A | 2/2016 |
| JP | 2016146447 A | 8/2016 |
| JP | 2016215231 A | 12/2016 |
| JP | 2016225536 A | 12/2016 |
| JP | 2017005008 A | 1/2017 |
| JP | 2017500725 A | 1/2017 |
| JP | 2017041482 A | 2/2017 |
| TW | 201639016 A | 11/2016 |
| TW | 201700251 A | 1/2017 |
| WO | 2006010289 A2 | 2/2006 |
| WO | 2010072675 A2 | 7/2010 |
| WO | 2013065450 A1 | 5/2013 |
| WO | 2014177721 A1 | 11/2014 |
| WO | WO-2015052220 A1 * | 4/2015 ......... B23K 26/0006 |
| WO | 2016083609 A2 | 6/2016 |
| WO | 2016083610 A2 | 6/2016 |
| WO | 2016119915 A1 | 8/2016 |

\* cited by examiner

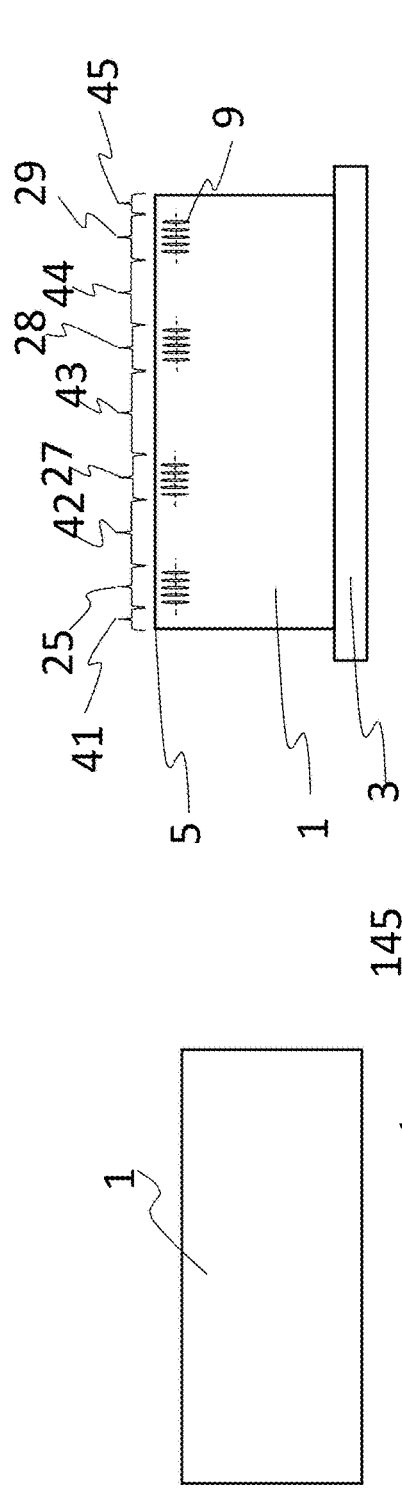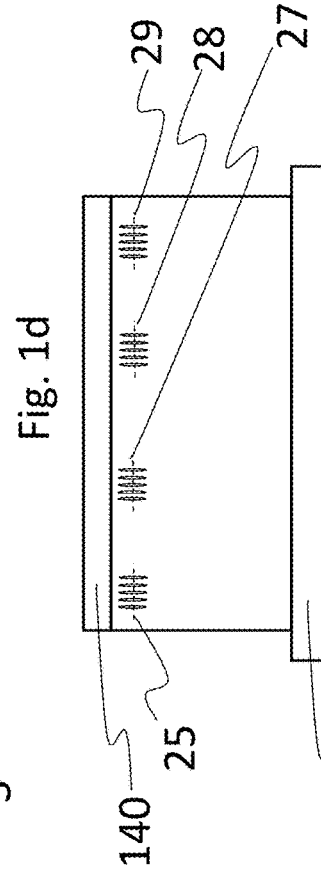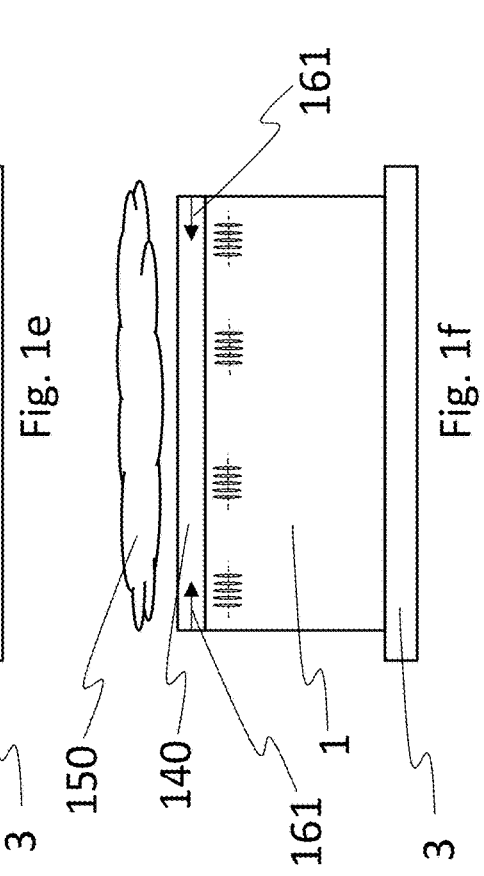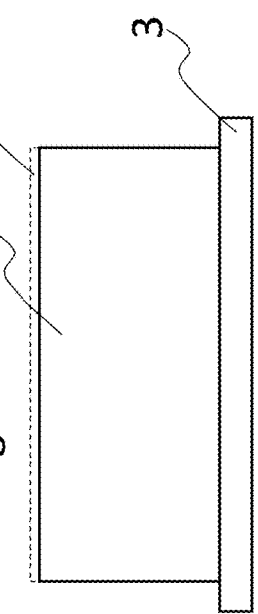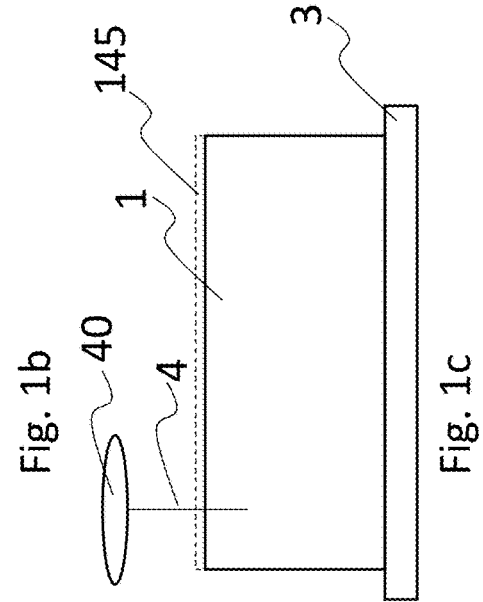

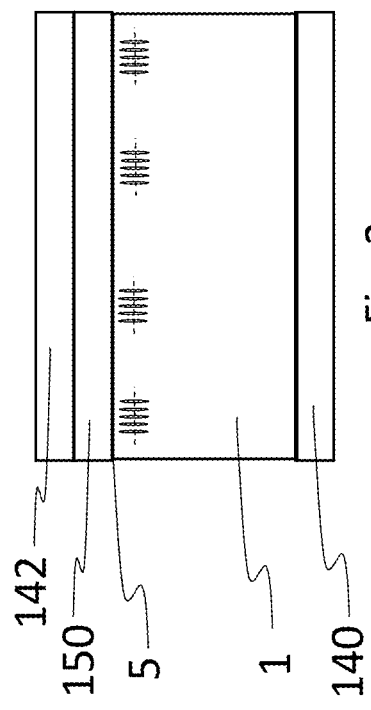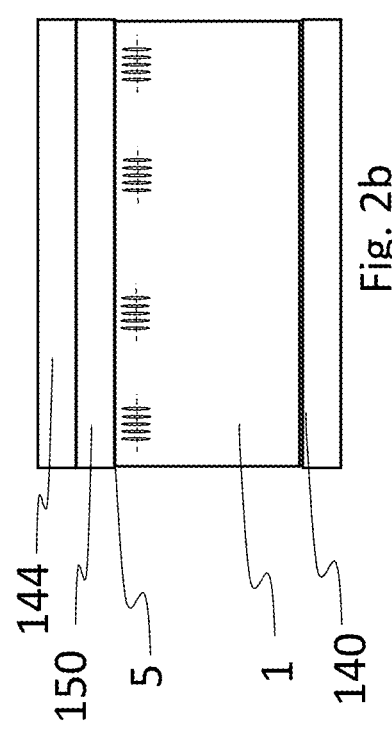

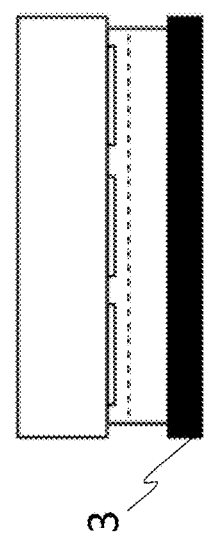
Fig. 3c
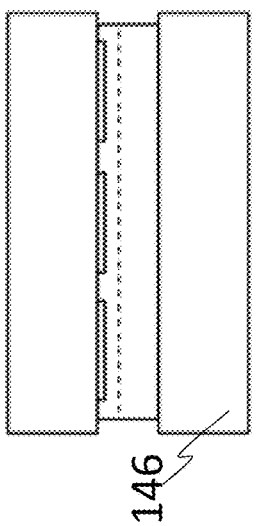
Fig. 3f
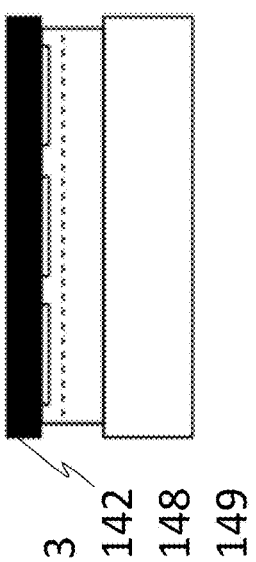
Fig. 3i
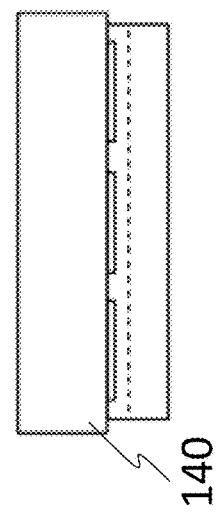
Fig. 3b
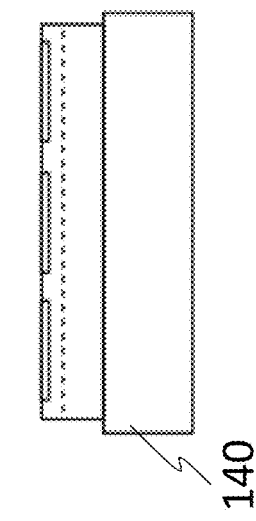
Fig. 3e
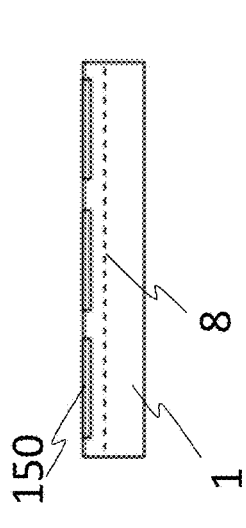
Fig. 3h
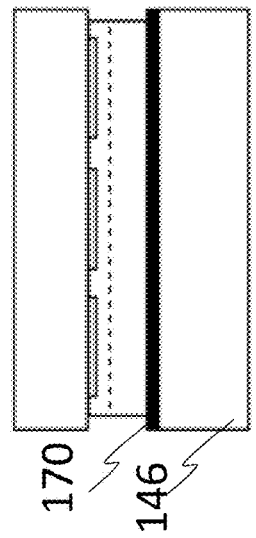
Fig. 3a
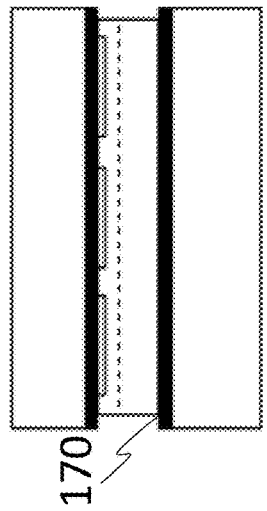
Fig. 3d
Fig. 3g

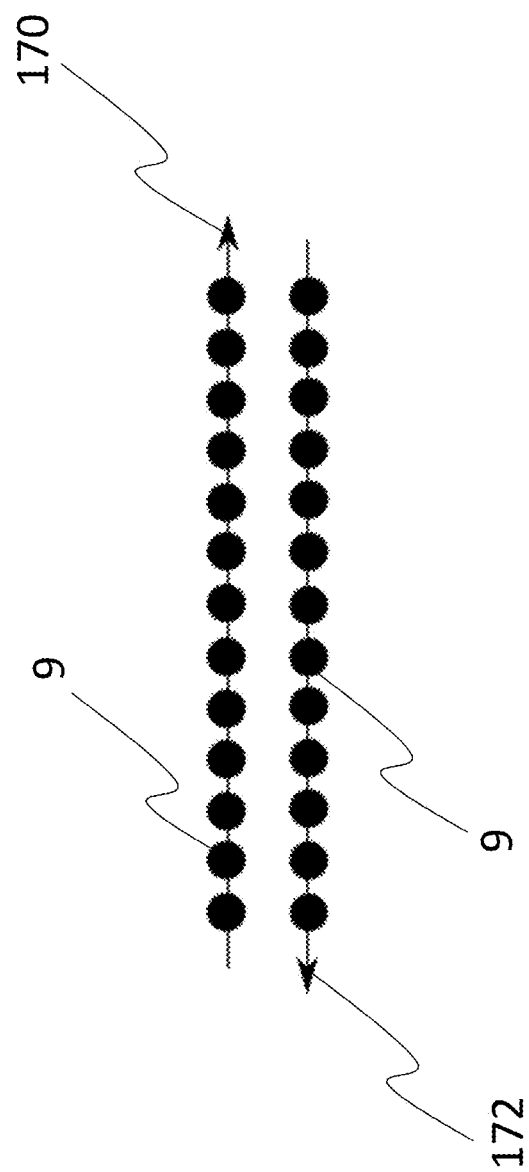

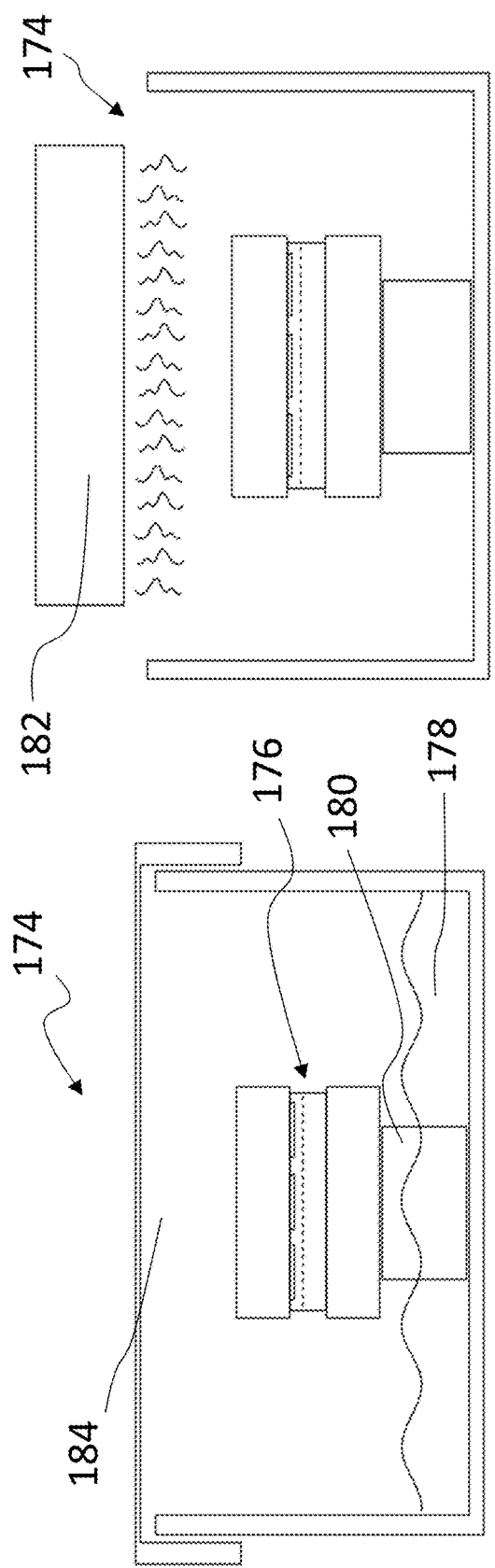
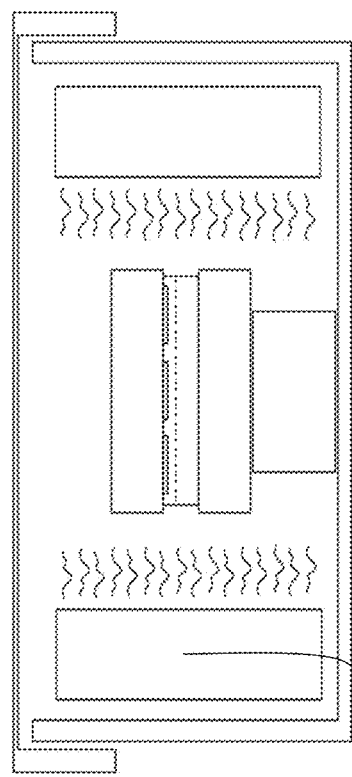
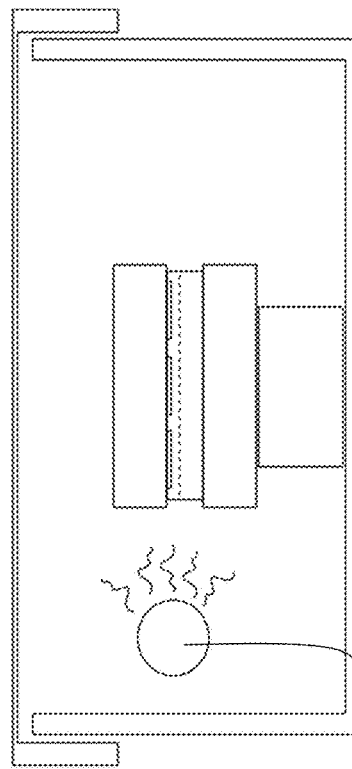
Fig. 5a  Fig. 5b  Fig. 5c  Fig. 5d

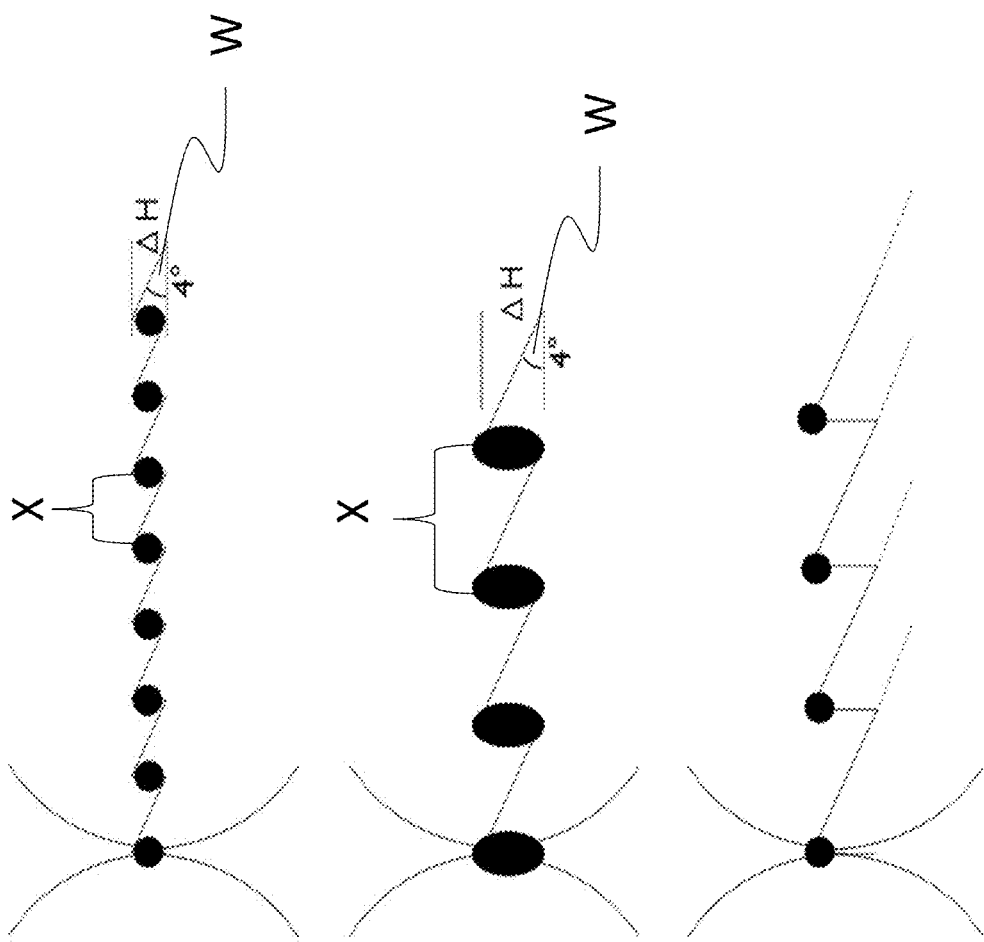

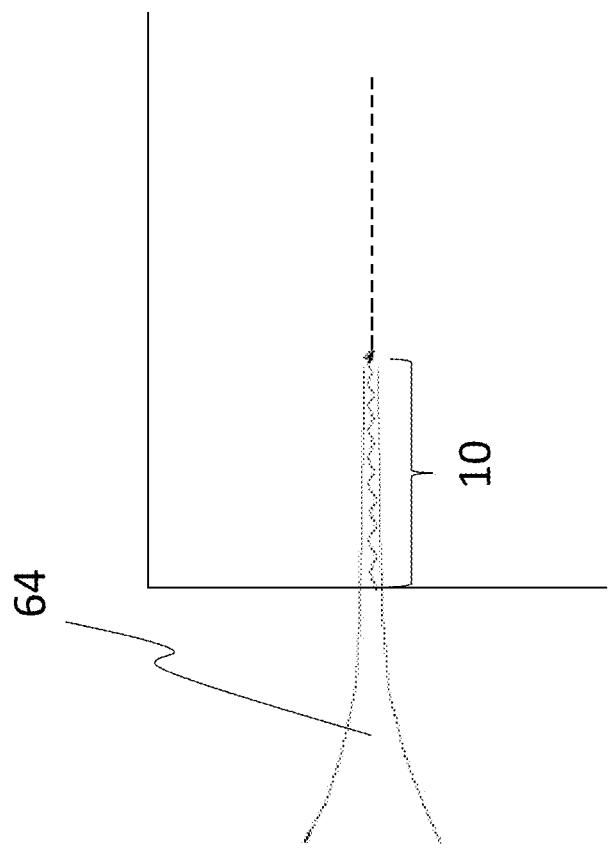
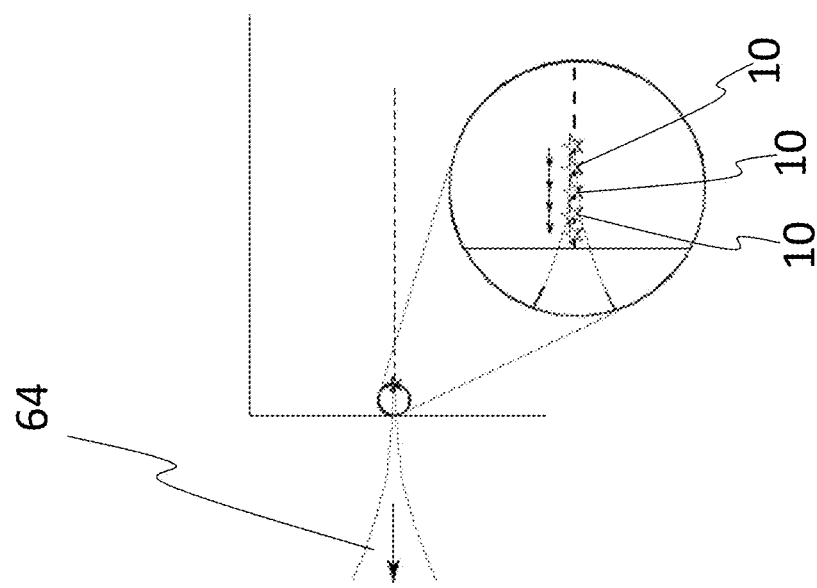
Fig. 17a
Fig. 17b

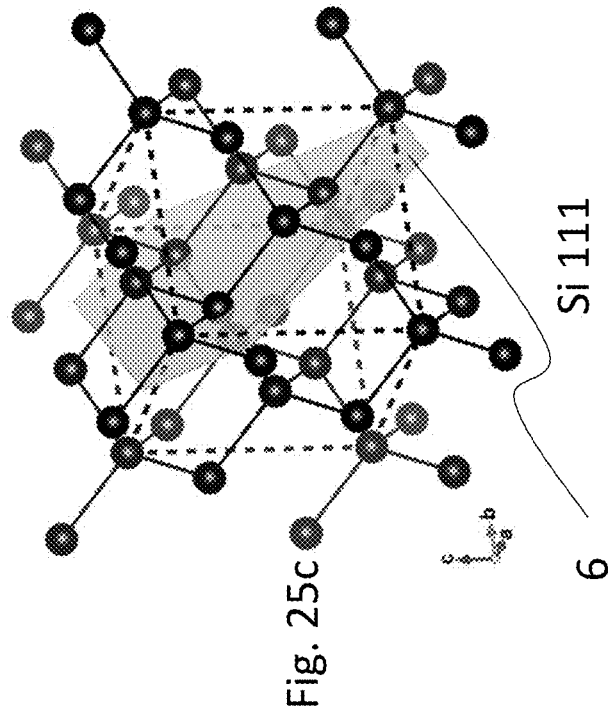
Fig. 25c Si 111
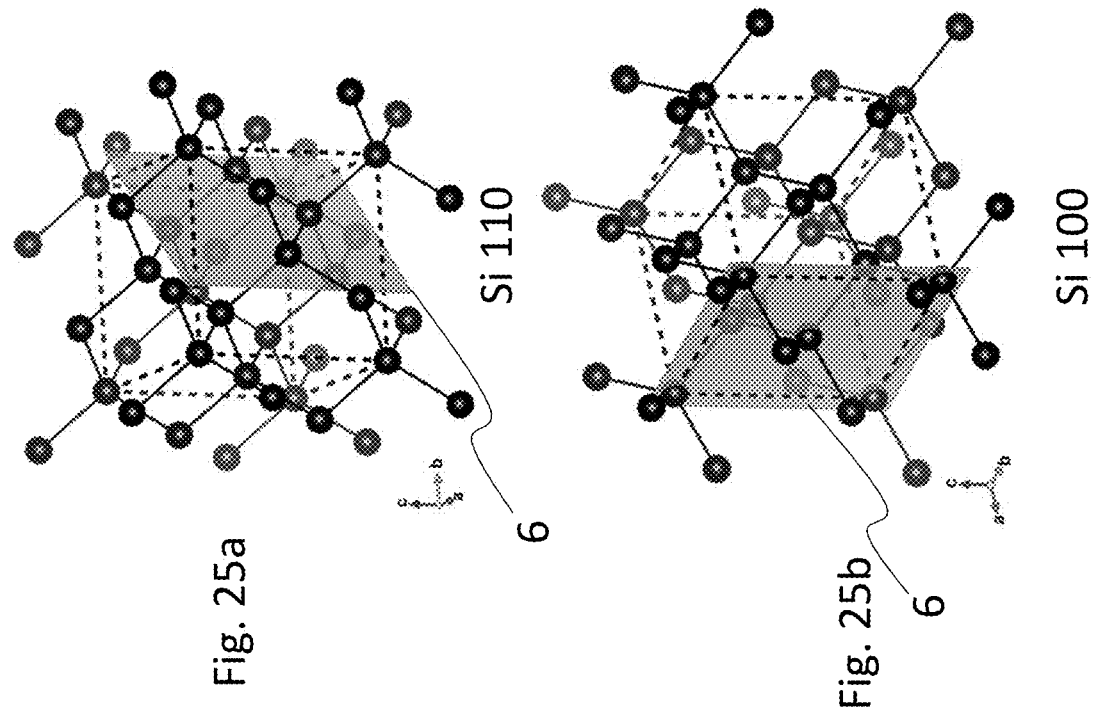
Fig. 25a Si 110
Fig. 25b Si 100

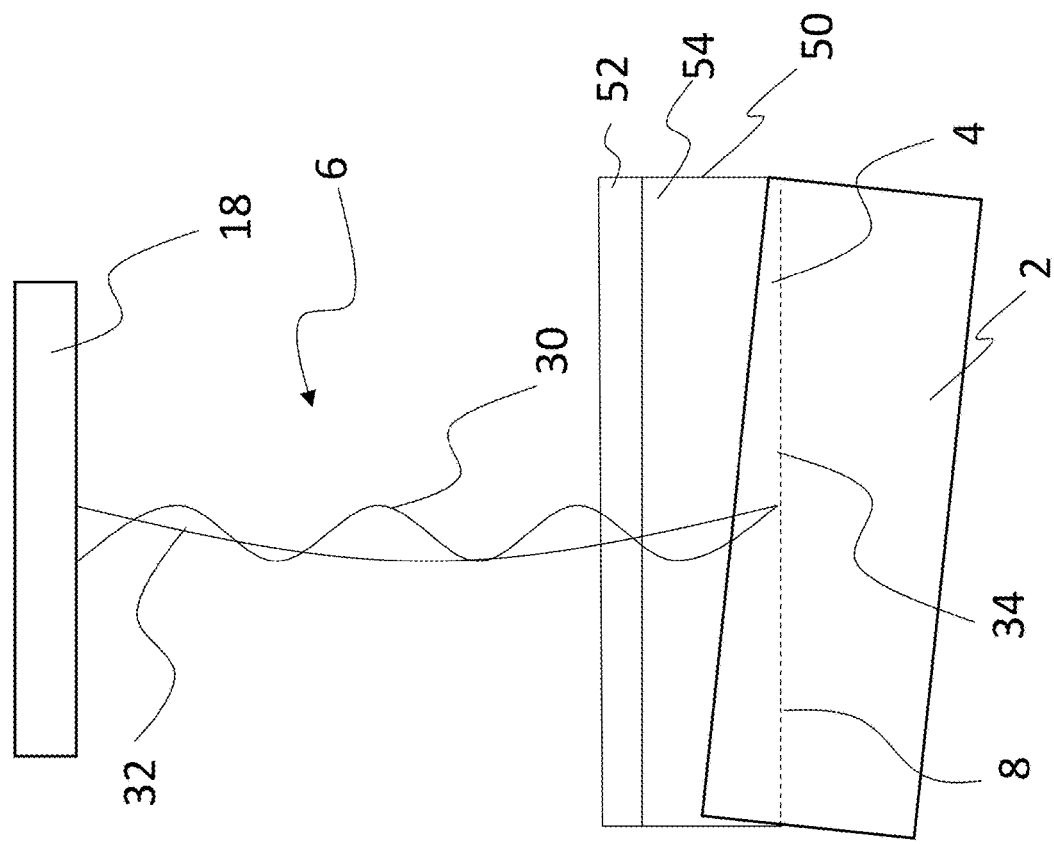
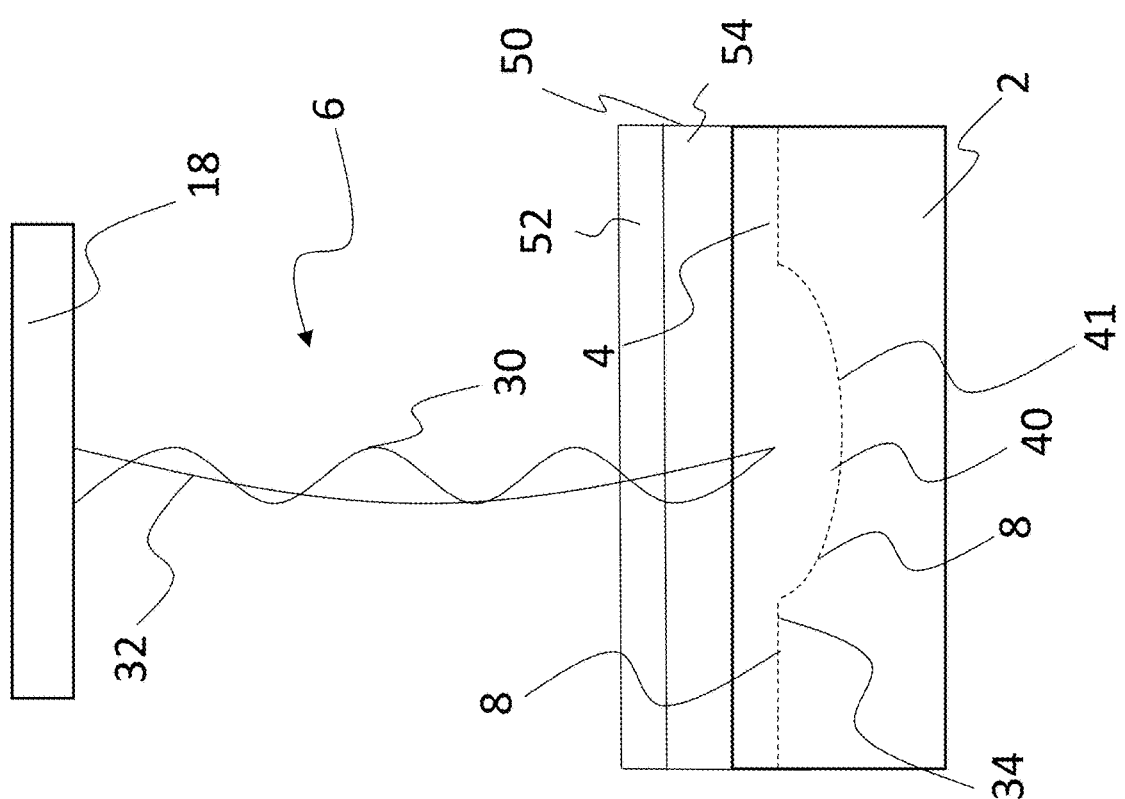

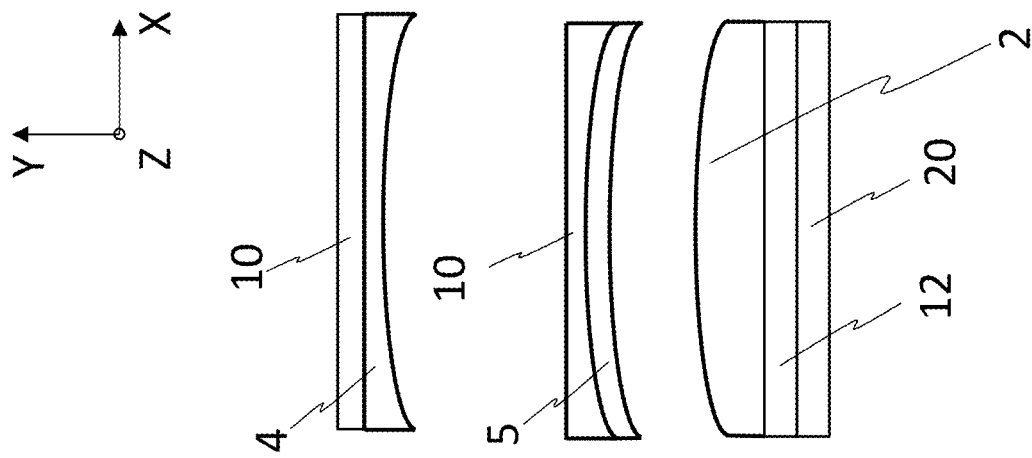
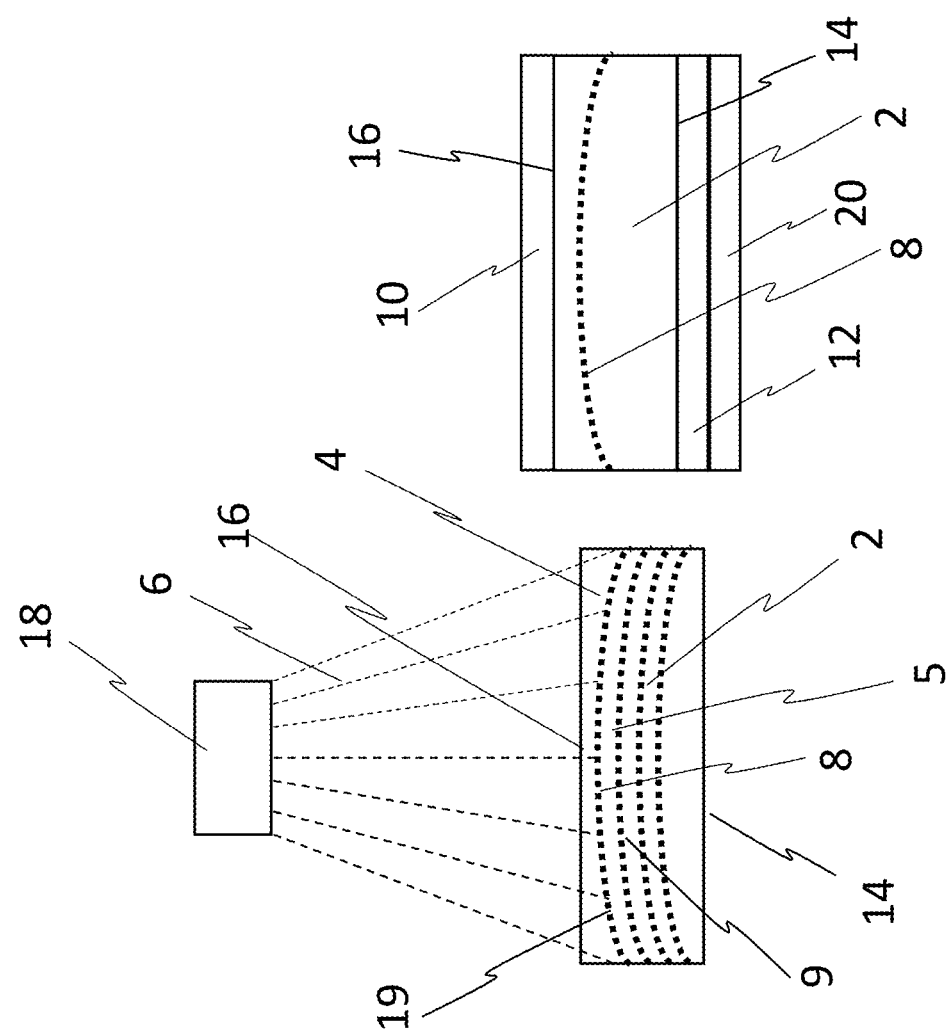

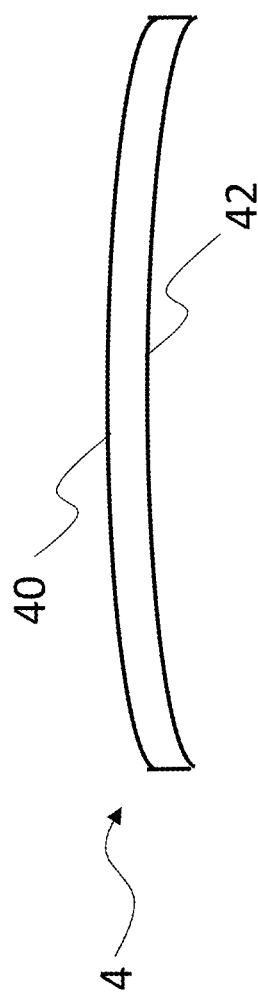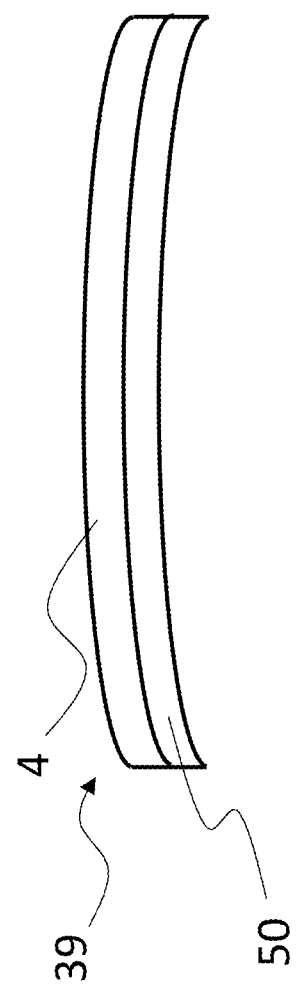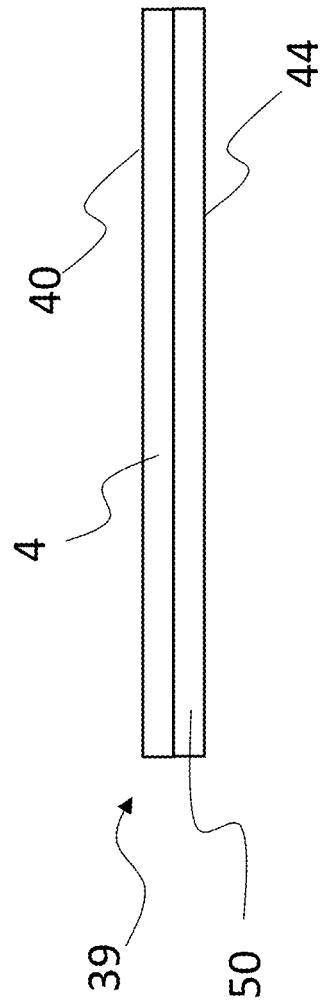

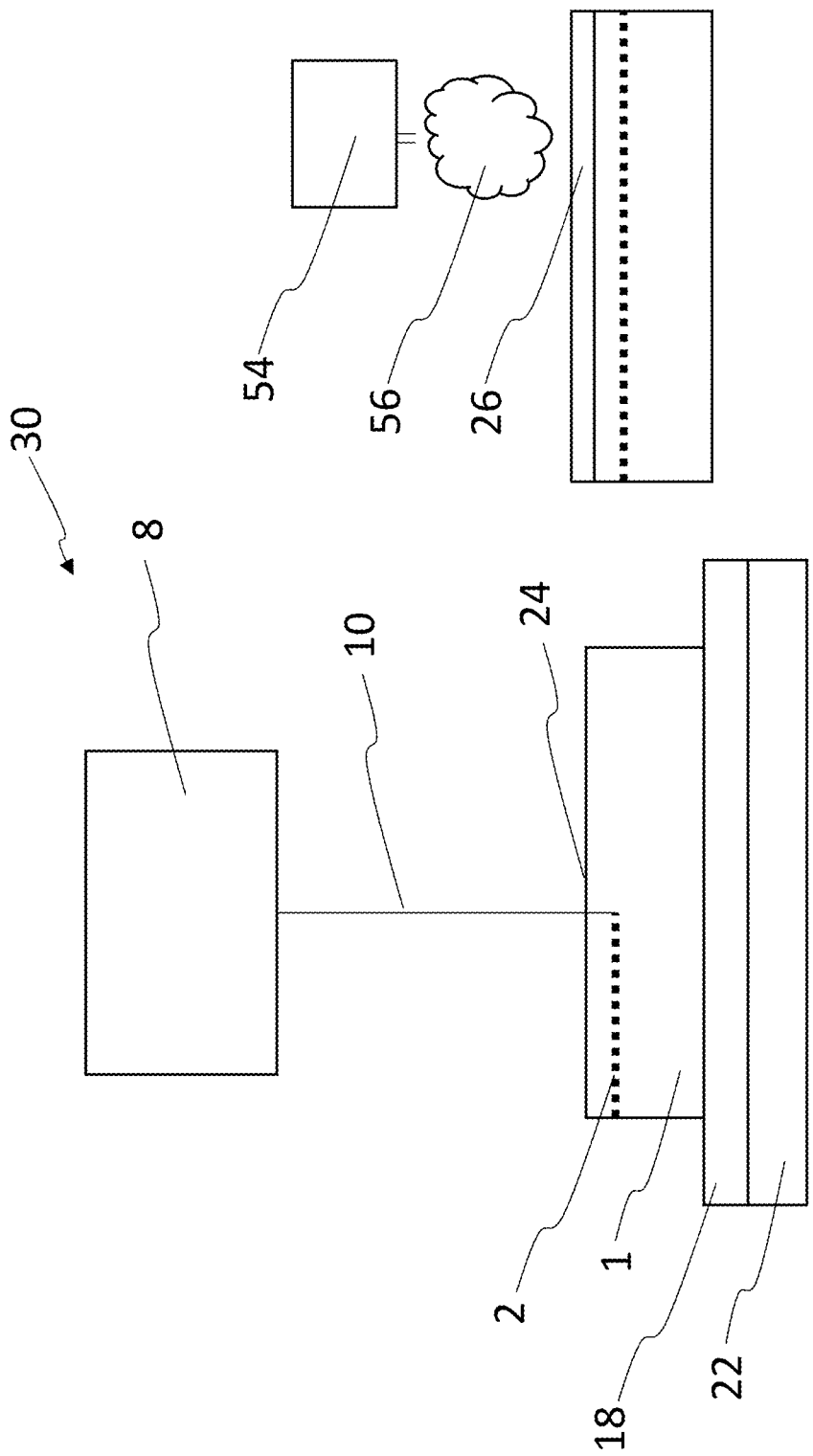

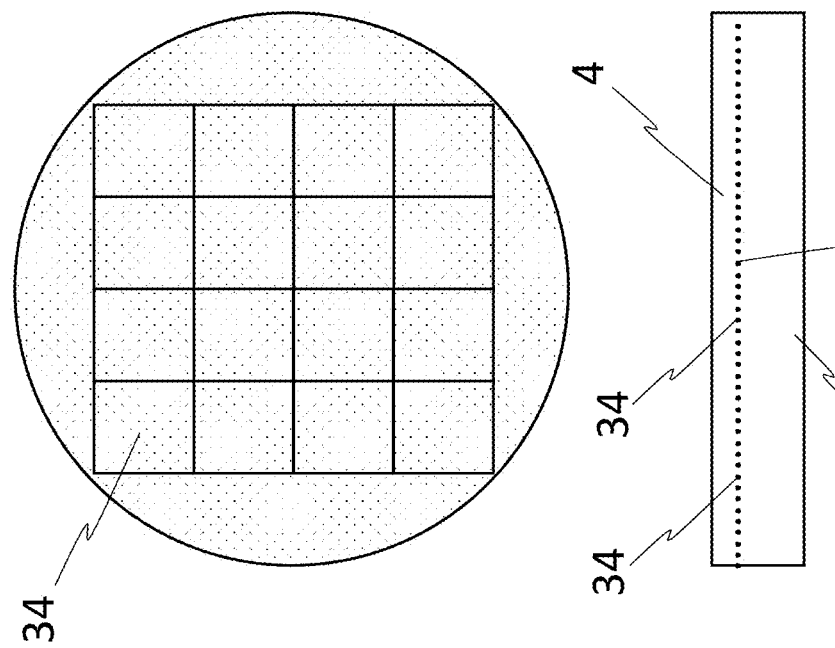
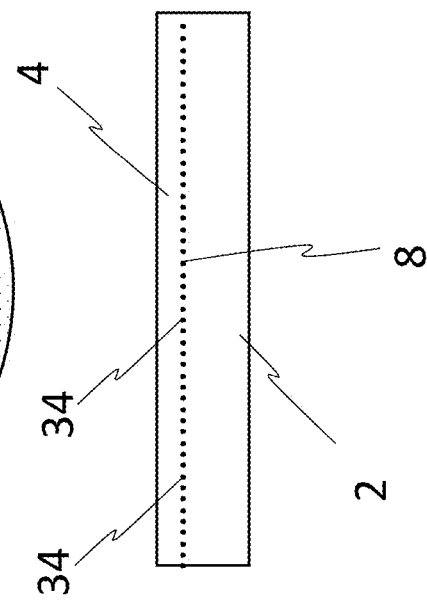
Fig. 40b
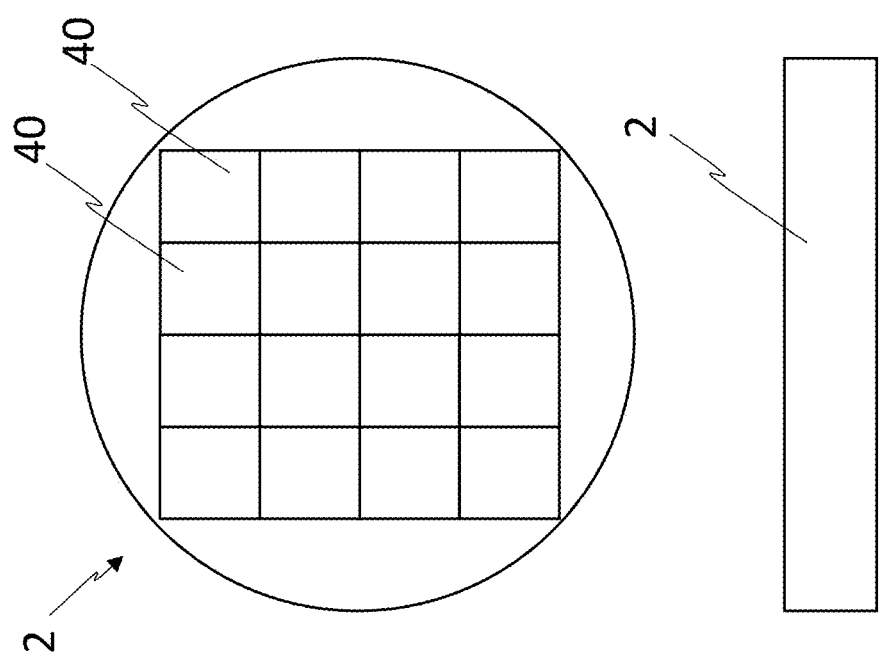
Fig. 40a

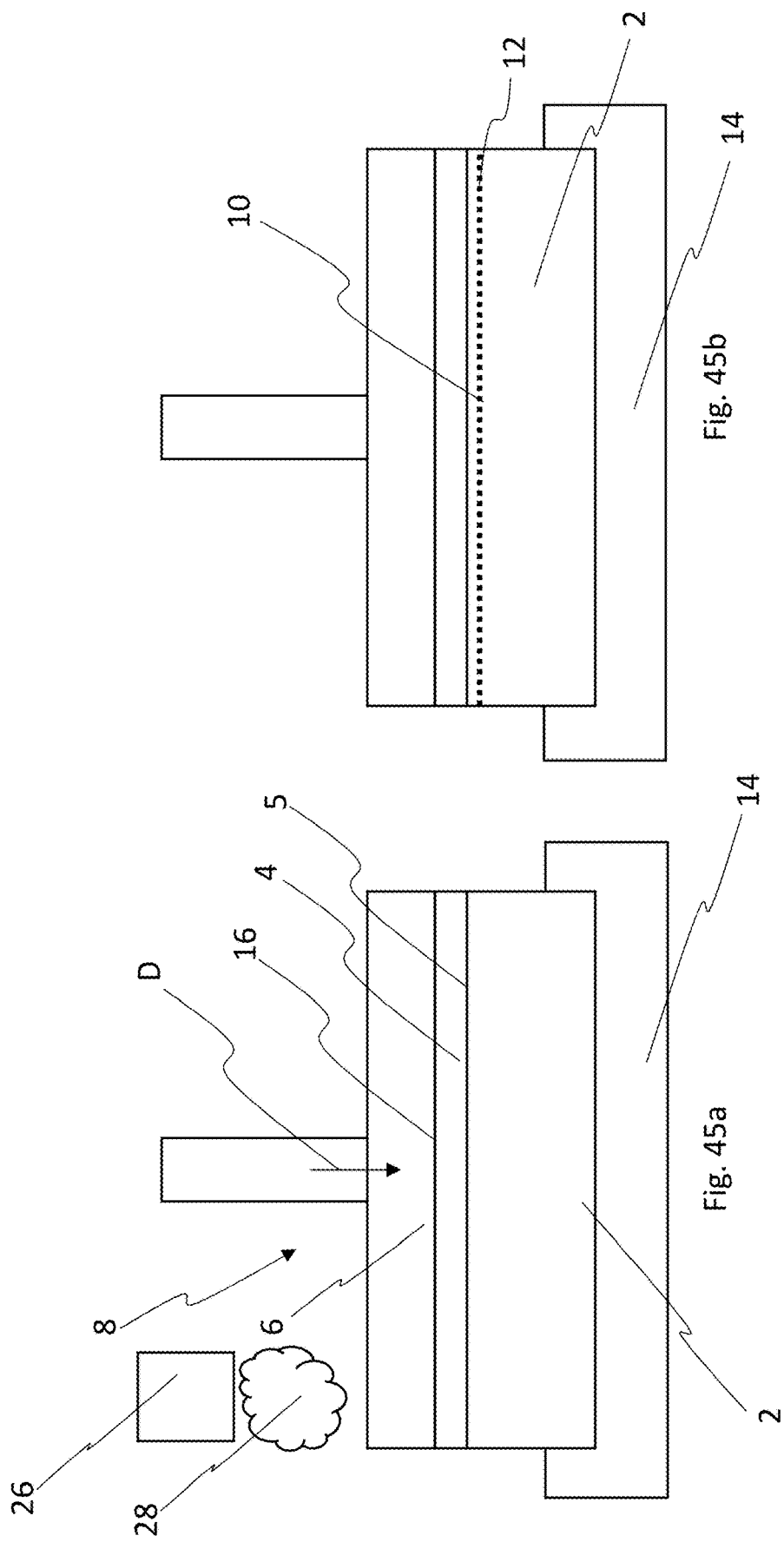

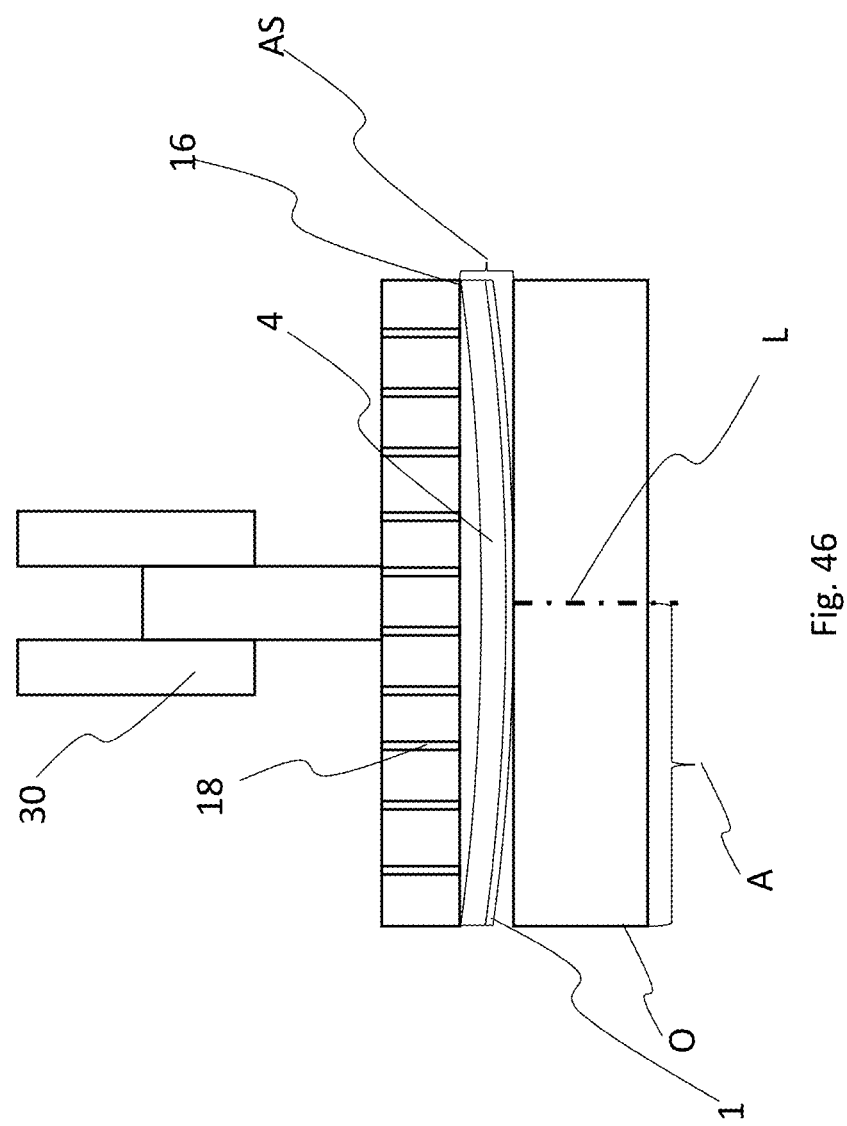

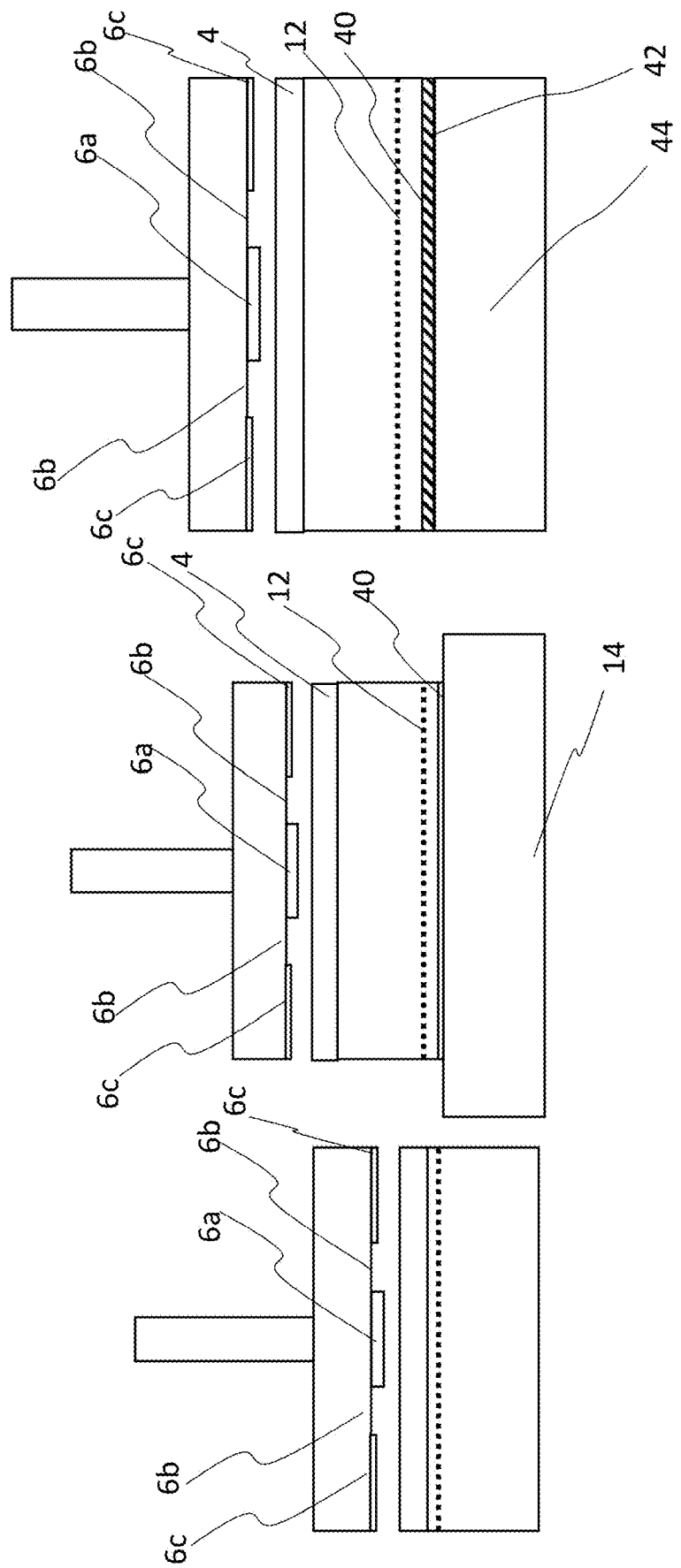

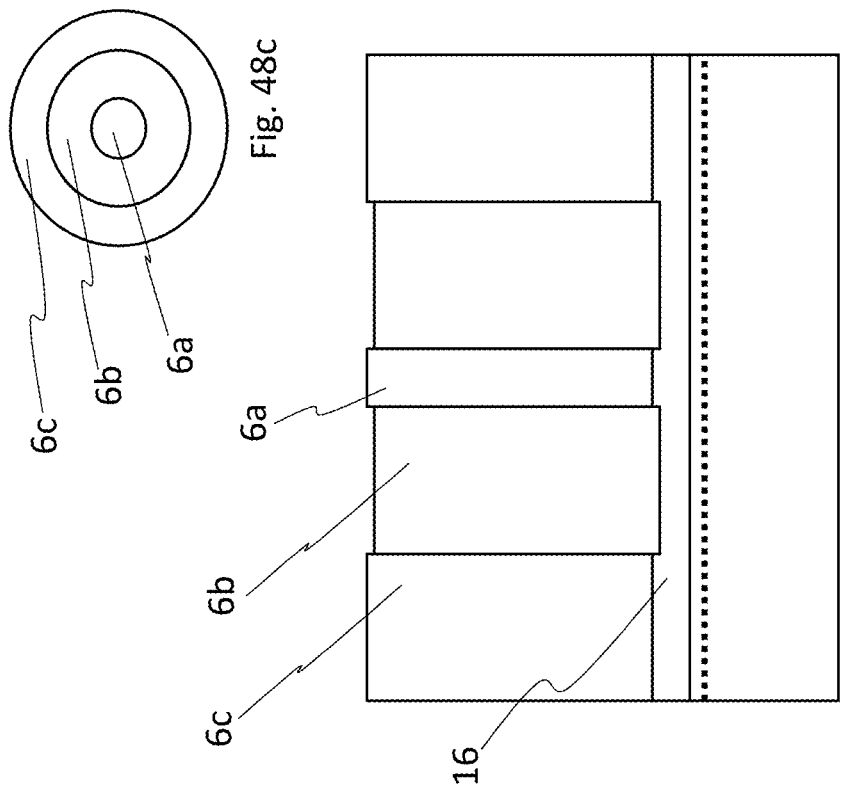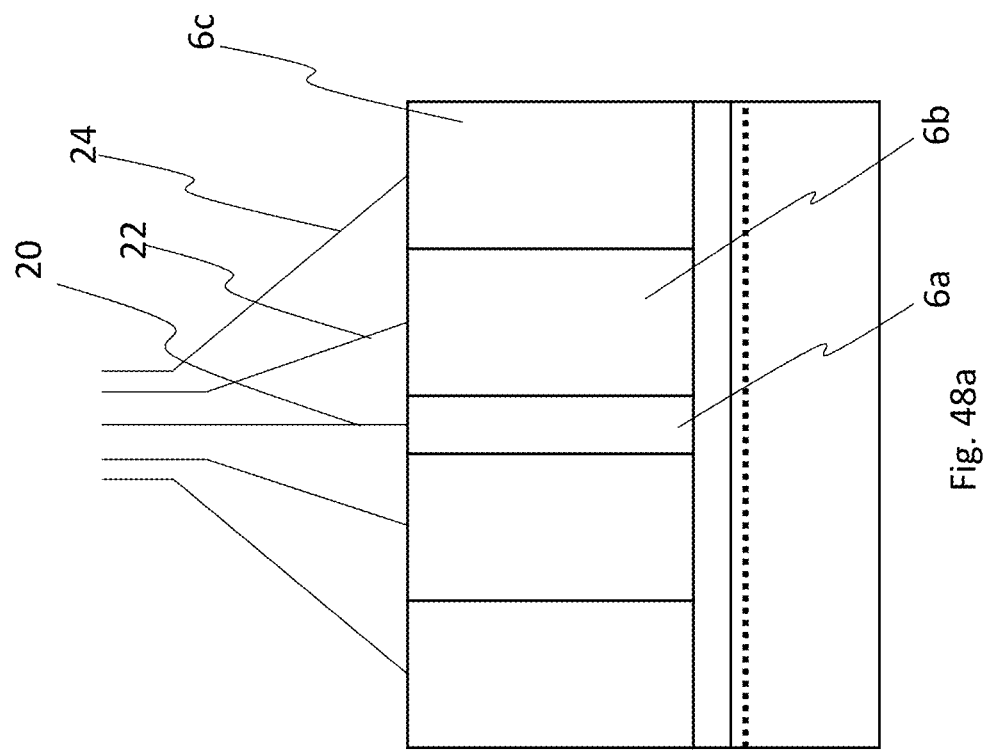

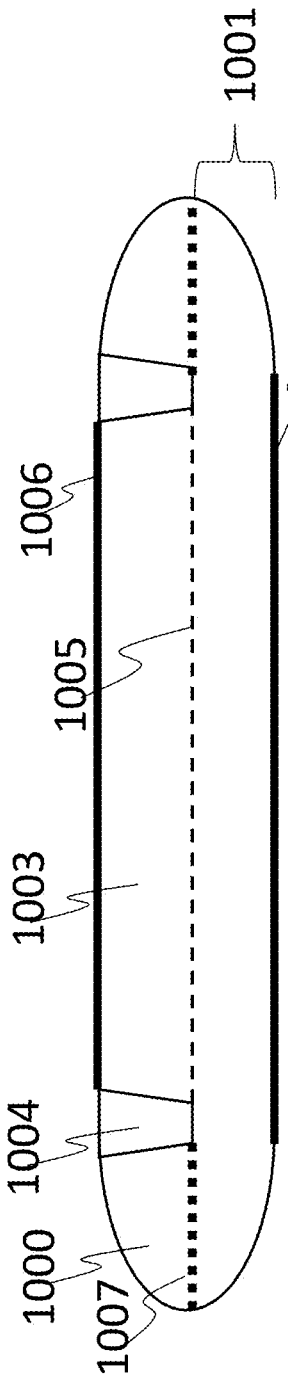
Fig. 51a
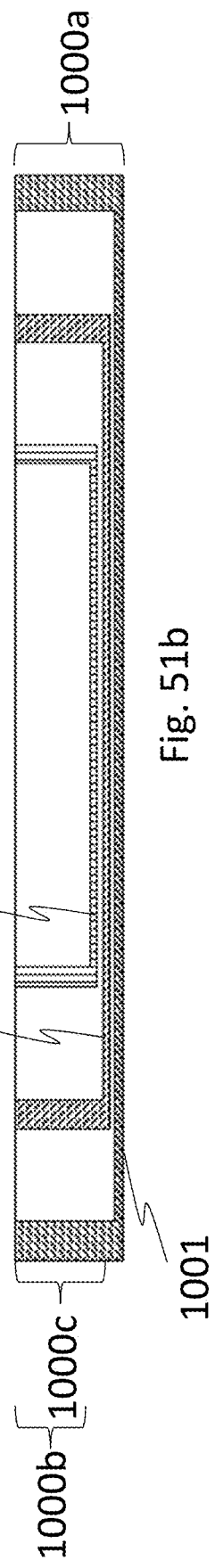
Fig. 51b
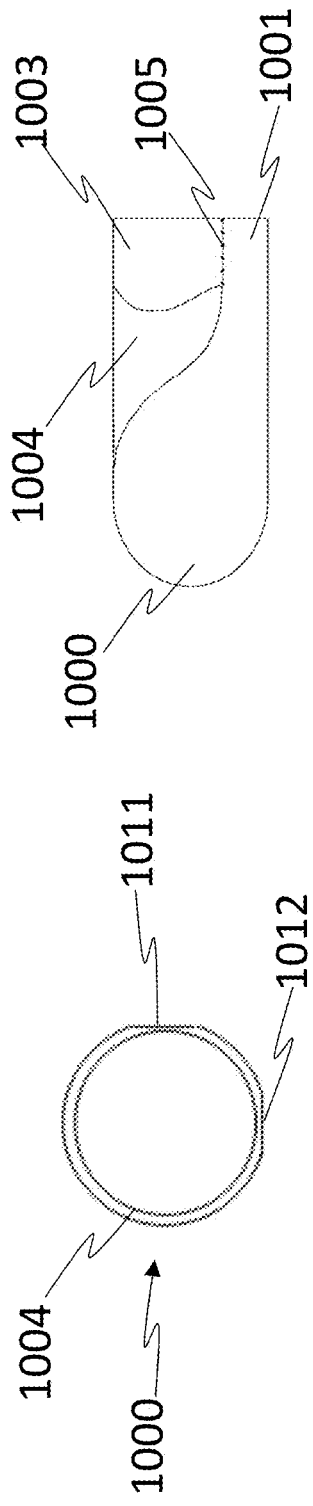
Fig. 51c
Fig. 51d

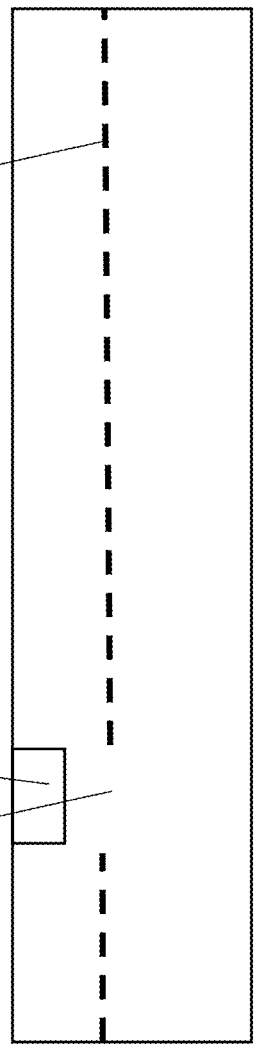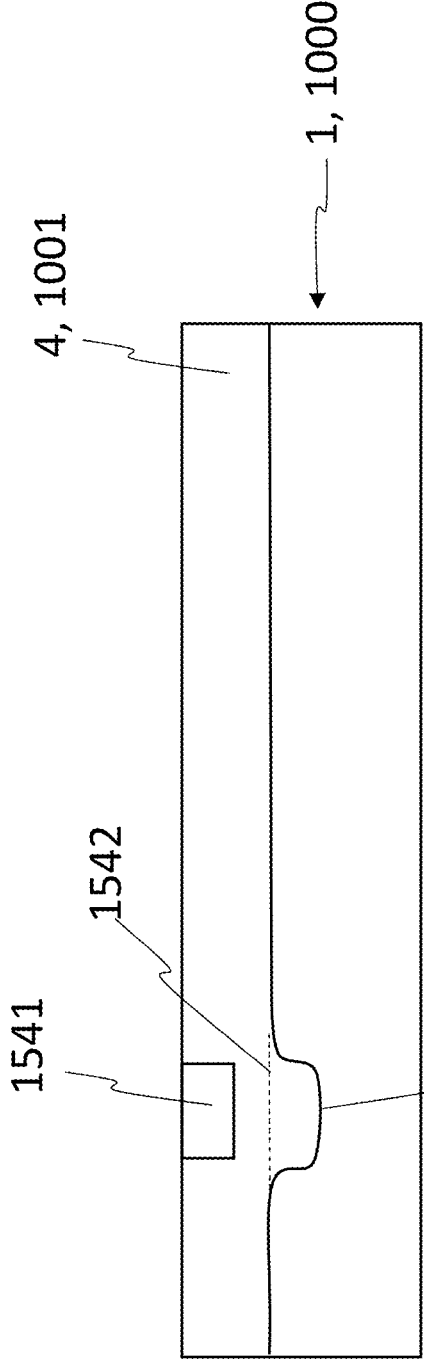

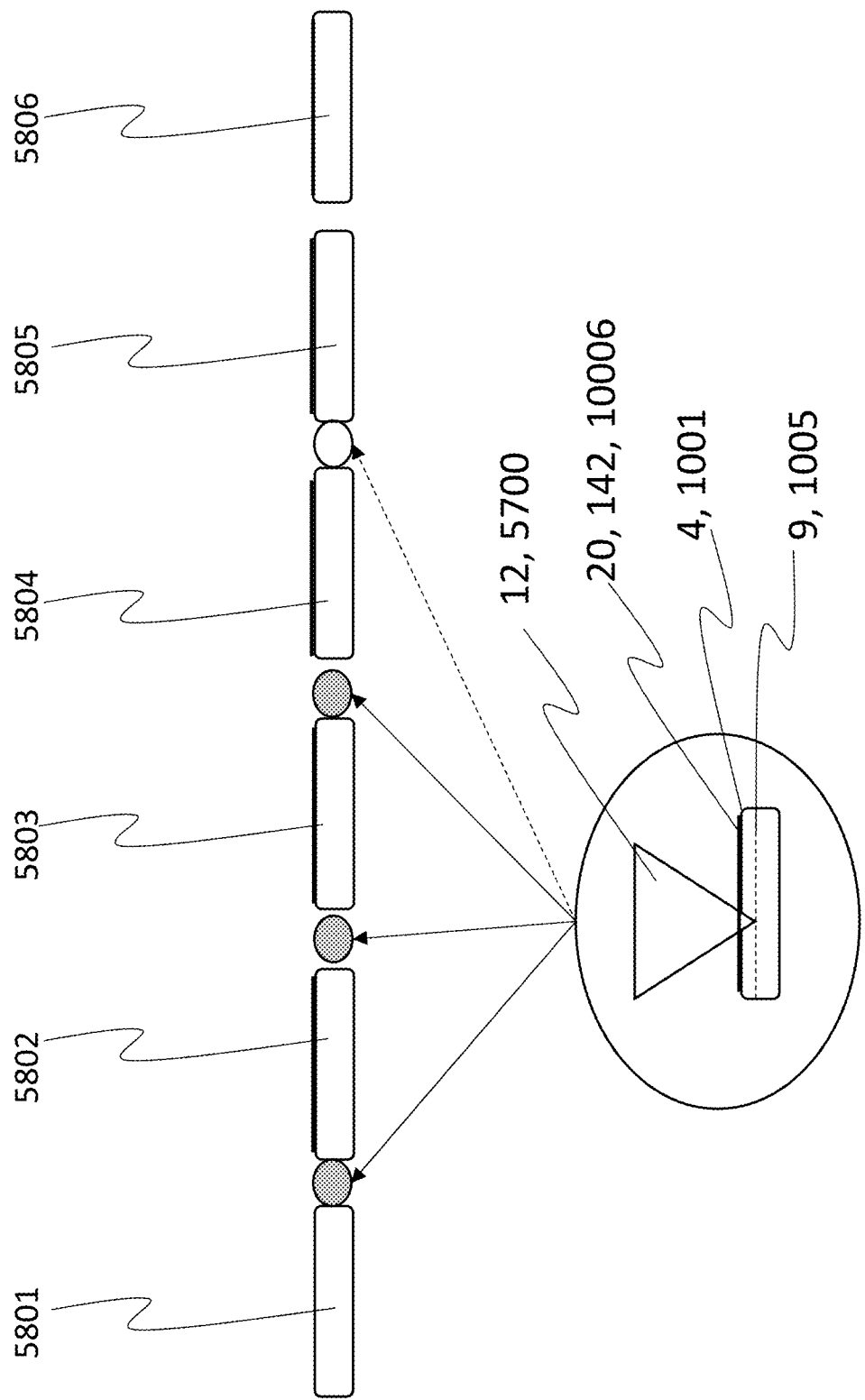

METHOD FOR REDUCING THE THICKNESS OF SOLID-STATE LAYERS PROVIDED WITH COMPONENTS

The present invention relates, according to claim 1, to a method of separating at least one solid-state layer from at least one solid-state body and, according to claim 16, to a solid-state body, especially a semiconductor wafer.

A number of components in the semiconductor industry are required on thinned solid-state layers or substrates. However, since thin substrates are difficult to handle in the customary processes and even wafers can be produced only down to a specific thickness by conventional wire sawing processes, the most common form of production of such components on thin substrates is the grinding-away or backside thinning of the substrate on completion of processing.

In this case, a conventional wafer is processed to completion before, in a grinding and polishing step at the end, the final desired substrate thickness is established by removing the excess material. This circumstance is disadvantageous for two reasons: firstly, valuable material is lost in the grinding step; secondly, the grinding/polishing step harbors the potential through damage to the substrate the potential for total loss of the components already processed that already contain a major part of the value created in the wafer.

A further method of thinning solid-state bodies is disclosed by publication WO2014/177721A1. By this method, a polymer layer is mounted on a solid state body. A heat treatment of the polymer layer then generates stresses in the solid-state body, by means of which a solid-state layer is separated from the remaining solid-state body.

Publication DE 10 2012 001 620 A1 describes the use of an additional sacrificial layer between solid-state body and polymer film that serves for improved removal of the polymer film after the splitting-off step, in that the sacrificial layer is decomposed or detached, for example by chemical means by addition of suitable reactants. However, a disadvantage of this process is the long period of time, which can be up several hours, that passes before the polymer layer is completely removed. This significantly limits industrial utilization. To accelerate the process of polymer removal, it is possible by an appropriate pretreatment to introduce additional driving forces in the form of suitable tensile stresses that are effective even at room temperature. These lead to an increase in the size of the area of attack for the reactants or the solvent and promote breakdown or detachment and dissolution.

In addition, WO 2010/072675 A2 discloses providing fillers in the polymer in order to be able to locally influence the coefficients of thermal expansion or the modulus of elasticity. However, it has been found that such fillers often worsen the adhesion of the polymer on the surface of the solid-state body to be divided, such that sufficient transmission of force is no longer possible.

It is thus an object of the present invention to improve the thinning of the semiconductor substrates, especially in that material is conserved and the wafer losses (called "yield loss") are reduced and/or to provide a means of more advantageous production of electrical components and/or to provide advantageous multicomponent arrangements.

The aforementioned object is achieved in accordance with the invention by a method of separating at least one solid-state layer from at least one solid-state body according to claim 1. This method preferably comprises at least the steps of:

Generating a variety of modifications by means of laser beams within the solid-state body to form a detachment plane, generating a composite structure by arranging or producing layers and/or components on or atop an initially exposed surface of the solid-state body, wherein the exposed surface is part of the solid-state layer to be removed, introducing an external force into the solid-state body to generate stresses in the solid-state body, wherein the external force is sufficiently strong that the stresses brings about crack propagation along the detachment plane.

The modifications to form the detachment plane are more preferably generated prior to the generation of the composite structure.

Thus, in accordance with the invention, the processing of the components is preceded by the generation of a laser modification layer in the solid-state body or substrate or workpiece that defines the later thinning plane or detachment plane. Thereafter, the further processes take place for forming or generating layers and/or for component production (lithography, etc.).

The layers and/or components that form the composite structure together with the solid-state layer are preferably brought about by means of lithography, especially coating with, for example, metal compounds, lacquering, optical exposure (e.g. scanning through a photomask), development of the photoresist (especially at low temperatures, such as temperatures below 70° C., especially below 50° C. or below 30° C. or below ambient temperature or below 20° C. or below 5° C. or below 0° C.), etching structures. To generate a circuit, especially a finished circuit, individual or multiple or all of these processes, especially lithography processes, may be repeated multiple times, especially more than 10 times or up to 10 times or more than 20 times or up to 20 times or more than 40 times or up to 40 times or more than 80 times or up to 80 times.

The solid-state body that remains after the removal of the solid-state layer preferably has a thickness greater than, especially several times greater than, the thickness of the solid-state layer removed. The solid-state material is preferably a semiconductor material or includes a semiconductor material.

It should be understood here that "atop or above" a surface of the solid-state layer to be removed may also be understood to mean that, in the case of a high-temperature step preceding the laser treatment for generation of the modifications, the surface generated by the high-temperature method may be coated, on which the further layer(s) and/or components for generating the composite structure may then be arranged or generated. By definition, the composite structure is generated only after the laser treatment; any multilayer arrangement present prior to the laser treatment is not called a composite structure in the context of this application, but a multilayer arrangement.

Thinning here means a reduction in the thickness of the solid-state body, which is preferably a wafer, by the material content that would be abrasively removed, i.e., for example, machined away, ground or polished away, in conventional production processes on solid-state bodies provided with components, especially wafers.

In addition, it is possible in accordance with the invention that a metal layer is generated on the surface exposed by the removal of the solid-state layer from the solid-state body for at least partial and preferably substantial and more preferably complete compensation of a deformation of the solid-state layer brought about by the compressive stresses on the modification constituents remaining or for at least partial and preferably substantial or complete compensation of the compressive stresses and/or the metal layer is preferably generated by sputtering or electrochemical deposition.

Alternatively, the present method may at least be defined by the steps specified hereinafter which, in each embodiment, have one or more of the features disclosed by this document: providing a solid-state body, generating modifications, especially by means of laser radiation, in the solid-state body to form or generate a detachment region or detachment plane or a crack progression region and removing a solid-state layer from the solid-state body owing to crack propagation across the detachment region or detachment plane or crack progression region or parts of the solid-state body across the detachment region or detachment plane or crack progression region.

Further preferred embodiments are the subject of the dependent claims and of the parts of the description cited below.

The aforementioned object is additionally or alternatively achieved by a method of providing at least one solid-state layer, wherein the solid-state layer is detached from a solid-state body. This method of the invention preferably comprises the steps of: generating a variety of modifications by means of laser beams within the solid-state body to form a detachment plane, wherein the modifications generate compressive stresses in the solid-state body, removing the solid-state layer by a separation of the remaining solid-state body and the solid-state layer along the detachment plane formed by the modifications, wherein at least constituents of the modifications that generate the compressive stresses remain on the solid-state layer, wherein a sufficient number of modifications are generated that the solid-state layer becomes detached from the solid-state body owing to the modifications or wherein an external force is introduced into the solid-state body to generate further stresses in the solid-state body, wherein the external force is sufficiently high that the stresses bring about crack propagation along the detachment plane formed by the modifications. According to the invention, any of the methods hereby disclosed may additionally or alternatively include the step of generating a material layer, especially a metal layer, on the surface exposed by the removal of the solid-state layer from the solid-state body for at least partial and preferably substantial and more preferably complete compensation of a deformation of the solid-state layer brought about by the compressive stresses on the remaining modification constituents or for at least partial and preferably substantial or complete compensation of the compressive stresses.

This solution is advantageous since very planar solid-state layers may be provided without any need for material-removing processing of the solid-state layer. This is advisable especially in the case of the solid-state material SiC since production thereof is very costly and therefore material losses should be avoided as far as possible. Moreover, SiC is very hard, which means that it is necessary to use very costly grinding tools that wear very quickly owing to the high hardness of SiC. This solution is also advisable since the solid-state layers provided are already equipped with a material layer, especially a metal layer, to establish an electrical contact and/or to form an interface for heat removal. Preference is likewise given to the generation of a composite structure by arrangement or generation of layers and/or components atop or above an initially exposed surface of the solid-state body, wherein the exposed surface is part of the solid-state layer to be removed. Preferably, the modifications to form the detachment plane are generated prior to the generation of the composite structure. In addition, an external force can be introduced into the solid-state body to generate stresses in the solid-state body, the external force being sufficiently high that the stresses bring about crack propagation along the detachment plane.

The problem stated above is additionally alternatively achieved by a method of generating electrical components. This method of the invention preferably comprises at least the steps of: generating a multitude of modifications by means of laser beams within a solid-state body to form a detachment plane or a detachment region or a crack progression layer or a generation plane, wherein the modifications generate compressive stresses in the solid-state body, generating a composite structure by arrangement or generation of layers and/or components atop or above an initially exposed surface of the solid-state body, wherein the exposed surface is part of the solid-state layer to be removed, removing the solid-state layer by a separation of the remaining solid-state body and the solid-state layer along the detachment plane formed by the modifications, wherein at least constituents of the modifications that generate the compressive stresses remain on the solid-state layer, wherein a sufficient number of modifications are generated that the solid-state layer becomes detached from the solid-state body owing to the modifications or wherein an external force is introduced into the solid-state body to generate further stresses in the solid-state body, wherein the external force is sufficiently high that the stresses bring about crack propagation along the detachment plane formed by the modifications, in the solid-state layer removed, there are preferably compressive stresses for deformation of the solid-state layer, wherein the compressive stresses are generated by the constituents of the modifications that remain in the solid-state layer, and the step of generating a material layer, especially a metal layer, on the surface exposed by the removal of the solid-state layer from the solid-state body for at least partial compensation of a deformation of the solid-state layer brought about by the compressive stresses on the remaining modification constituents or for compensation of the compressive stresses generated by the modification constituents. Preference is likewise given to the generation of a composite structure by arrangement or generation of layers and/or components atop or above an initially exposed surface of the solid-state body, wherein the exposed surface is part of the solid-state layer to be removed. Preferably, the modifications to form the detachment plane are generated prior to the generation of the composite structure. In addition, an external force can be introduced into the solid-state body to generate stresses in the solid-state body, the external force being sufficiently high that the stresses bring about crack propagation along the detachment plane.

In a preferred embodiment of the present invention, the surface of the solid-state layer exposed as a result of the removal has first surface components having an Ra value (average roughness) of less than 1, especially of less than 0.9 or of less than 0.7 or of less than 0.5, especially between 0.01 and 0.4. In addition, the exposed surface of the solid-state layer preferably has second surface components having an Ra value (average roughness) of more than 1, especially between 1 and 5. The proportion of the first surface components here is preferably greater than the proportion of the second surface components, where the second surface components form at least 1% or at least 2% or at least 5% or at least 10% or between 1% and 49% or between 1% and 40% or between 1% and 30% or between 1% and 20% of the total area formed from the first surface components and the second surface components. This solution is advantageous since the solid-state layer itself is further processable especially without further surface conditioning, for example grinding or lapping, with proportions having Ra values between 1 and 5.

In a further preferred embodiment of the present invention, the material layer, especially metal layer, is generated in a first state of matter and at a temperature above room temperature on the solid-state layer and is in a second state of matter at room temperature, wherein the metal layer, by virtue of the transition from the first state of matter to the second state of matter, subjects the solid-state layer to the at least partial compensation and preferably complete compensation of the deformation or compressive stresses brought about by the compressive stresses from the remaining modification constituents. Alternatively, the metal layer may be generated within a temperature range above room temperature on the solid-state layer, where the temperature range may be at least 100° C. or 150° C. or 200° C. or 250° C. or 300° C. or 350° C. or 400° C. above room temperature and more preferably up to a maximum of 2000° C. or less than the melting or evaporation temperature of the solid-state material, wherein the cooling of the metal layer to room temperature subjects the solid-state layer to at least partial compensation and preferably complete compensation of the deformation brought about by the compressive stresses from the remaining modification constituents and to compensation for the compressive stresses. The cooling and solidification of the metal layer thus gives rise to forces, especially tensile forces, by which the solid-state layer is preferably negatively deformed with respect to the deformation brought about by the compressive stresses or by which the compressive stresses are compensated. The compressive stresses preferably bring about a deformation referred to as bow. Room temperature is preferably defined here as 20° C., where room temperature may also describe the temperature in a process space that may preferably be between 0° C. and 100° C. or between 20° C. at 200° C.

In a further preferred embodiment of the present invention, the metal layer is generated by sputtering or electrochemical deposition. Preference is given to using, for example, in the case of a solid-state SiC layer having modification constituents, known sputtering materials or materials usable for electrochemical deposition, for example titanium, titanium-tungsten, nickel, platinum, TaSi2 and/or gold. The thickness of the metal layer is preferably determined here by the parameters of thickness of the solid-state layer, material of the solid-state layer, area of the solid-state layer, number and type of modifications.

In a further preferred embodiment of the present invention, the solid-state body consists of silicon carbide (SiC) or includes silicon carbide (SiC), where the solid-state layer is preferably separated from the solid-state body with a thickness of less than 200 μm, especially with a thickness of less than 150 μm or of less than 125 μm or of less than 110 μm or of less than 100 μm or of less than 90 μm or of less than 75 μm. This solution is advantageous since SiC has very good controllability by means of the method proposed here and hence electrical components are producible with distinctly lower material loss and with distinctly lower wear on the treatment devices.

In a further preferred embodiment of the present invention, the electrical components are vertical components, especially Schottky diodes and/or metal oxide semiconductor field-effect transistors (MOSFETs), wherein the metal layer forms an electrical contact, especially an ohmic contact, and/or forms an interface for heat removal. This embodiment is advantageous since vertical components can be generated by the present invention with comparatively low material and wear losses in very planar form (for example through the use of SiC) and hence more easily as well. This creates the possibility of generating electrical components in a distinctly more energy-efficient and inexpensive manner.

In a further preferred embodiment of the present invention, the electrical components are horizontal components, especially high-electron-mobility transistors (HEMTs), wherein the metal layer preferably forms an interface for heat removal. This embodiment is advantageous since these components can be produced in a smaller size and lower weight and more favorably.

In a further preferred embodiment of the present invention, a multitude of electrical components, especially at least 4 or at least 9 or at least 36 or at least 100, are generated on average per cm2 of a planar surface side of the solid-state layer, where the electrical components, after they have been produced, are separated from one another by means of dicing. This embodiment is advantageous since the individual electrical components are separable from one another quickly and very gently. Preferably, the individual electrical components have rectangular, especially square, footprints. The electrical components preferably have outer edges between 0.1 mm and 5 mm.

In a preferred embodiment of the present invention, the external force is introduced by arrangement of a receiving layer on an exposed surface of the composite structure, wherein the receiving layer includes a polymer material and the receiving layer is subjected to thermal stress for generation, especially mechanical generation, of stresses in the solid-state body, wherein the exposure to thermal stress involves cooling the receiving layer to a temperature below the ambient temperature, wherein the cooling is effected by subjecting the polymer material in the receiving layer to partial or complete crystallization and/or a glass transition, and wherein the stresses result in propagation of a crack in the solid-state body along the detachment plane that separates the first solid-state layer from the solid-state body.

Preferably in accordance with the invention, the external force can be introduced into the solid-state body by exposing the solid-state body to sound, especially ultrasound, with the solid-state body preferably disposed here in a liquid-filled vessel. The sound, especially ultrasound, may be used with a frequency range from 20 kHz to 100 kHz, but also in the high-frequency sound range with a frequency range from 100 kHz to 1 MHz. On account of these frequencies, there are preferably cavitation processes resulting in phenomena such as collapsing cavitation bubbles, for example, in solid-state bodies in liquid media. In liquid media, particularly in the region of phase boundaries, there is implosion and deformation of dynamically forming cavitation bubbles and formation of a microjet within the nanosecond range. The spatially resolved release of energy is preferably accomplished in the form of adiabatic heating in a very small space by virtue of the very rapid compression of the gas. There is occurrence here of extreme temperatures of up to 5000 K and pressures up to 500 bar, which enable new physical reactions in the region of the interface layer that do not otherwise take place. These enormous pressure differences result from the rebound of the bubble front outward (imploding shockwave). This results in significantly increased reaction rates in this region. According to the invention, particular preference is given to a spatially resolved CNC-controlled exposure with the aid of an ultrasound tip (sonotrode) which can bring about a controlled influence on the triggering of cracks and/or progression of cracks. The spatially resolved compressive stress can be utilized in a controlled manner for triggering cracks and/or progressing cracks.

The homogeneous and/or spatially resolved embodiment is advantageous since, especially in the case of use of the receiving layer, very precise introduction of force and hence triggering of cracks and/or progression of cracks can be brought about.

In a further preferred embodiment of the present invention, prior to the generation of the detachment plane, the solid-state body is treated by at least one high-temperature method, wherein the high-temperature method is performed with a temperature between 70° C. and the melting temperature or evaporation temperature of the material of the solid-state body.

Thus, the performance of the laser step on a partly processed wafer constitutes a further option; more preferably in accordance with the invention, this is performed after the high-temperature steps, but before the other processes. This solution is advantageous since not all structures that can be damaged by the laser method have formed yet.

It is possible here to optimize parameters of the laser method in such a way that stress in the solid-state body is minimized, for example by repeated multiple exposure of the solid-state body, by greater line separations and decreasing energies in every pass.

The laser process is preferably performed depending on the crystallographic orientation of the substrate, i.e. the laser modification is more preferably conducted in such a way that microcracks formed in the course of treatment neither hinder lithography nor run out of the modification plane in a supercritical manner and can lead to loss of substrate after the triggering of the removal crack. It is possible here, for example, to conduct first lines parallel to the preferred cracking direction in SiC, in order to define a cracking plane, before lines at a 90° angle thereto in a second step finally trigger the cracks and define the separation plane.

The performance of the high-temperature steps prior to the generation of the detachment plane is highly advantageous since a distinct increase in the temperature above 70° C. is associated with elevated mobility of dopant atoms, atoms of metallic contaminants and dislocations or other crystal structure defects. If the detachment plane had been generated or partly generated prior to the high-temperature step, it would then have been possible, for example, for microcracks that had formed to extend or grow further into the solid-state body or into the solid-state layer to be removed, which would mean that more material would have to be removed and hence greater losses would occur.

In a further preferred embodiment of the present invention, the at least one high-temperature method is an epitaxial method, a doping method or a method in which plasma is used. High-temperature methods are understood to mean all methods, especially material-removing methods, that are executed at a temperature above 70° C. The temperature that occurs is preferably less than 2000° C. or less than the melting temperature or evaporation temperature of the solid-state material. The high-temperature method preferably creates a multilayer arrangement of solid-state material and the one or at least one layer generated or disposed.

In a further preferred embodiment of the present invention, the high-temperature method generates at least one layer on the solid-state body, wherein the at least one layer generated has predefined parameters, wherein at least one predefined parameter defines a maximum degree of refraction and/or absorption and/or reflection and/or charge carrier generation via the photoeffect of laser light waves, wherein the degree of refraction and/or absorption and/or reflection and/or charge carrier generation via the photoeffect is below 5% and preferably below 1% and more preferably below 0.1%. This embodiment is advantageous since interactions of all metallic elements in the circuit with laser light are suppressed. Owing to interactions between a metal layer or metallic components and laser light or laser radiation, the metal layer and/or the components, especially electrical connections, can be damaged.

Moreover, this embodiment solves the further problem that, on introduction of the laser plane, when metallic structures or components (for example longitudinal extent or extent in laser penetration direction of greater than 20 nm) have already been disposed or generated on the substrate, where the laser process is disrupted either by back-reflections on the structures or by the structures themselves, since, for example, transmission is not ideal. Since a multiphoton process is preferably utilized for generation of the material modifications, the focus in the material must preferably be very accurate, especially ideal, in order to enable the required high intensities with simultaneously minimum disruption of wavefronts. Thus, this advantage also supports a laser treatment prior to the processing or generation of the final structures, especially layers and/or components.

In a further preferred embodiment of the present invention, the modifications are preferably generated by means of a multiphoton excitation, especially a two-photon excitation.

Preferably, a multitude of base modifications is first generated on a line, especially a curved line, that runs homogeneously at least in sections, especially in the section that runs homogeneously. These base modifications are preferably generated with or depending on predefined process parameters. The predefined process parameters preferably include at least the pulse duration, pulse energy, pulse interval within a line, interval between the lines, depth and/or numerical aperture. Preferably, at least one value from these process parameters and preferably multiple values or all values from these process parameters or more than two values from these process parameters are fixed depending on the crystal lattice stability of the solid-state body. The value is more preferably chosen such that the crystal lattice around the respective base modification remains intact, i.e. tears preferably to an extent of less than 20 µm or less than 10 µm or less than 5 µm or less than 1 µm.

In a further preferred embodiment of the present invention, the laser radiation may be generated with pulse lengths of less than 5 ns or less than 2 ns, especially of less than 1 ns or of less than 700 ps or of less than 500 ps or of less than 400 ps or of less than 300 ps or of less as 200 ps or of less than 150 ps or of less than 100 ps or of less than 50 ps or of less than 10 ps.

Preferably, changes in the material properties and modifications are respectively generated with laser pulses that are shorter than 5 ns, especially shorter than 2 ns or 1 ns. More preferably, the duration of the individual laser pulses is between 50 ps and 4000 ps or between 50 ps and 2000 ps or between 50 ps and 1000 ps, especially between 50 ps and 900 ps or between 50 ps and 700 ps or between 50 ps and 500 ps or between 50 ps and 300 ps or between 300 ps and 900 ps or between 500 ps and 900 ps or between 700 ps and 900 ps or between 300 ps and 500 ps or between 500 ps and 700 ps or between 300 ps and 700 ps or shorter than 900 ps or shorter than 700 ps or shorter than 500 ps or shorter than 300 ps or shorter than 100 ps or shorter than 50 ps.

In a further preferred embodiment of the present invention, the laser radiation is generated with pulse energies, where the pulse energies are between 100 nJ and 1 mJ or 500 nJ and 100 µJ or 1 µJ and 50 µJ. Preferably, the pulse energy per individual shot is 0.1-50 µJ after the lens and after the last optical processing means and before the penetration of the laser radiation into the solid-state body. If, for example, multiple foci are generated by means of a DOE, the laser radiation assigned to each individual focus should have a pulse energy of 0.1-50 µJ after the lens and after the last optical processing means and before the penetration of the laser radiation into the solid-state body.

In a further preferred embodiment of the present invention, for defined temperature control or for generation of the modification or for changing, especially for locally changing, a material property of the donor substrate, the laser radiation is introduced into the solid-state body with a pulse density between 0.1 nJ/µm² and 10,000 nJ/µm², preferably between 1 nJ/µm² and 1000 nJ/µm² and more preferably between 3 nJ/µm² and 200 nJ/µm².

In a further preferred embodiment of the present invention, trigger modifications for triggering subcritical cracks are generated, wherein at least one process parameter for generating the trigger modifications is different from at least one process parameter for generating the base modifications; preferably multiple process parameters are different. Additionally or alternatively, the trigger modifications may be generated in a direction inclined or spaced apart relative to the direction in which the line along which the base modifications are generated runs.

The subcritical cracks, especially produced by trigger modifications and/or by modifications that define the detachment region or the detachment plane or by modifications that form a linear shape, according to the invention, preferably propagate by less than 5 mm, especially less than 3 mm or less than 1 mm or less than 0.5 mm or less than 0.25 mm or less than 0.1 mm. An inclined alignment may correspond here, for example, to an angle between 0° and 90°, preferably an angle between 85° and 90° and more preferably an angle of 90°.

This is a threshold process which is triggered when a critical intensity (i.e. power/area) is exceeded. This means that short pulses need less energy/pulse; higher numerical aperture concentrates the energy to a smaller dot, i.e. needs less energy to attain the threshold intensity.

A greater depth usually means absorption losses, which is why the energy has to be adjusted again accordingly, example of SiC: NA=0.4, depth 180 µm, pulse length 3 ns, pulse energy about 7 µJ, at depth 350 µm more like 9 µJ.

In general, harder materials (sapphire, aluminum oxide ceramic, SiC, GaN) need greater pulse overlap in the lines, i.e. smaller pulse separations (<=1 µm); on the other hand, the line spacings chosen tend to be greater (e.g. >5 µm), whereas softer materials such as GaAs and Si tend to require greater pulse separations (>1 µm) and, on the other hand, smaller line spacings (<5 µm).

Example pattern of SiC—with fs pulses: pulse energy about 800 nJ, pulse separation 50 nm or greater, up to 200 nm, line pattern as follows: 30 lines separated by 1 µm, then 20 µm gap, then 30 lines again, then 96 µm gap and then the same again, crossed with 30 lines, 20 µm gap and 30 lines (always with separation 1 µm between the lines), then 300 µm gap and then again 30/20/30 line block. Depth 180 µm, degree of doping of SiC (characterized by sheet resistance >21 mohm cm), pulse length 400 fs, numerical aperture 0.65.

In a preferred embodiment, the solid-state material is silicon, where the numerical aperture is between 0.5 and 0.8, especially 0.65, the penetration depth is between 150 µm and 1500 µm, especially 300 µm, the pulse separation is between 1 µm and 5 µm, especially 2 µm, the line spacing is between 1 µm and 5 µm, especially 2 µm, the pulse duration is between 50 ns and 400 ns, especially 300 ns, and the pulse energy is between 3 µJ and 30 µJ, especially 10 µJ.

In a preferred embodiment, the solid-state material is SiC, where the numerical aperture is between 0.4 and 0.8, especially 0.4, the penetration depth is between 50 µm and 500 µm, especially 180 µm, the pulse separation is between 0.1 µm and 3 µm, especially 1 µm, the line spacing is between 10 µm and 100 µm, especially 75 µm, the pulse duration is between 100 fs and 10 ns, especially 3 ns, and the pulse energy is between 0.5 µJ and 30 µJ, especially 7 µJ.

Example pattern of aluminum oxide ceramic: pulse separation 500 nm, line spacing 10 µm, pulse duration 3 ns, pulse energy 22 µJ, NA=0.4

Example pattern of sapphire: lines written in triplicate at 0°, 45°, 90°, each with line spacing 1.5 µm, pulse separation 300 nm, pulse energy in the first pass 350 nJ, in the second pass 300 nJ and in the third pass 250 nJ, at an NA of 0.65 and a pulse duration of 250 fs.

In a further preferred embodiment of the present invention, the line separations, especially of the linear designs, are preferably between 5 µm and 200 µm, especially between 10 µm and 100 µm, especially between 40 µm and 80 µm, especially between 60 µm and 80 µm, especially at 70 µm or exactly 70 µm or 70 µm+/−10 µm or +/−8 µm or +/−6 µm or +/−5 µm or +/−4 µm or +/−3 µm or +/−2 µm or +/−1 µm, or especially at 75 µm or exactly 75 µm or 75 µm or +/−10 µm or +/−8 µm or +/−6 µm or +/−5 µm or +/−4 µm or +/−3 µm or +/−2 µm or +/−1 µm.

In a further preferred embodiment of the present invention, the individual modifications of a linear design are generated at a distance from a further modification in the same linear design of 0.05 µm to 40 µm, especially between 0.1 µm and 20 µm, especially between 0.5 µm and 15 µm. The distance between two immediately adjacent modifications in a linear design is preferably 10 µm or exactly 10 µm or 10 µm+/−8 µm or +/−6 µm or +/−5 µm or +/−4 µm or +/−3 µm or +/−2 µm or +/−1 µm.

In a further preferred embodiment of the present invention, the laser beams for generating the modifications, before they penetrate into the solid-state body, pass through an optical system having a numerical aperture (NA) of at least 0.35, especially of at least or exactly 0.6 or of at least or exactly 0.75 or of at least or exactly 0.8 or of at least or exactly 0.85 or of at least or exactly 0.9 or of at least or exactly 0.95. In general, the surface roughness decreases with shorter pulses; with femtosecond pulses it is possible to generate better surfaces (roughnesses less than 3 µm) than with nanosecond pulses (likely to above 3 µm), but the process is costlier and takes longer. Picosecond pulses constitute a middle way. The advantage in the case of shorter pulses is that the phase transition is athermal, i.e. there is coupling between laser pulse and crystal lattice, and hence fewer vibrations (phonons) are induced—the process thus runs colder overall. For that purpose, larger regions have to be amorphized (phase transformation) in order that the critical tension that triggers the cracks is built up.

In a further preferred embodiment of the present invention, the subcritical cracks propagate in the solid-state body for between 5 µm and 200 µm, especially between 10 µm and 100 µm or between 10 µm and 50 µm or between 10 µm and 30 µm or between 20 µm and 100 µm or between 20 µm and 50 µm or between 20 µm and 30 µm. This embodiment is advantageous since a smaller extent of crack propagation entails a smaller degree of reprocessing expenditure. The subcritical cracks propagate along the crystal lattice boundaries, but since the crystal lattice of the solid-state body is preferably inclined with respect to the detachment plane, especially at an angle between 0° and 6°, the result is a surface with a sawtooth profile. The further the cracks run, the greater the distance between the valleys and peaks of this surface in sawtooth form, which means that more material also has to be removed if a surface roughness of less than 80 nm or of less than 50 nm or between 20 nm and 50 nm is to be generated. In a further embodiment of the present invention, the crack propagation of the subcritical cracks thus runs in an inclined direction other than an angle of 90° relative to the direction of incidence of the laser beams; the direction of crack propagation is preferably at an inclination of between 93° and 99°, especially exactly 94° or 98°, relative to the direction of incidence.

In a further preferred embodiment of the present invention, the sections between the regions of multiple lines in which the subcritical cracks have propagated crack as a result of the stresses or the introduction of the external force that are generated, for example, by the glass transition or the ultrasound treatment. This embodiment is advantageous since, owing to the existing damage already brought about in the interior of the solid-state body, especially owing to the subcritical cracks, the stresses required can be much lower. Moreover, the crack is run very precisely.

In a further preferred embodiment of the present invention, the receiving layer is disposed or produced on a surface of the solid-state body that lies on the opposite side from the surface of the solid-state body where the layers and/or components for forming of the composite structure are disposed.

Prior to the triggering of the crack, the receiving layer according to the process, especially in the form of a polymer film, is applied on the side of the solid-state body where there is preferably no further layer and/or components.

To generate the external force, in a further preferred embodiment of the present invention, a polymer material is disposed on the main surface. The polymer material preferably has a glass transition temperature of below 20° C., especially of below 10° C. or below 0° C. The polymer material is more preferably cooled to a temperature below the glass transition temperature, wherein the glass transition that takes place generates mechanical stresses in the donor substrate, wherein the mechanical stresses join the subcritical cracks to one another, whereby the solid-state layer becomes detached from the donor substrate. Preferably, the solid-state layer is separated from the solid-state body by weakening the solid-state body by means of the modifications in the crack progression region in such a way that the solid-state layer becomes detached from the solid-state body owing to the removal of material or such a number of modifications is generated after the removal of material that the solid-state body in the crack progression region is weakened in such a way that the solid-state layer becomes detached from the solid-state body or a stress generation layer is generated or arranged at a surface, especially a planar surface, of the solid-state body at an inclined alignment to the surrounding surface, and subjecting the stress generation layer to thermal stress creates mechanical stresses in the solid-state body, wherein the mechanical stresses give rise to a crack for removal of a solid-state layer that spreads proceeding from the surface of the solid-state body exposed by the removal of material along the modifications, or the solid-state body is subjected to thermal stress, especially cooled, after the generation of modifications, and the thermal stress results in detachment of the solid-state layer from the solid-state body along the crack progression region.

Thus, the step of arranging or generating a receiving layer on the solid-state body preferably has the features that the receiving layer includes or consists of a polymer material, especially polydimethylsiloxane or an elastomer or an epoxy resin or a combination thereof, and the polymer material, owing to thermal stress on the receiving layer for generation, especially mechanical generation, of crack propagation stresses in the solid-state body undergoes a glass transition, and the crack propagation stresses result in spreading of a crack in the solid-state body along the crack progression region.

In a further preferred embodiment of the present invention, the receiving layer, in terms of mass, at least mainly and preferably entirely consists of the polymer material, where the glass transition of the polymer material is between −130° C. and 0° C., especially between −85° C. and −10° C. or between −80° C. and −20° C. or between −65° C. and −40° C. or between −60° C. and −50° C.

In a further preferred embodiment of the present invention, the polymer material of the receiving layer consists of or includes a polymer hybrid material which forms a polymer matrix, where there is a filler in the polymer matrix, where the polymer matrix is preferably a polydimethylsiloxane matrix and where the proportion by mass of the polymer matrix in the polymer hybrid material is preferably 80% to 99% and more preferably 90% to 99%.

According to the invention, therefore, a polymer hybrid material is specified for use in a splitting method in which at least two solid-state fragments are generated from a solid-state starting material. The polymer hybrid material of the invention comprises a polymer matrix and at least one first filler embedded therein. Where mention is made hereinafter of a or the filler, the possibility of multiple fillers shall likewise be included. For example, the filler may comprise a mixture of different materials, e.g. metal oxides, metal particles and inorganic fibers.

The polymer matrix utilized may be any polymer or a mixture of different polymers, with the aid of which it is possible to generate the stresses needed for a division of the solid-state starting material. For example, the polymer matrix may take the form of an elastomer matrix, preferably of a polydiorganosiloxane matrix, more preferably of a polydimethylsiloxane matrix. Such polymer materials can be utilized in a particularly simple manner as matrix material in combination with fillers since the properties can be flexibly adjusted owing to the variable degree of crosslinking and matched to the respective filler and the solid-state starting material to be divided. In one embodiment, the proportion by mass of the polymer matrix in the polymer hybrid material is 80% to 99%, 10 preferably 90% to 99%.

The first filler may be organic or inorganic in nature and may consist either of a chemical element or of a chemical compound or of a mixture of substances, for example an alloy.

The constitution of the first filler is such that it acts as reactant, initiator, catalyst or promoter during the detachment of the polymer hybrid material from the solid-state fragment after the division and hence leads, by comparison with a polymer material without first filler, to faster detachment of the polymer hybrid material from the solid-state fragment after the division.

The specific chemical composition and configuration of the first filler and the proportion by mass thereof is dependent especially on the specific material of the polymer matrix that is to be detached, the solvent utilized for the purpose, and the reactants used. In addition, the material of the solid-state starting material and the dimensions of the solid-state starting material to be divided also play a role.

The specific proportion of the first filler in the polymer matrix is highly dependent on the filler material and its mode of action. Firstly, the polymer matrix, in spite of the filler, must still fulfill its function of generating stresses. Secondly, the proportion of the first filler must be high enough to achieve the desired influence on the removal of polymer. The optimal proportion by mass of the first filler in each case can be ascertained by the person skilled in the art in simple experiments conducted in a concentration-dependent manner.

A contribution to an improvement in mechanical properties may additionally be made by a further filler, for example fumed silica in the form of an inorganic network in the polymer. As well as these strong interactions in the form of the network, it is also possible for less strong interactions to make a contribution to the improvement via purely hydrodynamic reinforcements. An example that may be mentioned here is a controlled increase in viscosity that enables improved processing in the splitting method and hence can contribute to improved manufacturing tolerances. In addition, this interaction makes it difficult for there to be any reduction in the internal degrees of freedom with regard to structural reorientation with increasing reinforcement.

This leads to a desired lowering of the glass transition temperature of the polymer used in the polymer hybrid material, which enables the advantage of a lower temperature in the splitting method. According to the invention, the first filler in a polymer hybrid material is used for acceleration of the detachment of the polymer hybrid material from a solid-state fragment which is obtained by division by means of a splitting method in which a solid-state starting material is divided into at least two solid-state fragments.

The first filler may be distributed in the polymer matrix in such a way that the proportion by mass of the first filler decreases proceeding from the outer, i.e. lower, interface of the polymer hybrid material which is joined to the solid-state starting material during the splitting method in the direction of a further interface of the polymer hybrid material arranged parallel to the lower interface. This means that the proportion by mass of the filler close to the solid-state starting material or fragment is greater than in the other regions of the polymer hybrid material. This distribution of the first filler enables particularly effective removal of the polymer hybrid material after the separation since the first filler is close to the interface to the solid-state fragment and can display its effect there. At the same time, the remaining regions of the polymer hybrid material include less or even zero fractions of the first filler, such that there is a minimum influence on the function of the polymer.

In one configuration, the polymer hybrid material has a layered construction, with only a layer facing the solid-state starting material including the first filler, while the rest of the polymer hybrid material is free of the first filler.

In addition, a lower region of the polymer hybrid material that directly adjoins the lower interface thereof may be free of the first filler. Thus, the resultant sequence of regions may be as follows: adjacent to the solid-state starting material is firstly a region with no first filler, followed by a region with a high proportion of first filler and then by a region having a low proportion of first filler or having no first filler.

These and all the regions described hereinafter may take the form of layers, meaning that the region extends predominantly parallel to the interface of the solid-state starting material to which the polymer hybrid material is applied and has a longitudinal and transverse extent at least in the region of this interface.

A lower region without first filler may especially be provided if the first filler worsens the adhesion of the polymer hybrid material to the solid-state starting material. In order to avoid this, a region without first filler is first disposed, followed by a region with a high proportion of first filler in order that the first filler can fulfill its function. A lower region without first filler may have a thickness, for example, between 10 µm and 500 µm, for example 100 µm.

In addition, an upper region of the polymer hybrid material that directly adjoins the upper interface thereof may be free of the first filler. The lower interface is understood to mean the interface that bounds the polymer hybrid material from the environment at the opposite side from the lower interface and from the solid-state starting material. The upper and lower interface may be arranged parallel to one another.

Such an upper region without first filler may be provided especially when the first filler adversely affects the heat transfer between the environment and polymer hybrid material, for example if the cooling of the polymer hybrid material were to be delayed.

The first filler may comprise or consist of a material that can react with a reactant, preferably an oxidant, with release of a gaseous product.

It is thus possible to generate cavities in the polymer matrix that enable faster access by the reactants and solvent to the polymer matrix and any sacrificial layer present and additionally bring about faster transporting-away of the reactants and dissolved constituents.

The generation of gaseous reaction products can introduce additional driving forces that further assist the removal of the polymer hybrid material.

The formation of additional cavities and of gaseous reaction products accelerates the removal of polymer and therefore contributes to an increase in the overall yield of the splitting method. By varying the proportion of first filler, it is possible to influence the cavity density in the interface region between solid-state fragment and polymer hybrid material or between sacrificial layer and polymer hybrid material in a controlled manner.

The first filler may comprise a metal, especially aluminum, iron, zinc and/or copper, or consist of a metal, especially the aforementioned metals.

In relation to all the materials mentioned in the present context, "consisting of" includes the possibility that impurities for technological reasons or additions for technological reasons that may serve, for example, for production of the fillers and their distribution or binding to the polymer matrix may be present.

Metallic fillers may react with oxidizing agents, for example hydrochloric acid, nitric acid, citric acid, formic acid or sulfamic acid, with release of a gaseous product and hence be removed from the polymer hybrid material.

For example, aluminum reacts with concentrated hydrochloric acid to form solvated metal ions and hydrogen according to the following equation: ☐

$$6HCl+2Al+12H_2O \rightarrow 2[AlCl3*6H2O]+3H_2$$

In a similar manner, the reaction of zinc as filler by reaction with concentrated hydrochloric acid leads to formation of 5 additional cavities: $Zn+2 HCl \rightarrow ZnCl_2+H_2$ In the examples mentioned, the generation of hydrogen introduces additional driving forces that further assist the removal of the polymer hybrid material. In addition, the first filler can improve the thermal conductivity within the polymer hybrid material, for example in that the first filler has a higher thermal conductivity than the polymer of the polymer matrix. This may be the case, for example, when A further advantage in the case that the first filler comprises a metal lies in the improved thermal conductivity within the polymer hybrid material. Thereby By virtue of an improved thermal conductivity are the stresses generated by means of cooling for the division of the solid-state starting material are generatable more effectively, i.e. more quickly and with lower consumption of coolant. This increases can increase the overall yield of the splitting method.

In addition, a second 25 filler may be provided in the polymer hybrid material, which increases the adhesion of the polymer hybrid material on the solid-state starting material by comparison with a polymer hybrid material without second filler. Preferably, the adhesion is increased by comparison with a polymer material without filler.

For example, the second filler may be a filler that can be activated by means of plasma. Plasma activation results in new surface species that can be created so as to result in stronger interaction with the surface of the solid-state starting material and, ultimately, the adhesion of the polymer hybrid material is improved.

The nature of the surface species achievable by the plasma treatment is dependent primarily on the process regime of the plasma process. For example, during the plasma treatment, gases such as nitrogen, oxygen, silanes or chlorosilanes may be added, so as to give rise to polar groups, for example, which can interact more strongly with the surface of the solid-state starting material.

The second filler may be distributed 15 in the polymer matrix in such a way that the proportion by mass of the second filler increases in the direction of the lower interface. For example, the polymer hybrid material may contain the second filler only in a region adjoining the lower interface, where the region may also take the form of a layer in the sense of the abovementioned definition.

This enables the arrangement of the second filler preferably close to the interface between polymer hybrid material and solid-state starting material, which improves the adhesion and hence enables better force transmission into the solid-state starting material to be divided. For example, the second filler may comprise core-shell polymer particles.

Preference is given here to particles having a polymer composition that differs from the polymer matrix of the polymer hybrid material in that the surface, i.e. the shell, of the core-shell particles in particular is more strongly activatable, for example by means of low-temperature plasma.

Examples of these are core-shell particles comprising a polysiloxane core with an acrylate shell or comprising a nanoscale silicate core with an epoxide shell or comprising a rubber particle core with an epoxide shell or comprising a nitrile rubber particle core with an epoxide shell. The second filler may be activatable by means of low-temperature plasma, for example cold plasma. For example, the plasma may be generated by means of dielectric barrier discharge (DBD). It is possible here to generate electron densities in the range from 1014 to 1016 m$^{-3}$. The average temperature of the "cold" non-equilibrium plasma (plasma volume) generated by DBD is about 300±40 K at ambient pressure. The average temperature of the non-thermal plasma generated by DBD is about 70° C. at ambient pressure.

In the case of DBD treatment, the surface is subjected, for example, to uni- or bipolar pulses of pulse durations of a few microseconds to a few tens of nanoseconds and amplitudes in the single-digit to double-digit kilovolt range. No metallic electrodes are to be expected here in the discharge space, and hence no metallic impurities or electrode wear.

A high efficiency is additionally advantageous since no charge carriers have to exit from or enter the electrodes.

Dielectric surfaces may be modified and chemically activated at low temperatures. The surface modification can be effected, for example, by an interaction and reaction of the surface species by ion bombardment.

In addition, it is possible to specifically add process gases, for example nitrogen, oxygen, hydrogen, silanes or chlorosilanes, e.g. $Si_xH_yE_z$ with E=F, Cl, Br, I, O, H and x=0 to 10, z=0 to 10, SiH4, Si(EtO)4 or Me3SiOSiMe3, in a plasma treatment in order to generate, for example, particular chemical groups at the surface. The second filler may additionally be activatable by means of corona □5 treatment, flame treatment, fluorination, ozonization or UV treatment, or excimer irradiation. Such activation generates polar groups, for example, at the surface of the second filler, which can interact with the surface of the solid-state starting material and hence improve the adhesion. The polymer hybrid material may also additionally, by comparison with a polymer hybrid material having a first filler or with a polymer hybrid material having a first and second filler, comprise a third filler. This third filler has higher thermal conductivity and/or a higher modulus of elasticity compared to the polymer of the polymer matrix.

For example, the modulus of elasticity of the polymer under low-temperature conditions is in the lower single-digit gigapascal range (about 1-3 GPa), whereas, for example, metallic fillers have a modulus of elasticity in the double-digit to triple-digit gigapascal range. In the case of a corresponding high filler content, a percolating filler network is possible, which enables improved introduction of force into the solid-state starting material.

The percolation is significantly influenced by the degree of volume filling of the respective fillers (e.g. 0.1% by volume, 1□30% by volume to 10% by volume according to the aspect ratio). With increasing introduction of force, the viscoelastic layer construction of the polymer structure can be immersed and multiple percolation pathways become active. It is possible here to enable improved heat transfer since there can be improved contact of the fillers with the surface of the solid-state starting material.

The mechanical stability of the polymer hybrid material is rapidly attained even at low temperatures. The overall result is a lower standard deviation in the corresponding profiles of structure properties, for example breaking stress and elongation at break of the polymer hybrid material, and hence an increase in the overall yield of the splitting method. The spatially resolved changes in the profile of properties (tension peaks in the polymer hybrid material) and hence in the solid-state body are smaller, which leads to a higher overall yield of the splitting method and a better quality of the solid-state fragments produced.

The third filler can bring about improved heat transfer between the environment and polymer hybrid material and faster conduction of heat within the polymer hybrid material, such that the polymer hybrid material can be cooled more quickly and the splitting method can be performed rapidly and hence more effectively overall.

An increase in the modulus of elasticity can achieve higher stresses for the division of the solid-state starting material, such that it is also possible to divide solid-state starting materials for which particularly high stress is required.

Moreover, the third filler can also serve to influence the coefficient of thermal expansion. The aim here is a maximum difference between the coefficients of thermal expansion of the polymer hybrid material and the solid-state starting material to be divided, in order to be able to generate stresses necessary for the division. Preferably, the third filler has a high coefficient of thermal expansion, i.e. a coefficient of expansion higher than that of the polymer matrix. For example, the coefficient of thermal expansion of the third filler may be more than 300 ppm/K.

The third filler may be distributed in the polymer matrix such that the proportion by mass of the third filler increases in the direction of the upper interface in order to enable more rapid heat transfer especially at the interface to the environment.

The third filler may comprise a metal, especially aluminum, iron, zinc and/or copper, or consist of one of the metals mentioned. Metals are generally notable for a high heat conductivity and thermal conductivity.

The fillers described (first, second, third filler) may be distributed in particulate form in the polymer matrix, and the particle size may be in the μm and nm range, based on at least one dimension of the particle. As well as a spherical shape, the filler particles may also assume different configurations, for example a rod or disk shape.

The filler particles may have any particle size distribution, for example monomodal or bimodal, narrow, especially monodisperse, or broad. The fillers may be either physically bound, for example by embedding into the polymer network, or chemically bound to the polymer matrix. In addition, one or more of the fillers described may comprise or consist of inorganic or organic fibers, for example carbon, glass, basalt or aramid fibers, provided that the functions described above are reconcilable therewith. It is optionally also possible to add a further filler that comprises or consists of the fibers mentioned.

Fibers typically have strongly anisotropic properties. By direction-dependent positioning of the filler in the polymer hybrid material, it is possible to influence the stresses needed for the division of the solid-state starting material in a controlled manner. This can contribute to an increase in the overall yield of the splitting method. An additional advantage, in the case that an organic or inorganic filler is used as fibrous material having a strongly anisotropic structure, is that this can achieve an improvement in the mechanical properties within the polymer hybrid material.

The fillers described may additionally comprise or consist of core-shell particles. Additionally or alternatively, a further filler comprising or consisting of core-shell particles may be provided in the polymer hybrid material.

The use of core-shell polymer particles additionally allows, as well as improved activatability, also a new configuration of energy-absorbing mechanisms that can lead overall to an increase in impact resistance and fracture toughness, especially an increase in low-temperature fracture resistance, of the polymer hybrid material in the case of use in the splitting method, and hence can likewise contribute to a higher overall yield of the splitting method. For example, mechanical destruction of a film of a polymer hybrid material may be less likely to occur, and so the possibility of reuse of the film can be promoted.

By way of example, by preventing crack propagation owing to core-shell polymer particles, it is possible to prevent destruction of the film in the splitting method and hence to open up reutilization pathways.

It is possible here for elastomer particles present to undergo plastic deformation and form cavities, which means that further additional energy can be absorbed. Additional absorption of energy can likewise be compensated for by the shear flow of the matrix, which improves mechanical properties overall. It is a feature of core-shell particles that a generally spherical core made of one material is surrounded by a shell made of a second material. The shell may either completely surround the core or alternatively be permeable. The materials may either be inorganic materials, for example metals, or organic materials, for example polymers. For example, it is possible to combine two different metals with one another. Alternatively, it is possible to surround a core made of a polymer with a shell made of a metal or a second polymer.

Core-shell particles enable the combination of the properties of the first and second materials. For example, by means of an inexpensive polymer core, it is possible to fix the size and density of the filler particles, while the metallic shell can react as described above. Owing to their often monodisperse particle size distribution, the properties of the core-shell particles can additionally be precisely predicted and adjusted.

Furthermore, one or more fillers (first, 5 second and/or third filler) may comprise or consist of carbon in the form of carbon black, graphite, chopped carbon fibers, carbon nanofibers, preferably in the form of carbon nanotubes (CNTs), for example multiwall carbon nanotubes (MWCNTs) and single-wall carbon nanotubes (SWCNTs). Carbon nanotubes are cylindrical graphite layers formed from a different number of cylinders.

If these tubes consist of just one cylinder, they are referred to as single-wall carbon nanotubes (SWCNTs). If two or more cylinders are present, the result is either double-wall carbon nanotubes (DWCNTs) or multiwall carbon nanotubes (MWCNTs). These may preferably be in concentrically nested form.

In various embodiments, the third filler may comprise or consist of MWCNTs since these have particularly high thermal conductivity (>3000 $W*(m*K)-1$) and at the same time have very high tear resistance in the range of 5-60 GPa. The high mechanical stability is manifested in high tear resistance values, extreme elasticity and very good durability of the filler.

This is based on the sp2-hybridized strong σ-C—C bonds combined with a delocalized p orbital as the π bond to there adjacent carbon atoms. Torsions of up to 90° are possible here.

SWCNTs can achieve even higher property values (modulus of elasticity: 410 GPa to 4150 GPa vs. graphite: 1000 GPa, SWCNTs: thermal conductivity about 6000 $W*(m*K)-1$). However, a poorer cost/benefit ratio is found here compared to MWCNTs. The cylinder diameters of MWCNTs are typically in the range from 1 nm to 100 nm, preferably from 5 to 50 nm, with a length of 500 nm to 1000 μm.

In further embodiments, the third filler may comprise MWCNTs and, at the same time, the second and/or first filler may comprise or consist of carbon black, since it is likewise possible here to achieve an improvement in thermal conductivity (for example up to 200 $W*(m*K)-1$). Since the use of carbon black, by way of example, has a distinctly lower tear resistance with values of <0.4 GPa, a combination of both or further fillers is possible and can lead to an improvement in the overall splitting yield and to an improvement in the overall costs in the splitting method.

20 The average diameter here of the carbon black particles is in the range from 5 nm to 500 nm, preferably from 20 nm to 200 nm, more preferably from 40 nm to 100 nm.

In addition, the fillers may comprise or consist of silica, for example fumed silica. 25 Additionally or alternatively, a further filler comprising or consisting of silica may be provided in the polymer hybrid material.

Fumed silica may form a three-dimensional network and hence contribute to an improvement in mechanical stability. Thus, such a filler may serve for controlled adjustment of the mechanical properties of the polymer hybrid material. One or more of the fillers mentioned (first, second, third filler) may consist of the same material if it is reconcilable with the function ascribed to it. For example, both the first and third fillers may comprise aluminum or consist of aluminum. Aluminum can be utilized as described above both for generation of cavities and hence for acceleration of the detachment of the polymer hybrid material from the solid-state fragment and for an increase in thermal conductivity. Such a configuration simplifies the manufacturing process since it may be sufficient to add just one or two fillers in order to fulfill all functions.

The first and second and any third filler may also consist of different materials. This enables individual and hence better adaptation of the filler to the desired function.

A film of the invention comprises a polymer hybrid material as described above. The film may have a thickness of, for example, 0.5 to 5 mm.

A polymer hybrid material of the invention or a film of the invention is applied to at least this surface, so as to result in a corresponding composite structure. The polymer hybrid material applied and the film applied are also referred to hereinafter as receiving layer. The thickness of such a receiving layer may, for example, be between 0.5 mm and 5 mm, especially between 1 mm and 3 mm. Optionally, the polymer hybrid material or film may be applied to multiple exposed surfaces, especially to surfaces in a mutually parallel arrangement.

The thermal stress preferably constitutes cooling of the receiving layer below ambient temperature and preferably below 10° C. and more preferably below 0° C. and further preferably below −10° C. or below −40° C.

The cooling of the receiving layer is most preferably effected in such a way that at least some of the receiving layer undergoes a glass transition, or else undergoes partial or complete crystallization. The cooling here may be a cooling operation to below −130° C., which can be brought about, for example, by means of liquid nitrogen. This embodiment is advantageous since the receiving layer contracts and/or undergoes a glass transition as a function of the change in temperature and the resultant forces are transmitted to the solid-state starting material, by means of which mechanical stresses can be generated in the solid-state body and lead to triggering of a crack and/or to crack propagation, with spreading of the crack initially in the first detachment plane for splitting-off of the solid-state layer.

In a further step, the polymer hybrid material or the film is removed from the solid-state fragment, for example by a chemical reaction, a physical detachment operation and/or mechanical material removal.

The operation of detachment of the polymer hybrid material from the solid-state fragment can take place at moderate ambient temperature, for example in the range from 20° C. to 30° C., preferably in the higher temperature range from 30° C. to 95° C., for example from 50° C. to 90° C., or else, for example, in a lower temperature range between 1° C. and 19° C.

The elevated temperature range can enable shortening of a chemical detachment reaction owing to an increase in the reaction rate, for example in the case of use of a sacrificial layer between the polymer hybrid material and the solid-state body. In the case of use of a sacrificial layer, the detachment can be effected in aqueous solution, advantageously at a pH in the range of 2-6. In various embodiments, by way of example, the detachment operation can be effected in the form of a treatment with a solution of a suitable apolar solvent, particular preference being given to moderate ambient temperatures in the range from 1° C. to 50° C. and particular preference to from 20° C. to 40° C.

A particular advantage here is detachment without thermal treatment of the film. It is advantageously possible here to employ aliphatic and aromatic hydrocarbons, for example toluene, n-pentane, n-hexane, but also halogenated solvents, for example carbon tetrachloride. It is possible here to introduce additional forces into the polymer hybrid material to be detached and the interface to the solid-state fragment since a solvent treatment can result in occurrence of very significant reversible swelling of the polymer hybrid material, which simplifies detachment overall.

In further embodiments, a combination with the above-described mechanism of detachment of the sacrificial layer and treatment with a suitable apolar solvent can be effected—likewise without thermal treatment of the film.

On the exposed layer or the exposed components of the composite structure generated, it is possible to arrange or generate a stabilization layer for bounding of deformations of the exposed layer or the exposed components, said deformations resulting from the mechanical stresses introduced by means of the receiving layer. The side with components is thus preferably protected and held (for example to counter warping of the substrate or of the solid-state body and gray room conditions). This can be accomplished via soluble polymers (organics) or holding layers. This embodiment is advantageous since it can limit interaction with small Mems structures, for example. The surface characteristics of a wafer executed with components is usually not regular, which, in the event of excessive or abrupt movements, can lead to excess field increases and local surface damage. Thus, this embodiment is a solution that brings about good protection of the solid-state layer and of the layers and/or components disposed and/or generated thereon, especially from mechanical damage or destruction.

The method may preferably likewise or alternatively include one or more of the steps of: providing a solid-state body for separation of at least one solid-state layer, wherein the solid-state body has a first planar area component and a second planar area component, wherein the first planar area component is preferably aligned essentially or exactly parallel to the second planar area component.

Generating defects by means of at least one radiation source, especially a laser, in the internal structure of the solid-state body to define a crack triggering site, proceeding from which the solid-state layer is separated from the solid-state body.

Generating defects or modifications by means of laser beams from at least one laser in the internal structure of the solid-state body to define a crack progression along which the solid-state layer is separated from the solid-state body, wherein the laser beams penetrate into the solid-state body through the second planar area component.

In a further preferred embodiment of the present invention, the stabilization layer consists of or includes a preferably water-soluble ceramic, especially Fortafix from Detakta, and/or a soluble polymer, especially poly(ethylene glycol) (PEG), especially with different and/or adjusted chain lengths. Fortafix is a one- and two-component ceramic cement for use as adhesive, enamel for protection from corrosion and chemical effects, casting compound for mold construction or for insulation, as dipping compound for securing of heating wires, for the insetting of knife blades, for example in metal or ceramic grips. The polymer (PEG) is soluble in water and a number of organic solvents. It is insoluble in hexane, diethyl ether and tert-butyl methyl ether—i.e. other organic solvents. Accordingly, the surface structures/components may be filled with PEG before a protective layer is applied. The stabilization layer is preferably generated in situ or provided as a film. Additionally or alternatively, the stabilization layer is cast or the layer and/or the exposed components are contacted with liquid material which only becomes the stabilization layer through curing or solidification. The stabilization layer is additionally or alternatively removed from the layer or the exposed components by applying a solvent or by dipping into a solvent. The stabilization layer thus includes or consists of a ceramic material and/or it includes or consists of a polymer material.

In a further preferred embodiment of the present invention, the modifications are successively generated in at least one line or row, wherein the modifications generated in a line or row are preferably generated at a distance X and with a height H in order that a crack that propagates between two successive modifications, especially a crack that propagates in crystal lattice direction, the direction of crack propagation of which is aligned at an angle W relative to the detachment plane, connects the two modifications to one another. The angle W here is preferably between 0° and 6°, especially 4°. Preferably, the crack propagates from a region beneath the center of a first modification toward a region above the center of a second modification. The essential relationship here is therefore that the size of the modification can/must be altered depending on the separation of the modifications and the angle W.

In a further preferred embodiment of the present invention, in a first step, the modifications are generated on a line and preferably at the same distance from one another. It is additionally conceivable that a multitude of these lines generated in the first step are generated. These first lines are more preferably generated parallel to the direction of crack propagation and preferably in a straight line or in the form of an arc, especially in the same plane. After the generation of these first lines, second lines for detachment and/or driving of preferably subcritical cracks are preferably generated. The second lines are likewise generated preferably in a straight line. More preferably, the second lines are in an inclined, especially orthogonal, alignment relative to the first lines. The second lines preferably extend in the same plane as the first lines or more preferably in a plane parallel to the plane in which the first lines extend. Subsequently, third lines are preferably generated to connect the subcritical cracks.

In a further preferred embodiment of the present invention, a cooling device is provided for cooling of the receiving layer to a temperature between −130° C. and −10° C., especially to a temperature between −80° C. and −50° C. The cooling device preferably includes a nebulizer, especially at least or exactly one perforated pipeline, for nebulization of liquid nitrogen, and the cooling effect is more preferably generated by nebulized nitrogen. Alternatively, it is conceivable that the cooling device has a nitrogen bath, wherein the receiving layer is positioned at a distance from the liquid nitrogen held in the nitrogen bath. Alternatively, it is conceivable that the cooling device is provided a spraying means that preferably uniformly provides nitrogen, especially in liquid or nebulized form, wherein the spraying means is preferably disposed above and/or to the side of the receiving layer. This embodiment is advantageous since the liquid nitrogen is of very good suitability for defined cooling of objects. In addition, this embodiment is advantageous since a very much more energy-efficient process is provided compared to low-temperature processes of less than −80° C. or of less than −90° C.

The cooling device preferably has a nitrogen bath and a positioning device in order to defined setting of the distance of the position of the receiving layer from the liquid nitrogen held in the nitrogen bath, wherein the nitrogen bath and the positioning device are preferably disposed in a space at least partly and preferably completely delimited from the environment.

In a further preferred embodiment of the present invention, one or more temperature measurement device(s) is/are provided. With the temperature measurement device(s) and temperature measurement(s) are preferably conducted, wherein the temperature values detected are preferably used to control the setting or flow through a nitrogen valve for temperature control.

For more homogeneous temperature control, it is also possible to use a ventilator within the chamber, which generates forced convection and hence reduces temperature gradients.

A further cooling option (not depicted) is contact cooling with a temperature-controlled cooling body through which, for example, a coolant flows in a closed circuit and is brought into contact with the solid-state body.

The temperature is preferably measured on the solid-state body, especially on the receiving layer and/or on the underside of the solid-state body; the underside of the solid-state body is preferably spaced apart from the bottom of the chamber, the solid-state body preferably being positioned by provision of a positioning device, by means of which the distance of the solid-state body from the bottom of the chamber or the distance of the receiving layer from liquid nitrogen is more preferably variable, especially in a temperature-dependent manner.

In addition, a chamber is preferably provided to accommodate the nitrogen and the positioning device, said chamber preferably being sealable and/or thermally insulated from the environment.

According to the present description, a solid-state starting material is preferably understood to mean a monocrystalline, polycrystalline or amorphous material. Owing to the highly anisotropic atomic bonding forces, preference is given to monocrystalline materials having a highly anisotropic structure. The solid-state starting material preferably includes a material or material combination of one of main groups 3, 4, 5 and/or of transition group 12 of the Periodic Table of the Elements, especially a combination of elements from main groups 3, 4, 5 and transition group 12, for example zinc oxide or cadmium telluride.

As well as silicon carbide, the semiconductor starting material may also include, for example, silicon, gallium arsenide GaAs, gallium nitride GaN, silicon carbide SiC, indium phosphide InP, zinc oxide ZnO, aluminum nitride AlN, germanium, gallium(III) oxide Ga2O3, aluminum oxide Al2O3 (sapphire), gallium phosphide GaP, indium arsenide InAs, indium nitride InN, aluminum arsenide AlAs or diamond.

The solid-state body or workpiece (e.g. wafer) preferably includes a material or material combination of one of main groups 3, 4 and 5 of the Periodic Table of the elements, for example SiC, Si, SiGe, Ge, GaAs, InP, GaN, Al2O3 (sapphire), AlN. More preferably, the solid-state body includes a combination of the elements that occur in the fourth, third and fifth groups of the Periodic Table. Conceivable materials or material combinations here are, for example, gallium arsenide, silicon, silicon carbide, etc. In addition, the solid-state body may include a ceramic (e.g. Al2O3—aluminum oxide) or consist of a ceramic; preferred ceramics here are, for example, perovskite ceramics (for example Pb-, O-, Ti/Zr-containing ceramics) in general and lead magnesium niobates, barium titanate, lithium titanate, yttrium aluminum garnet, especially yttrium aluminum garnet crystals for solid-state laser applications, surface acoustic wave (SAW) ceramics such as lithium niobate, gallium orthophosphate, quartz, calcium titanate, etc. in particular. The solid-state body thus preferably includes a semiconductor material or a ceramic material, and the solid-state body more preferably consists of at least one semiconductor material or a ceramic material. The solid-state body is preferably an ingot or wafer. The solid-state body is more preferably a material at least partly transparent to laser beams. It is thus also conceivable that the solid-state body includes a transparent material or consists of or has been manufactured partly from a transparent material, for example sapphire. Further materials that are useful here as solid-state material on their own or in combination with another material are, for example, "wide band gap" materials, InAlSb, high-temperature superconductors, especially rare earth cuprates (e.g. YBa2Cu3O7). It is additionally or alternatively conceivable that the solid-state body is a photomask, where the photomask material used in the present case may preferably be any photomask material known up to the filing date and more preferably combinations thereof. In addition, the solid-state body may additionally or alternatively include or consist of silicon carbide (SiC).

The modifications may be a phase transformation of the solid-state material, especially of silicon carbide to silicon and carbon, which generates an expansion in volume in the solid-state body, which in turn generates compressive stresses in the solid-state body.

The laser exposure of the invention preferably has the effect of a substance-specific location-resolved cumulation of the energy input, which results in a defined heat treatment of the solid-state body at a defined location or at defined locations and in a defined time. In a specific application, the solid-state body may consist of silicon carbide, as a result of which a highly locally limited heat treatment of the solid-state body to a temperature of, for example, more than 2830+/−40° C. is preferably undertaken. This heat treatment results in novel substances or phases, especially crystalline and/or amorphous phases, the resulting phases preferably being Si (silicon) and DLC (diamond-like carbon) phases formed with distinctly reduced strength. This layer of reduced strength then gives rise to the detachment region or detachment plane.

In addition, the aforementioned object is achieved by a solid-state body that has been produced by an aforementioned method and has at least one detachment plane within the solid-state body, wherein the detachment plane is formed from modifications that have been generated by means of laser radiation. In addition, the solid-state body has a region resulting from a high-temperature treatment method.

In a further preferred embodiment, the layer(s) and/or components(s) have been disposed or generated in the region. Alternatively, the layer(s) and/or component(s) may have been disposed or generated on a surface of the solid-state layer to be removed. The solid-state body preferably has a thickness or average thickness of less than 1000 μm, especially of less than 800 μm or 700 μm or 600 μm or 500 μm or 400 μm or 300 μm or 200 μm or 100 μm or 80 μm or 50 μm.

The invention thus also provides for the production of components on such a pretreated/modified wafer and the modified wafer as component substrate itself.

The present invention additionally or alternatively further relates to a multicomponent arrangement. The multicomponent arrangement of the invention is preferably generated by means of a process described in this property right specification and more preferably has at least one solid-state layer. The solid-state layer preferably consists to an extent of more than 50% (by mass), especially to an extent of more than 75% (by mass) or to an extent of more than 90% (by mass) or to an extent of more than 95% (by mass) or to an extent of more than 98% (by mass) or to an extent of more than 99% (by mass) of SiC, where the solid-state layer, in the region of a first surface, includes modifications or modification constituents that generate compressive stresses, where the modifications are amorphized (phase-transformed) constituents of the solid-state layer, where the modifications are at a shorter distance from, or form part of, the first surface than from a second surface, where the second surface is formed parallel or essentially parallel to the first surface, where the first surface is planar or essentially planar and/or where the second surface is planar or essentially planar. In addition, the multicomponent arrangement of the invention likewise includes a metal layer generated on the first surface of the solid-state layer. In addition, it is possible that one or more further layers and/or one or more further components are disposed on the second surface, especially for formation of electrical components that can be used as horizontal or vertical components.

Preference is given to the generation of a composite structure by arrangement or generation of layers and/or components atop or above an initially exposed surface of the solid-state body, wherein the exposed surface is part of the solid-state layer to be removed. Preferably, the modifications to form the detachment plane are generated prior to the generation of the composite structure. In addition, an external force can be introduced into the solid-state body to generate stresses in the solid-state body, the external force being sufficiently high that the stresses bring about crack propagation along the detachment plane.

Preferably, the modifications are spaced apart from the second surface by less than 200 μm, especially less than 150 μm or less than 110 μm or less than 100 μm or less than 75 μm or less than 50 μm.

A surface in the context of the present invention should preferably be regarded as essentially planar when every square centimeter of the surface, when the surface is laid on an ideal smooth and ideal planar surface, has at least one constituent in contact with the ideally smooth and ideally planar surface.

A surface in the context of the invention should preferably regarded as planar when every square centimeter, especially square millimeter, of the surface, when the surface is laid on an ideal smooth and ideal planar surface, at least has multiple, especially at least 2, 3, 4 or 5, constituents in contact with the ideally smooth and ideally planar surface.

In a further preferred embodiment of the present invention, a diffractive optical element (DOE) is disposed in the pathway of the laser radiation prior to the penetration of the laser radiation into the donor substrate or into the solid-state body. The laser radiation is divided by the DOE into multiple light pathways for generation of multiple foci. The effect of the DOE is preferably to bring about an image field curvature over a length of 200 μm of not more than 50 μm, especially not more than 30 μm or not more than 10 μm or not more than 5 μm or not more than 3 μm, wherein the DOE simultaneously generates at least 2 and preferably at least or exactly 3 or at least or exactly 4 or at least or exactly 5 or at least or exactly or up to 10 or at least or exactly or up to 20 or at least or exactly or up to 50 or up to 100 foci to change the material properties of the donor substrate. This embodiment is advantageous since a significant acceleration of the process can be achieved.

It has thus been recognized in the context of the present invention that high powers are divided between multiple foci in the focal plane with diffractive optical elements (DOEs). DOEs show interference phenomena even before the focal plane; it has been recognized that interferences at the surface can generate local intensity maxima in front of the focal plane that can lead to damage to the surface and can lead to reduced transmissivity for laser radiation for processing at depth. It has also been recognized that some materials (e.g. SiC) have local differences in refractive index and other material properties (e.g. absorption, transmission, scatter), for example by virtue of the material doping (common occurrence: dopant spot). It has additionally been recognized that, depending on the surface roughness of the material at the laser introduction surface, the wavefront of the laser can be significantly impaired at depth in the material, such that the focus has reduced intensity (lower multiphoton transition probability), which would in turn cause higher intensities with the problems mentioned above.

Incidence of the laser beams onto or into the solid-state body or the donor substrate at the Brewster angle is complicated and can be highly demanding since the different beam components cover different path lengths in the medium of higher refractive index. The focus must accordingly be adjusted via higher energy and/or via beamforming. Beamforming is preferably effected here, for example, via one or more diffractive optical elements (DOEs), which compensates for this difference in a dependent manner across the laser beam profile. The Brewster angle is relatively large, which, in the case of a high numerical aperture, makes demands on the optics and their dimensions and the working distance. Nevertheless, this solution is advantageous since reduced reflections at the surface also contribute to reduced surface damage since the light intensity is better coupled into the material. In the context of this invention, is also possible for laser beams to be introduced in all other embodiments disclosed in this document at the Brewster angle or essentially at the Brewster angle. With regard to introduction at the Brewster angle, reference is hereby made to the document "Optical Properties of Spin-Coated TiO2 Antireflection Films on Textured Single-Crystalline Silicon Substrates" (Hindawi Publishing Corporation International Journal of Photoenergy, Volume 2015, Article ID 147836, 8 pages, http://dx.doi.org/10.1155/2015/147836). This document is fully incorporated into the subject matter of the present patent application by reference. The aforementioned and incorporated document especially discloses calculations for the optimal angle of incidence for various materials and hence refractive indices. The energy from the laser or the laser exposure device is adjusted not so much depending on the material but more depending on the possible transmission at a particular angle. Thus, if the optimal transmission is 93%, for example, these losses must be taken into account by comparison with experiments with perpendicular incidence and losses that would then be 17%, for example, and the laser power must be adjusted correspondingly.

An example: 83% transmission at a perpendicular angle versus 93% at an angle means that, to achieve the same energy at depth, only 89% of the laser power used on perpendicular incidence is required (0.83/0.93=0.89). In the context of the invention, the portion of oblique incidence thus preferably serves to lose less light through surface reflection and bring more deep into the material. A possible subsequent problem that can occur as a result in particular arrangements is that the focus at depth can take on a "skewed" profile and hence the intensities achieved—the key parameter for multiphoton processing—are lower again, i.e. are possibly even less than in the case of perpendicular incidence, where all beam components cover the same optical distance in the material. This can preferably be accomplished by a diffractive optical element or by multiple diffractive elements or a penetrating wedge or multiple penetrating wedges—and/or other optical elements—in the beam pathway that compensate for these additional pathways and/or the influence on the individual beams—especially different spherical aberrations across the beam profile. These DOEs can be calculated numerically by suitable software solutions (e.g. Virtuallab from Lighttrans, Jena) and then manufactured or provided.

The present invention preferably additionally or alternatively relates to a method of generating modifications in a solid-state body, wherein the modifications define a crack progression region or a detachment plane for progression of a crack to remove a solid-state component, especially a solid-state layer, from the solid-state body. The process of the invention preferably comprises at least the steps of: moving the solid-state body relative to a laser exposure device or a laser, successively generating a multitude of laser beams by means of the laser exposure device for generating at least one modification in each case, wherein the laser exposure device is adjusted for defined focusing of the laser beams and/or for adjustment of the laser energy, especially continuously, depending on at least one parameter, especially on a multitude of parameters, especially two, at least two or exactly two or not more than as parameter.

In a further preferred embodiment of the present invention, a fluid, especially a gas, especially air, is moved between the laser exposure device and the solid-state body. Preferably, flow characteristics of the fluid present between the solid-state body and the laser exposure device, especially in the region of beam progression, are adjusted to prevent dust accumulations in the region of the laser radiation. In a further preferred embodiment of the present invention, the flow characteristics are adjusted by the supply of a fluid, especially ionized gas, to the region of beam progression between a lens and the solid-state body or the flow characteristics are adjusted by generating a reduced pressure, especially a vacuum, in the region of beam progression between a lens and the solid-state body.

In a further preferred embodiment of the present invention, the solid-state body has at least one coating or is coated with a coating, wherein the refractive index thereof is different than the refractive index of the surface of the solid-state body on which the coating is disposed, or wherein a coating having a refractive index different than the refractive index of the surface of the solid-state body on which the coating is disposed is generated on the solid-state body. The generation or arrangement of the coating is preferably preceded or followed by the step of generating modifications within the solid-state body by means of laser beams from a laser exposure device, wherein the modifications preferably define the crack progression region along which the solid-state layer is separated from the solid-state body.

In a further preferred embodiment of the present invention, the coating is generated or has been generated by means of spin-coating, wherein the coating includes nanoparticles, especially of at least one material selected from the list at least consisting of silicon, silicon carbide, titanium oxide, glass or Al2O3.

In a further preferred embodiment of the present invention, multiple coatings are arranged one on top of another or are generated one on top of another, wherein the refractive indices thereof are different; preferably, a first coating that has been disposed or generated on the solid-state body has a greater refractive index than an added coating which is produced on the first coating.

The coatings are thus preferably selected and generated or disposed in such a way that the refractive index of the respective layer preferably becomes smaller or decreases with the distance of the respective layer from the solid-state body. Thus, in the case of layering: 1. solid-state body, 2. first coating, 3. second coating, 4. third coating; the refractive index of the solid-state body is preferably greater than the refractive index of the first coating and the refractive index of the first coating is preferably greater than the refractive index of the second coating and the refractive index of the second coating is preferably greater than the refractive index of the third coating. The steps between the refractive indices here may have a continuous or discontinuous profile. In addition, the different coatings may have different thicknesses. However, it is conceivable here that two or three or more of the coatings have the same thickness. Preferably, a coating has a thickness in each case in the range between 50-400 nm. This means that, for example, the first coating may have a thickness (or average thickness) of 100 nm. The thicknesses of the second coating and of the third coating may thus correspond essentially or correspond entirely therewith, wherein at least one of the coatings and preferably both have a different thickness. For example, the second coating may have a thickness (or average thickness) of 150 nm. In addition, the third coating may be thicker or thinner than the first coating and/or than the second coating, for example have a thickness (or average thickness) of 75 nm, 110 nm or 300 nm.

The method of the invention preferably likewise comprises the step of removing donor substrate material proceeding from a surface that extends in circumferential direction of the donor substrate in the direction of the center of the donor substrate, especially for generating a circumferential depression. Preferably, the removal of material exposes the detachment region. In other words, modifications that may define the detachment region or detachment plane may have been generated beforehand. It is thus possible that the donor substrate is weakened by the modifications in a detachment region or along a detachment plane in such a way that the solid-state slice or solid-state layer is detached from the donor substrate as a result of the removal of material or, after the removal of material, such a number of modifications is generated that the donor substrate is weakened in the detachment region in such a way that the solid-state layer is detached from the donor substrate or a stress generation layer is generated or disposed at a surface, especially a planar surface, of the donor substrate in an inclined alignment relative to the circumferential surface and thermal stress on the stress generation layer generates mechanical stresses in the donor substrate, wherein the mechanical stresses give rise to a crack for removal of a solid-state layer that spreads proceeding from the surface of the donor substrate exposed by the removal of material along the modifications.

This solution is advantageous since an edge of the donor substrate in the region of which modifications for further development of the detachment region can be generated only with great difficulty can be removed or reduced or modified. This results in radial removal of material which reduces the distance of the circumferential surface from the detachment region.

Further preferred embodiments are subject matter of the subsidiary claims and/or other parts of the description that follow.

In a further preferred embodiment of the present invention, the detachment region defined by the modifications is spaced apart further from the circumferential surface of the donor substrate before the removal of material. This embodiment is advantageous since the detachment region is thus easy to generate and nevertheless preferably adjoins the outer circumferential surface of the donor substrate after the removal of material.

In a further preferred embodiment of the present invention, the modifications for defining the detachment region are generated prior to the removal of material, and the removal of material, at least in places, achieves a reduction in the separation of the detachment region to less than 10 mm, especially to less than 5 mm and preferably to less than 1 mm, or the modifications for defining the detachment region are generated after the removal of material, in which case the modifications are generated in such a way that the detachment region, at least in places, is spaced apart by less than 10 mm, especially less than 5 mm and preferably less than 1 mm from a surface exposed by the removal of material. More preferably, at least individual modifications of the detachment region are part of the at least partly and preferably completely circumferential surface of the donor substrate that has been exposed by the removal of material.

In a further preferred embodiment of the present invention, the material is removed by means of ablation beams, especially ablation laser beams, or ablation fluids, and the removal of material generates a depression with an asymmetric shape, or the removal of material is effected in circumferential direction at least in sections of the donor substrate in the entire region between the detachment region and a surface of the donor substrate homogeneously spaced apart from the detachment region as a reduction in the radial extent of the donor substrate.

The method of the invention preferably likewise comprises the step of generating at least one modification within the donor substrate by means of at least one laser beam, wherein the laser beam penetrates the donor substrate via a surface, especially a planar surface, of the donor substrate, wherein the laser beam is inclined relative to the planar surface of the donor substrate such that it enters the donor substrate at an angle other than 0° or 180° to the longitudinal axis of the donor substrate, wherein the laser beam is focused to generate the modification in the donor substrate. The solid-state layer or solid-state wafer preferably becomes detached from the donor substrate by virtue of the modifications generated, or a stress generation layer is generated or disposed on the planar surface of the donor substrate, and mechanical stresses are generated in the donor substrate by thermal stress from the stress generation layer. The mechanical stresses preferably give rise to a crack for removal of a solid-state layer that propagates along the modifications. Preferably, a first component of the laser beam penetrates into the donor substrate at a first angle to the planar surface of the donor substrate and at least one further component of the laser beam preferably penetrates into the donor substrate at a second angle to the planar surface of the donor substrate, wherein the magnitude of the first angle differs from the magnitude of the second angle, wherein the first component of the laser beam and the further component of the laser beam are preferably focused to generate the modification in the donor substrate.

Preferably, the donor wafer or donor substrate or the solid-state body and/or the laser device that emits the laser beams is rotated about an axis of rotation during the generation of the modifications. More preferably, additionally or alternatively to the rotation of the donor wafer, the distance of the laser beams from the center of the donor wafer is altered.

In a further preferred embodiment of the present invention, the entirety of the laser beams is aligned in the same orientation relative to the planar surface of the donor substrate for the generation of modifications in the region of the center of the donor substrate and for the generation of modifications in the region of an edge of the donor substrate that arises in radial direction.

This solution is advantageous since the entire cross section of the laser beam hits a planar surface on entry into the solid-state body since homogeneous damage then occurs at depth. This homogeneous damage can be generated at the outer edge of the donor substrate, especially that which extends orthogonally to the planar surface. Thus, the modifications around the edge region of the donor substrate and in the region of the center of the donor substrate can be generated by means of a processing step.

In a further preferred embodiment of the present invention, the first component of the laser beams penetrates into the donor substrate at a first angle to the surface of the donor substrate and the further component of the laser beams penetrates at a second angle for the generation of modifications in the region of the center of the donor substrate and for the generation of modifications in the region of an edge of the donor substrate that arises in radial direction, wherein the magnitude of the first angle is always different from the magnitude of the second angle. Preferably, the first angle and second angle are constant or unchanged or are not changed during the generation of the modifications.

The method of the invention preferably likewise comprises the step of removing donor substrate material proceeding from a surface that extends in circumferential direction of the donor substrate in the direction of the center of the donor substrate for generating a depression. The material is preferably removed by means of ablation laser beams and/or the depression is generated asymmetrically. It is possible here that the individual, the multiple, the majority or all of the modifications that generate or form the detachment plane or the detachment region are generated before or after the removal of material. It is thus also possible to generate a first proportion of the modifications before the removal of material and a further proportion of modifications after the removal of material. It is possible here that the modifications are generated with different laser parameters before the removal of material than after the removal of material. It is thus possible, after the removal of material, to generate modifications within the donor substrate by means of further laser beams, in which case the modifications are preferably positioned such that they adjoin the depression. The solid-state wafer or solid-state layer is preferably detached from the donor substrate by the modifications generated, or a stress generation layer is generated or arranged at a surface, especially a planar surface, at an inclined alignment relative to the circumferential surface. Preferably, thermal stress on the stress generation layer generates mechanical stresses in the donor substrate, wherein the mechanical stresses give rise to a crack for removal of a solid-state layer that propagates proceeding from the depression along the modifications.

The modifications here are preferably achieved with very short pulses in a very small vertical region by focusing in the material with high numerical aperture.

In the ablation, the ablation laser beams are focused on the surface of the material, with a lower numerical aperture and often a wavelength that is absorbed in a linear manner by the material. The linear absorption of the ablation laser beams at the material surface leads to evaporation of the material, the ablation, i.e. a removal of material, not just a change in structure.

This solution is advantageous since an edge region of the donor substrate is processed by means of a material-removing treatment, by means of which the outer edge of the donor substrate is moved in the direction of the center of the donor substrate in the region of the plane in which the crack propagates. The movement is preferably effected in the direction of the center to such an extent that, depending on the penetration depth of the laser beams and/or the angle of the laser beams relative to one another, all laser beams can penetrate into the donor substrate over the same planar surface.

Further preferred embodiments are subject matter of the subsidiary claims and/or of the parts of the description that follow.

In a further preferred embodiment of the present invention, the depression surrounds the donor substrate completely in circumferential direction. This embodiment is advantageous since the crack can be introduced into the donor substrate in a defined manner over the entire circumference of the donor substrate.

In a further preferred embodiment of the present invention, the depression runs in the direction of the center, narrowing toward an end of the depression, especially in the form of a wedge or notch, where the end of the depression lies in the plane in which the crack propagates. This embodiment is advantageous since the end of the depression will create a notch that defines the direction of propagation of the crack.

In a further preferred embodiment of the present invention, the asymmetric depression is generated by means of a grinding tool which is negatively shaped at least in sections relative to the depression. This embodiment is advantageous the grinding tool is producible in accordance with the edge or depression to be generated.

In a further preferred embodiment of the present invention, the grinding tool has at least two differently shaped working components, wherein a first working component is intended for working of the donor substrate in the region of the bottom side of a solid-state wafer to be separated and a second working component for working the donor substrate in the region of the top side of the solid-state wafer to be separated from the donor substrate. This embodiment is advantageous since, by means of the grinding tool, as well as reshaping operations to bring about improved crack progression, reshaping operations for better handling can likewise be brought about at the same time or with a time delay on the donor substrate or on the components of the donor substrate that form one or more solid-state wafer(s).

In a further preferred embodiment of the present invention, the first working component generates a deeper depression, or one of greater volume, in the donor substrate than the second working component, wherein the first working component and/or the second working component have curved or straight grinding faces. Preferably, the first working component has a curved main grinding face and the second working component likewise preferably has a curved secondary grinding face, wherein the radius of the main grinding face is greater than the radius of the secondary grinding face, the radius of the main grinding face preferably being at least twice as high as the radius of the secondary grinding face, or the first working component has a straight main grinding face and the second working component has a straight secondary grinding face, where the main grinding face removes more material from the donor substrate than the secondary grinding face, or the first working component has a straight main grinding face and the second working component has a curved secondary grinding face or the first working component has a curved main grinding face and the second working component has a straight secondary grinding face.

Preferably, the grinding tool has a multitude, especially more than 2, 3, 4, 5, 6, 7, 8, 9 or 10, of working components in order to work a corresponding multitude of components of the donor substrate that can be assigned to different solid-state wafers in a machining or material-removing manner.

In a further preferred embodiment of the present invention, the ablation laser beams are generated with a wavelength in the range between 300 nm (UV ablation with frequency-tripled Nd:YAG or other solid-state laser) and 10 µm (CO2 gas laser, often used for gravure and cutting processes), with a pulse duration of less than 100 microseconds and preferably of less than 1 microsecond and more preferably of less than 1/10 microsecond, and with a pulse energy of more than 1 µJ and preferably of more than 10 µJ. This embodiment is advantageous since the depression can be generated by means of a laser device and not by means of a grinding tool which is subject to wear.

The modifications in the donor substrate are generated in a material-dependent manner preferably with the configurations or laser parameters cited below: If the donor substrate consists of silicon or the donor substrate includes silicon, preference is given to using nanosecond pulses or shorter (<500 ns), a pulse energy in the microjoule range (<100 µJ) and a wavelength of >1000 nm.

For all other materials and material combinations, preference is given to using pulses <5 picoseconds, pulse energies in the microjoule range (<100 µJ) and wavelengths variable between 300 nm and 2500 nm.

Particular preference is given here to providing a large aperture in order to get deep into the material or the solid-state body. The aperture for generation of the modifications within the donor substrate is thus preferably larger than the aperture for ablation of material by means of the ablation laser beams for generating the depression. The aperture is preferably at least multiple times larger, especially at least 2, 3, 4, 5 or 6 times larger, than the aperture for ablation of material by means of the ablation laser beams for generating the depression. The focus size for generating a modification, especially with regard to its diameter, is preferably less than 10 µm, preferably less than 5 µm and more preferably less than 3 µm.

The method of the invention preferably likewise comprises one or more of the following steps: providing the donor substrate or providing a donor substrate (or solid-state body) having crystal lattice planes inclined relative to a planar main surface. The main surface of the donor substrate is preferably bounded firstly in the longitudinal direction of the donor substrate, wherein a crystal lattice plane normal is inclined in a first direction relative to a main surface normal. Providing at least one laser. Introducing laser radiation from the laser into the interior of the solid-state body preferably via the main surface to change the material properties of the solid-state body in the region of at least one laser focus. The laser focus is preferably formed by laser beams from the laser emitted by the laser. The change in the material property by changing the site of penetration of the laser radiation into the donor substrate forms a linear design. The changes in the material property are preferably generated in a generation plane that preferably runs parallel to the main surface. The linear design preferably runs in a rectilinear or curved manner at least in sections. The crystal lattice planes of the donor substrate are preferably in an inclined alignment relative to the generation plane. The linear design, especially at least the section that extends in a rectilinear manner or the section that extends in a curved manner, is inclined relative to a (straight) cutting line that arises at the point of intersection between the generation plane and the crystal lattice plane, as a result of which the changed material property tears the donor substrate in the form of subcritical cracks. Preferably, the step of removing the solid-state layer by introducing an external force into the donor substrate to connect the subcritical cracks is effected or so much material in the generation plane is changed by means of the laser radiation that the solid-state layer becomes detached from the donor substrate with connection of the subcritical cracks. The main surface here is preferably regarded/defined as an ideally planar surface.

This method is advantageous in that the linear design is inclined relative to a (straight) cutting line that arises at the interface between the generation plane and the crystal lattice plane and limits crack growth perpendicular to writing direction. The modifications for each writing line are thus not generated in the same crystal lattice planes. For example, the first 1-5% of the modifications for each writing line can thus intersect with just a fraction, especially less than 75% or less than 50% or less than 25% or less than 10% or no crystal lattice planes, of the last 1-5% of the modifications of the same writing line. The writing line here preferably has a length of more than 1 cm or more than 10 cm or more than 20 cm or up to 20 cm or up to 30 cm or up to 40 cm or up to 50 cm. Thus, for each writing line, significantly fewer modifications will be produced in the same crystal lattice planes, thereby limiting crack propagation along these crystal lattice planes. What is meant here by "inclined" is not parallel or not overlapping and thus, for example, may be the case even from an angle of 0.05°, but it is also possible at very small angles, especially below 1°, for crystal lattice planes, especially slip planes, that vary over the length of extension of the linear design to be cut or modified or changed locally by the modification or modifications.

This leads to a significant second advantage of the present invention, namely that the writing direction does not necessarily have to be performed in such a way that the further cracks generated must overlap the cracks generated last. It is now also possible for the writing direction to be in the opposite direction. This is because, owing to the possible shortness of the cracks via the method of the invention, there is no shading by the cracks made last. In spite of the opposite writing direction, this makes it possible to achieve, for example, line spacings of less than 100 µm, especially less than 75 µm or less than 50 µm or less than 30 µm or less than 20 µm or less than 10 µm or less than 5 µm or less than 2 µm.

A change in the material property may preferably be understood here to mean the generation of a material modification or the generation of a crystal lattice defect, especially the accomplishment of a locally limited phase change.

In a first preferred embodiment of the present invention, the linear design or writing line is inclined relative to the cutting line in an angle range between 0.05° and 87°, especially in an angle range between 3° or 5° and 60° and preferably between 10° and 50°, especially between 10° and 30°, such as between 12° and 20° or between 13° and 15°, or between 20° and 50°, especially between 25° and 40° or between 30° and 45° or between 28° and 35°. This solution is advantageous since the inclination is so great that a sufficient number of different crystal lattice planes are part of every further modification of the same linear design or writing line.

In a further preferred embodiment of the present invention, a sufficient amount of material of the donor substrate is changed to form a linear design or multiple linear designs that the ends of the individual crystal lattice planes that are exposed as a result of the solid-state layer removal and the changes in the material result in Moiré patterns, for which purpose a multitude of material change regions that extend in a linear and preferably rectilinear manner and are aligned parallel to one another are generated.

A linear design should preferably be regarded here as a group of dots that forms a straight or curved line. The distances between the centers of the individual dots are preferably less than 250 µm, especially less than 150 µm or less than 50 µm or less than 15 µm or less than 10 µm or less than 5 µm or less than 2 µm apart.

Preferably, multiple linear designs are generated in the same generation plane; preferably, at least a plurality of the linear designs are arranged at the same distance from one another. Preferably, the linear designs may be in the form of an arc, especially a circular arc, or in straight form.

In a further preferred embodiment of the present invention, multiple first linear designs are generated, wherein each linear design generates a subcritical crack or multiple subcritical cracks, wherein the subcritical cracks of the first linear designs are spaced apart at a defined distance Al, wherein the distance Al is sufficiently great that the subcritical cracks do not overlap in axial direction of the donor substrate, and are especially spaced apart by at least or up to 2 µm or at least or up to 5 µm or at least or up to 10 µm or at least or up to 20 µm or at least or up to 30 µm or at least or up to 50 µm or at least or up to 75 µm or at least or up to 100 µm, and, after the generation of the first linear designs, at least one further linear design in each case is generated by means of laser beams, especially by changing the material properties, at least between two first linear designs and preferably between more than two first linear designs. In microscopic view, any modification or any accumulation of modifications preferably results in tearing of the surrounding donor substrate material, especially in the direction in which the slip plane of the crystal extends. Over the longitudinal extent of a linear design, it is thus possible to trigger a multitude of subcritical cracks. The multitude of subcritical cracks each in linear form is preferably joined together or can be joined together by an external force and hence forms a subcritical main crack, in each case in linear form.

In a further preferred embodiment of the present invention, the donor substrate has a hexagonal crystal lattice with wurtzite structure or corundum structure, wherein the linear design is generated at a predetermined angle between 15° and 60°, especially in the wurtzite structure at an angle between 25° and 35° and preferably at an angle of 30° and in the corundum structure between 10° and 60° and preferably at an angle of 45°, relative to the cutting line or the donor substrate has a cubic crystal lattice, wherein the linear design is generated at a predetermined angle between 7.5° and 60°, especially in a monoclinic cubic structure at an angle between 17.5° and 27.5° and preferably at an angle of 22.5°, or in yttrium aluminum garnet between 8° and 37° and preferably at an angle of 22.5°, relative to the cutting line, or the donor substrate has a triclinic crystal lattice structure, wherein the linear design is generated at a predetermined angle of 5° to 50°, especially between 10° and 45° or at 10° or at 45°, relative to the cutting line, or the donor substrate has a zincblende crystal structure, wherein the linear design is generated at a predetermined angle between 15° and 60°, especially in gallium arsenide at a predetermined angle between 18° and 27° and preferably at an angle of 22.5° or in indium phosphide between 18 and 27° and preferably at an angle of 22.5°, relative to the cutting line.

In a further preferred embodiment of the present invention, multiple donor substrates, during the change in the material property, are simultaneously disposed alongside one another on a rotating device, especially a turntable, and are rotatable about a common axis of rotation. The speed of rotation is greater than 10 revolutions/minute and preferably greater than 50 revolutions/minute, and more preferably greater than 150 revolutions/minute, especially up to 600 revolutions/minute. The linear design here is preferably curved. The angle at which the curved linear design is inclined relative to the cutting line that arises at the point of intersection between the generation plane and the crystal lattice plane should preferably be regarded here as an average angle; more preferably, an average angle is defined/used only in the case of production of a curved linear design. The average angle is based here preferably exclusively on the middle 80% of the length over which the respective curved linear design extends, meaning that the inclination or angles of the first 10% and the inclination or angles of the last 10% of the length of extension are preferably not take into account here for the determination of the average angle. Preferably, for every relevant modification of the curved linear design, the inclination or angle relative to the cutting line is determined, added up and divided by the number of angle values added up.

In a further preferred embodiment of the present invention, a beamforming device is provided to change the properties of the incident laser radiation, especially a device for changing the polarization of the laser beams, especially in the form of a rotating half-wave plate or a Pockels cell, and/or the beamforming device is preferably set up for circular or elliptical polarization of the laser radiation, wherein the donor substrate is exposed to the circularly or elliptically polarized laser radiation, especially in the form of quarter-wave plates.

In a further preferred embodiment of the present invention, a beamforming device is provided for changing the properties of the incident laser beams. These properties of the laser beams are especially the polarization properties of the laser beams, the three-dimensional profile of the laser beams before and after the focusing, and the phase distribution of the individual wavelengths of the incident laser beams in space and time, which can be influenced by the wavelength-dependent dispersion in individual elements of the beam pathway such as the focusing optics.

For this purpose, the beamforming device may be equipped, for example, with a rotating half-wave plate or similar birefringent elements for changing the polarization of laser beams passing through. In this way, the polarization of the incident laser beams can be altered as a function of the speed of rotation of the receiving component. In addition, it is thus also possible to alter the polarization direction at a particular angle to crystal directions of the solid-state body in the receiving component. This can also be effected, for example, by means of an element similar to a Pockels cell in the beamforming device, additionally or alternatively to the half-wave plate. In the case of such elements, an external electrical field results in field-dependent birefringence in the material, called the Pockels effect or linear electrooptical effect, which can be used to change the polarization of laser beams depending on the electrical voltage applied. This solution offers the advantage that they have faster switching times compared to a rotating plate and hence can be better synchronized with the movement of the table or solid-state body.

Alternatively, the beamforming device may also be configured such that the laser beams are circular-polarized before the exposure of the solid-state body. Laser radiation is usually linear-polarized, but can be transformed to circular-polarized light by birefringent optical elements such as quarter-wave plates. Circular-polarized light, by contrast, is transformed back to linear-polarized light by just such an element. It is also possible here to use a mixed form or combination of circular- and linear-polarized laser radiation, called elliptically polarized laser radiation.

In principle, this provides a solution to the problem that, in the case of multiphoton absorption, the cross section of action depends very significantly on the crystal direction or angle between the direction of polarization of the light and the crystal orientation since, as the solid-state body rotates, the crystal direction would change constantly in relation to the laser beam, this can be remedied by synchronized rotation of the laser polarization or circularly or elliptically polarized light, and the cross section of action for the multiphoton absorption can be kept constant.

In addition, the beamforming device may be such that it changes the spatial profile of the laser beams before focusing or at the focal point. This can be achieved in just one spatial direction by simple elements such as a slit or telescope. Such a telescope may be achieved, for example, from a combination of a cylindrical lens with a divergent cylindrical lens, the relative focal lengths of which then define the change in laser beam size in one spatial direction. The telescope may alternatively consist of multiple elements in order to prevent crossing of the laser beams. Depending on the spatial beam profile of the laser beams prior to focusing, the shape of the focus on exposure of the solid-state body may likewise be altered and chosen advantageously. For that purpose, the beamforming device may additionally be such that the shape of the laser beam focus can be changed depending on the speed of rotation of the receiving component or else the orientation of the solid-state body. For example, on exposure of the solid-state body in a region of the solid-state body relatively close to the axis of rotation, an adjusted spatial profile at the focal point may be generated by the beamforming device, for example a laser beam profile that narrows in the outward direction.

Numerous materials, especially transparent materials such as glasses and crystals, feature a wavelength-dependent refractive index. Laser beams in pulse form, especially those in the femtosecond range, consist of a spectrum of wavelengths that can experience different refractive indices in a beamforming unit or an optical system for focusing prior to the exposure of the solid-state body. The effect of this dispersion is that femtosecond laser pulses become longer, lowering their peak intensity, which is undesirable for the use of multiphoton processes. The beamforming unit may accordingly be such that it compensates for the dispersion of other optical elements in the beam pathway before or after the focusing. This dispersion can act either as a chromatic aberration in space or as a pulse extension or pulse compression in time. More particularly, the dispersion can also be altered and utilized by means of the beamforming unit in such a way as to give rise to a predefined color distribution of the wavelengths present in the laser pulse at the focal point.

Standard means of compensating for and introducing artificial phase distributions into laser pulses, for example in order to compensate for dispersion, are combinations of prisms or diffraction gratings, what are called spatial light modulators (SLMs) that are based on liquid crystals, or chirped mirrors that have a specific sequence of dielectric layers of different refractive indices. A spatial light modulator (SLM) may be used in order, after the laser beam has been expanded, to impart different phases to individual regions of the laser beam—individual pixels of the SLM that are illuminated by the laser beam. These phase differences lead to an altered intensity distribution of the laser radiation in the focus of the processing optics or of the lens. This altered intensity distribution can lead to formation of multiple foci and replace a diffractive optical element, but it can also alter the beam profile—the intensity distribution—of the laser in multiple dimensions and hence generate, for example, oval shapes or else intensity distributions differing from a Gaussian form, for example a "top hat" profile with a broad range of equal intensity in the center of the laser beam intensity profile. More particularly, a decrease in the z extent of the beam profile can achieve a reduction in the laser damage region.

This solution, especially for compensation of dispersion, is advantageous since it compensates for the problem that dispersions occur to an enhanced degree in the case of passage of short pulses (e.g. less than 100 fs), meaning that the pulse dissipates since some light components are faster than others. The pulse would otherwise become longer, which would lower its peak intensity, which is undesirable in the case of use of multiphoton processes.

In a further preferred embodiment of the present invention, the main surface is part of the solid-state layer after the removal of the solid-state layer and, after the removal, preferably has a lower thickness than the remaining residual donor substrate. This embodiment is advantageous since the remaining donor substrate can be processed and used as solid-state layer or for removal of a further solid-state layer.

In a further preferred embodiment of the present invention, the method additionally includes the step of moving the donor substrate relative to the laser. For defined focusing of the laser radiation and/or for adjustment of the laser energy, the laser is preferably adjusted continuously here as a function of at least one parameter and preferably a multitude of parameters, especially at least two parameters. Thus, preference is given here to a position-dependent laser power adjustment for adaptation to inhomogeneities in the samples or in the solid-state body or the substrate.

According to the production method, for example, doping inhomogeneities occur in the solid-state body, which can advantageously be compensated for by the solution mentioned. Example: silicon carbide (SiC) is prepared in gas phase deposition by blowing in dopant gas (N2), forming a dopant spot clearly visible to the eye. These inhomogeneities frequently require different laser parameters for successful laser modification (sufficient damage more preferably without induction of cracks) than the average laser parameters for workpieces/samples otherwise assumed to be homogeneous. For the multitude of samples, the process parameters are robust (i.e. sufficiently large process window) in order to successfully modify samples that are homogeneous on average with moderate laser parameters. For larger local deviations of material properties, it is necessary to use locally adjusted laser parameters. Thus, inline adjustments or adjustments with prior knowledge are conceivable.

This solution is advantageous since some materials (e.g. SiC) have differences in local refractive index and other material properties (for example absorption, transmission, scatter) that can be balanced or compensated for by means of a position-dependent adjustment of laser exposure. This purpose is preferably served by individual or multiple material properties among the following: absorption, transmission, scatter, refractive index, etc., each as possible parameters. What is meant here by "position-dependent" is that there is relative movement of the solid-state body to be treated with respect to the laser exposure device. It is thus conceivable here that the laser exposure device and/or the solid-state body is moved. The at least one parameter is preferably detected prior to the exposure of the solid-state body to the laser beams in the course of an analysis step. The change in the parameter via the surface area of incidence and/or via the volume of the solid-state body exposed is preferably stored as data in retrievable form in the form of property profile data and is more preferably used to actuate the laser exposure device for position-dependent laser exposure of the solid-state body. It is additionally conceivable that a movement device on which the solid-state body is disposed, especially an X/Y table or a rotary table, is actuated or operated as a function of the property profile data. It is alternatively conceivable that the property profile data are generated and evaluated in real-time, i.e. used directly for actuating the laser exposure device and/or the movement device.

Inline minor adjustments are thus preferably based on changes that can be detected in real time (with advance sensor movement before processing position). Contactless single-sided (i.e. reflective rather than transmissive) measurement methods are particularly suitable, for example spectral reflection. For adjustments with prior knowledge, a laser system that reads a map with correction factors K(x,y) as prior knowledge prior to the processing and with the aid of which laser parameters are set locally (x,y) is preferably required. In the case of fixing, the samples are preferably provided preferably on the movement device, especially the chuck/carrier, preferably with exact orientation, such that this prior knowledge can be registered in the machine with the chuck/carrier. Suitable methods of adjusting the local energy density include, for example, power readjustment, adjusted writing patterns (different perforation density) or multiple passes with different writing patterns.

In a further preferred embodiment, an additional or alternative parameter is the degree of doping of the solid-state material, which is preferably determined by the analysis of back-scattered light (preferably Raman scatter), wherein the back-scattered light has a different wavelength for a different wavelength range than the defined incident light for triggering of the back-scatter, wherein a Raman instrument is preferably part of the apparatus and the degree of doping is preferably determined by means of the Raman instrument, wherein one or more or all of these parameters are preferably detected, especially simultaneously, by means of a common detection head. Raman spectroscopy is preferably likewise used in the case of glasses, sapphire, aluminum oxide ceramic. The Raman method is advantageous since it measures in the depth of the material, but only from one side, does not require high transmission and gives the charge carrier density/doping, which can be correlated to the laser parameters, by a fit to the Raman spectrum.

An additional alternative parameter, in a further preferred embodiment of the present invention, is the degree of doping of the solid-state body at a predetermined site or in a predetermined area, especially in the interior, of the solid-state body, especially spaced apart from the solid-state body surface. Preferably, the degree of doping is linked to location information in such a way as to give rise to a treatment map or to provide location-resolved treatment instructions that define(s) the laser parameters, especially laser focus and always energy, and/or further machine parameters, especially the advance rate, in a location-dependent manner.

In a further preferred embodiment of the present invention, the degree of doping is determined by the analysis of back-scattered light with inelastic scatter (Raman scatter), wherein the back-scattered light has a different wavelength or different wavelength range than the defined incident light used to trigger the back-scatter, wherein the back-scattered light is back-scattered from the predefined site or from the predetermined area.

This embodiment is advantageous since, in the laser method, especially on SiC (but also other materials), the process has to be run in a location-adapted manner (e.g. different laser energy, etc.). It has been recognized in accordance with the invention that, for example, in the case of SiC, the doping in particular is crucial for this purpose, since this alters the transparency of the material to the processing wavelength and necessitates higher laser energies.

In a further preferred embodiment of the present invention, the degree of doping is determined by means of ellipsometry measurement (e.g. Müller matrix ellipsometry with backside reflection). Ellipsometry measurement is preferably based on optical transmission of the material.

In a further preferred embodiment of the present invention, the degree of doping is determined by means of a purely optically calibrated transmission measurement, where the calibration is brought about by means of Hall measurement and 4-point measurement. This method can likewise ascertain the doping/number of free charge carriers in the material, which then allows the laser energy required for the process to be ascertained.

In a further preferred embodiment of the present invention, the degree of doping is determined by means of an eddy current measurement, preferably by determining and evaluating conductivity differences in the solid-state material.

In the case of eddy current measurements or in the case of use of eddy current sensors or in eddy current measurement technology, preference is given to utilizing a transmitting and receiving coil in order to detect local conductivity differences. In the transmitting coil, a high-frequency electromagnetic primary alternating field is generated. Eddy currents (locally flowing currents) are then induced in the conductive material, and these in turn cause a secondary electromagnetic alternating field in the opposite direction. The overlap of these fields can be measured, separated and evaluated. It is thus possible to measure different quality features (layer thickness, the sheet resistance, the material homogeneity) of mainly thin conductive layers, but also of bulk material. In transmission arrangement (test specimen between transmitting coil and receiving coil), optimal resolutions are achieved, but the arrangement of both coils on one side of the sample for reflection measurements is also possible. By appropriate design of the coils and choice of frequency, it is possible to utilize different penetration depths and sensitivities.

In principle, there is a multitude of test methods by which the doping can be measured in principle. What is important here is a rapid, contactless, nondestructive method.

A first parameter here is the average refractive index of the material of the donor substrate or the refractive index of the material of the donor substrate in the region of the donor substrate that has to be traversed by laser radiation to generate a defined material change and a second or alternative first parameter here may be the processing depth in the region of the donor substrate that has to be traversed by laser radiation to generate a defined material change. The first parameter is preferably determined by a means of determining refractive index, especially by means of spectral reflection, and/or the second parameter is preferably determined by a means of determining topography, especially by means of a confocal-chromatic distance sensor.

In a further preferred embodiment of the present invention, a first parameter is the average refractive index of the material of the solid-state body or the refractive index of the material of the solid-state body in the region of the solid-state body that has to be traversed by laser beams to generate a defined modification, or the transmission of the solid-state body at defined points in the solid-state body and preferably for a defined solid-state body depth. A second or alternative first parameter, in a further preferred embodiment of the present invention, is the processing depth in the region of the solid-state body that has to be traversed by laser beams to generate a defined modification. In a further preferred embodiment of the present invention, the first parameter is determined by a means of determining refractive index, especially by means of spectral reflection, and/or the second parameter is determined by a means of determining topography, especially by means of a confocal-chromatic distance sensor.

In a further preferred embodiment of the present invention, data for the parameters, especially for the first parameter and for the second parameter, are provided in a data storage device and sent to a control device at least prior to the generation of the material change, wherein the control device adjusts the laser depending on the particular location of the material change to be generated, wherein the control device for adjustment of the laser preferably likewise processes distance data to give a distance parameter, wherein the distance parameter gives the distance of the respective location at which laser radiation is introduced into the donor substrate at the time of material change to generate the material change from the laser, wherein the distance data are collected by means of a sensor device.

Data for the parameters, especially for the first parameter and for the second parameter, in a further preferred embodiment of the present invention, are provided in a data storage device and sent to a control device at least prior to the generation of the modifications, wherein the control device adjusts the laser exposure device as a function of the respective site of the modification to be generated.

In a further preferred embodiment of the present invention, the number of modifications may vary as a function of the distance from the edge or from the center and/or for each writing line or each linear design. It is possible, for example, in radial direction, to generate more or fewer modifications in the region of the center of the solid-state body than in an edge region. The edge region is preferably understood to mean a circumferential region that preferably extends up to 0.1 mm or 0.5 mm or 1 mm or 5 mm or 10 mm or 20 mm in radial direction toward the center. Preferably, an accumulation of modifications is generated in the edge region at at least one point or at multiple points, especially in homogeneous or heterogeneous distribution, wherein the accumulation of modifications by more modifications than the immediately surrounding proportions of the solid-state body, especially at a radial distance of up to 0.1 mm or 0.5 mm or 1 mm or 2 mm or 3 mm or 5 mm or 10 mm or 20 mm or 30 mm or 40 mm from the edge or from the center of the accumulation, or proportions spaced apart from the edge of the accumulation have fewer modifications. This accumulation may be used, for example, to generate additional local stresses in order to trigger the crack. Additionally or alternatively, by means of a triggering unit, especially by mechanical contact or sound exposure, especially ultrasound exposure, or an energy input, especially by means of a laser or microwave or heating, an increase in stress can be brought about to trigger a crack, especially a main crack.

In a further preferred embodiment of the present invention, the solid-state body is connected to a cooling device via a solid-state surface, especially during the laser exposure or laser treatment or generation of modifications, wherein the solid-state surface connected to the cooling device is formed parallel or essentially parallel to the surface via which the laser beams penetrate into the solid-state body, wherein the cooling device is operated depending on the laser exposure, especially depending on the temperature change of the solid-state body that results from the laser exposure. More preferably, the surface via which the solid-state body is connected to the cooling device is exactly opposite the surface via which the laser beams penetrate into the solid-state body. This embodiment is advantageous since an increase in temperature of the solid-state body on generation of the modifications can be limited or reduced. The cooling device is preferably operated in such a way that the heat input introduced into the solid-state body by the laser beams is withdrawn from the solid-state body by the cooling device. This is advantageous since this can significantly reduce the occurrence of thermally induced stresses or deformations. This cooling device is thus preferably a cooling device for leading off or removing heat introduced into the solid-state body by means of the laser beams during the generation of modifications.

In a further preferred embodiment of the present invention, the cooling device has at least one sensor device for detecting the temperature of the solid-state body and brings about cooling of the solid-state body as a function of a defined temperature profile. This embodiment is advantageous since the sensor device can very precisely detect a change in temperature of the solid-state body. Preference is given to using the change in temperature as a data input for actuating the cooling device.

In a further preferred embodiment of the present invention, the cooling device is coupled to a rotation device and the cooling device is rotated by means of the rotation device during the generation of modifications together with the solid-state body disposed thereon, especially at more than 100 revolutions per minute or at more than 200 revolutions per minute or at more than 500 revolutions.

In a further preferred embodiment of the present invention, the laser beam energy from the laser, especially fs laser (femtosecond laser) or ps laser (picosecond laser) or ns (nanosecond laser), is chosen such that the physical transition in the solid-state body or in the crystal, in at least one direction, is less or greater than 30 times, or 20 times or 10 times or 9 times or 8 or 7 times or 6 times or 5 times or 4 times or three times the Rayleigh length.

In a further preferred embodiment of the present invention, the beam quality $M^2$ is <1.6.

In a further preferred embodiment of the present invention, the wavelength of the laser beam from the laser, especially the fs laser or ps laser or ns laser, is chosen such that the linear absorption of the solid-state body or the material is less than 10 cm$^{-1}$ and preferably less than 1 cm$^{-1}$ and more preferably less than 0.1 cm$^{-1}$.

In a further preferred embodiment of the present invention, prior to the generation of the modifications or defects, an immersion fluid is applied to the exposed surface of the solid-state body. To generate the modifications, the workpiece or solid-state body is then preferably exposed through the immersion fluid. In a further preferred embodiment of the present invention, the refractive index of the immersion fluid preferably corresponds at least essentially or corresponds or corresponds exactly to the refractive index of the solid-state body. This solution is advantageous since the use of an immersion fluid, especially an oil or water, compensates for the roughness of the surface of the solid-state body that arises on splitting or another surface treatment. It is thus possible through the use of the immersion fluid, especially without any polishing of the exposed surface which is generally customary prior to the generation of defects and after a first splitting-off of a solid-state layer, to very exactly introduce defects or modifications, especially by means of laser beams, in the solid-state body.

In a further preferred embodiment of the present invention, the immersion fluid is preferably applied in such an amount on the exposed surface that it wets at least more than half and preferably the entirety of the exposed surface.

In a further preferred embodiment of the present invention, the immersion fluid is covered with a cover plate in such a way that the refractive index is the same between the crack progression layer to be generated and the cover plate, and there is especially no occurrence of any inclusions of air between the exposed surface and the cover plate.

In a further preferred embodiment of the present invention, the cover plate has a surface roughness lower than the surface roughness of the exposed surface at least on the side remote from the exposed surface of the solid-state body.

In a further preferred embodiment of the present invention, the immersion fluid is applied to the exposed surface as droplets and the droplet is contacted with the modification generation apparatus or a portion of the laser apparatus, especially an optical element, in such a way that relative motion between the solid-state body and the modification generation apparatus brings about a repositioning of the droplet. Alternatively, the solid-state body can be disposed in a tank and the immersion fluid surrounds or flows around the solid-state body partly and preferably completely; in particular, the immersion fluid forms a layer or liquid layer that completely surrounds the exposed surface.

In a further preferred embodiment of the present invention, the modifications, or the modifications generated by means of the laser beams, define at least one crack progression layer or detachment plane or detachment region within the solid-state body, wherein the crack progression layer describes at least a three-dimensional outline. As a result of the application/generation/introduction of external force, crack propagation is brought about within the workpiece or solid-state body. The crack propagation preferably results in removal of a three-dimensional solid-state layer or a three-dimensional solid-state body from the solid-state body along the crack progression layer. At least or exactly one surface of the solid-state layer or of the solid-state body corresponds here to the three-dimensional outline of the crack progression layer or to the outline described by the detachment region. It is thus possible by the present invention to remove or detach not just a planar solid-state layer from a workpiece or solid-state body, but likewise a non-planar solid-state body or a non-planar solid-state layer as a result of a fracture or a crack progression.

In a preferred embodiment of the present invention, the shape of the crack progression layer thus has, at least in sections, the outline of a three-dimensional object, especially of a lens or of a parallelepiped.

In a further preferred embodiment of the present invention, a defect generation apparatus or modification generation apparatus, especially an ion cannon or a laser, is used to generate the defects or modifications.

In a further preferred embodiment of the present invention, the application or generation of the receiving layer on the exposed surface of the solid-state body precedes the generation of the modifications, wherein the receiving layer has at least one locally varying property, wherein the modifications are generated by laser beams from a laser, wherein the laser beams are influenced by the receiving where in such a way that the modifications are generated as a function of the at least one locally varying property. In this embodiment, the laser beams are thus preferably guided directly through the receiving layer. Given suitable choice of the receiving layer, the crack progression layer that describes at least a three-dimensional outline can be generated in such a way that the receiving layer, especially in film form, is first produced as desired in a 3D mold or with a 3D structure (e.g. injection molding). The receiving layer preferably consists of a polymer, especially an elastomer or multiple elastomers, that are preferably optically stable, for example some representatives of the silicones. The effect of the receiving layer applied, especially bonded, to the solid-state body, in the generation of defects or generation of modifications, i.e. in the laser exposure, by virtue of their 3D structure or 3D shape, is that the optical pathway of the laser is altered in a suitable manner such that the desired defects or modifications that form the crack progression layer are generated. The locally varying property of the receiving layer is preferably the thickness of the receiving layer.

In a further preferred embodiment of the present invention, the method of the invention may additionally or alternatively include the step of modifying the crystal lattice of the solid-state body by a modifying means. Preference is given here to generating multiple modifications to form a nonplanar, especially curved, detachment region within the solid-state body. The modifications are preferably generated here as a function of defined parameters. The defined parameters preferably describe a correlation between a deformation of the solid-state component depending on a defined further treatment of the solid-state component.

This solution is advantageous since the solid-state component is preferably generated in such a way that it takes on the desired shape as a result of the later processing. Thus, as a function of the material properties of the solid-state component and of the coating, the solid-state component is generated with a shape that exploits the deformation resulting from the coating, in order to create a surface of the multilayer arrangement that is preferably planar or essentially planar at least on one side and preferably on both sides.

The object may additionally or alternatively be achieved by a process for producing a multilayer arrangement. The method of producing the multilayer arrangement preferably comprises one, individual or multiple or all of the following steps: providing a wafer, especially a curved wafer, having a first nonplanar shape; disposing or generating a further layer on at least one surface of the wafer; wherein the further layer and the wafer have different coefficients of thermal expansion, wherein the further layer is disposed or generated on the surface of the wafer at a coating temperature different than a target temperature, and wherein the further layer is configured such that it impinges on the wafer on attainment of the target temperature in such a way that the wafer is deformed from the first nonplanar shape to a second shape that differs from the first shape, wherein the second shape is preferably a planar shape. Preferably, the nonplanar solid-state body has a warp or forms a warp which is negative or essentially negative with respect to the deformation of the solid-state component brought about by the coating.

This solution is advantageous since the defined configuration of the wafer advantageously exploits the deformation that occurs as a result of the coating in order to obtain a multilayer arrangement which is preferably planar preferably at least on one side. More preferably, the further layer is generated by means of epitaxy.

It is additionally conceivable that the wafer has already been provided with a coating prior to the disposing or generation of the further layer.

Furthermore, the present invention may additionally or alternatively relate to a nonplanar solid-state component, especially to a nonplanar, especially curved, wafer. The nonplanar, especially curved, solid-state component has preferably been produced by a method presented herein. Preferably, the method comprises one, individual or multiple or all of the following steps:

providing a solid-state body for removal of the nonplanar solid-state component, modifying the crystal lattice of the solid-state body by means of a modifying means, especially a laser, especially a pico- or femtosecond laser, generating multiple modifications to form a nonplanar detachment region in the crystal lattice. The modifications are preferably generated as a function of defined parameters. The defined parameters preferably describe a correlation between a deformation of the nonplanar solid-state layer or of the nonplanar solid-state body removed or to be removed or of the solid-state component or of the nonplanar solid-state component as a function of a defined further treatment of the nonplanar solid-state layer or of the nonplanar solid-state body removed or to be removed or of the solid-state component or of the nonplanar solid-state component. This is then followed indirectly or directly, especially after one or more treatment steps, especially material-mounting or -applying steps, especially one or more epitaxy steps and/or one or more ion implantation steps and/or one or more etching steps, by the step of detaching the solid-state component from the solid-state body.

As a result of division of the solid-state body into a first solid-state body which preferably has the surface via which the laser beams have been introduced into the solid-state body and/or which has a metal layer or a stabilization layer and/or electrical components and into a second solid-state body or solid-state component, the second solid-state body or solid-state component is preferably processed. The second solid-state body or solid-state component is preferably processed in such a way that electrical components and/or metallic structures and/or epitaxial layer(s) can be generated or disposed or formed thereon. The second solid-state body or solid-state component preferably undergoes a surface treatment comprising grinding, an edge process for processing the solid-state body edges or wafer edges, especially for forming the solid-state body edges or wafer edges, and/or a chemical-mechanical polishing process. Then one or more layers, especially metal layers, are disposed or formed and/or electrical components are disposed or generated on the processed wafer or solid-state body in one or more further steps.

In a further preferred embodiment of the present invention, the method of the invention additionally or alternatively comprises the step of providing a solid-state body, especially a thick wafer, for detachment of at least one solid-state layer, especially a thin wafer, of generating a first group of defects or modifications by means of a laser or by means of laser beams for defining a first plane of detachment along which the solid-state layer is separated from the solid-state body.

In a further preferred embodiment of the present invention, the method of the invention additionally or alternatively comprises the step of generating further modifications or generating a second group of modifications by means of the laser or of the laser beams for defining at least one second or further detachment plane. The first detachment plane and the second detachment plane are preferably in an inclined, preferably orthogonal, alignment to one another. The solid-state layer is preferably detached from the remaining solid-state body along the first detachment plane as a result of the exposure to stress or introduction of an external force. The solid-state layer removed, especially without or with further layers or structures, especially electrical components, disposed thereon, is divided along the second detachment plane to individualize solid-state elements in a further step, especially a downstream step.

This method is advantageous since the generation of modifications in multiple mutually orthogonal planes without significant loss of material brings about defined weakening of the solid-state structure or the solid-state layer structure, which advantageously defines intended breakage sites along which a crack induced by means of stresses can be conducted.

In a preferred embodiment of the present invention, at least a third group or yet a further group of defects or modifications is generated by means of the laser or laser beams to define at least one and preferably more than one third plane of detachment. Preferably, every third plane of detachment is aligned orthogonally to the first plane of detachment and orthogonally to the second or to a second plane of detachment. After the removal, the solid-state layer is preferably divided or separated along the second detachment plane and along the third detachment plane to individualize the solid-state elements. Preferably, multiple third detachment planes are generated, which, in interplay with multiple second detachment planes, form a pattern preferably in the form of a grid that delimits the individual solid-state elements that form, or form part of, the solid-state body from one another. This embodiment is advantageous since the pattern in grid form constitutes an intended breakage site in grid form, along which the multitude of individual solid-state elements can be separated from one another in a simple and defined manner. It is possible here that the second detachment planes always have the same separation from one another or have different separations in sections or in full. It is possible here that the third detachment planes always have the same separation from one another or have different separations in sections or in full. Preferably, however, the second detachment planes always have the same separation from one another and preferably the third detachment planes always have the same separation from one another. Preferably, the separation between the second detachment planes is greater than or identical to the separation between the third detachment planes.

In a further preferred embodiment of the present invention, the stresses for detachment of the solid-state layer are generated from the solid-state body by the thermal stress on at least one receiving layer disposed on the solid-state body, especially a polymer layer. The thermal stress is preferably cooling of the receiving layer or polymer layer to or below ambient temperature and preferably below 10° C. and more preferably below 0° C. and further preferably below −10° C. The cooling of the polymer layer is most preferably effected in such a way that at least some of the polymer layer, preferably consisting of PDMS, undergoes a glass transition. The cooling here may be a cooling operation to below −100° C., which can be brought about, for example, by means of liquid nitrogen. This embodiment is advantageous since the polymer layer contracts and/or undergoes a glass transition as a function of the change in temperature and transmits the resultant forces to the solid-state body, by means of which mechanical stresses can be generated in the solid-state body and lead to triggering of a crack and/or to crack propagation, with spreading of the crack initially in the first detachment plane for splitting-off of the solid-state layer.

In a further preferred embodiment of the present invention, the polymer layer is stressed in such a way that it undergoes a change in shape in a first direction and/or in a second direction, wherein a change in shape in the first direction brings about detachment of solid-state elements from one another along the second plane of detachment and a change in shape in the second direction brings about detachment of solid-state elements from one another along the third plane of detachment. This embodiment is advantageous since the polymer layer already disposed on or adhering to the solid-state layer removed in any case serves not just for removal of the solid-state layer from the solid-state body and to receive the solid-state layer removed, but is also used for individualization of the solid-state elements. This therefore constitutes a distinct process simplification and a distinct process acceleration, which means that the individual solid-state elements can be produced at distinctly lower cost and more rapidly.

In a further preferred embodiment of the present invention, the change in shape of the polymer layer in the first direction and/or in the second direction is a radial expansion which is brought about as a result of mechanical stress and/or thermal stress. The polymer layer can thus preferably be altered in terms of its shape in various ways, which creates a high level of process flexibility. Preferably, the polymer layer is pulled, compressed and/or bent in one or more directions. However, it is additionally or alternatively likewise conceivable that the polymer layer is heated such that it expands.

Preferably, the modifications to form the second plane of detachment and/or to form the third plane of detachment are generated or introduced preferably at least partly beneath the first plane of detachment and/or partly above the plane of detachment, especially in the region between the first plane of detachment and the surface via which the laser beams have penetrated into the solid-state body to generate the first plane of detachment. Preferably, the second plane of detachment and any third plane of detachment extend orthogonally to the first plane of detachment. More preferably, therefore, modifications are generated at different distances from the preferably exposed surface of the solid-state layer to be removed or from the surface via which the laser beams have penetrated into the solid-state body to generate the first plane of detachment. What is meant here by "partly beneath" is that the modifications to form the second and any third plane of detachment are generated mainly above the first plane of detachment, or in this region more preferably has/have at least twice or at least three times or at least five times as many modifications as below the plane of detachment. The modifications in the second and/or third plane of detachment may preferably be generated up to 200 μm, especially up to 100 μm or up to 75 μm or up to 50 μm or up to 25 μm or up to 10 μm or up to 5 μm, beneath the first plane of detachment. The modifications in the second and/or third plane of detachment may preferably be generated at least 1 μm or at least 5 μm or at least 10 μm or at least 15 μm or at least 25 μm or at least 50 μm beneath the first plane of detachment.

In a further preferred embodiment of the present invention, the method of the invention additionally or alternatively comprises the step of pressing at least one pressurizing element of a pressurizing device onto at least one predetermined proportion of a stress generation layer or receiving layer for pressing the stress generation layer or receiving layer onto the surface. The step of separating the solid-state slice or solid-state layer from the donor substrate or solid-state body is preferably effected here by means of thermal stress on the stress generation layer. This preferably generates mechanical stresses in the donor substrate. The mechanical stresses give rise to a crack for separation of a solid-state slice or solid-state layer. The pressurizing element is preferably pressed onto the stress generation layer during the thermal stress on the stress generation layer. The effect of this is preferably that a reduction in the crack propagation rate is achieved.

This solution is advantageous since it has been recognized that the crack runs distinctly more accurately along a desired detachment region or a desired detachment plane or a desired detachment outline when a further force counteracts the mechanical stresses generated by the stress generation layer. This results from the fact that a vertical crack component is reduced or suppressed by the pressurization. This means that the departures of the crack from the plane or from the detachment plane are reduced and hence the result is a distinctly more planar crack progression, which increases the overall benefit/yield/output and/or can reduce the number of laser modifications or laser exposure. In other words, with the same or comparable laser exposure, the material losses are reduced or the laser processing time or laser utilization can be reduced with unchanged output. This solution is also advantageous since the splitting process, i.e. the period from commencement of heat treatment until complete detachment of the wafer or solid-state wafer, can be significantly reduced. This results from a distinct improvement in thermal coupling. The distinctly improved thermal coupling preferably results from the thermal stress on the donor substrate via the pressurizing element. The pressurizing element is preferably likewise used here to withdraw heat or to cool the donor substrate and/or the receiving layer, especially the polymer layer. The splitting process time can be shortened or significantly reduced from more than 10 min to less than 1 min. The shortened splitting process time is additionally advantageous since a distinct improvement in line control, i.e. of the subsequent treatments, especially consisting of laser exposure, disposing of a receiving layer on the donor substrate or laminating, performance of the splitting process and surface processing, especially grinding, of the surfaces generated or exposed as a result of the removal.

The solution of the invention is also advantageous since electronic components can be disposed or generated on the donor substrate and these are not damaged on splitting by a deformation of the solid-state layer or of the wafer, or the risk of damage can be significantly reduced. Thus, bending of the solid-state layer or of the wafer in the removal is reduced, especially completely avoided. In other words, the solid-state layer or wafer is preferably bent by less than 20° or less than 15° or less than 10° or less than 5° or less than 1° or less than 0.5°. Preferably, bending of the wafer or of the solid-state layer at least in the region or component exposed to the pressurization means is limited preferably to less than 20° or less than 15° or less than 10° or less than 5° or less than 1° or less than 0.5°.

The stress generation layer contracts as a result of the thermal stress, as a result of which tensile forces are introduced into the donor substrate by the stress generation layer. The pressure applied counteracts the tensile forces, which reduces force peaks and causes the crack to propagate in a distinctly more defined manner.

In a preferred embodiment of the present invention, at least sections of the pressurizing element are in two-dimensional contact with the stress generation layer during the pressurization. Preferably, the pressurizing element covers more than 20% or more than 30% or more than 50% or more than 75% or more than 90% or the entirety of the surface that bounds the donor substrate in the axial direction, which is part of the solid-state layer after the removal. Preferably, the pressurizing element here abuts the stress generation layer disposed or generated on this surface. Preferably, the pressurizing element here is in contact with more than 20% or more than 30% or more than 50% or more than 75% or more than 90% of the surface area of the stress generation layer that covers the donor substrate in axial direction.

In a further embodiment of the present invention, the at least one pressurizing element generates the pressure in an edge region, wherein the edge region preferably comprises the outer 5% or 10% or 15% or 20% or 30% or 40% or 50% or 60% or 70% or 80% furthest from the center or closest to the edge of the surface in radial direction of the stress generation layer disposed on the donor substrate, and/or the at least one pressurizing element generates the pressure in a center region, wherein the center region preferably comprises the inner 5% or 10% or 15% or 20% or 30% or 40% or 50% or 60% or 70% or 80% closest to the center or extending toward the center of the surface of the stress generation layer disposed on the donor substrate in radial direction, or the at least one pressurizing element generates the pressure over the entire two-dimensional proportion of the surface area of the donor substrate on which the stress generation layer is disposed. This embodiment is advantageous since the pressure for influencing the crack propagation can be applied as required.

In a further preferred embodiment of the present invention, the pressurizing element exerts a compression force, depending on the substrate diameter, of at least 10 N, especially between 100 N and 3000 N or between 3000 N and 10,000 N or up to 100 kN on the stress generation layer.

This solution is advantageous since, firstly, the forces generated by the stress generation layer can be counteracted in a controlled manner and, secondly, crack propagation and crack triggering is nevertheless possible.

In a further preferred embodiment of the present invention, the pressurizing element is disposed so as to be movable and is deflected relative to the donor substrate preferably as a result of the thermal stress on the stress generation layer by the stress generation layer, or the donor substrate is disposed so as to be movable and is deflected relative to the pressurizing element as a result of the thermal stress on the stress generation layer by the stress generation layer. The pressurizing element and/or the donor substrate is preferably deflectable and/or movable in axial direction of the donor substrate. In a further preferred embodiment of the present invention, the pressurizing element is only deflected once a predefined minimum force is exceeded. This embodiment is advantageous since the predefined minimum force makes it possible to very precisely adjust the extent to which force peaks that occur are to be reduced.

In a further preferred embodiment, a multitude of pressurizing elements is provided, wherein the individual pressurizing elements serve to apply locally different pressures and/or have different shapes and/or contact area dimensions and/or are deflectable to different extents and/or are deflectable with different forces. This embodiment is advantageous since a multitude of parameters can be employed for optimal adjustment of the pressurization.

In a further preferred embodiment of the present invention, the pressurizing element or the pressurizing elements can be pressed against the stress generation layer to generate a predefined contact pressure profile, wherein the contact pressure profile depends at least in sections on the distance of pressure application to the axial center of the donor substrate and/or on the crack propagation speed and/or the thermal stress and/or on the material of the donor substrate and/or on a conditioning of the donor substrate, especially by means of laser beams.

In a further preferred embodiment of the present invention, the pressurizing element exerts a compression force in each case of at least 10 N, especially between 100 N and 3000 N or between 3000 N and 10,000 N or up to 100 kN on the stress generation layer. Preferably, the pressurization, in the case of two pressurizing elements used simultaneously, may differ by a factor of up to or at least 0.1 or of up to or at least 0.3 or of up to or at least 0.5 or of up to or at least 0.75 or of up to or at least 1.5 or of up to or at least 2 or of up to or at least 5 or of up to or at least 10 or of up to or at least 20. Thus, the pressurizing elements are not deflected until predefined minimum forces have been exceeded. This embodiment is advantageous since the predefined minimum forces make it possible to very precisely adjust the extent to which force peaks that occur are to be reduced by the individual pressurizing elements.

In a further preferred embodiment of the present invention, the method of the invention additionally or alternatively comprises one or more of the following steps: generating or disposing a stress generation layer on a surface, especially a planar surface, of the donor substrate that axially bounds the donor substrate. Disposing a pressurizing element of a pressurizing device at a predetermined distance from the stress generation layer or at a predetermined distance from the detachment region for contacting with the stress generation layer during the removal. Removing the solid-state layer from the donor substrate by thermal stress on the stress generation layer. This preferably generates mechanical stresses in the donor substrate. Preferably, the mechanical stresses deflect proportions of the solid-state layer. Preferably, this gives rise to a crack for removing a solid-state layer. This preferably results in deflection of at least a removed proportion of the solid-state layer owing to the stress generation layer in the direction of the pressurizing element and pressing thereof against the pressurizing element. Preferably, the pressurizing element limits the maximum deflection of the solid-state layer.

Preferably, the contact side of the pressurizing element is disposed at a distance in axial direction from the surface of the stress generation layer which is lower than the shortest distance between the axial center of the donor substrate and the (radial) circumferential face of the donor substrate. Preferably, the distance is between 0.001 times and 0.9 times, especially between 0.001 times and 0.5 times or between 0.001 times and 0.1 times, the length of the shortest distance between the axial center of the donor substrate and the (radial) circumferential face of the donor substrate. More preferably, the distance between the contact side of the pressurizing element and the surface of the stress generation layer is less than 5 cm, especially less than 2 cm or less than 1 cm or less than 0.5 cm or less than 0.1 cm.

In the removal of at least partly processed wafers (precursors of electronic devices), it may be advantageous that bending of the surface is avoided. It is particularly advantageous that the processed surface or processed layer of the donor substrate, especially a device layer, is bent only to a minor degree, if at all, the polymer or receiving layer is disposed on another donor substrate surface and the polymer or the receiving layer is not disposed on the processed layer. Thus, the receiving layer or polymer layer is heated, at least in the multitude of solid-state layers or wafers removed from a donor substrate, at a minimum distance from the processed layer, where the minimum distance is preferably a multiple of, especially at least twice or at least 5 times or at least 10 times or at least 20 times, the thickness of the receiving layer or polymer layer. This is advantageous since the thermal stress on the processed layer is significantly reduced.

It may further be advantageous to bond the resultant thin component wafer or processed layer directly to a transfer wafer for further processing (this transfer wafer may in turn be held, for example, by a holding device for further stabilization). The bonding is effected here by means of direct bonding or temporarily with a bonding tape, where the bond can be released, for example, by means of radiation, especially UV radiation, or heat, especially temperatures above 20° C. or above 50° C. or above 100° C., especially up to 110° C. or up to 200° C. or up to 500° C., or an alternative treatment. This solution is preferably combinable with individual or all of the embodiments described above, especially the preferred embodiments relating to claim 1.

The object stated at the outset is likewise achieved by a plant for separating solid-state wafers from a donor substrate. This plant preferably comprises at least one laser device for generating modifications within the donor substrate to form a detachment region for conducting a removal crack, a temperature control device for cooling a stress generation layer applied to the donor substrate to trigger the removal crack, a pressurizing device having at least one pressurizing element for pressurizing the stress generation layer disposed on the donor substrate during the propagation of the removal crack. There is thus preferably suppression of the vertical crack components. This leads to fewer departures of the crack from the plane, which results in a higher yield and/or necessitates less laser exposure. In addition, the application of force has the effect of distinctly better thermal coupling, which leads in turn to a distinctly reduced splitting time. The reduced splitting time enables better synchronization with other processes since it was more than 10 minutes per split without this application of force and is less than one minute through the application of force. Overall, it is thus possible to a distinct improvement in line control comprising two or more of the following treatment steps: generating modifications within the solid-state body or donor substrate by means of a laser and/or applying a polymer film to the donor substrate, especially by means of a laminating device, and/or splitting the donor substrate in the region or along the detachment plane generated by the modifications or the detachment region as a result of the introduction of an external force into the donor substrate, especially by means of a cooling device or an ultrasound device, and/or performing a surface treatment or surface processing operation on the surface of the remaining residual donor substrate exposed by the split, especially by means of a material-removing processing device, such as a grinder, and/or a chemical surface treatment, especially by etching.

The solution of the invention is therefore also advantageous in that the application of force reduces the bending of the solid-state body removed or to be removed to a minimum, or completely prevents it. This also enables splitting of a solid-state layer, especially composite structure, away from the donor substrate on which semifinished or finished functional components, especially devices, for example transistors, or resistors or processors are disposed or generated. In addition, a higher temperature in the middle plane (device plane) is possible, which likewise reduces the risk of damage to the devices. Thus, a significant improvement in the processes is provided for the MEMS and/or compound wafer treatment.

Pressurizing element a contact surface for contacting with the surface of the stress generation layer has. The temperature control device is preferably a cooling device, especially a device for providing at least one or exactly one functional fluid, especially liquid nitrogen or nebulized nitrogen. At least one pressurizing element has been provided with a heating element.

In addition, the subject matter of patent application DE 10 2016 123 679.9, filed at the German Patent and Trademark Office on 7 Dec. 2016, is fully incorporated by reference into the subject-matter of the present property right specification.

Further advantages, aims and properties of the present invention are elucidated by the description of appended drawings that follows, in which the separation method of the invention is detailed by way of example. Components or elements that are used with preference in the method of the invention and/or that at least essentially correspond in terms of their function in the figures may be identified here by identical reference numerals, with no need for numbering or elucidation of these components or elements in all figures.

These Show:

FIG. 1a-f a treatment procedure of the invention,

FIG. 2a-b two schematic examples of solid-state arrangements as can be provided in accordance with the invention, FIG. 3a-i further schematic examples of solid-state arrangements of the invention or solid-state arrangements that can be generated in the process of the invention—as intermediate, FIG. 4 a schematic diagram of two lines formed by modifications, FIG. 5a-d various cooling devices that are preferably usable for cooling in the method of the invention, FIG. 6a-c three different schematic examples for crack propagation between modifications, FIG. 7 differently oriented modification lines to bring about different functions, FIG. 8 an example of a Schottky diode, FIG. 9 an example of a MOSFET, FIG. 10a-c the generation of depressions that extend from the edge into the interior of the solid-state body, where the depressions preferably extend along a detachment plane defined by modifications 9, FIG. 11 a first example of an edge treatment in the course of the solid-state wafer production or solid-state layer production of the invention, FIG. 12 an example of an edge treatment in the course of the solid-state wafer production or solid-state layer production of the invention, FIG. 13 a further example of an edge treatment in the course of the solid-state wafer production or solid-state layer production of the invention, FIG. 14 a diagram that shows the problems that occur in the generation of modifications in a solid-state body when the modifications are generated by means of laser beams, FIG. 15 a diagram showing various laser beam angles, FIG. 16a/16b a diagram of a modification generation step and a schematic diagram of the modifications generated, FIG. 17a/17b two diagrams of modification generation steps, FIG. 18 a generation of modifications with an aberration adjustment and FIG. 19 a schematic diagram of a solid-state body having depressions that are covered or masked or closed by a stress generation layer, FIG. 20a-20d a further example of an edge treatment in the course of the solid-state wafer production of the invention, FIG. 21 a donor substrate with crystal lattice planes aligned at a non-90° angle relative to the longitudinal axis and laser writing lines generated, FIG. 22 a further donor substrate with crystal lattice planes aligned at a non-90° angle relative to the longitudinal axis and laser writing lines generated, where the alignment of the laser writing lines or linear design is defined by means of planes, FIG. 23 that the modifications of a linear design intersect with a multitude of different crystal lattice patterns, FIG. 24 an example of a crystal lattice with slip plane for 4HSiC, FIG. 25a an example of a crystal lattice with slip plane 110 for Si, FIG. 25b an example of a crystal lattice with slip plane 100 for Si, FIG. 25c an example of a crystal lattice with slip plane 111 for Si, FIG. 26a-27a the change in inclination of the linear design relative to the ends of the crystal plane when the donor substrate is moved under a laser device by means of a rotation device, FIG. 27b a top view of an illustrative rotation device, FIG. 27c a side view of a processing plant, wherein the processing plant has a laser element preferably movable in a linear manner and a rotation device having a multitude of donor substrates disposed thereon, FIG. 28a the generation of a three-dimensional crack progression layer, FIG. 28b the generation of a further crack progression layer for generation of a three-dimensional solid-state body, FIG. 29a a schematic construction for generation of defects in a solid-state body, FIG. 29b a schematic diagram of a layer arrangement prior to the removal of a solid-state layer from a solid-state body, FIG. 29c a schematic diagram of a layer arrangement after the removal of a solid-state layer from a solid-state body, FIG. 30a a first variant shown in schematic form for defect generation by means of laser radiation, FIG. 30b a second variant shown in schematic form for defect generation by means of laser radiation, FIG. 31a a schematic side view of a nonplanar wafer of the invention, FIG. 31b a schematic side view of a nonplanar wafer of the invention with a coating disposed or generated thereon, FIG. 31c a schematic side view of a preferred form of a multilayer arrangement of the invention after a defined heat treatment, FIG. 32 an example of a laser exposure device of the invention, FIG. 33a an example of an apparatus of the invention, FIG. 33b the exposure of a polymer layer disposed on the solid-state body to a functional fluid, FIG. 34a an illustrative diagram of a surface profile of a solid-state body and the refractive indices of this surface profile, FIG. 34b multiple diagrams of surface profiles, FIG. 35a multiple diagrams of the changes from default positions of the laser head; and FIG. 35b two progressions that represent profiles of different modification distributions, FIG. 36a a schematic construction of a Raman instrument as used with preference in accordance with the invention, especially as part of the apparatus of the invention, FIG. 36b various illustrative vibration states of the lattice vibrations of SiC, FIG. 37a/b two graphs that show dopant concentrations in a solid-state body, FIG. 38a a feed-forward process of the invention, FIG. 38b a feedback process of the invention, FIG. 39 an example of a schematic diagram of the detachment plane, FIG. 40a shows a schematic top view and a schematic side view of the solid-state body, FIG. 40b shows the diagram of FIG. 40a and a schematic diagram of a first detachment plane, FIG. 41 shows a schematic of a further arrangement of the defects that define the detachment planes, FIG. 42a shows a schematic example of the formation of multiple second detachment planes, FIG. 42b shows a further schematic example with regard to the formation of the second detachment planes and the third detachment planes, FIG. 43 shows a solid-state layer with two detachment planes disposed on a polymer layer, FIG. 44a shows a solid-state layer prior to the division into solid-state elements, FIG. 44b shows a solid-state layer after the division into solid-state elements, FIG. 45a a schematic of an apparatus for pressurization of a donor substrate provided with a stress generation layer by means of a pressurizing device, FIG. 45b a schematic of an arrangement according to FIG. 45b, wherein the donor substrate has been modified in its interior by means of laser beams, FIG. 46 a schematic of an apparatus for limiting a deflection movement of the solid-state layer components removed, FIG. 47 a schematic of a pressurizing device with multiple pressurizing elements, FIG. 48a a schematic of an apparatus for pressurizing different surface components of the stress generation layer with different pressures, FIG. 48b a schematic of an apparatus for pressurizing different surface components of the stress generation layer with different pressures and for limiting the deflection movement of the solid-state wafer, and FIG. 48c a schematic of a top view of the apparatus shown in FIG. 48b, FIG. 49 shows a schematic cross-sectional view of a thick wafer for removal of multiple solid-state layers, where all solid-state layers have the same diameter, FIG. 50 shows a schematic cross-sectional view of a thick wafer for removal of multiple solid-state layers, where all solid-state layers have different diameters, FIG. 51a-d various diagrams of multiple wafers with different diameters, FIG. 52 a function by means of which laser beams can be introduced into a solid-state body through a metal-coated surface, FIG. 53 two examples of writing pathways during the generation of modifications, FIG. 54a-b examples for elucidation of the effect of components, implant regions, dopants, etched trenches, etc. on the location of the focus, FIG. 55-57 further examples for elucidation of the effect of components, implant regions, dopants, etched trenches, etc. on the location of the focus, FIG. 58 diagram of junctures for generation of modifications by means of laser beams in the interior of a solid-state body, wherein the modifications are generated in a front-side process, and FIG. 59 diagram of junctures for generation of modifications by means of laser beams in the interior of a solid-state body, wherein the modifications are generated in a back-side process.

FIG. 1a shows the provision of the solid-state body 1, especially a wafer.

According to FIG. 1b, the solid-state body 1 provided is coupled or stuck or welded or screwed or clamped or dried or frozen or sucked by a vacuum onto a tool carrier (chuck) 3, where the tool carrier preferably comprises a cooling functionality and hence preferably becomes the cooling device 3. Freezing-on is effected here preferably via the solidifying of a fluid, especially a liquid, especially water or one or more other materials having a solidification or setting temperature below 50° C. or below 30° C. or below 20° C. or below 10° C. or below 5° C. or below 0° C. or below −10° C. or below −20° C. or below −50° C. (in all cases based on an ambient pressure of 1 bar). Drying-on here preferably means solidifying by release of moisture or withdrawal of moisture. It is likewise possible here that the solid-state body is fixed to the chuck by two or more than two effects, for example sucking-on and clamping-on or clamping-on and sticking-on or clamping-on and screwing-on and drying-on. The chuck or tool carrier more preferably takes the form of a vacuum chuck. The solid-state body 1 is preferably fixed, especially stuck, onto the cooling device 3 in longitudinal direction by its underside, which is preferably opposite the surface 5 in longitudinal direction. The laser beams are thus introduced into the solid-state body 1 in the direction of the cooling device 3 via the surface 5, which is part of the solid-state layer to be removed, to generate the modifications 9. In addition, there is more preferably a high-temperature treatment of the surface 5, especially an epitaxial material arrangement on the solid-state surface 5, which preferably results in a further layer 145 or multiple further layers 145. The at least one high-temperature method is preferably an epitaxial method, a doping method or a method using plasma, wherein the high-temperature method, especially in the case of an epitaxial method, generates at least one layer 145 on the solid-state body 1, where the at least one layer 145 generated has predefined parameters, where at least one predefined parameter defines a maximum degree of refraction and/or absorption and/or reflection of laser light waves, where the degree of refraction and/or absorption and/or reflection is less than 5% and preferably less than 1% and more preferably less than 0.1%. In addition, the layer 145 generated or the further layers 145 generated may preferably be metal-free.

FIG. 1c shows a schematic of the generation of modifications 9 by means of the laser beams. The laser beams preferably penetrate here into the solid-state body 1 via the layer 145 generated by means of the high-temperature metal beforehand. However, it is alternatively likewise conceivable that the laser beams penetrate into the solid-state body 1 via a clear surface, i.e. one not coated with the further layer 145, of the solid-state body 1, especially from below. The solid-state body here 1 is preferably held laterally or on the outer ends (width and/or depth direction).

FIG. 1d shows a schematic section diagram of the solid-state body 1 after the generation of modifications 9. In this example, 4 blocks of modifications 9 are apparent, which lead to 4 crack components 25, 27, 28, 29. Adjoining the blocks with modifications 9, reference numerals 41, 42, 43, 44 and 45 each indicate regions without modifications 9 or regions in which fewer modifications 9 are generated than in the regions in which the blocks of modifications 9 are generated.

FIG. 1e shows a state in which a receiving layer, especially including a polymer material, is disposed or generated on components (not shown) that are disposed on the surface 5 or on a further layer generated epitaxially on the surface 5 beforehand. The receiving layer has preferably been generated as a film and, after generation thereof, has been coupled, especially bonded or stuck, to the surface 5. However, it is likewise possible to form the receiving layer by applying a liquid polymer to the surface 5 and then solidifying.

Between the step of generating the modifications and applying the receiving layer, there is preferably a disposal or generation of further layers 150 and/or components 150 on the surface 5 or on a further layer 145 already generated during an upstream high-temperature method.

FIG. 1f shows a schematic of a temperature control operation on the receiving layer. The receiving layer is preferably adjusted to a temperature below ambient temperature, especially cooled, especially to a temperature of less than 20° C., or of less than 1° C. or of less than 0° C. or of less than −10° C. or of less than −50° C. or of less than −60° C. In this case, the material of the receiving layer 140 undergoes a glass transition or/and crystallization as a result of the cooling. Preferably, the temperature of the receiving layer is controlled by means of liquid nitrogen, especially by means of nebulized nitrogen. Owing to the temperature control, especially owing to the glass transition, the receiving layer contracts, which generates mechanical stresses in the solid-state body 1. Owing to the mechanical stresses, a crack that connects the crack components 25, 27, 28, 29 is triggered, by which the solid-state component 12 is separated from the solid-state body 1.

FIG. 2a shows an embodiment in which the receiving layer 140 is disposed on a surface of the solid-state body that is spaced apart further from modifications than a surface 5 which is parallel or preferably essentially parallel or completely parallel thereto. The surface preferably has a further layer 145 (analogously to FIGS. 1b-1f). Components 150 or further material layers 150 are preferably disposed on the further layer 145 or on the exposed surface 5. Preferably, a stabilization layer and/or a protection layer 142 is disposed or generated on an exposed surface of the further material layer 150 or of the components 150. The components 150 here may be cast, for example, especially with a polymer material and/or ceramic material. It is additionally conceivable that a stabilization device, especially a further wafer, for example a glass wafer, is coupled, especially stuck or bonded, to the stabilization layer and/or protective layer 142. The effect of the stabilization layer and/or protective layer 142 or of the stabilization layer and/or protective layer 142 and the stabilization device here is that the components 150 or further material layer 150 are deformed only insignificantly, if at all, in the splitting operation or after the splitting operation. In the splitting operation, the deformation can be brought about by the forces generated by means of the receiving layer 140 and, after the splitting operation, deformation can be brought about by the remaining modifications, especially conversions of matter. The effect of the modifications in the case of a conversion of matter is to give rise to compression forces, which would result in warpage (bowing) of the solid-state layer removed without the stabilization layer/stabilization device. The stabilization layer 142 may thus additionally or alternatively take the form of a glass wafer or silicon wafer or of a metal layer, or a glass wafer may additionally or alternatively be disposed on the stabilization layer 142. If the stabilization layer 142 is executed as a metal layer, this may be attached by bonding, especially adhesive bonding. Alternatively, it is possible that the metal layer 142 is generated on the composite structure, especially by means of sputtering.

A unit composed of removed solid-state layer and stabilization layer and/or protective layer 142 disposed thereon and of any stabilization device disposed thereon is then preferably subjected to further treatment for removal of stress. More preferably, the stabilization layer 142 or stabilization device forms a holding device by means of which the solid-state layer removed can be fixed for a material removal treatment with respect to a material removal device, especially a grinding and/or polishing device. By means of the material removal device, the modification components that remain on the solid-state layer removed are then removed, especially by material removal.

In the context of this invention, the solid-state layer is preferably always thinner than the remaining solid-state component. However, it is also conceivable that the receiving layer is disposed or generated not on a surface of the later solid-state layer but on a surface of the remaining solid-state component. When the solid-state material is silicon, the solid-state layer removed preferably has a height relative to the remaining solid-state body of less than 40% of the height of the remaining solid-state body, especially of less than 30% or 20% of the height of the remaining solid-state body. In the case of silicon, predetermined parameters are preferably envisaged for the generation of modifications: the numerical aperture is preferably between 0.5 and 0.8, especially 0.65, the penetration depth is between 150 µm and 1000 µm, especially 300 µm, the pulse separation is between 1 µm and 5 µm, especially 2 µm, the line spacing is between 1 µm and 5 µm, especially 2 µm, the pulse duration is between 50 ns and 400 ns, especially 300 ns, and the pulse energy is between 3 µJ and 30 µJ, especially 10 µJ.

If the material is SiC, the solid-state layer removed preferably has a height relative to the remaining solid-state body of less than 50% of the height of the remaining solid-state body, especially of less than 45% or 40% or 35% or 30% or 25% of the height of the remaining solid-state body. In the case of SiC, predetermined parameters are preferably envisaged for the generation of modifications: the numerical aperture is preferably between 0.4 and 0.8, especially 0.4, the penetration depth is preferably between 50 µm and 500 µm, especially 180 µm, the pulse separation is preferably between 0.1 µm and 3 µm, especially 1 µm, the line spacing is preferably between 10 µm and 200 µm, especially between 10 µm and 100 µm, especially 75 µm, the pulse duration is between 1 fs and 10 ns, especially 3 ns, and the pulse energy is preferably between 0.5 µJ and 30 µJ, especially 7 µJ.

In FIG. 2b as well, analogously to FIGS. 1b-1f, a further layer 145 may be generated, even if this has not been indicated. The further material layers or components 150 are therefore preferably generated or disposed on the further layer 145 or on an exposed surface of the solid-state body.

In addition, FIG. 2b shows that the receiving layer may be disposed on a surface of the remaining solid-state body and a further receiving layer 146 may be disposed on the components of further material layers 150. The components here may additionally have been provided with a stabilizing layer 142, which means that the further receiving layer 146 has preferably been generated or disposed on the stabilization layer and/or protective layer 142. The further receiving layer 146 is preferably provided as a film and preferably likewise consists at least partly of a polymer material. More preferably, the further receiving layer 146 has the same material as the receiving layer 140 or 142. This embodiment is advantageous since the stresses for generating the crack can be introduced into the solid-state body from two sides.

FIGS. 3a to 3i show different arrangements that may be provided after the generation of the further material layers or components 150 to induce the crack.

FIGS. 3a-3i show various solid-state arrangements 176 as are advantageous for inducing crack progression stresses and/or crack triggering stresses.

Figure 7:
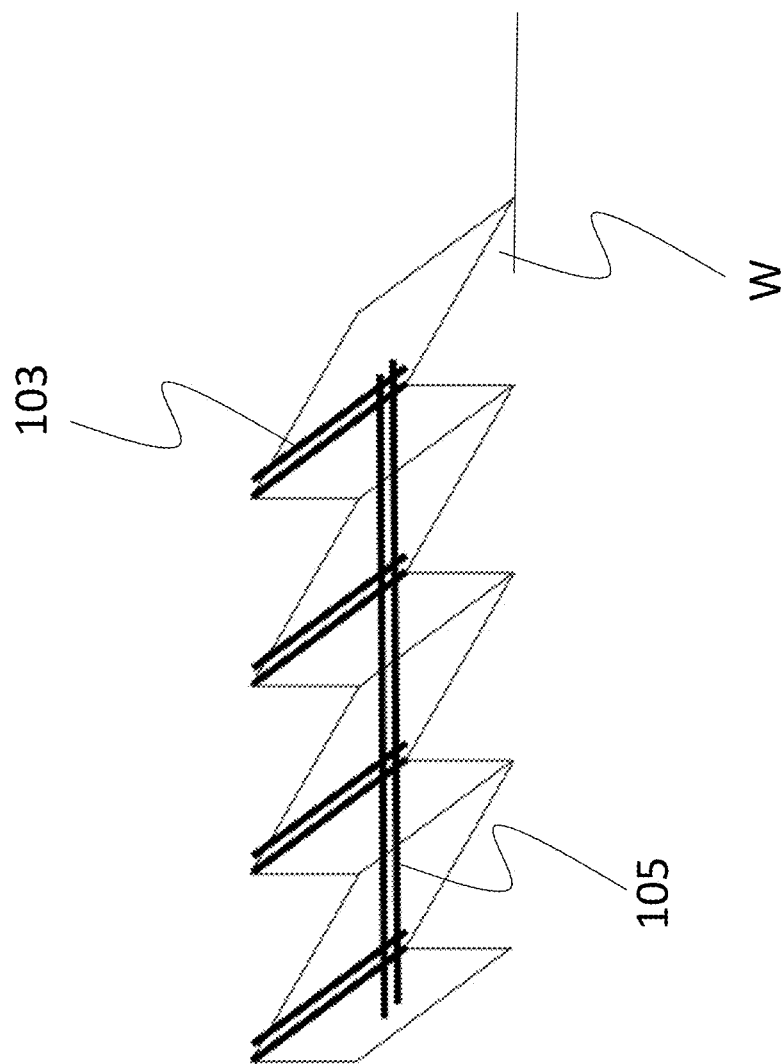

FIG. 3a here shows a processed solid-state body 1 or wafer with structures or components 150.

By comparison with the solid-state body 1 shown in FIG. 3a, there is a receiving layer 140 disposed or generated on the component side, especially on the components 150 or the further material layers 150, in the solid-state body 1 shown in FIG. 3b. The receiving layer 140 here is preferably disposed on the solid-state layer to be removed. The receiving layer 140 may also be identified as splitting film and has thus preferably been laminated onto the structure side. In the subsequent step, the entire arrangement is then cooled down, which brings about the split or crack triggering and/or crack progression.

By comparison with the diagram in FIG. 3b, according to FIG. 3c, a holding layer/bonded wafer is disposed on the underside of the solid-state body or on the exposed surface of the solid-state body. The holding layer may also be a tool carrier or chuck 3. In the subsequent step, the entire arrangement is then cooled down, which brings about the split or crack triggering and/or crack progression.

FIG. 3d, by comparison with FIG. 3b, shows an arrangement in which the solid-state body has been provided with receiving layers 140, 146 on both sides. The further receiving layer 146 is disposed here on a surface of the residual solid-state body that remains at a later stage, where an adhesion promotion layer 148 and/or sacrificial layer 149 and/or protective layer 142 may have been disposed or generated between the further receiving layer 146 and the solid-state body 1. The two receiving layers 140 and 146 have preferably been laminated on. In the subsequent step, the entire arrangement is then cooled down, which brings about the split or crack triggering and/or crack progression.

FIG. 3e shows an arrangement in which, by contrast with the arrangement known from FIG. 3d, no adhesion promotion layer 148 and/or sacrificial layer 149 and/or protective layer 142 has been disposed or generated between the further receiving layer 146 and the solid-state body 1. In the subsequent step, the entire arrangement is then cooled down, which brings about the split or crack triggering and/or crack progression.

FIG. 3f shows an arrangement constructed in an inverse manner from the arrangement known from FIG. 3d, meaning that the adhesion promotion layer 148 and/or sacrificial layer 149 and/or protective layer 142 has not been disposed or generated between the further receiving layer 146 and the solid-state body 1 but has/have been generated or disposed between the receiving layer 140 and the solid-state body 1 and hence on the solid-state layer to be removed. It is possible here to generate one or more layers, for example by means of spin-coating, on the components 150 or the structures. As a subsequent step, the entire arrangement is then cooled down, which brings about the split or crack triggering and/or crack progression.

FIG. 3g shows an arrangement or embodiment that corresponds to a combination of the arrangements of FIGS. 3d and 3f. The solid-state body has preferably been laminated with splitting film on both sides; it is likewise possible to provide a protective layer and/or adhesion promotion layer and/or sacrificial layer beneath the splitting film on either side; spin-coating, for example, on the structures is also possible. As a subsequent step, the entire arrangement is then cooled down, which brings about the split or crack triggering and/or crack progression.

FIG. 3h shows an arrangement similar to the arrangement shown in FIG. 3b, wherein the receiving layer has been disposed or laminated not onto a surface of the solid-state layer to be removed but onto one side of the residual solid-state body that remains after the removal. The removal is then effected as a result of the cooling analogously to the separation from an ingot or as in an ingot process.

FIG. 3i shows an arrangement which is similar to the arrangement known from FIG. 3c, wherein one or more of the layers or devices mentioned hereinafter are disposed or generated on the component side of the solid-state body or on or above the components 150. These layers or devices are preferably: at least or exactly one adhesion promotion layer 148 and/or at least or exactly one sacrificial layer 149 and/or at least or exactly one protective layer 142 and/or at least or exactly one stabilization device 3, especially a tool carrier or chuck or a further wafer. As a subsequent step, the entire arrangement is then cooled down, which brings about the split or crack triggering and/or crack progression.

FIG. 4 shows an illustration of an example for a writing pattern in X-Y processing:

Arrows 170, 172 represent the laser advance direction; the black circles represent the different laser shots or modifications 9 that do not overlap here with their damaging effect in the material. It is preferable here when the laser first moves in one direction and generates modifications 9 before turning round and writing modifications 9 in the second (lower) direction.

FIGS. 5a to 5d show different cooling devices 174. The solid-state arrangements 176 processed in these cooling devices 174 result from the various forms or executions of the solid-state bodies 1 provided with one or more receiving layers 140, 146 that are shown and described in FIGS. 1a to 3i. The cooling devices 174 shown herein all use a liquefied gas 178 as starting cooling medium for cooling. According to this embodiment, this starting cooling medium is either nebulized or evaporated. Preferably, the starting cooling medium is liquid nitrogen. Alternative cooling methods, for example by means of Peltier elements, are likewise conceivable and possible.

The cooling device 174 preferably serves to cool the receiving layer 140, 146 down to a temperature between −130° C. and −10° C., especially to a temperature between −80° C. and −50° C.

According to FIG. 5a, the cooling device 174 includes a nitrogen bath, wherein the receiving layer is positioned spaced apart, especially by means of an adjustable positioning device 180, from the liquid nitrogen held in the nitrogen bath. Thus, the solid-state arrangement is preferably disposed above a nitrogen bath on a positioning device or on a holder. The result is thus a temperature gradient over the chamber height, and that the temperature at the solid-state arrangement is adjustable over the fill height with the starting cooling medium or the position of the solid-state arrangement 176 (distance from the base of the chamber).

According to the embodiments of FIGS. 5b to 5d, the cooling device may preferably include a nebulizer, especially at least or exactly one perforated pipeline, for nebulization of liquid nitrogen or a nebulizer for nebulization of liquid nitrogen and the cooling effect may be generated by nebulized or evaporated nitrogen.

According to FIG. 5b, a homogeneous spray device/nebulizer is provided for spraying or nebulization. The spraying or nebulizing is preferably effected above the solid-state arrangement 176. In addition, there are preferably temperature measurements for temperature monitoring that give output data for regulation of a valve, especially nitrogen valve. The temperature measurements are preferably made on the substrate or on the solid-state body 1, or on the receiving layer 140.

The substrate or the solid-state body 1 or the solid-state arrangement 176 preferably rests above the chamber base in order to stay clear of the settling of nitrogen at the base of the chamber.

According to FIG. 5c, a perforated pipeline is preferably used as homogeneous spray device. In addition, there are preferably temperature measurements for temperature monitoring that give output data for regulation of a valve, especially nitrogen valve. The temperature measurements are preferably made on the substrate or on the solid-state body 1, or on the receiving layer 140.

The substrate or the solid-state body 1 or the solid-state arrangement 176 preferably rests above the chamber base in order to stay clear of the settling of nitrogen at the base of the chamber.

According to FIG. 5d shows a cooling device 176 having a homogeneous spray device/nebulizer 182 for cooling of preferably multiple or each side. In addition, there are preferably temperature measurements for temperature monitoring that give output data for regulation of a valve, especially nitrogen valve. The temperature measurements are preferably made on the substrate or on the solid-state body 1, or on the receiving layer 140.

The substrate or the solid-state body 1 or the solid-state arrangement 176 preferably rests above the chamber base in order to stay clear of the settling of nitrogen at the base of the chamber.

The chamber 184 of the cooling device 174 is preferably closed in order to as far as possible prevent a temperature gradient by insulation.

FIG. 6 shows three examples of preferred relationships between the crystal lattice orientation and the generation of modifications. This method is useful especially for the separation of solid-state layers from a solid-state body consisting of SiC or including SiC. These relationships result in a further method of the invention. This further method of the invention preferably serves to separate at least one solid-state layer 4 from at least one solid-state body 1, especially a wafer from an ingot, or to thin a wafer. The further method of the invention preferably comprises at least the steps of: generating a multitude of modifications 9 by means of laser beams within the solid-state body 1 to form a detachment plane 8, and introducing an external force into the solid-state body 1 to generate stresses in the solid-state body 1, wherein the external force is sufficiently strong that the stresses result in crack propagation along the detachment plane 8.

According to the invention, the modifications are generated successively in at least one line or row, wherein the modifications 9 generated in a line or row are preferably generated at a separation X and with a height H in order that a crack that propagates between two successive modifications, especially a crack that propagates in crystal lattice direction, the direction of crack propagation of which is aligned at an angle W relative to the detachment plane, joins the two modifications together. The angle W here is preferably between 0° and 6°, especially 4°.

Preferably, the crack propagates from a region below the center of a first modification toward a region above the center of a second modification. The essential relationship here is therefore that the size of the modification can/must be altered as a function of the separation of the modifications and the angle W.

Moreover, this method may also include the step of generating a composite structure by arrangement or generation of layers and/or components atop or above an initially exposed surface 5 of the solid-state body 1, wherein the exposed surface 5 is preferably part of the solid-state layer 4 to be removed. More preferably, the modifications to form the detachment plane 8 are generated prior to the generation of the composite structure.

To introduce the external force, it is possible, for example, analogously to the above-described methods, to dispose a receiving layer 140 on an exposed surface 5 of the composite structure or solid-state body.

The three FIGS. 6a to 6c are supposed to illustrate how the size of the damage/modification zone amorphized/phase-transformed by laser affects the height covered by the sawtooth pattern of the crack. In general, the crack runs along the crystal planes, i.e. between individual atoms of the crystal. These clear planes no longer exist in the modified zone, which thus comes to a halt.

By means of a numerical aperture which is preferably as high as possible, the size of the damage zone can be reduced in beam direction, and also laterally in the focal plane. Since it is necessary to attain only the threshold intensity, a smaller pulse energy is then sufficient here.

If the damage zone is then made smaller in a suitable manner, the laser modifications can be increased in density, which allows the sawtooth to be shorter, resulting overall in a smaller vertical extent of the modified plane (first image).

If the damage zone, by contrast, is made larger (higher energy and/or lower numerical aperture—FIG. 6b), the elevated pressure in the amorphized zone also triggers a larger microcrack, which can be controlled (i.e. stopped in a controlled manner) with enablement of a damage zone of greater extent at a greater distance.

Finally, FIG. 6c shows the risk that if the damage zone is not sufficiently large and cracks that run too far are triggered by the laser modification, the cracks firstly run too far—i.e. the difference in height that results from the cracks becomes greater than desired—and the cracks are secondly driven below the further damage zones and not stopped by the amorphized material. This then leads again to material losses since all the material layers that have been incised have to be removed for the end product or another laser processing operation.

FIG. 7 shows a schematic of a snapshot from a further method of the invention. This further method preferably serves to separate at least one solid-state layer 4 from at least one solid-state body 1, especially a wafer from an ingot, or to thin a wafer. The further method of the invention preferably comprises at least the steps of: generating a multitude of modifications 9 by means of laser beams within the solid-state body 1 to form a detachment plane 8, and introducing an external force into the solid-state body 1 to generate stresses in the solid-state body 1, wherein the external force is sufficiently strong that the stresses result in crack propagation along the detachment plane 8.

According to the invention, in a first step, the modifications are generated on a line 103 and preferably at the same distance from one another. It is additionally conceivable that a multitude of these lines generated in the first step is generated. These first lines are more preferably generated parallel to the direction of crack propagation and preferably in a straight line or in the form of a circular arc, especially in the same plane. After the generation of these first lines, second lines 105 are preferably generated for triggering and/or driving preferably subcritical cracks. These second lines are preferably likewise generated in a straight line. More preferably, the second lines are inclined relative to the first lines, especially orthogonally aligned. The second lines preferably extend in the same plane as the first lines or more preferably in a plane parallel to the plane in which the first lines extend. Subsequently, third lines are preferably generated to connect the subcritical cracks.

This method is useful especially for the separation of solid-state layers from a solid-state body consisting of SiC or including SiC.

In addition, the modifications may be generated successively in at least one line or row, wherein the modifications 9 generated in a line or row are preferably generated at a separation X and with a height H in order that a crack that propagates between two successive modifications, especially a crack that propagates in crystal lattice direction, the direction of crack propagation of which is aligned at an angle W relative to the detachment plane joins the two modifications together. The angle W here is preferably between 0° and 6°, especially 4°. Preferably, the crack propagates from a region below the center of a first modification toward a region above the center of a second modification. The essential relationship here is therefore that the size of the modification can/must be altered as a function of the separation of the modifications and the angle W.

Moreover, this method may also include the step of generating a composite structure by arrangement or generation of layers and/or components 150 atop or above an initially exposed surface 5 of the solid-state body 1, wherein the exposed surface 5 is preferably part of the solid-state layer 4 to be removed. More preferably, the modifications to form the detachment plane 8 are generated prior to the generation of the composite structure.

To introduce the external force, it is possible, for example, analogously to the above-described methods, to dispose a receiving layer 140 on an exposed surface 5 of the composite structure or solid-state body.

Thus, in the further laser method of the invention, lines are preferably generated parallel to the direction of crack propagation (preferably called transverse lines) on SiC (but also other materials), in order first to define a plane for the preferred crack triggering (crack initialization) before longitudinal lines drive the cracks. The cracks here are initialized first in the transverse direction, then in the longitudinal direction, before a final step makes lines between the longitudinal lines from the second step in order to fully trigger the cracks. This enables shorter crack pathways, which minimizes the final surface roughness.

Example image for transverse lines (with the sawtooth) and crack triggering lines (on the wave crests of the sawtooth).

Figure 8:
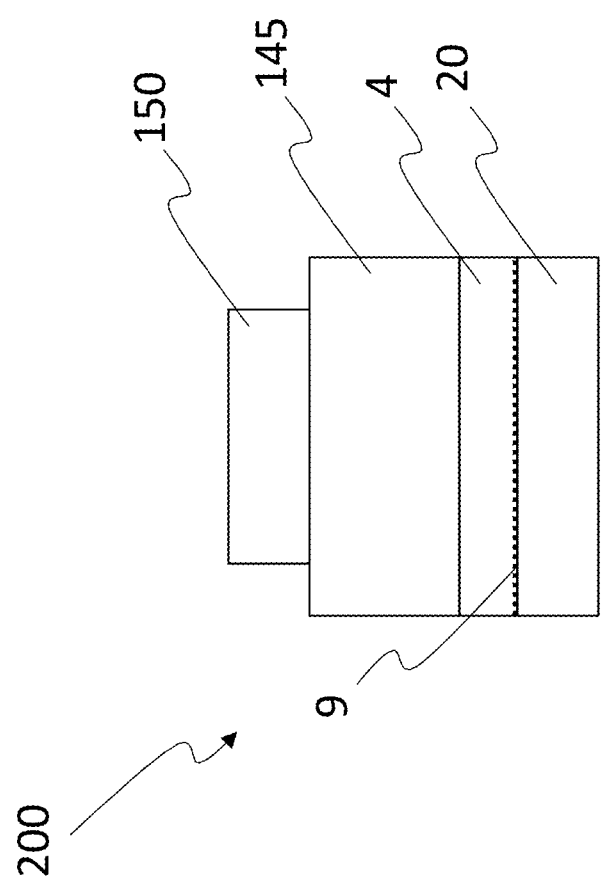

FIG. 8 shows, by way of example, a Schottky diode 200. This diode 200 preferably includes a solid-state layer 4 that in turn includes components modified by means of laser radiation, especially modifications 9. The modifications 9 here have been generated in the vicinity of a first surface of the solid-state layer 4. A metal layer 20 has preferably been generated on this first surface of the solid-state layer 4, especially by means of sputtering or chemical deposition. The solid-state layer 4 has a second surface which is opposite the first surface and on which a further layer 145 has been generated, especially by means of an epitaxy method. The solid-state layer 4 preferably consists of highly doped SiC or includes highly doped SiC, and the layer 145 generated preferably consists of lightly doped SiC or includes lightly doped SiC. Lightly doped here means preferably a lower level of doping than highly doped. Thus, the layer 145 generated preferably has less doping per unit volume than the solid-state layer 4. Reference numeral 150 indicates a Schottky contact.

Figure 9:
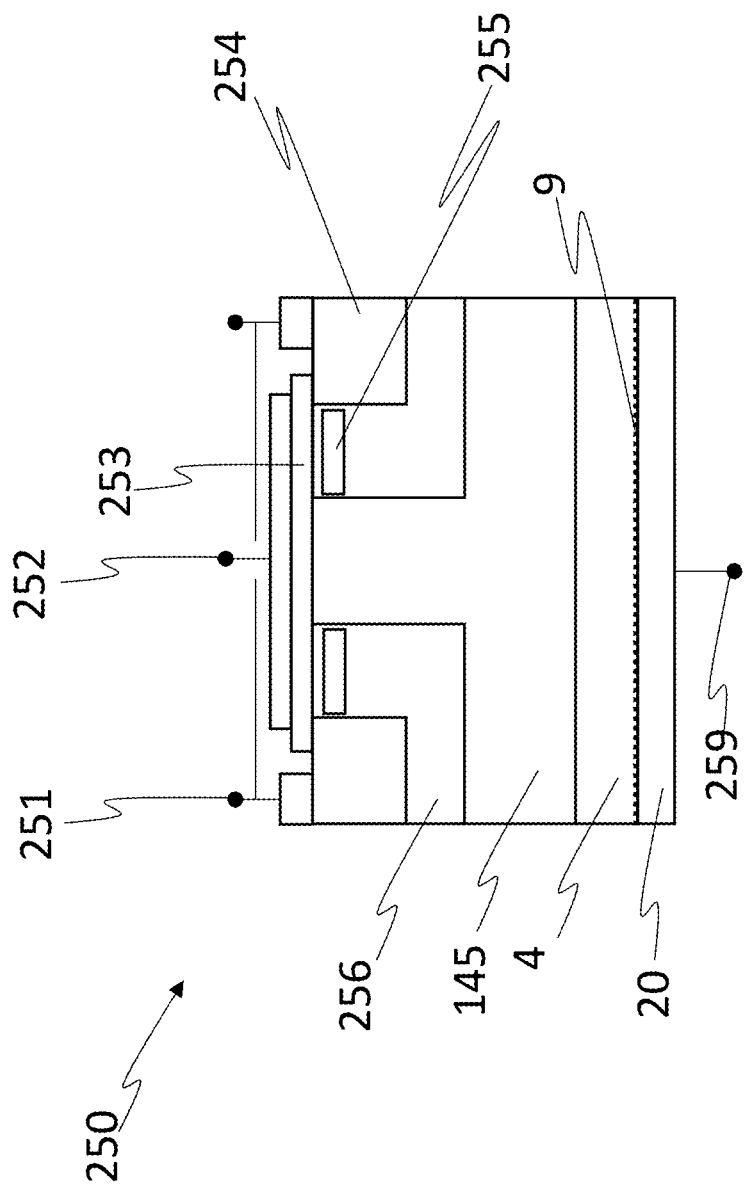

FIG. 9 shows, by way of example, the structure of a MOSFET 250. This MOSFET 250 preferably includes a solid-state layer 4 that in turn includes components modified by means of laser radiation, especially modifications 9. The modifications 9 here have been generated in the vicinity of a first surface of the solid-state layer 4. A metal layer 20 has preferably been generated on this first surface of the solid-state layer 4, especially by means of sputtering or chemical deposition. The metal layer 20 preferably forms a drain (high) via a terminal 259. The solid-state layer 4 has a second surface opposite the first surface. A further layer, especially n-type SiC, has been formed, especially generated or disposed, on the second surface. Reference numeral 256 indicates a further material or element, especially p-type SiC. Reference numeral 254 represents n+. Reference numeral 255 preferably indicates one or more channels, especially for conducting current. The layer identified by reference numeral 253 preferably consists of or includes SiO2. Reference numeral 251 indicates a source (low), and reference numeral 252 indicates a gate.

The present invention may thus relate to a method of providing at least one solid-state layer 4, wherein the solid-state layer 4 is separated from a solid-state body 1. The method of the invention preferably comprises the steps of:
generating a multitude of modifications 9 by means of laser beams within the solid-state body 1 to form a detachment plane 8, wherein the modifications 9 generate compressive stresses in the solid-state body 1, removing the solid-state layer 4 by a separation of the remaining solid-state body 1 and the solid-state layer 4 along the detachment plane 8 formed by the modifications 9, wherein at least constituents of the modifications 9 that generate the compressive stresses remain on the solid-state layer 4, wherein so many modifications 9 are generated that the solid-state layer 4 becomes detached from the solid-state body 1 owing to the modifications, or wherein an external force is introduced into the solid-state body 1 to generate further stresses in the solid-state body 1, wherein the external force is sufficiently strong that the stresses bring about crack propagation along the detachment plane 8 formed by the modifications, generating a metal layer on the surface exposed by the separation of the solid-state layer 4 from the solid-state body 1 for at least partial and preferably substantial and more preferably complete compensation for a deformation of the solid-state layer 4 brought about by the compressive stresses of the remaining modification constituents or for at least partial and preferably substantial or complete compensation for the compressive stresses.

Alternatively, the present invention may relate to a method of generating electrical components. This method preferably comprises the steps of generating a multitude of modifications 9 by means of laser beams within a solid-state body 1 to form a detachment plane 8, wherein the modifications 9 generate compressive stresses in the solid-state body 1, generating a composite structure by disposing or generating layers and/or components 150 on or above an initially exposed surface 5 of the solid-state body 1, wherein the exposed surface 5 is part of the solid-state layer 4 to be removed, removing the solid-state layer 4 by a separation of the remaining solid-state body 1 and the solid-state layer 4 along the detachment plane 8 formed by the modifications 9, wherein at least constituents of the modifications 9 that generate the compressive stresses remain on the solid-state layer 4, wherein so many modifications 9 are generated that the solid-state layer 4 becomes detached from the solid-state body 1 owing to the modifications, or wherein an external force is introduced into the solid-state body 1 to generate further stresses in the solid-state body 1, wherein the external force is sufficiently strong that the stresses bring about crack propagation along the detachment plane 8 formed by the modifications, generating a metal layer 20 on the surface exposed by the separation of the solid-state layer 4 from the solid-state body 1 for at least partial compensation for the compressive stresses brought about by the modification constituents.

Figure 10:
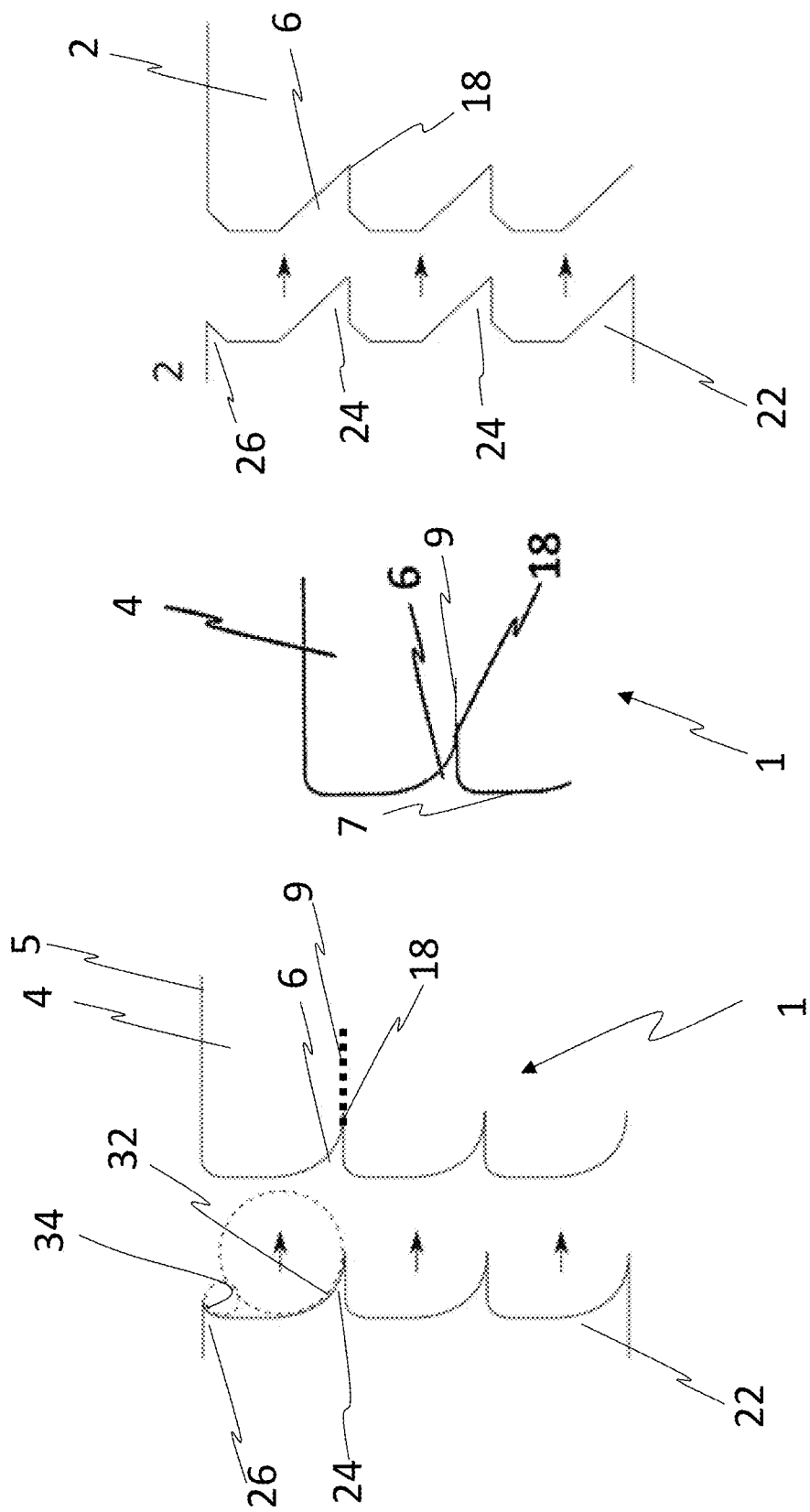

FIG. 10a shows a diagram that shows a grinding tool 22 with a particular outline. If reference is made to a planar, straight or curved component in relation to the grinding tool, what this always means is a proportion of the outline shown. It is of course possible for the grinding tool 22 to take the form, for example, of a rotary grinding tool, which would mean that the components that adjoin the outline in circumferential direction would preferably extend in a curved manner in circumferential direction. The grinding tool 22 shown in the first diagram in FIG. 10a has a first processing component 24 having a curved main grinding surface 32, and has a second processing component 26 having a curved secondary grinding surface 34, where the radius of the main grinding surface 32 is greater than the radius of the secondary grinding surface 34, the radius of the main grinding surface 32 preferably being at least twice, three times, four times or five times as large as the radius of the secondary grinding surface 34.

According to the invention, additionally or alternatively, a method of separating at least one solid-state slice 4, especially a solid-state wafer or a solid-state layer, from a donor substrate 1 or solid-state body is provided. In the context of the present property right specification, the terms "donor substrate" and "solid-state body" may preferably be used synonymously. This method preferably comprises the steps of:
providing a donor substrate 1, generating modifications 9 within the donor substrate 1 by means of laser beams, wherein the modifications 9 define a detachment region along which the solid-state layer is separated from the donor substrate 1, removing material from the donor substrate 1 proceeding from a surface that extends in circumferential direction of the donor substrate 1 in the direction of the center (Z) of the donor substrate 1, especially to generate a circumferential depression, wherein the removal of material exposes the detachment region 8 or a detachment plane, removing the solid-state layer 4 from the donor substrate 1, wherein the donor substrate is weakened by the modifications in the detachment region such that the solid-state layer 4 becomes detached from the donor substrate 1 owing to the removal of material or such a number of modifications 9 is generated after the removal of material that the donor substrate 1 is weakened in the detachment region such that the solid-state layer 4 becomes detached from the donor substrate 1 or a stress generation layer 140 or receiving layer is generated or disposed on a surface, especially a planar surface, of the donor substrate 1 in an inclined arrangement relative to the circumferential surface and thermal stress on the stress generation layer 140 generates mechanical stresses in the donor substrate 1, wherein the mechanical stresses result in a crack for removal of a solid-state layer 4 that propagates proceeding from the surface of the donor substrate exposed by the removal of material along the modifications 9. It is possible here that the modifications 9 are generated partly or entirely before the removal of material or after the removal of material. The depression 6 thus preferably becomes narrower in the direction of center Z up to a depression end 18. The depression preferably runs in the form of a wedge, with the depression end 18 preferably exactly in the plane in which the crack propagates or in which the modifications 9 are generated. In addition, it is possible that a composite structure is generated by arrangement or generation of layers and/or components 150 atop or above an initially exposed surface 5 of the solid-state body 1, wherein the exposed surface 5 is part of the solid-state layer 4 to be removed. The modifications 9 to form the detachment plane 8 are preferably generated prior to the generation of the composite structure.

After the composite structure has been generated, an external force is preferably introduced into the solid-state body 1 to generate stresses in the solid-state body 1, the external force being sufficiently high that the stresses bring about crack propagation along the detachment plane 8.

FIG. 10b shows a diagram in which the modifications 9 shown in FIG. 10a, which are especially amorphous components of the crystal lattice, were treated by etching. An etching treatment of noncrystalline constituents of the solid-state body 1 is thus preferably effected, while the crystalline constituents of the solid-state body are not or essentially not altered by the etching treatment. This preferably exploits the effect that etching methods can be established selectively in crystalline—noncrystalline regions. Reference numeral 19 thus indicates a region in which the solid-state layer 4 has been removed from the remaining residual solid-state body by an etching treatment of modifications 9. This solution is advantageous since the mechanical crack opening is conducted deeper into the crystal by the (incipient) etching. This creates a more accurately defined crack initiation. Preferably, the thinner and deeper the extension or notch extends into the interior of the solid-state body, the better the surface exposed as a result of splitting-off of the solid-state layer in terms of surface quality. The etching parameters are preferably chosen here such that nonamorphous components, especially any polished top side 5 and/or the unmodified edge 7, are not etched. Thus, the method of the invention, especially the method described with regard to FIG. 10a, is supplemented, for example, with the step of an etching treatment or etching removal of modifications 9 that define at least sections of the detachment region. The solid-state body 1, especially prior to generation of a composite structure, preferably consists of SiC or includes SiC; preferably, the solid-state body includes at least 95% (by mass) or at least 99% (by mass) or at least 99.99% (by mass) SiC.

It is further pointed out that the removal of material at the edge of the solid-state body, especially with a subsequent etching step, can be added on in any method disclosed by this property right specification.

In the third diagram, FIG. 10c, the first processing component 24 of the grinding tool 22 has a straight main grinding face 32 and the second processing component 26 has a straight secondary grinding face 34, wherein more material is removed from the donor substrate 2 by means of the main grinding face 32 than by the secondary grinding face 34.

Figure 11:
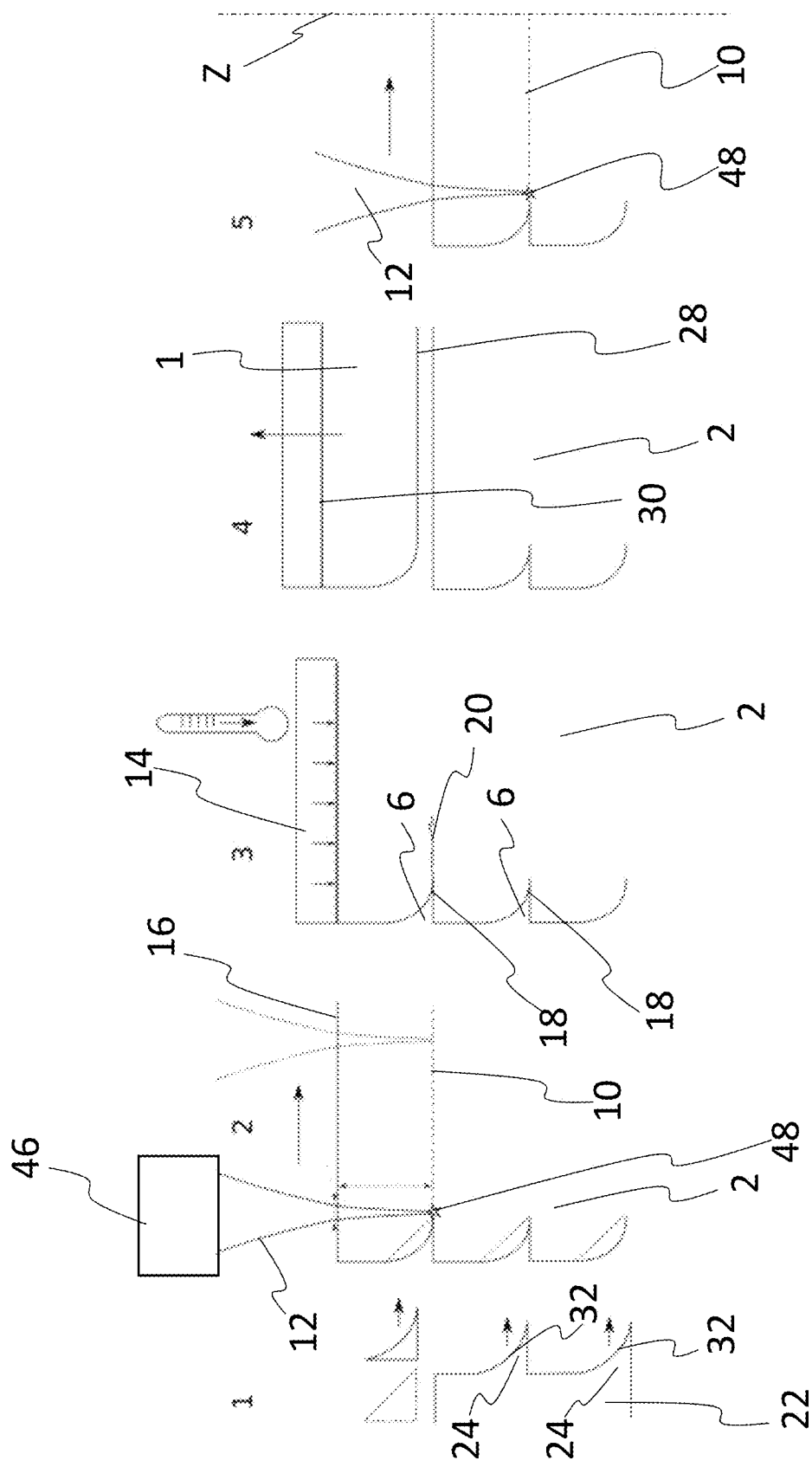

FIG. 11 shows 5 diagrams that show examples of the solid-state wafer production or wafer production of the invention. Diagram 1 shows a grinding tool 22 having two processing components 24 spaced apart from one another, each of which forms a main grinding face 32. The main grinding faces 32 here are designed such that they generate depressions 6 in a donor substrate 2. The grinding tool 22 is preferably designed as a rotary grinding tool or as a belt grinding tool.

Diagram 2 of FIG. 11 shows a donor substrate 2 in which depressions 6 have been generated by means of the grinding tool 22. The depressions 6 are preferably spaced apart uniformly from one another in longitudinal direction of the donor wafer 2, although it is also conceivable that the separations are different. In the second diagram in FIG. 2, moreover, modifications 10 are generated in the donor substrate 2 by means of a laser device 46. For that purpose, the laser device 46 emits laser beams 12 that penetrate into the donor substrate 2 via a preferably planar surface 16 of the donor substrate 2 and generate or bring about a modification 10 of the lattice structure of the solid-state body or donor substrate 2 at a focal point 48, especially via a multiphoton excitation. The modification 10 here is preferably a material transformation, especially a conversion of the material to another phase, or a material destruction.

The third diagram shows that a stress generation layer 14 has been generated or disposed on the surface 16, via which the laser beams 12 have been introduced into the donor substrate 2 to generate the modifications 10. The stress generation layer 14 is subjected to thermal stress or temperature control, especially cooling, to generate mechanical stresses in the donor substrate 2. The thermal stress on the stress generation layer 14 results in contraction of the stress generation layer 14, which gives rise to the mechanical stresses in the donor substrate 2. The depressions 6 generated beforehand form notches here, by means of which the mechanical stresses can be guided in such a way that the crack 20 that results from the stresses propagates in a controlled manner in the crack progression region defined by the modifications 10. The ends of the depressions 18 therefore preferably adjoin the respective crack progression region defined by the modifications 10. Preferably, it is always only exactly that solid-state layer 1 of which the depression 6 is at the shortest distance from the stress generation layer 14 that is split off.

The diagram 4 shows a state after crack propagation. The solid-state wafer 1 has split off from the donor substrate 2 and the stress generation layer 14 initially still remains on the surface 16 of the solid-state wafer 1.

Reference numeral 28 indicates which side of the solid-state wafer 1 is identified here as the bottom side of the solid-state wafer 1, and reference numeral 30 which side of the solid-state wafer 1 is identified here as the top side of the solid-state wafer 1.

The diagram 5 shows a method in which detachment of the solid-state layer 1 from the donor substrate 2 is brought about without a stress generation layer 14. In this case, preferably, after the generation of the depression 6, so many modifications 10 are generated by means of laser beams 12 that the solid-state layer 1 becomes detached from the donor substrate 2. The dotted line Z here preferably indicates a center or axis of rotation of the donor substrate 2. The donor substrate 2 is preferably rotatable about the axis of rotation Z.

Figure 12:
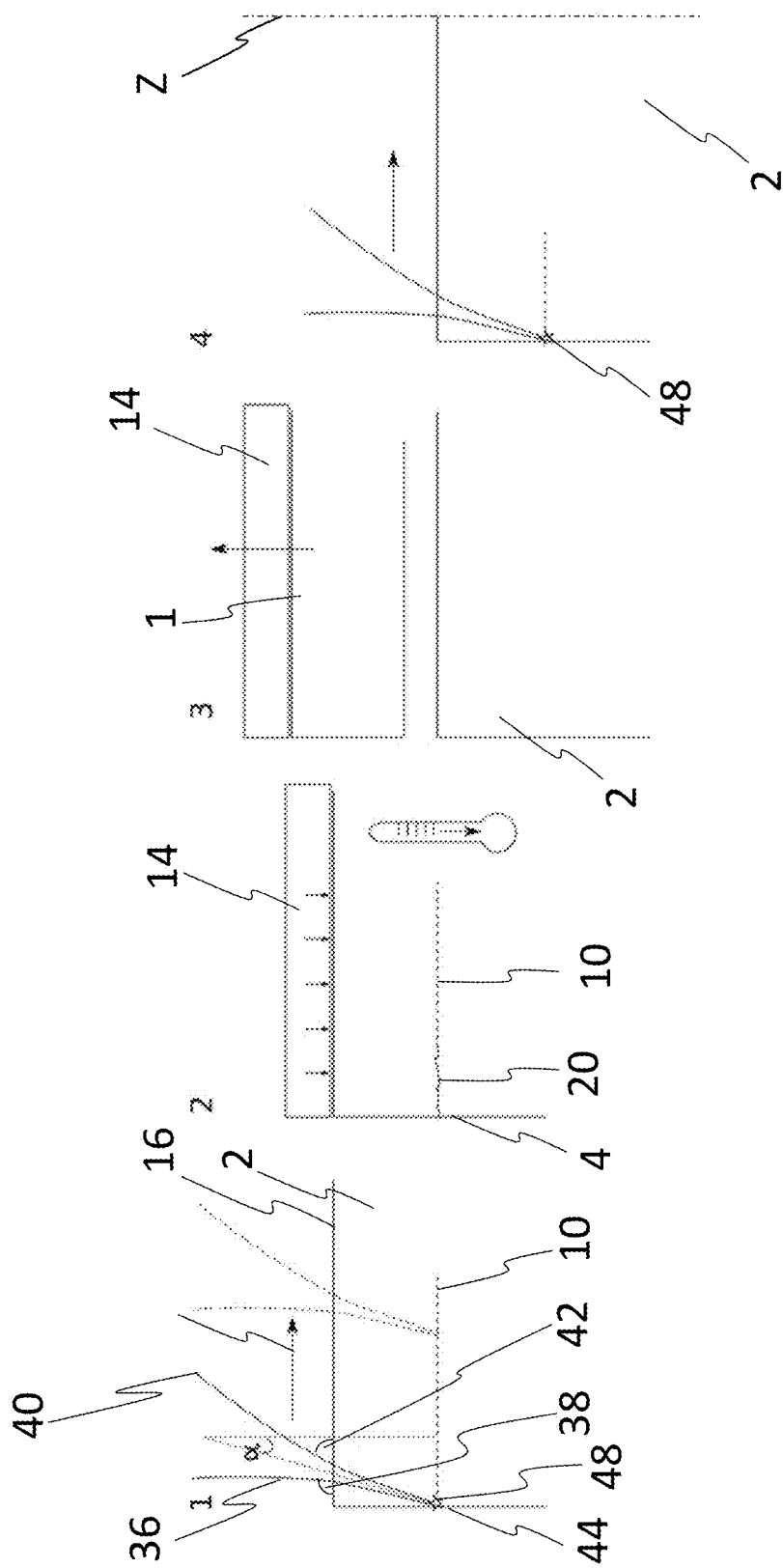

FIG. 12 shows 4 diagrams. The first diagram of FIG. 12 shows a donor substrate 2 which is exposed to laser beams 12. The laser beams 12, in their entirety, are inclined relative to the surface 16 via which the laser beams penetrate into the donor substrate 2 in such a way that the inclination thereof is at a non-90° angle. Preferably, a first component 36 of laser beams 12 is oriented at a first angle 38 relative to the surface 16, and a further component 40 of laser beams 12 is oriented at a second angle 42 relative to the surface 16. The laser beam components 36 and 40 are preferably inclined for generation of all modifications 12 generated for removal of a particular solid-state layer 1 with respect to the surface 16 via which the laser beam components 36, 40 penetrate into the donor substrate 2, preferably always in an identical manner. It can also be inferred from the first diagram of FIG. 4 that the focal point 48 for generating modifications 10, on account of the inclined laser beam components 36, 40, can be conducted within the donor substrate 2 up to the edge 44 or directly up to the edge 44.

It can also be inferred from diagram 2 of FIG. 12 that, according to the laser beam components 36, 40 in an inclined alignment, material-removing treatment of the edge 44 of the donor substrate 2 is required only to a distinctly reduced degree, if at all. The stress generation layer 14 disposed or generated at the surface 16 results in a generation of mechanical stresses in the donor substrate 2, as a result of which, owing to modifications 10 generated up to the edge 44, a crack 20 propagates in a very precisely guided manner from the edge 44 into the donor substrate 2.

Diagram 3 of FIG. 12 shows a solid-state wafer 1 completely split off from the donor substrate 2, wherein the solid-state wafer 1 in this embodiment has preferably not undergone any edge treatment.

Diagram 4 of FIG. 12 indicates it is likewise possible by the generating of modifications 10 by means of laser beams 36, 40 (without a stress generation layer 14) to remove a solid-state wafer 1 from the donor substrate 2.

The present invention thus relates to a method of separating solid-state wafers 1 from a donor substrate 2. This method of the invention comprises the steps of:

providing a donor substrate 2, generating modifications 10 within the donor substrate 2 by means of laser beams 12, wherein the laser beams 12 penetrate into the donor substrate 2 via a planar surface 16 of the donor substrate 2, wherein the entirety of the laser beams 12 is inclined relative to the planar surface 16 of the donor substrate 2 in such a way that a first component 36 of the laser beams 12 penetrates into the donor substrate 2 at a first angle 38 relative to the planar surface 16 of the donor substrate 2 and at least one further component 40 of the laser beams 12 penetrates into the donor substrate 2 at a second angle 42 to the planar surface 16 of the donor substrate 2, wherein the magnitude of the first angle 38 differs from the magnitude of the second angle 42, wherein the first component 36 of the laser beams 12 and the further component 40 of the laser beams 12 are focused to generate the modification 10 in the donor substrate 2, wherein the solid-state wafer 1 becomes detached from the donor substrate 2 as a result of the modifications 10 generated or a stress generation layer 14 is generated or disposed on the planar surface 16 of the donor substrate 2 and thermal stress on the stress generation layer 14 generates mechanical stresses in the donor substrate 2, wherein the mechanical stresses result in a crack 20 for removal of a solid-state layer 1 that propagates along the modifications 10.

Figure 13:
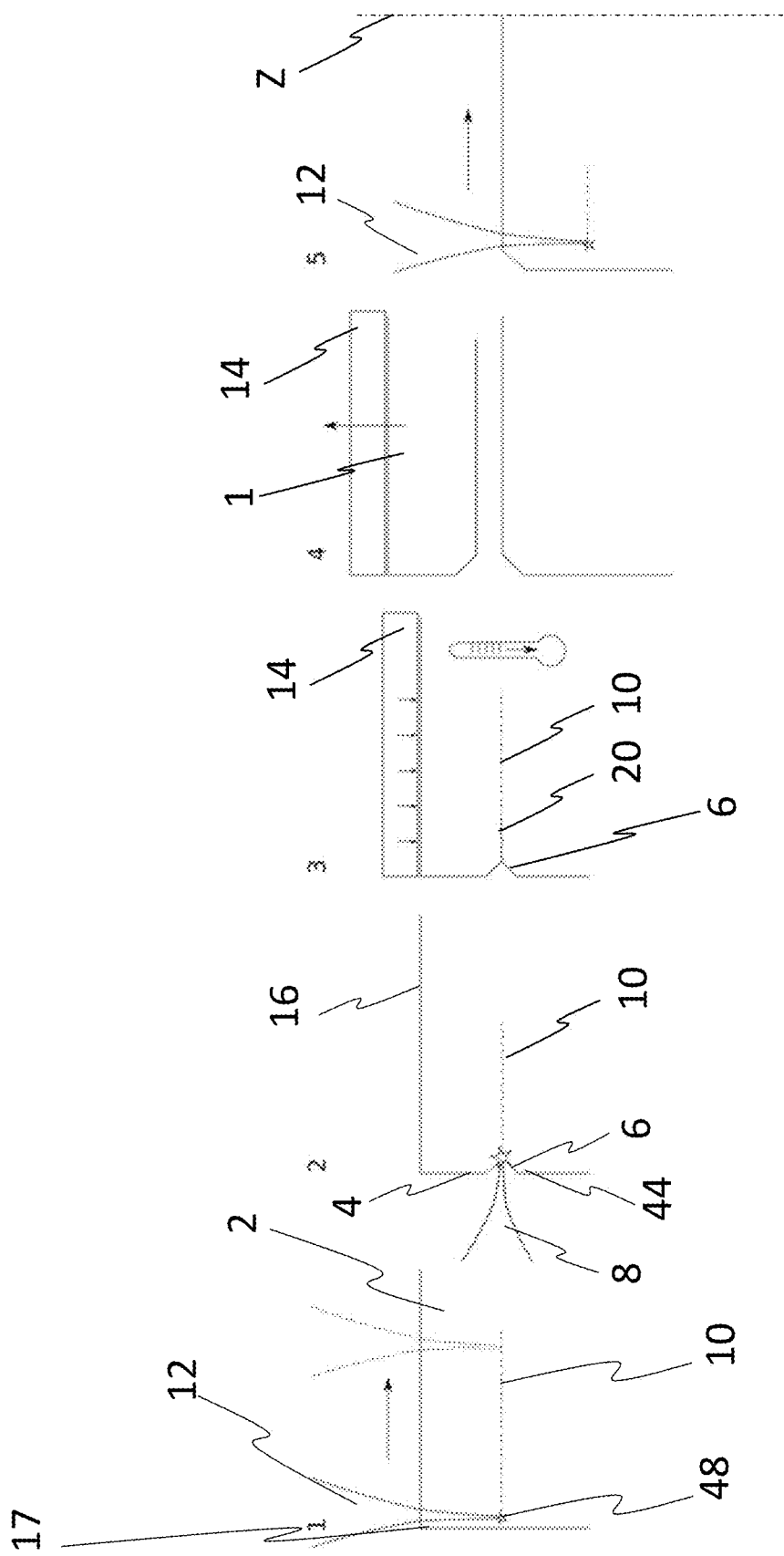

FIG. 13 shows a further variant of the method of the invention. It can be recognized by a comparison of the first and fifth diagrams that the modifications 10 generated by means of the laser beams 12 in the case of a planar surface 16 can be generated closer to the edge 44 than when the edge 17 of the surface 16 is at a distance as shown in the fifth diagram. The laser beams 12 here penetrate into the donor substrate 2 analogously to the generation of modifications elucidated with regard to FIG. 12.

The second diagram in FIG. 13 shows the generation of a depression 6 proceeding from a circumferential surface 4 in the direction of the center Z of the donor substrate 2, wherein the depression is generated by means of ablation laser beams 8 from an ablation laser (not shown). Preferably, the ablation laser beams 8 here evaporate the material of the donor substrate 2 to generate the depression 6.

According to diagram 3 of FIG. 13, the shape of the depression is generated not in an unsymmetric manner but in a symmetric manner. Thus, according to this diagram, a stress generation layer 14 is likewise generated or disposed on the donor substrate 2 and subjected to thermal stress to generate mechanical stresses for triggering a crack 20, especially by means of liquid nitrogen.

Diagram 4 of FIG. 13 shows the solid-state wafer 1 split off from the donor substrate 2, on which the stress generation layer has additionally been disposed.

It can further be inferred from diagram 5 of FIG. 13 that, in the case of a donor substrate 2 whose edge 17 has been processed, the depression 6 to be generated by means of ablation laser beams 8 must extend further in the direction of the center of the donor substrate 2 than if the edge 17 had not been processed. However, it is likewise conceivable here that the depression is generated not by means of ablation laser beams 8 but by means of a grinding tool 22 (as known, for example, from FIG. 1).

Figure 14B:
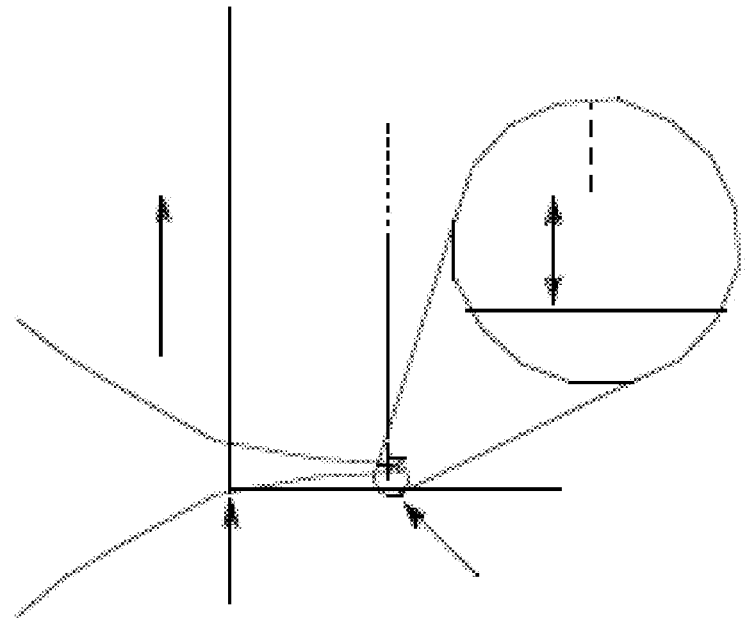
Figure 14A:
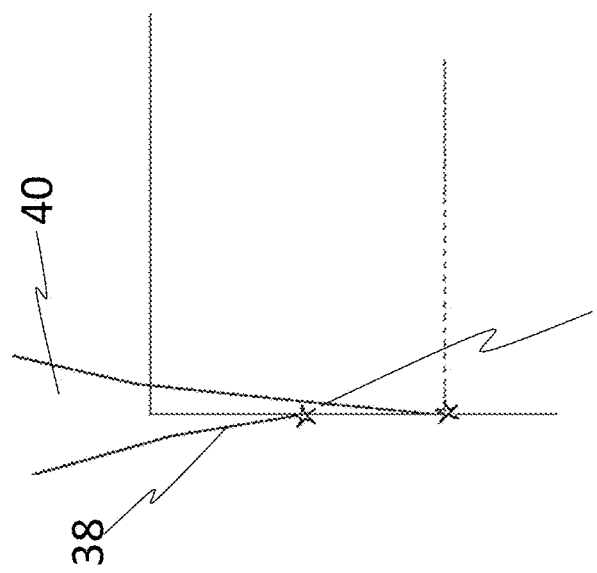

FIGS. 14a and 14b show a problem that occurs in the generation of modifications by means of laser beams 12 in the edge region of the donor substrate 2. As a result of the different refractive indices in the air and in the donor substrate, the laser beam components 38, 40 of a laser beam 12 do not exactly coincide, as a result of which unwanted effects such as the generation of defects at unwanted sites, unwanted local heating or prevention of generation of modifications.

FIG. 14b shows that problem-free generation of modifications 10 is possible only when the modification 10 to be generated is sufficiently far removed from the circumferential surface of the donor substrate 2 that the two laser beam components 38, 40 are each refracted by material having the same refractive index and preferably over the same path length. However, the effect of this is that the generation of modifications, as effected in the region far removed from the edge region, cannot be extended readily to the edge region.

Figure 15:
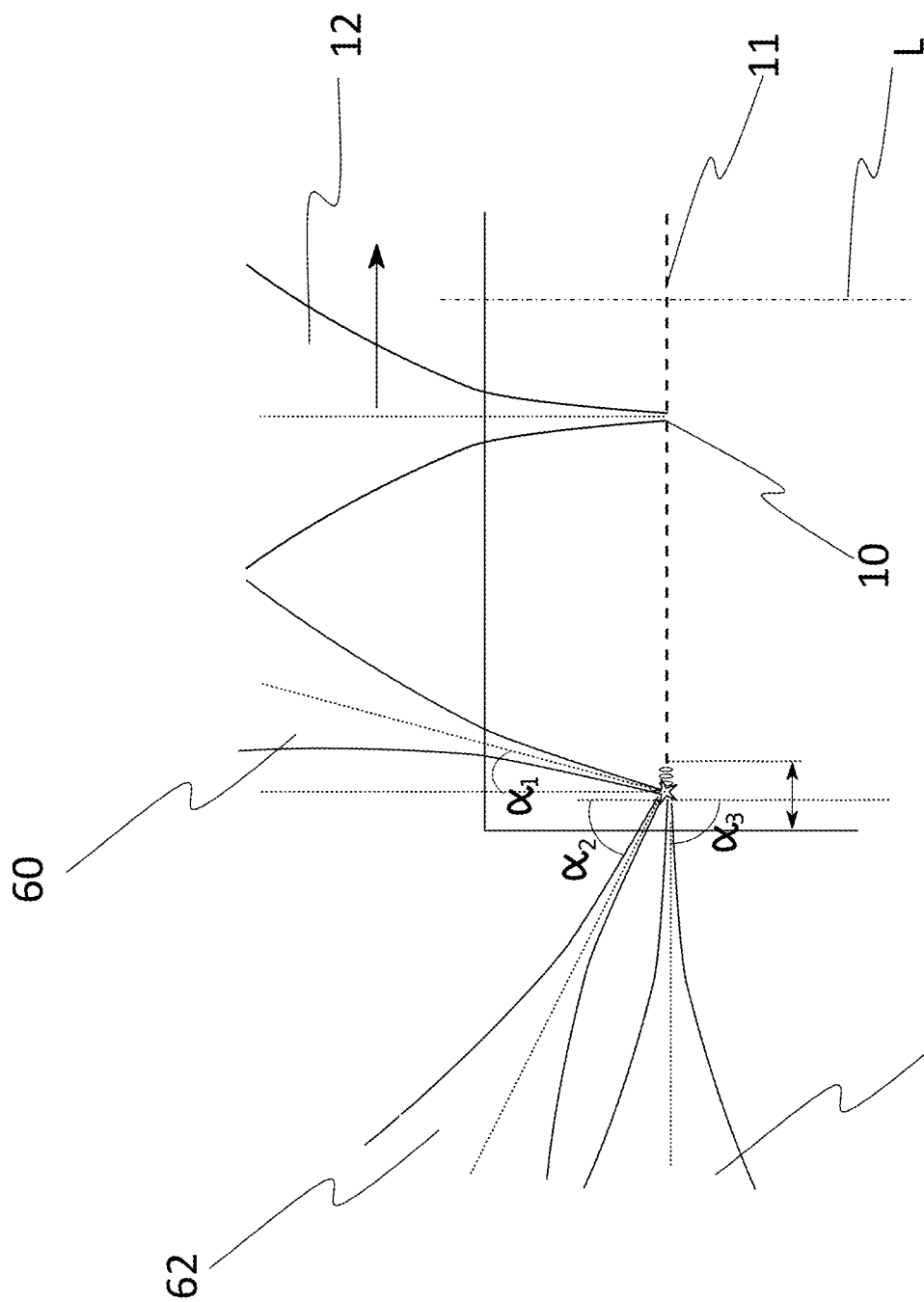

FIG. 15 shows an arrangement in which a laser beam 12 is aligned parallel to the longitudinal axis L. In addition, this diagram additionally or alternatively shows a laser beam 60 inclined at an angle α1 relative to the longitudinal axis L. Both laser beams 12 and 60 can serve here to generate modifications 10 that define a detachment region 11. It is conceivable here that the laser beam 12 uninclined relative to the longitudinal axis L generates a multitude of modifications 10 and, in the edge region, i.e. at a distance of less than 10 mm, especially of less than 5 mm or of less than 2 mm or of less than 1 mm or of less than 0.5 mm, from the circumferential surface (circumference surface), modifications 10 are generated by the laser beam 60 inclined relative to the longitudinal axis L.

Alternatively, it is also conceivable that all modifications 10 in the detachment region or the majority of modifications 10 in the detachment region 11 are generated by the laser beam 60 inclined at an angle α1 relative to the longitudinal axis L.

Additionally or alternatively, in the context of the present invention, the modifications 10 in the edge region may be generated by a further laser beam 62, 64 inclined relative to the longitudinal axis L of the donor substrate 2, where this laser beam preferably penetrates into the donor substrate 2 via a circumferential surface of the donor substrate 2. It can be inferred from the diagram that a laser beam 62 can be introduced into the donor substrate 2 via the circumferential surface to generate the modifications 10 in the edge region, for example at an angle α2 greater than 0° and less than 90° relative to the detachment region 11. In addition, it can be inferred from the diagram that a laser beam 64 can be introduced into the donor substrate 2 via the circumferential surface of the donor substrate 2 to generate the modifications 10 in the direction of extension of the detachment region 11. The laser beam 64 is preferably inclined here at an angle α3 between 80° and 100°, especially 90° are essentially 90°, relative to the longitudinal axis L of the donor substrate 2.

It is thus possible for one of the laser beams 60, 62, 64 to generate modifications 10 in the region of the edge.

In addition, according to the invention, the statements relating to FIG. 12 may be applied or read onto the subject matter shown in FIG. 15.

Figure 16A:
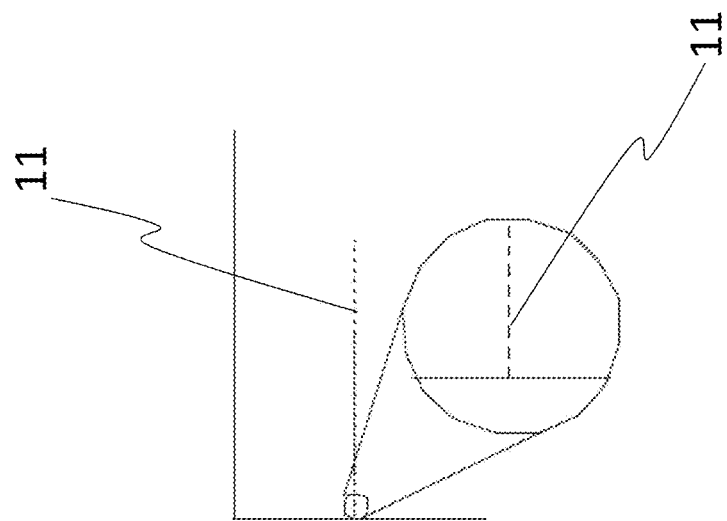

FIG. 16a shows a detachment region 11 generated up to the edge region. In addition, FIG. 16a shows the generation of modifications by means of a laser beam 64. The laser beam 64 preferably generates multiple modifications 10 in radial direction, especially in a line, with increasing distances from the center or an axis of rotation (which preferably extends orthogonally to the planar surface 16 of the donor substrate 2) of the donor wafer 2.

Figure 16B:
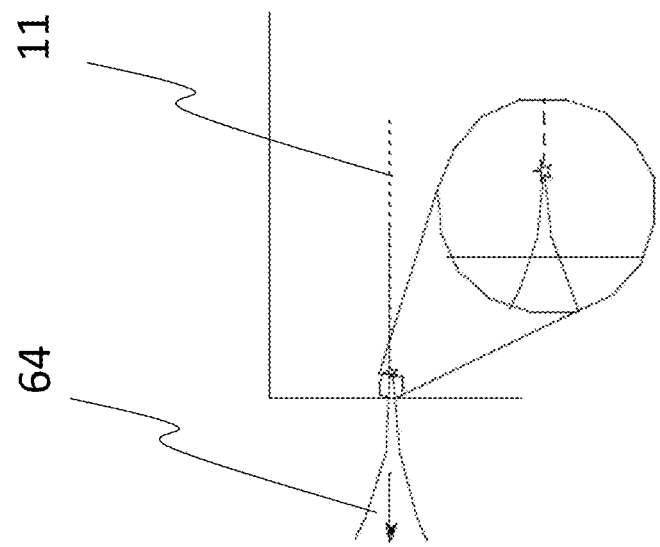

FIG. 16b shows, in schematic form, a state after the generation of the modifications 10. In this diagram, the detachment region 11 takes the form of a modification layer that extends entirely within the donor wafer 2.

FIGS. 17a and 17b show two variants for generation of modifications 10 by means of laser beams introduced via the circumferential surface.

According to FIG. 17a, a multitude of modifications 10 is generated via the same introduction site through which the laser beams 64 penetrate into the donor substrate 2. The laser beams are focused into the donor substrate 2 at different depths in radial direction to generate the modifications 10. Preferably, the modifications 10 are generated with decreasing penetration depth of the laser beams or with decreasing distance of the focal point from the penetration site.

FIG. 17b shows the generation of modifications in the manner of filaments. The modifications 10 generated in the form of filaments are longer than a multiple of, especially, for example, 10 times, 20 times or 50 times, their cross-sectional extent.

Figure 18:
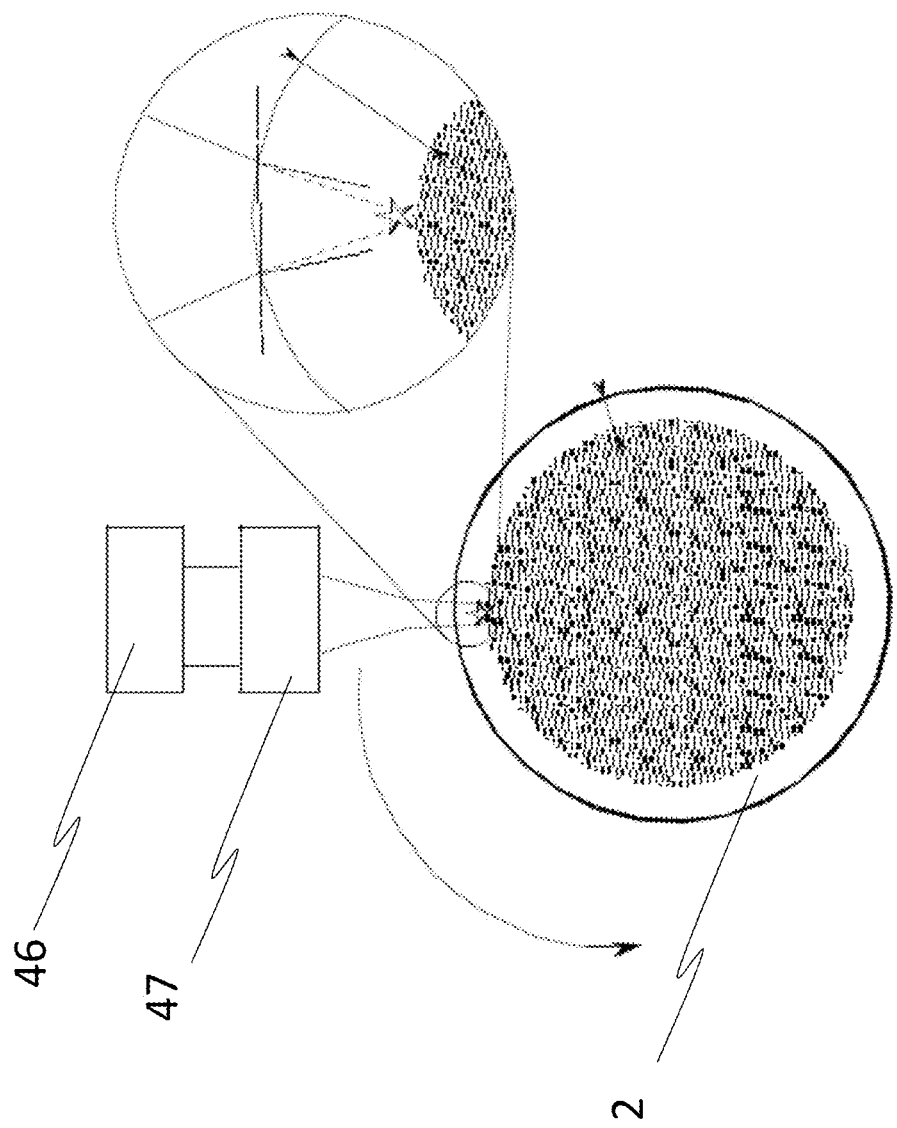

FIG. 18 shows a laser device 46, an aberration means 47 and a section diagram of a donor substrate 2. The detail diagram of FIG. 18 shows the laser beam 12 penetrating into the donor wafer 2 via the curved circumferential surface of the donor wafer 2, wherein the dotted lines shown show the beam progression adjusted by the aberration means 47.

The present invention thus relates to a method of separating solid-state wafers 1 from a donor substrate 2. This method of the invention comprises the steps of: providing a donor substrate 2, generating at least one modification 10 within the donor substrate 2 by means of a laser beam 12, wherein the laser beam 12 penetrates into the donor substrate 2 via a planar surface 16 of the donor substrate 2, wherein the laser beam 12 is inclined relative to the planar surface 16 of the donor substrate 2 such that it penetrates into the donor substrate at a non-0° and non-180° angle relative to the longitudinal axis of the donor substrate, wherein the laser beam 12 is focused to generate the modification 10 in the donor substrate 2, wherein the solid-state wafer 1 becomes detached from the donor substrate 2 by the modifications 10 generated or a stress generation layer 14 is generated or disposed on the planar surface 16 of the donor substrate 2 and thermal stress on the stress generation layer 14 generates mechanical stresses in the donor substrate 2, wherein the mechanical stresses result in a crack 20 for removal of a solid-state layer 1 that propagates along the modifications 10.

Figure 19:
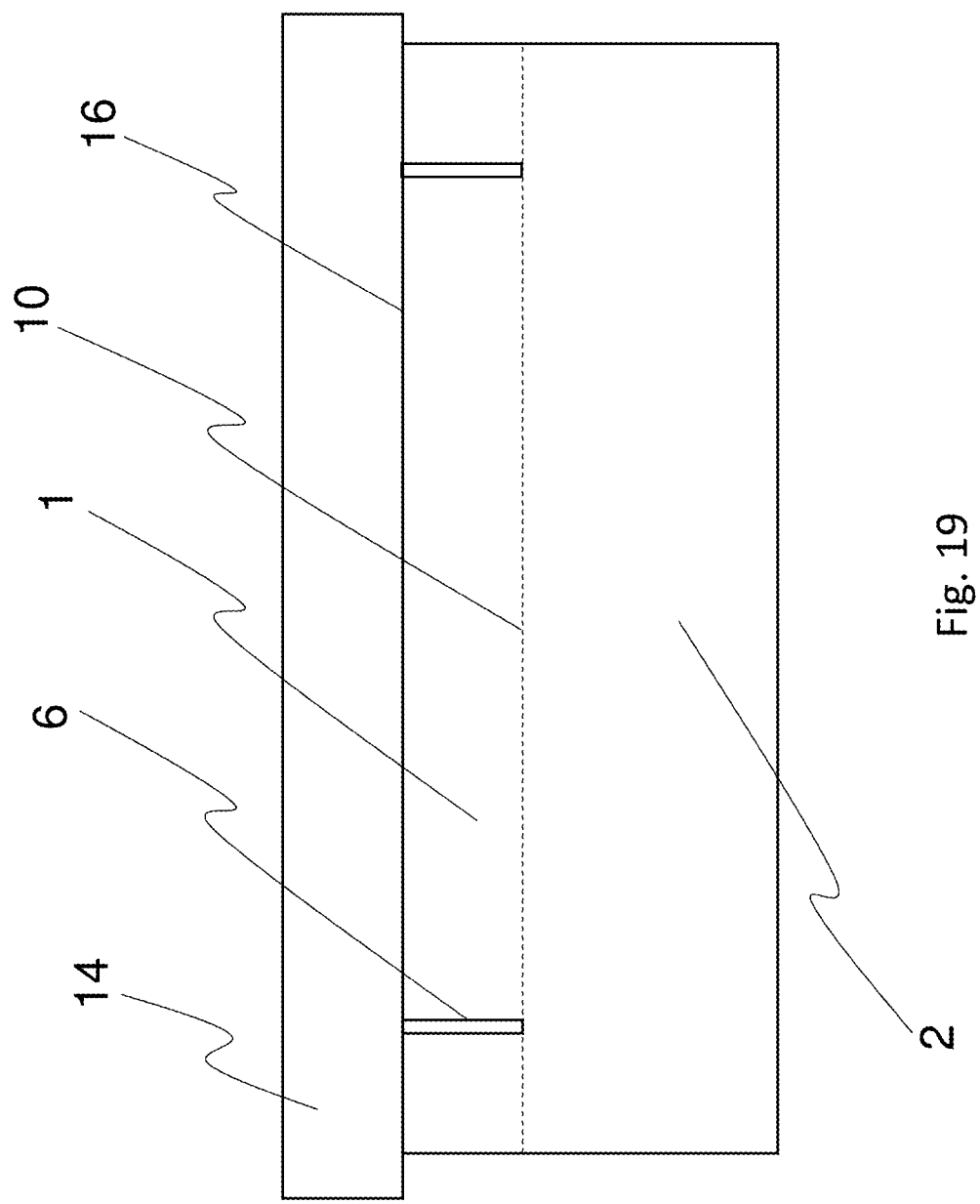

FIG. 19 shows, in schematic form, an arrangement in which the stress generation layer 14 preferably overlaps or covers or closes at least one depression 6, especially recess or trench, that preferably extends proceeding from a planar or essentially planar surface 16 in the direction of a further surface of the solid-state body 2 which is preferably parallel to the planar surface 16.

The stress generation layer 14 is preferably generated as a polymer layer or is generated as a layer that consists of at least one polymer material in predominant proportions by mass and/or volume. The surface 16 on which the stress generation layer 14 is disposed preferably includes treated components. Treated components are preferably understood here to mean components in which material has been removed. Preferably, depression(s), especially recesses 6 and/or trenches 6, extend proceeding from the surface 16 on which the stress generation layer 14 is disposed and which preferably extends essentially or completely parallel to a crack progression layer formed from modifications 10, preferably orthogonally to the surface and/or to the crack progression layer. It is alternatively conceivable here that just one depression 6, especially a trench and/or a recess, has been generated and/or formed by means of material removal. The material removal is preferably brought about prior to the generation or disposing of the stress generation layer 14 on the surface 16, especially by means of laser ablation. The stress generation layer 14, in the state of coupling or bonding to the solid-state body 2, covers the depression(s) 6, especially the trench(es) or the recess(es).

Preferably, there is no further coating, especially no further application of material, between the generation of the depression 6, especially the recess and/or the trench, and the disposing of the stress generation layer. This is advantageous since material could otherwise collect in the recess/trench.

Preferably, the stress generation layer is disposed by means of a plasma lamination process. This is advantageous since it is thus possible to generate a connection between the solid-state body 1, especially the main surface 16 of the later solid-state layer 1, and the stress generation layer 14 over the depression 6, especially recess/trench. The connection is preferably a laminating or adhesive bonding operation. This is preferably implemented using cold plasma.

Additionally or alternatively, according to the invention, a "spontaneous split" with a laser plane or crack progression plane generated beforehand and depth modification can be brought about by a material removal step, especially laser ablation. This is preferably brought about without a stress generation layer 14.

The stress generation layer 14 can also be referred to as stressor layer, especially as self-supporting stressor layer.

It has also been recognized in accordance with the invention that a self-supporting stressor layer is crucially technically advantageous over a vapor-deposited stressor layer or one applied by deposition in some other way since such stressor layers can firstly be produced in greater volume in simpler methods in specialized plants with higher throughput and can secondly be used in lamination processes that likewise allow higher processing rates. In addition, self-supporting stressor layers can also be detached again from the substrate with a low level of difficulty after lamination processes, which, for example, also allows reuse, i.e. of the stressor layer or the stress generation layer, which is impossible with deposited layers.

It is particularly advantageous that lamination processes can also be implemented without adhesive bonding methods or the like purely by a surface activation, surface treatment or surface modification of the substrate. Thus, coupling or connection of the stress generation layer to the solid-state body, especially to the surface 16 of the later solid-state layer 1, is more preferably effected by a surface activation and/or surface treatment and/or surface modification of the solid-state body or surface 16 of the later solid-state layer 1.

For example, the surface can preferably be activated by contact with ozone generated especially in a chamber and/or by ultraviolet light of a particular wavelength and/or by plasma methods with different species formed on the surface of the substrate and/or the stressor layer and/or in the process gas, especially free-radical aldehyde and alcohol species. Preference is given here especially to hot plasma methods in which high temperatures are employed in order to generate free charge carriers and free radicals in the plasma, which allows different reaction pathways and chemical surface reactions than at lower temperatures for the subsequent reactions at the surfaces of substrate and stressor layer. The surface modification mechanism may thus differ depending on temperature, and likewise between different substrates; for example, in the case of SiC as opposed to Si, the carbon atoms involved may form different surface species in the plasma treatment that can likewise have an adhesion-promoting effect in the lamination process.

Alternatively, the use of a cold plasma process is possible, in which a plasma is generated not by thermionic emission and via hot tungsten filaments or similar methods but by means of piezoelectric transformers at atmospheric pressure and preferably without elevated temperatures. These lower temperatures reduce and/or likewise alter the reaction pathways available for surface activations and surface modifications for promotion of adhesion in lamination processes, both on the substrate or solid-state body and on the stressor layer. The resultant surface species thus depend on a multitude of parameters and the surface activation method in particular.

The surface treatment or modification comprises, for example, the exposure of the surface to be treated, at least in sections, by a corona treatment and/or by a flame treatment and/or by a treatment by means of electrical barrier discharge and/or by fluorination and/or by ozonization and/or by excimer irradiation and/or by a treatment with a plasma, wherein preferably individual or multiple physical parameters, such as the nature of the plasma, the track pitch in the plasma treatment, the type of nozzle, the nozzle separation and/or the duration of plasma treatment, are varied or variable.

Preferably, a plasma pretreatment or plasma treatment is employed both for purification and subsequently for homogenization of the surface species (e.g. hydrophobization inter alia).

By means of a controlled individual plasma treatment, spatially resolved variation of the surface activation can be generated or established, which then allows lamination of the stressor layer—likewise with locally variable properties if desired.

The process of plasma surface activation or plasma surface treatment permits a greater degree of influence in order to apply the desired differentiated adhesion or force transmission after the lamination of the stressor layer on the substrate also to large areas in a defined symmetric or else asymmetric form. It is possible here by process variation to establish altered adhesion or cohesion in a controlled manner, especially locally. Depending on the starting properties of the different solid-state materials, especially semiconductor materials, it is possible to apply layers and/or, by means of further process gases (oxygen inter alia) in proportions, to modify the desired added layer(s), especially sacrificial layers or substrate and/or stressor layer surfaces, in a controlled manner (hydrophobically, hydrophilically, wetting etc.). This leads to spatially resolved adjusted degrees of adhesion or spatially resolved adapted or adjusted force transmission connection, even in lamination processes, which, compared to the by adhesive bonding and deposition solutions for the stressor layer, only homogeneous and not locally resolved.

As already described, different physical parameters may be used during the plasma treatment (for example nature of the plasma, track pitch in the plasma treatment, type of nozzle, nozzle separation, duration of plasma treatment). In addition to these influencing parameters, controlled mixing of process gases in proportions, for example nitrogen, oxygen, hydrogen, SiH4, Si(EtO)4 or Me3SiOSiMe3 (inter alia), can bring about a greater range of the necessary surface properties. These preferably result from new chemical surface species that are deposited on the semiconductor surface and/or the subsequent sacrificial layers and/or the stressor layer and also enable different formation of surface functionality and lamination process properties. This leads to the desired target profiles, for example different spatially resolved adhesion and cohesion properties, of the semiconductor surfaces and/or the subsequent stressor layers and/or other layers.

A corona treatment is an electrical method of surface treatment or modification of plastics. This involves exposure of the surface to an electrical high-voltage discharge. A corona treatment is used, for example, to promote adhesion in plastics, films inter alia (PE, PP).

In a flame treatment, it is near-surface oxidation of the respective compounds in particular that is manifested. Essentially oxidation processes take place, by which, according to the material and experimental conditions, different polar functional groups are formed (e.g. oxides, alcohols, aldehydes, carboxylic acids, esters, ethers, peroxides).

A treatment by dielectric barrier discharge (DBD, AC voltage gas discharge) is similar to a low-temperature plasma or a glow discharge (e.g. GDMS). In DBD treatment, the surface is subjected to uni- or bipolar pulses with pulse durations of a few microseconds down to a few tens of nanoseconds and amplitudes in the single-digit kilovolt range. Dielectric barrier discharge is advantageous since no metallic electrodes are to be expected here in the discharge space, and hence no metallic impurities or electrode wear.

Further advantages of dielectric barrier discharge, according to the application, may be, for example, that it has high efficiency since no charge carriers must exit from or into the electrodes (absence of cathode drop, no thermionic emission necessary) or that the dielectric surfaces can be modified and chemically activated at low temperatures. The surface modification is preferably effected here by an interaction and reaction of the surface species by an ion bombardment and the action of the ultraviolet radiation on the surface species (e.g. 80 nm-350 nm, incoherent light UV and VUV, by high-performance high-frequency generators). Dielectric barrier discharge is employed, for example, for in situ generation of ozone in drinking water/wastewater treatment, wherein the ozone ozonizes the water. Analogously, in a surface treatment or modification of the invention by means of ozonization, the surface to be treated is exposed to ozone.

Surface treatment or modification by means of halogenation, especially fluorination, has the effect of converting an element or a compound to a halide. The fluorination thus introduces fluorine into preferably organic compounds with the aid of fluorinating agents.

A surface treatment or modification by means of a UV treatment is preferably effected by an excimer irradiation or by ultraviolet light-emitting diode sources, for example based on aluminum nitride. An excimer irradiation is effected by the use of at least one excimer laser. Excimer lasers are gas lasers that can generate electromagnetic radiation in the ultraviolet wavelength range. A gas discharge that takes place here is thus caused by a high-frequency electromagnetic field. Therefore, there is also no need for any electrodes in the gas discharge. The UV radiation generated is preferably within a wavelength range between 120 nm and 380 nm.

Figure 20:
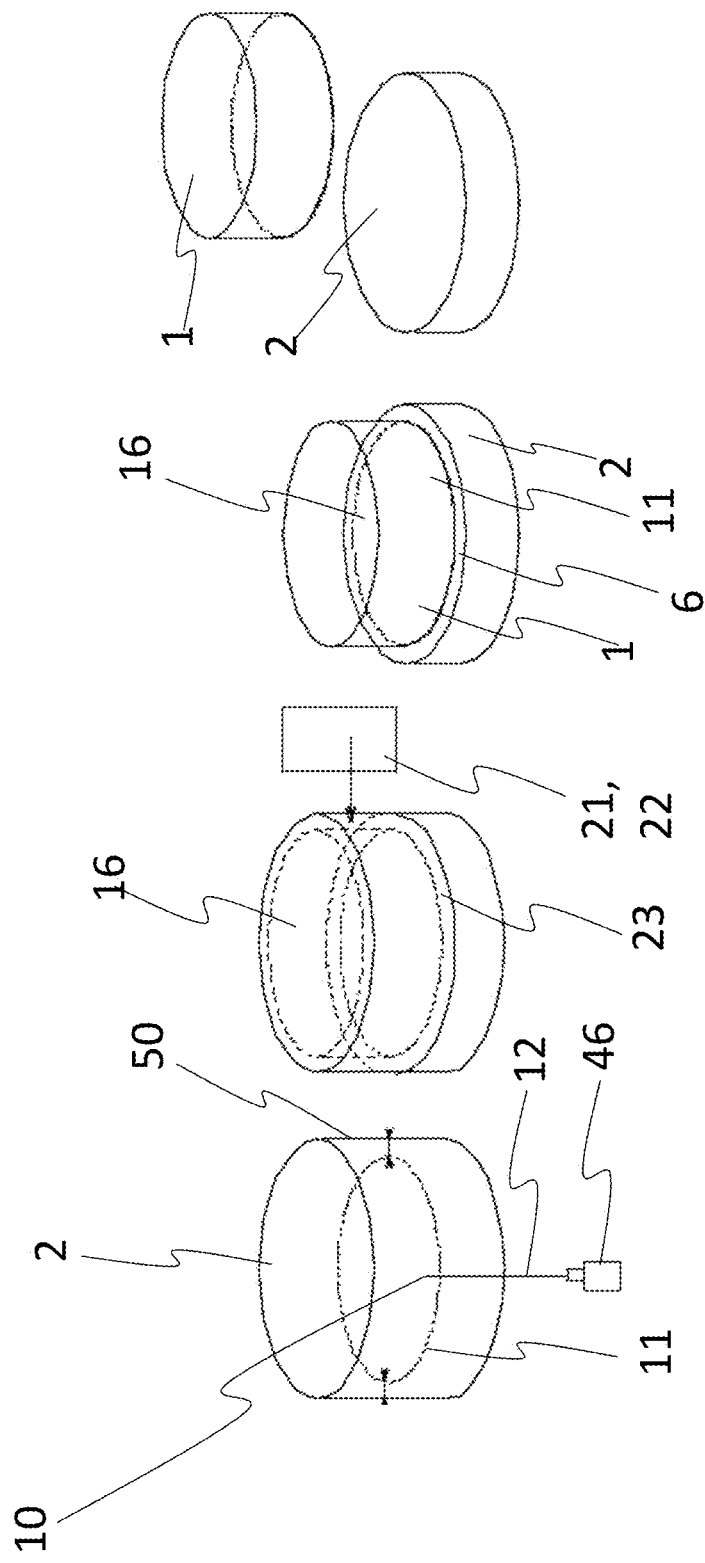

FIG. 20a shows an additional or alternative solution of the invention for separating solid-state layers 1 or solid-state slices 1 from a donor substrate 2. According to FIG. 20a, a detachment region 11 is generated within the donor substrate 2. The modifications 10 here are preferably spaced apart from a circumferential boundary face 50 of the donor substrate 2. The modifications 10 are preferably generated analogously to diagram 2 of FIG. 11. It is conceivable here that the laser beams 12 are introduced into the donor substrate 2 from the top, i.e. via the surface 16, or are introduced into the donor substrate 2 from the bottom, with "at the bottom" on the opposite side from "at the top". Preference is therefore given to laser exposure "from the bottom" via a surface of the solid-state body or donor substrate which is preferably parallel or at least essentially parallel to the surface 16. In the case of irradiation "from the bottom", the pathway of the laser beams to the modification generation site is preferably longer than the pathway from the modification generation site to the surface 16. Of course, it is also possible to rotate the solid-state body, i.e., for example, rotate it by 180° about a horizontal axis, and then introduce the modifications via the surface parallel to surface 16. Since, in this case, the modifications generated are preferably still generated closer to the surface 16, this variant corresponds to the generation of modifications or defects in the "from the bottom" variant.

FIG. 20b shows, in schematic form, the processing of the donor substrate 2 by means of an ablation tool 22, especially a tool for material-removing processing of the donor substrate 2, such as a grinding tool 22. The processing removes material at least in sections in the circumferential direction of the donor substrate 2 over the entire region between the detachment region and a surface of the donor substrate 2 which is preferably spaced apart homogeneously, especially parallel, to the detachment region for reducing the radial extent of the donor substrate 2. The material is preferably annularized, especially with a constant or essentially constant radial extent.

FIG. 20c shows an example of a state after the removal of the material. It is conceivable here, for example, that the material is removed in the axial direction of the donor substrate 2 down to the detachment plane or beneath or above it.

FIG. 20d shows a state after the removal or detachment of the solid-state layer 1 from the donor substrate 2.

The method according to the present invention may comprise one or more or all of the following steps:

moving the solid-state body relative to a laser exposure device, successively generating a multitude of laser beams by means of the laser exposure device for generating at least one modification in each case, wherein the laser exposure device is adjusted for defined focusing of the laser beams and/or for adjustment of the laser energy, especially continuously, depending on at least one parameter, especially on a multitude of parameters.

The laser beam preferably penetrates into the donor substrate via a planar surface of the donor substrate. The laser beam is preferably inclined relative to the surface, especially the planar surface, of the donor substrate or solid-state body in such a way that it penetrates into the donor substrate at a non-0° or non-180° angle relative to the longitudinal axis of the donor substrate. The laser beam is preferably focused to generate the modification in the donor substrate.

The solid-state body preferably has crystal lattice planes inclined relative to a planar main surface, where the main surface of the solid-state body firstly bounded in longitudinal direction of the solid-state body, where a crystal lattice plane normal relative to a main surface normal is inclined in a first direction, where the modifications are changes in the material property of the donor substrate. The change in the material property, by changing the site of penetration of the laser radiation, forms a linear design at least in sections in the solid-state body, where the linear design may take the form of a dotted line, dashed line or solid line. Preferably, the linear design or multiple linear designs or all or the multitude of linear designs have a length of more than 1 mm or of more than 5 mm or of more than 10 mm or of more than 20 mm or of more than 30 mm or a length of up to 1 mm or of up to 5 mm or of up to 10 mm or of up to 20 mm or of up to 30 mm or of up to 50 mm or of up to 100 mm. The changes in the material property are preferably generated in the generation plane, especially in at least one generation plane or in exactly one generation plane, or in a or the detachment region. The crystal lattice planes of the solid-state body are preferably in an inclined alignment relative to the generation plane or detachment region. The linear design is preferably inclined relative to a cutting line that arises at the point of intersection between the generation plane or the detachment region and the crystal lattice plane.

The changed material property results in tearing of the solid-state body preferably in the form of subcritical cracks. Furthermore, the solid-state layer is preferably removed by introducing an external force into the donor substrate to connect the subcritical cracks, or so much material in the generation plane or in the detachment region is changed by means of the laser radiation that the solid-state layer becomes detached from the donor substrate with connection of the subcritical cracks.

Figure 21:
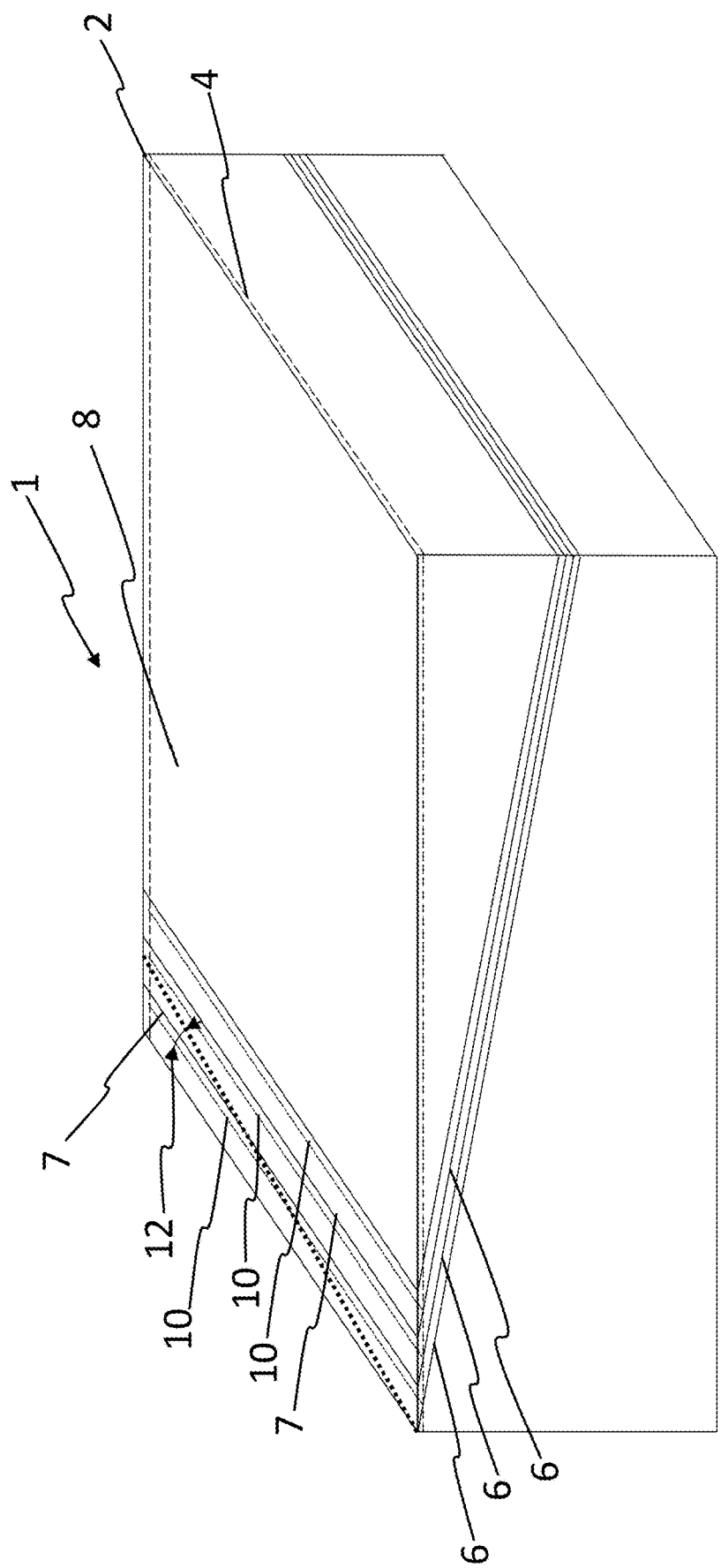

FIG. 21 shows in schematic form that laser radiation 14 (cf. FIG. 27c) from a laser is introduced via a main surface 8 into the interior of the solid-state body 1 to alter the material properties of the solid-state body 1 in the region of at least one laser focus, where the laser focus is formed by the laser beams from the laser emitted by the laser. The change in the material property, by changing the site of penetration of the laser radiation into the donor substrate 1, forms a linear design 103, where the changes in the material property are generated in at least one, preferably the same, generation plane 4. The crystal lattice planes 6 of the donor substrate 1 are inclined here relative to the generation plane 4, especially at an angle between 3° and 9°, preferably of 4° or 8°. The linear design 103 or writing line here is inclined with respect to a cutting line 10 that arises at the interface between the generation plane 4 and the crystal lattice plane 6. The changed material property results in tearing of the donor substrate 1 in the form of subcritical cracks. A step of removing the solid-state layer 2 by introducing an external force into the donor substrate 1 to connect the subcritical cracks is not shown here. Alternatively, a sufficient amount of material in the generation plane 4 can be altered by means of the laser radiation in such a way that the solid-state layer 2 becomes detached from the donor substrate 1 with connection of the subcritical cracks.

The processing takes place in the form of generation of linear designs 103 or writing lines or lines that are formed by setting individual laser shots at a defined distance.

Specifically, for example, the production of a wafer of silicon carbide of the 4H polytype with a 0001 surface with/without doping with an off-angle in the crystal axis of >0° (the industry standard being 4° or 8°—about the direction of a main axis) is possible. Since the slip plane of the hexagonal crystal structure runs parallel to the 0001 plane, the result is a straight line in the 0001 crystal plane intersecting with the wafer surface since it is inclined off-angle relative thereto.

The basic consideration for this novel method is thus that the processing direction of the laser lines 103 differs from the direction of these straight intersecting lines. The processing direction should preferably likewise not run in one of the main crystal directions or along the straight lines of the preferred slip plane of the crystal intersecting with the surface of the crystal.

In addition, for example, the production of a wafer from silicon carbide of the 4H polytype is possible. Silicon carbide of the 4H polytype has a hexagonal crystal system with a wurtzite structure and sixfold symmetry in the 0001 plane. Accordingly, there is a new main axis of the crystal every 60°. When the surface through which the working laser penetrates the piece of material to be processed has been cut in the 0001 plane, the sixfold symmetry recurs on rotation about the surface normal. The result is then a line writing direction that rotates by 30° relative to the respective main axes and hence is oriented between two main axes. In this way, it is ensured that the written line crosses the unit cells of the crystal if at all possible and it is more difficult for cracks that encompass larger regions and affect multiple unit cells at once to form. Silicon carbide of the 4H polytype is often cut at an off-angle of 4° relative to the 0001 plane in order to simplify epitaxy steps in later processing. It is found here that the projection of the main axes of the crystal relative to one another is still virtually at 60° relative to one another, and therefore 30°+/−3° is the preferred writing angle for the processing of the invention.

In addition, for example, the production of a wafer from cubic SiC (called 3C) is possible. Cubic SiC behaves like cubic crystal systems, i.e. has the 111 plane as the preferred slip plane, which results in a preferred line writing direction of 22.5°+/−3°.

Moreover, for example, the production of a wafer from silicon with a 100 surface with/without doping with an off-angle of the crystal axis of 0° is possible.

The preferred slip plane for the silicon with its cubic structure (diamond structure) is the 111 plane which intersects with the wafer surface at a 45° angle to the main crystal axes. This therefore results in a target line writing angle of 22.5°+/−3° relative to the main axes of the crystal and the line of intersection of the slip plane with the wafer surface, which are oriented at an angle of 45° to one another.

Since silicon substrates can also be cut with an off-angle, a different processing angle again may be preferred here. In the case of tilting about a main axis by an angle α, the symmetry at the surface of the substrate is broken from a 4-fold to a 2-fold symmetry by the tilting. The projected length of the main axis about which there is no tilting is then scaled in proportion with cos(a), which leads to a change in the ideal angle between the main axes and line of intersection of the slip plane with the surface. The two line writing angles b that are then possible owing to the breaking of symmetry are then either b1=tan−1(cos a)/2 or b2=tan−1(1/cos a)/2.

For gallium nitride with a hexagonal wurtzite structure having 6-fold crystal symmetry in the 0001 plane, the preferred slip plane of which is the 0001 plane, the result of the angle of 60° for the main axes of the crystal that follows therefrom is a preferred line direction of 30°+/−3° relative to the main axes.

For sapphire or aluminum oxide with a hexagonal corundum structure with 6-fold crystal symmetry in the 0001 plane, the angle of 60° for the main axes of the crystal that follows therefrom results in a preferred line direction of 30°+/−3° relative to the main axes for what is called C-plane sapphire.

For sapphire cut in the A plane, the main axis orientation is at a 90° angle, with 180° symmetry, which results in a preferred line writing angle of 45°+/−3°.

C-plane substrates of sapphire are cut in such a way that sixfold symmetry is exhibited at the surface and the surface corresponds to the slip plane, i.e. an angle of 30°+/−3° is preferred.

For sapphire cut in the M plane, the main axis orientation is at a 90° angle, with 180° symmetry, which results in a preferred line writing angle of 45°+/−3°.

R-plane sapphire has no rotational symmetry, but has main axis projections at 45° to the projection line of the slip plane, and therefore a writing direction of 22.5°+/−3° is preferred here too.

For lithium tantalate with a triclinic structure related to the hexagonal crystal system, depending on the orientation of the substrate, a writing direction between 10°+/−3° and 45°+/−3° relative to the individual main axes and their projection into the substrate surface is found.

For gallium arsenide with a zincblende structure having 4-fold crystal symmetry in the 100 plane, the preferred slip plane of which is the 111 plane, the result of the angle of 90° for the main axes of the crystal that follows therefrom is a preferred line direction of 22.5°+/−3° relative to the main axes of the substrate or donor substrate 1 with a 100 surface.

For gallium oxide with a monoclinic cubic structure having 4-fold crystal symmetry in the 100 plane, the preferred slip plane of which is the 111 plane, the result of the angle of 90° for the main axes of the crystal that follows therefrom is a preferred line direction of 22.5°+/−3° relative to the main axes of the substrate with a 100 surface.

For germanium with a diamond structure having 4-fold crystal symmetry in the 100 plane, the preferred slip plane of which is the 111 plane, the result of the angle of 90° for the main axes of the crystal that follows therefrom is a preferred line direction of 22.5°+/−3° relative to the main axes of the substrate with a 100 surface.

For indium phosphide with a zincblende structure having 4-fold crystal symmetry in the 100 plane, the preferred slip plane of which is the 111 plane, the result of the angle of 90° for the main axes of the crystal that follows therefrom is a preferred line direction of 22.5°+/−3° relative to the main axes of the substrate with a 100 surface.

For yttrium aluminum garnet with a cubic structure having 4-fold crystal symmetry in the 100 plane, the preferred slip plane of which is the 111 plane, the result of the angle of 90° for the main axes of the crystal that follows therefrom is a preferred line direction of 22.5°+1-3° relative to the main axes of the substrate with a 100 surface.

Figure 22:
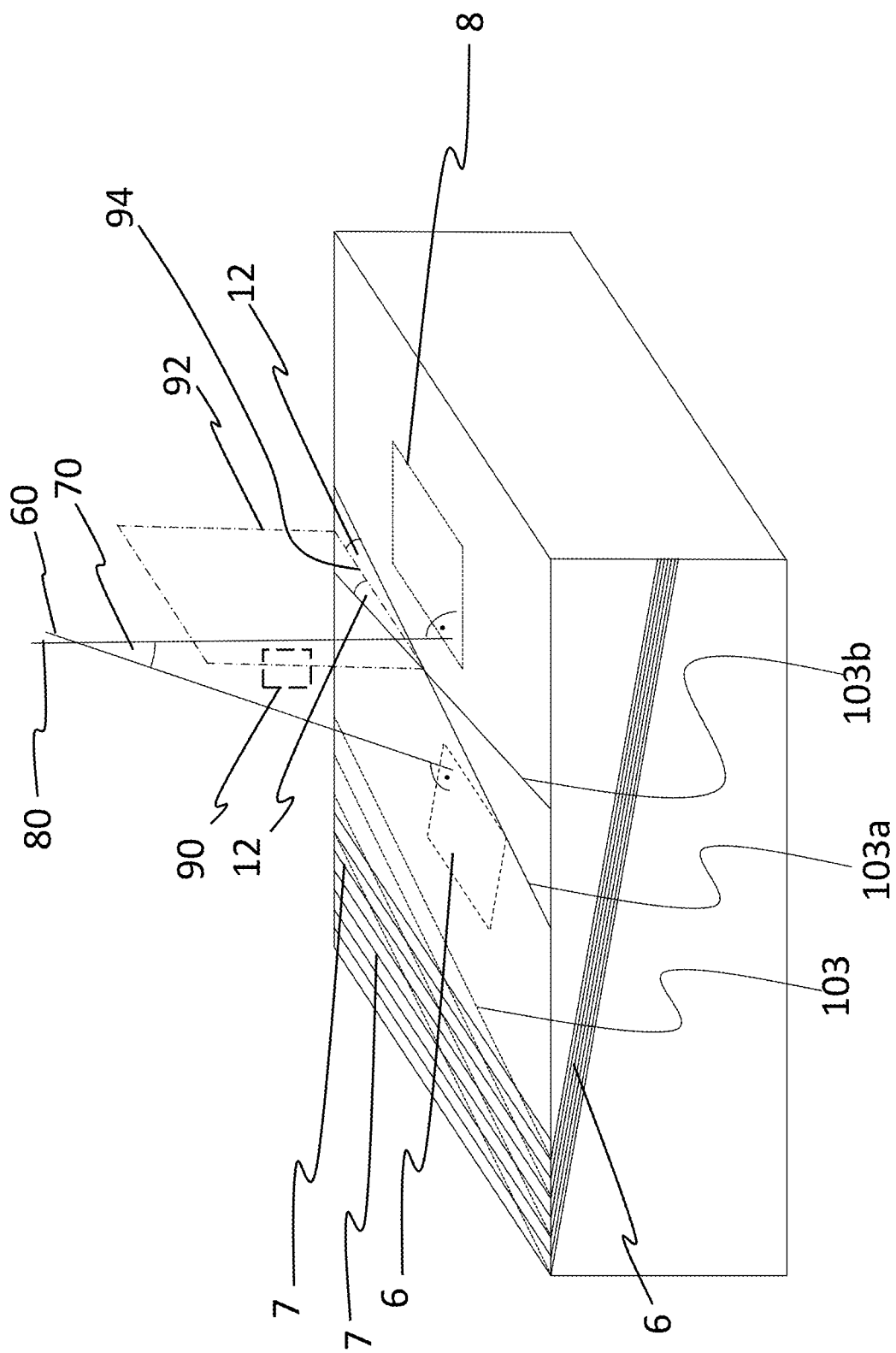

FIG. 22 shows an essential step of the method of the invention for separating at least one solid-state layer 2 from a donor substrate 1 and a geometric derivation of the alignment of the writing line 103 or the alignment of the linear design.

According to this diagram, the method of the invention may also or alternatively comprise the following steps:

providing the donor substrate 1, wherein the donor substrate 1 has crystal lattice planes 6 inclined relative to a planar main surface 8, wherein the main surface 8 delimits the donor substrate 1 in longitudinal direction L of the donor substrate 1 on the one hand, wherein a crystal lattice plane normal 60 is inclined in a first direction relative to a main surface normal 80, providing at least one laser 29, introducing laser radiation 14 from the laser into the interior of the solid-state body or donor substrate 1 via the main surface 8 to change the material properties of the solid-state body in the region of at least one laser focus, wherein the laser focus is formed by laser beams from the laser emitted by the laser, wherein the change in the material property by changing the site of penetration of the laser radiation into the donor substrate 1 forms a linear design, wherein the linear design preferably runs in a rectilinear manner at least in sections and wherein the linear design, especially at least the section that extends in a rectilinear manner, is generated parallel to the main surface 8 and extends in a second direction inclined at a non-90° angle relative to the first direction, wherein the changed material property results in tearing of the donor substrate 1 in the form of subcritical cracks, removing the solid-state layer by introducing an external force into the donor substrate to connect the subcritical cracks or changing so much material in the generation plane by means of the laser radiation that the solid-state layer becomes detached from the donor substrate with connection of the subcritical cracks. The main surface here is preferably part of the solid-state layer 2 removed.

The second direction here is preferably inclined relative to the first direction within an angle range between 45° and 87°, especially within an angle range between 70° and 80°, and preferably at 76°.

Figure 23:
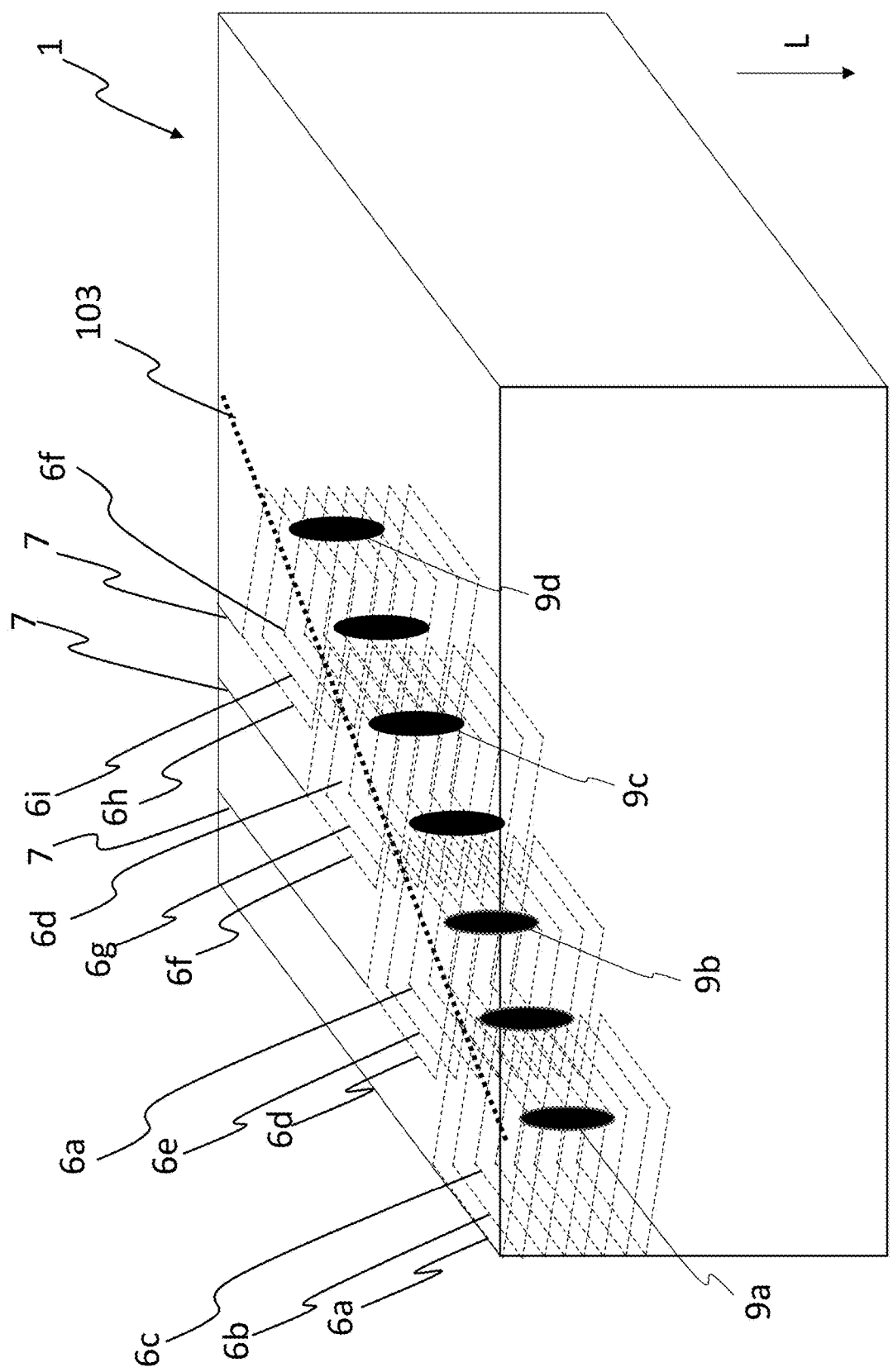

FIG. 23 shows that the linear design 103 or the writing line is inclined relative to the ends of the crystal lattice plane or, as shown in FIG. 22, inclined relative to a cutting line 10 or straight cutting line that arises at the point of intersection between the generation plane 4 and the crystal lattice plane 6. This alignment limits crack propagation in the direction of the crystal lattice planes 6 (especially slip planes). The modifications 9 for each writing line are thus not generated in the same crystal lattice planes 6. For example, the first 1-5% of the modifications for each writing line 103 can thus intersect with just a fraction, especially less than 75% or less than 50% or less than 25% or less than 10% or no crystal lattice planes, of the last 1-5% of the modifications of the same writing line 103 in longitudinal substrate direction L. This relationship is especially illustrated schematically in that modification 9a intersects with crystal lattice planes 6a-6c and modification 9b intersects with crystal lattice planes 6a, 6d and 6e. Thus, the two modifications 9a and 9b intersect with different crystal lattice planes even though they are part of the same linear design 103 or writing line. It is also apparent that, for example, modifications 9c and 9d preferentially intersect with other, especially mainly or entirely other, crystal lattice planes (6d, 6f, 6g; 6f, 6h, 6i) than modification 9a (6a, 6b, 6c).

The ends 7 of the crystal lattice planes 6 end at the main surface 8 preferably forms a kind of sawtooth pattern in a microscope section view.

The individual crystal lattice planes 26a-26i are preferably inclined at an angle between 2° and 10°, especially between 3° and 9°, such as 4° or 8°, relative to the longitudinal axis L. Preferably, the individual crystal lattice planes of the donor substrate 1 are aligned parallel to one another.

Figure 24:
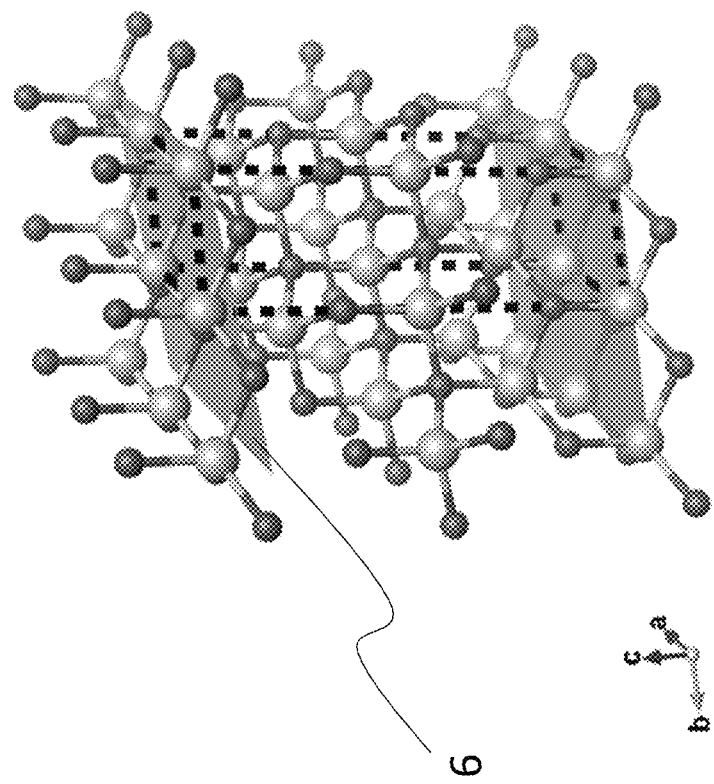
Figure 26B:
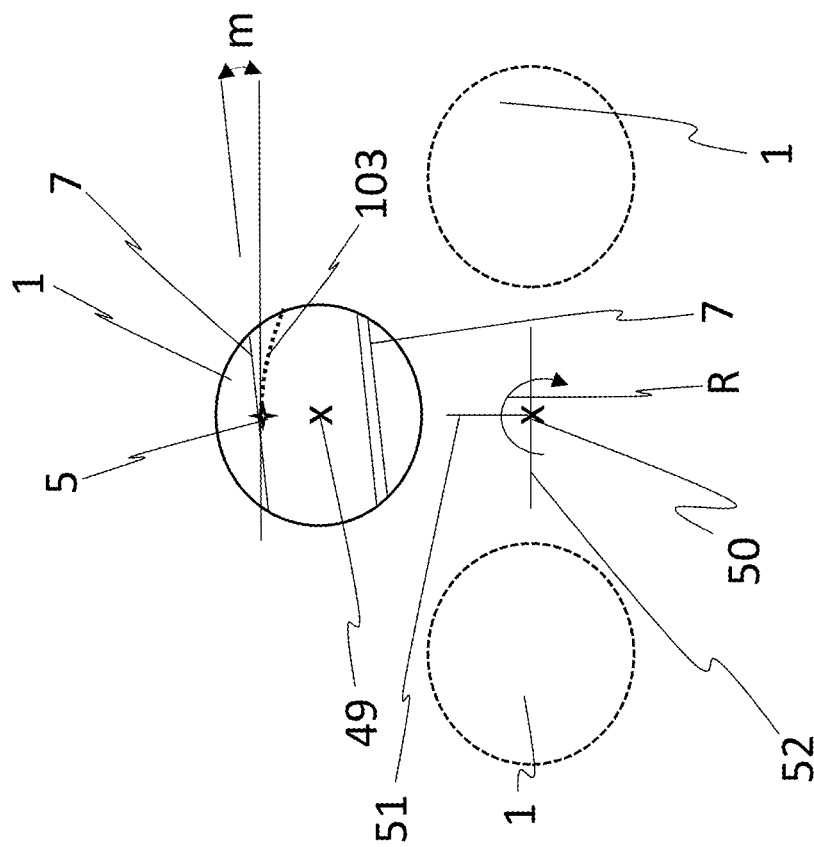
Figure 26A:
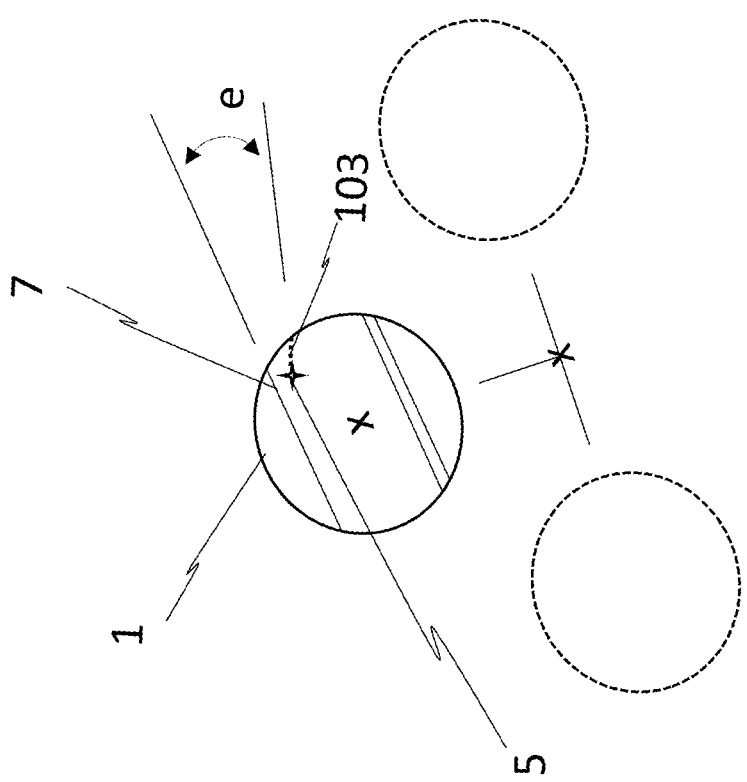

FIG. 24 shows an example of a crystal lattice with a slip plane for 4HSiC; FIG. 5a shows an example of a crystal lattice with a 110 slip plane for Si; FIG. 5b shows an example of a crystal lattice with 100 slip plane for Si, and FIG. 5c shows an example of a crystal lattice with 111 slip plane for Si.

The crystal lattice planes 6 are preferably lattice planes of a particular type. If the crystal structure is cubic face-centered, the slip plane is preferably the {111} plane and the slip direction is the <110> direction. If the crystal structure is cubic body-centered, the slip plane is preferably the {110} plane and the slip direction is the <111> direction or the slip plane is preferably the {112} plane and the slip direction is the <111> direction or the slip plane is preferably the {123} plane and the slip direction is the <111> direction. If the crystal structure is hexagonal, the slip plane is preferably the {0001} plane and the slip direction is the <1120> direction or the slip plane is preferably the {1010} plane and the slip direction is the <1120> direction or the slip plane is preferably the {1011} plane and the slip direction is the <1120> direction.

FIGS. 26a to 27a show schematics of the generation of a linear design 103 by means of laser or laser device in a donor substrate 1. The linear design 103 is generated here in the form of an arc or in curved form. The laser device or the site of generation of modifications is preferably unchanged here. In other words, the site of generation of modifications and the center of rotation 50 of the rotation device 45 preferably remain in the same alignment relative to one another. There is thus preferably merely movement of the donor substrate 1 past the laser device 29 or past an outlet for laser radiation 32. The donor substrate 1 is preferably disposed on the rotation device in such a way that the line-forming ends 7 of the crystal lattice planes 6 are inclined relative to a direction 52 that extends orthogonally to the connecting line 51 between the center of rotation 50 of rotation device 45 and the center 49 of the donor substrate 1, especially at an angle between 3° and 87° and preferably at an angle between 10° and 60° or 14° and 45°.

It can be seen from the overall consideration of FIGS. 26a-27a that, with progressive rotation of the rotation device 45, the donor substrate 1 is moved past the laser device and the linear design 103 is generated or extended. At the start (FIG. 26a) of the linear design, it is generated at an angle e to the cutting line 10 or to a line formed by the end of a crystal lattice plane. In the middle (FIG. 26b) of the linear design, it is generated at an angle m to the cutting line 10 or to a line formed by the end of a crystal lattice plane. At the end (FIG. 27a) of the linear design, it is generated at an angle s to the cutting line 10 or to a line formed by the end of a crystal lattice plane. The angle e here is preferably greater than the angle m, and the angle m is preferably greater than the angle s. However, it is likewise conceivable here that the angle s is of greater magnitude than the angle m.

The angles are preferably determined in such a way that the centers of two adjacent modifications are theoretically connected to one another and the angle of the line resulting therefrom is determined with respect to the cutting line 10 or with respect to a line formed by the end 7 of a crystal lattice plane 6.

According to figures FIG. 26a-27a, the ideal writing angle in an arrangement of rotating substrates is chosen as the average angle between the angle of the tangents at the wafer edge and the tangents in the middle of the wafer, i.e., for SiC, average angle 30° may mean, for example, depending on the radius of the turntable and the substrate radius, an angle interval between 25° and 35°, and therefore, for example, a preferred writing angle of 30° for hexagonal systems on average is observed.

Figure 27B:
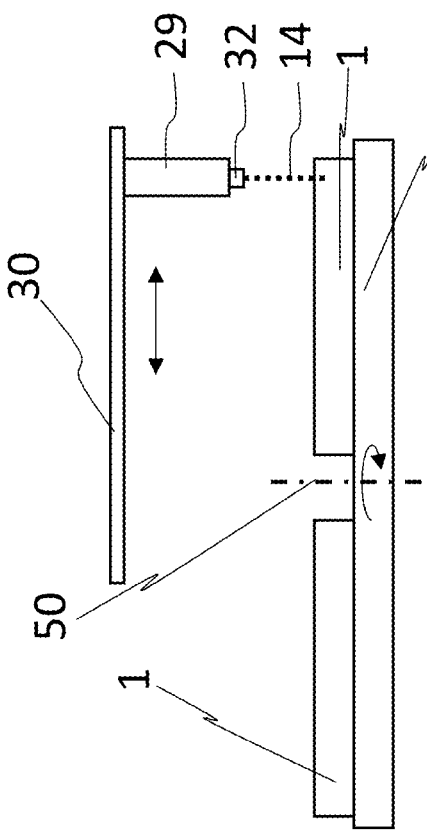

FIG. 27b shows, purely by way of example, a top view of a rotation device 45. On this rotation device 45, there may simultaneously be disposed a multitude, especially more than 2 or more than 3 or more than 5 or more than 10, preferably up to 15 or up to 20 or up to 30, donor substrates, especially boules or ingots or wafers.

Figure 27C:
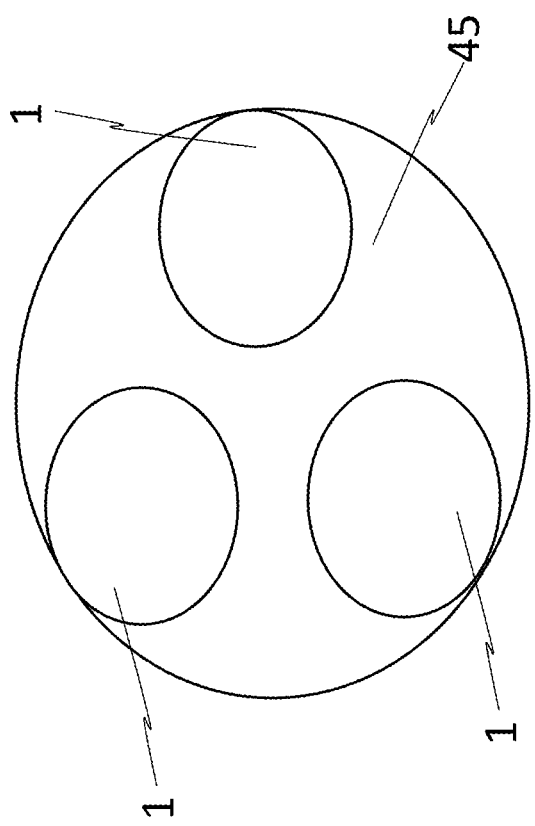
Figure 27A:
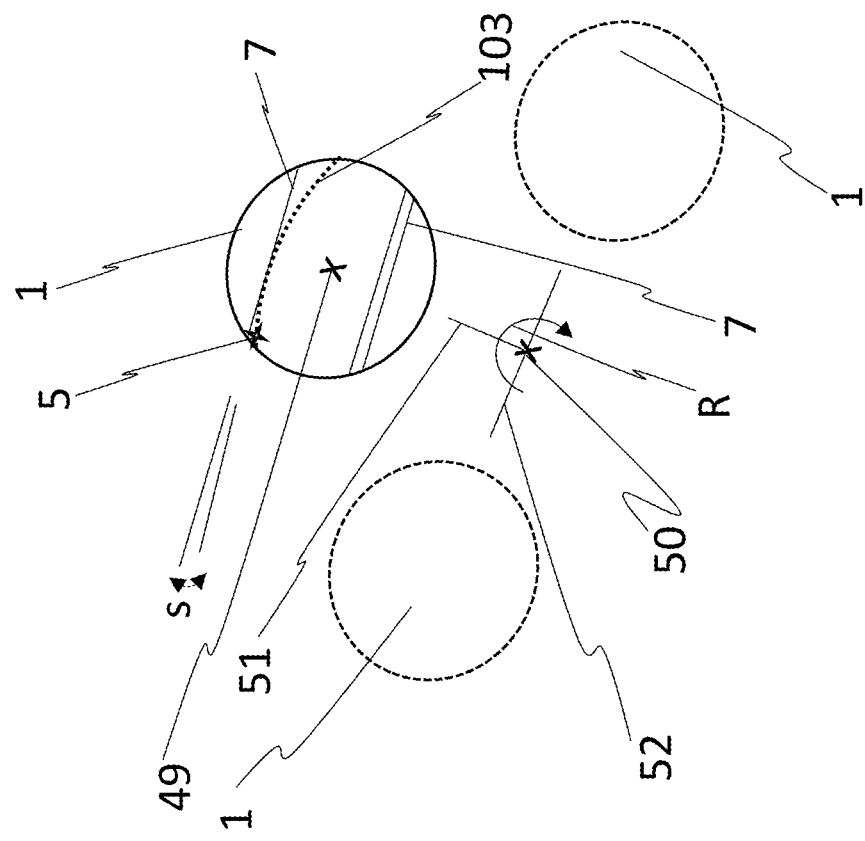

FIG. 27c shows a schematic side view of a plant for generation of modifications 9 within a donor substrate 1 or solid-state body. Preferably, an element 29 of a laser device, especially a laser head, or a beam guide connected to a laser, is disposed on a movement or repositioning device 30 preferably disposed at a fixed location. The movement or repositioning device 30 preferably enables movement of the element 29 of the laser device or movement of the laser device in preferably linear direction, especially in radial direction, of the rotation device 45. Thus, the element 29 of the laser device or the laser device, after the generating of one or more defined writing lines 103, is repositioned to preferably multiple or all donor substrates 1. The repositioning results in introduction of the emitted laser beams into the respective donor substrate 1 at another site 5 for generation of modifications.

In FIG. 28a, a defect generation device 18 or modification generation device is shown, but one executed in such a way that it generates the modifications 34 preferably at least in sections in different planes, which results in generation of the one or crack progression layers 8 at least in sections, corresponding to the surface or outline of the surface of a three-dimensional body.

It is thus possible by the present invention to extract not just a planar solid-state layer 4 from a workpiece or solid-state body 1, but likewise to extract a nonplanar solid-state body 40 as a result of a fracture or crack progression. It is also conceivable that a solid-state body 40 extending in a planar manner in sections and in a three-dimensional manner in sections is extracted from the solid-state body 1.

It is additionally conceivable that an immersion fluid 54 is applied to the exposed surface of the solid-state body 1 as droplets or, as shown, as a fluid layer. If the immersion fluid 54 has been provided as a fluid layer, a wall device 50 is preferably also provided to form a receiving tank in order that the liquid is kept at the desired position. In addition, a cover plate 52 may be applied to the fluid, especially placed on or immersed. The immersion fluid 54 preferably has essentially or exactly the same refractive index as the solid-state body 1. The refractive index of the cover plate may differ from or likewise correspond to the refractive index of the immersion fluid. It is thus more preferably conceivable that, especially for compensation of surface roughness, the generation of defects is generated through the immersion fluid 54 and more preferably through the immersion fluid 54 and the cover plate 52. The focus of the laser 18 for generation of defects is preferably computer-controlled.

FIG. 28b shows a further arrangement in which a crack progression layer 8 is generated in an inclined solid-state body 1, especially an ingot, for detachment of a nonplanar solid-state layer 4 or of a nonplanar solid-state body 40. For precise generation of the crack progression layer 8, an immersion fluid 54 is preferably provided. Which is applied to the exposed surface of the solid-state body 1 as droplets or, as shown, as a fluid layer. If the immersion fluid 54 has been provided as a fluid layer, a wall device 50 is preferably also provided to form a receiving tank in order that the liquid is kept at the desired position. In addition, a cover plate 52 may be applied to the fluid, especially placed on or immersed. The immersion fluid 54 preferably has essentially or exactly the same refractive index as the solid-state body 1. The effect of the immersion fluid 54 is that the refractive index is always the same in the pathway between the cover plate 52 and the crack progression layer 8 to be generated, in order that the generation of modifications can proceed with a minimum level of defects.

FIG. 29a shows a solid-state body 2 or a substrate disposed in the region of a radiation source 18, especially a laser. The solid-state body 2 preferably has a first planar area component 14 and a second planar area component 16, where the first planar area component 14 is aligned preferably essentially or exactly parallel to the second planar area component 16. The first planar area component 14 and the second planar area component 16 preferably bound the solid-state body 2 in a Y direction which is preferably in a vertical or perpendicular alignment. The planar area components 14 and 16 preferably each extend in an X-Z plane, where the X-Z plane is preferably in a horizontal alignment. Alternatively, however, it is conceivable that the first and/or second area component 14, 16 has a nonplanar, especially curved, shape.

In addition, it can be inferred from this diagram that the radiation source 18 emits beams 6 onto the solid-state body 2. According to the configuration or depending on defined parameters, the beams 6 penetrate into the solid-state body 2 to defined depths and generate a crystal lattice modification 19, especially a defect, at the respective position or at the respectively predetermined position. Preferably, a sufficient number of modifications or crystal lattice modifications 19 is generated that these define at least one detachment region 8. Preferably, the detachment region 8 has a nonplanar outline or nonplanar form, where the detachment region 8 more preferably has, at least in sections, a spherical form, especially corrugated and/or arched and/or curved form. In addition, the beams 6 can be guided through an optical system, for example for focusing or bundling, preferably disposed between the radiation source 18 and the solid-state body 2 (not shown).

Reference numeral 9 indicates a further detachment region in the solid-state body 2. According to the present invention, the further detachment region 9 may likewise be generated during the generation of the detachment region 8. Alternatively, it is conceivable that the further detachment region 9 is generated after or before the generation of the detachment region 8. Preferably, the further detachment region 9 is generated after the removal of the solid-state component 4 or before the removal of the solid-state component 4. Preferably, multiple detachment regions 8, 9 in a solid-state body 2 define multiple solid-state components 4, 5 that are preferably separable successively from the solid-state body 2. In a preferred embodiment of the present invention, exactly or at least or at most one detachment region 8 is generated in a solid-state body 2. In a further preferred embodiment of the present invention, two, at least two or exactly two or three, at least three or exactly three or four, at least four or exactly four or five, at least five or exactly five or more, especially, for example, up to 10 or 25 or 50 or 100 or 500, detachment regions are generated in the solid-state body 2.

FIG. 29b shows a multilayer arrangement wherein the solid-state body 2 includes the detachment region 8 and has been provided in the region of the first area component 14 with a holding layer 12 which is in turn preferably covered by a further layer 20, where the further layer 20 is preferably a stabilization device, especially a metal plate. There is preferably a receiving layer, especially a polymer layer 10, disposed on the second area component 16 of the solid-state body 2. The receiving layer 10 and/or the holding layer 12 preferably consist at least partly and more preferably entirely of a polymer, especially of PDMS.

It is alternatively conceivable that the receiving layer 10 is generated on the surface of the solid-state body 2 by means of epitaxy, for example. Preferably, the receiving layer 10 generated and the solid-state body 2 have different coefficients of thermal expansion. The generation of the receiving layer 10, which in this case may also be regarded as coating 50, may preferably be followed by cooling of the multilayer arrangement created, which, owing to the different coefficients of thermal expansion, results in stresses by which the solid-state component 4 is separated or detached from the solid-state body 2 along the detachment region 8.

FIG. 29c shows a state after triggering of a crack and subsequent crack progression. The solid-state layer 4 adheres to the polymer layer 10 and is or can be spaced apart from the remaining residue of the solid-state body 2.

In addition, according to the present invention, different detachment regions 8, 9 may have different forms or outlines. It is further conceivable that, for example, the second area component 16 which is a surface of the solid-state component 4, 5 removed at a later stage is converted to a different form prior to the removal of the solid-state component 4, 5. This change in form can be made analogously to the removal of the solid-state component 4, 5 or can be brought about by a material-removing processing operation, especially a grinding process.

The present invention thus relates to a method of producing solid-state layers. The method of the invention comprises at least the steps of providing a solid-state body 2 for removal of at least one solid-state layer 4, of generating modifications, such as crystal lattice defects, by at least one modifying means, especially a radiation source, especially at least one laser, especially at least one fs laser or ps laser or ns laser, in the internal structure of the solid-state body to define at least one detachment region 8, 9 along which the solid-state layer(s) 4, 5 are separated from the solid-state body 2. In addition, the method of the invention preferably includes the step of thermal stress on a polymer layer 10 disposed on the solid-state body 2 for generation, especially mechanical generation, of stresses in the solid-state body 2, wherein the stresses result in propagation of a crack in the solid-state body 2 along the detachment region 8 that separates the solid-state layer 4 from the solid-state body 2.

Figure 30B:
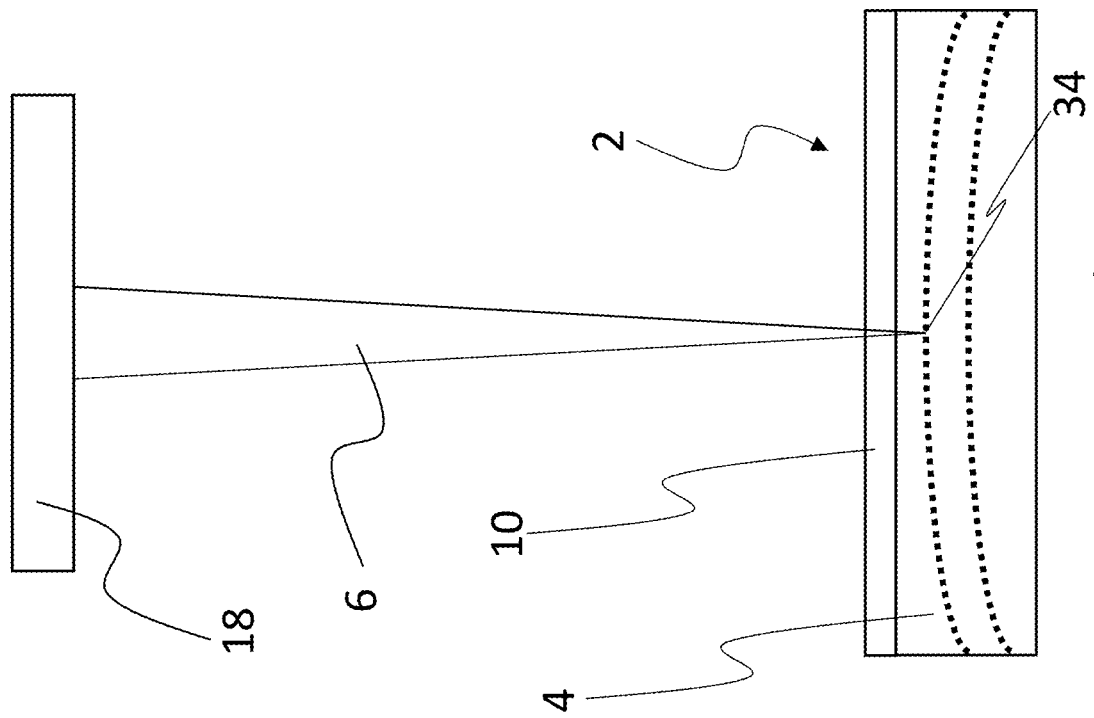
Figure 30A:
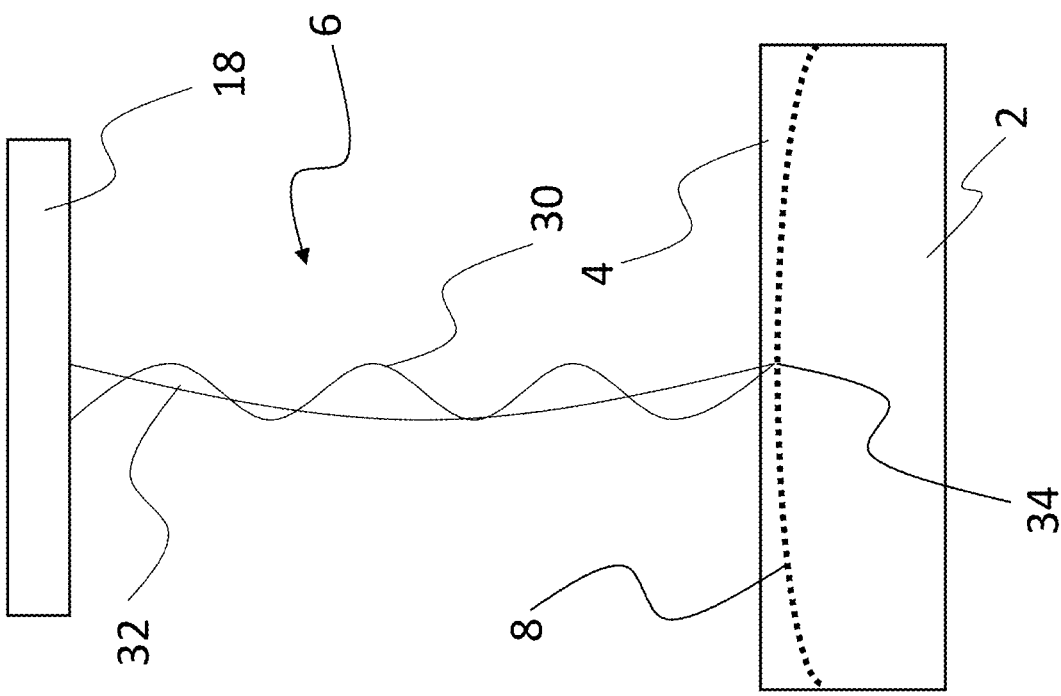

FIGS. 30a and 30b show examples of the generation of a detachment region 8 shown in FIG. 33a through the introduction of modifications 19, especially defects or damage sites, into a solid-state body 2 by means of laser beams 6.

FIG. 30a thus shows, in schematic form, how modifications 19 can be generated in a solid-state body 2, especially for generation of a detachment region 8 by means of a radiation source 18, especially one or more lasers, especially one or more fs lasers. The radiation source 18 here emits radiation 6 having a first wavelength 30 and a second wavelength 32. The wavelengths 30, 32 here are matched to one another, or the distance between the radiation source 18 and the detachment region 8 to be generated is matched, in such a way that the waves 30, 32 meet essentially or exactly at the detachment region 8 in the solid-state body 2, which results in generation of a defect at the site of meeting 34 owing to the energies of the two waves 30, 32. The generation of defects can be effected here by different or combined breakdown mechanisms, for example sublimation or chemical reaction, where the breakdown may be initiated by thermal and/or photochemical means, for example.

FIG. 30b shows a focused light beam 6, the focal point of which is preferably in the detachment region 8. It is conceivable here that the light beam 6 is focused by one or more focusing bodies, especially lens(es) (not shown).

FIG. 31a shows a nonplanar solid-state component 4 of the invention or a nonplanar wafer, where the solid-state component 4 or wafer 4, according to a diagram, forms a warp or exhibits a warped form in cross section. It is conceivable here that the solid-state component 4 has two surface outlines or surface forms that are the negative of one another. However, it is likewise conceivable that the surface outlines or surface forms of the two mutually opposite main surfaces 40, 42 of the solid-state component 4 are not the negative of one another, but have different outlines or forms.

FIG. 31b shows the generation of a coating 50, especially an epitaxially generated layer. The coating 50 is preferably disposed or generated on the solid-state component 4 at a temperature of more than 50° C., especially more than 100° C. or more than 150° C. or more than 200° C. or more than 300° C. or more than 400° C. It is conceivable here that the coating 50 is disposed or generated on the solid-state body 4 essentially or with a constant thickness. Alternatively, however, it is likewise conceivable that the coating 50 has locally different thicknesses. The further treatment thus preferably constitutes the disposal or arrangement of a defined coating 50 on at least one surface 40, 42 of the solid-state component 4. The defined parameters here preferably include at least data that at least indirectly incorporate the coefficients of thermal expansion of the material of the solid-state component 4 and of the coating 50, or incorporate or define a deformation of the solid-state component 4 as a result of a defined thermal treatment of the solid-state component 4 provided with the coating 50.

FIG. 31c shows a situation after the generation or arrangement of the coating 50 on at least one surface 40, 42 of the solid-state component 4, wherein the form of the multicomponent arrangement 39 generated has changed owing to different coefficients of thermal expansion. Preferably, at least one of the main surfaces 40 and 44 of the multicomponent arrangement 39 or multilayer arrangement has been transformed to a planar or essentially planar form. The deformation preferably results from a preferably defined thermal treatment, especially heating or cooling, of the multilayer arrangement 39.

According to the invention, the solid-state component 4 is thus configured, depending on the downstream treatment process, especially coating process, in such a way that the form of one or both main surfaces 40, 42 of the solid-state component 4 changes in a defined manner as a result of the treatment, especially the coating process, especially flattens out or becomes planar. More preferably, the coating is a metal layer or a semiconductor layer, especially a gallium nitride layer (GaN) or silicon layer which is disposed or generated on a solid-state component composed of silicon, sapphire, silicon carbide (SiC) or gallium arsenide (GaAs).

Figure 32:
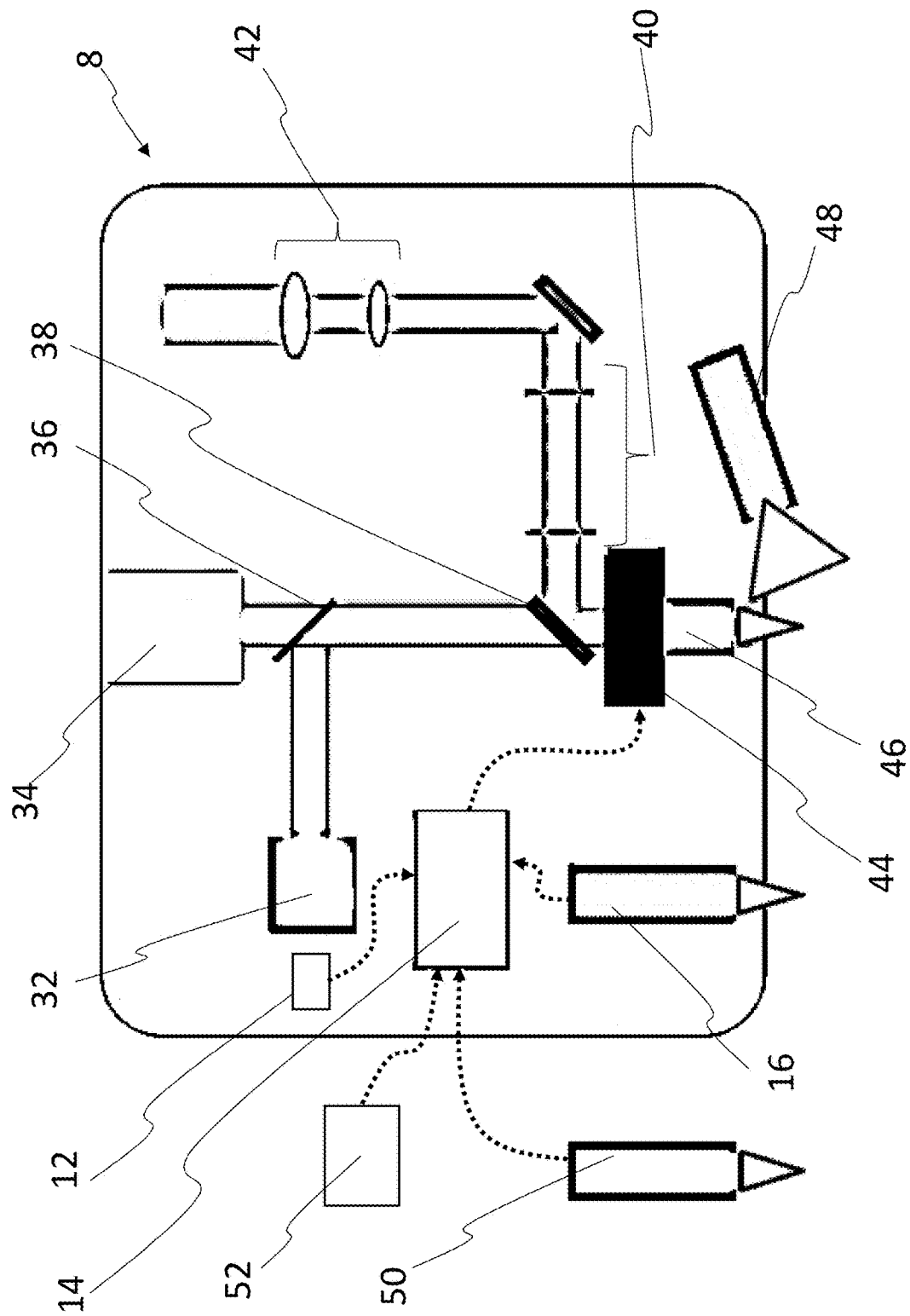

FIG. 32 shows a laser exposure device 8 of the invention, as envisaged with preference in the method of the invention and the apparatus 30 of the invention for generating modifications 2 in a solid-state body 1.

The laser exposure device 8 here has at least one laser beam source 32, especially with focus marking. The laser beam source 32 may thus preferably specifically be a coaxial light source with focus marking. The light rays 10 generated by the laser beam source 32 are preferably guided on a predetermined pathway from the laser beam source 32 to a focus device 44 or a setting device 44 for setting a focus size and a focus position in the solid-state body 1. The setting device 44 here may preferably be a fine focusing device, especially in Z direction or in laser beam progression direction. The setting device 44 may preferably take the form of a piezoelectric fine focusing device. The laser beams 10 that have passed through the setting device 44 preferably pass through a microscope with a long working distance 46. More preferably, the microscope with the long working distance 46 and the setting device 44 adapt or adjust or modify the laser radiation in such a way that the modification 2 is generated at the predefined site. It is conceivable here that the modification 2 is generated at a site that differs or is spaced apart from the predefined site, for example, by less than 5 μm and preferably less than 2 μm and more preferably less than 1 μm. The setting device 44 is preferably actuated by means of a control device 14, where the control device 14 preferably calculates or determines or uses the relative position and orientation of the solid-state body 1 relative to the laser exposure device 8 or the distance of the current surface component into which laser radiation is to be introduced relative to the laser exposure device 8 and the local refractive index or average refractive index of the solid-state material and the processing depth of the solid-state body 1 at the respective site for the adjustment of the laser exposure device 8, especially at least of the setting device 44. The control device 14 can detect or receive the data required in real time by means of corresponding sensor devices or sensor means that thus communicate therewith. Alternatively, however, it is likewise conceivable that an analysis of the surface via which the laser beams 10 penetrate into the solid-state body 1 to generate modifications 2 is undertaken or conducted for one or both of the parameters of refractive index and processing depth prior to the commencement of processing. The parameters may then be saved or read in in the form of corresponding location-dependent data in a storage device or a data storage means 12. The data storage means 12 here may be part of the laser exposure device 8 as an exchangeable medium, especially a memory card, or as a fixed memory.

Alternatively, however, it is likewise conceivable that the data storage means 12 is disposed outside the laser exposure device 8 and can be connected to the laser exposure device 8 with at least temporary communication. Additionally or alternatively, a user 52 can also impose working cycles or changes in the working cycle on the control device 14. It is also conceivable that the data storage means 12 takes the form of part of the control device 14. Additionally or alternatively, by means of a sensor device 16, distance data relating to the distance between the defined surface points of the solid-state body 1 and the laser exposure device 8 can be detected. These distance data are preferably likewise provided to the control device 14 for processing.

It is additionally conceivable that the laser exposure device 8 includes a camera 34, especially a coaxial focus camera. The camera 34 is preferably disposed in the direction of the beam path of the laser beams 10 exiting from the laser exposure device 8. It is conceivable here that an optical element 36, especially a partly transparent mirror, is disposed in the optical field of the camera 34. Preferably, the optical element 34 introduces the laser radiation 10 into the optical field of the camera.

It is additionally conceivable that a further optical element 38 or a diffractive optical element, especially a beam divider 38, is provided. The beam divider 38 here can separate or divide a portion of the laser beam 10 from the main beam. The proportion of the laser radiation that has been separated or divided off can be modified by an optional spherical aberration compensation 40 and/or by an optional beam widener 42.

In addition, reference numeral 48 indicates a fluid provision device 48 provided with preference, especially for providing a cooling fluid. Preferably, by means of the fluid provision device 48, it is possible to bring about control of the temperature, especially cooling, of the solid-state body 1 and/or the microscope.

Reference numeral 50 indicates a means of determining refractive index that can preferably also analyze transparent and reflective surfaces. Preferably, the refractive index is determined by the means of determining the refractive index 50 prior to the generation of modifications. It is alternatively conceivable here that the determination of the refractive index is conducted in a different system and the data detected are supplied to the present laser exposure device 8 by means of data transfer.

The dotted lines ended by an arrow that are shown in FIG. 32 preferably indicate data and/or signal transmissions.

FIG. 33a shows, in schematic form, a preferred arrangement of the device components of laser exposure device 8, receiving device 18 and driving or movement device 22 of the apparatus 30. It is apparent that the solid-state body 1 in this arrangement is preferably disposed between the receiving device 18 and the laser exposure device 8. The solid-state body 1 has preferably been stuck onto the receiving device 18, although it is also conceivable that it is pressed on.

FIG. 33b shows an arrangement after the generation of modifications 2 or after the complete generation of the crack progression region 4. In this diagram, a receiving layer or polymer layer 26 has been disposed or formed at the surface 24 of the solid-state body 1 via which the laser beams 10 have penetrated into the solid-state body 1. In addition, the device 54 indicates a functional fluid source that dispenses the functional fluid 56. The functional fluid 56 is preferably liquid nitrogen. The functional fluid 56 thus preferably cools the receiving layer 26 down to a temperature below 20° C., especially to a temperature below 10° C. or to a temperature below 0° C. or to a temperature below the glass transition temperature of the polymer material of the receiving layer 26. The cooling of the receiving layer 26 generates high mechanical stresses that result in crack propagation along the crack progression region 4.

Figure 34A:
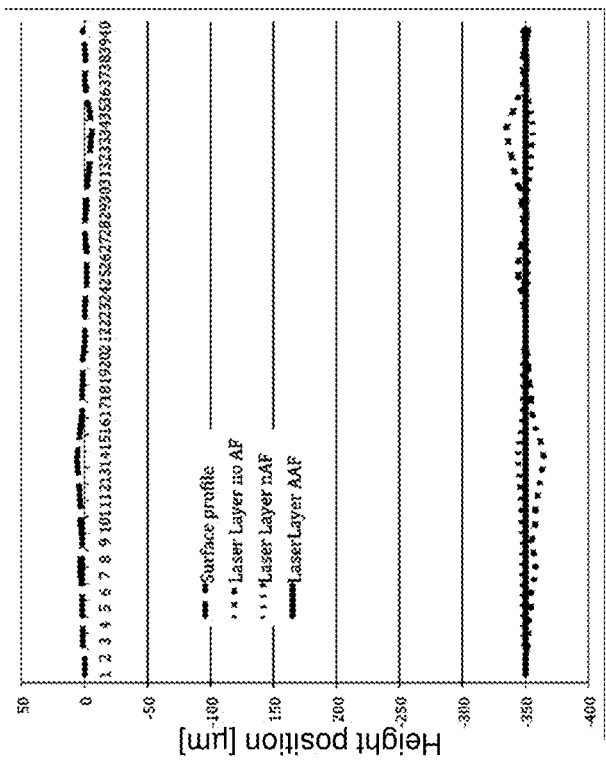

FIG. 34*a* shows, purely by way of example, the relationship between a surface profile of a solid-state body 1 and the refractive index of the solid-state material. The values reported on the horizontal axis are in the unit μm.

Figure 34B:
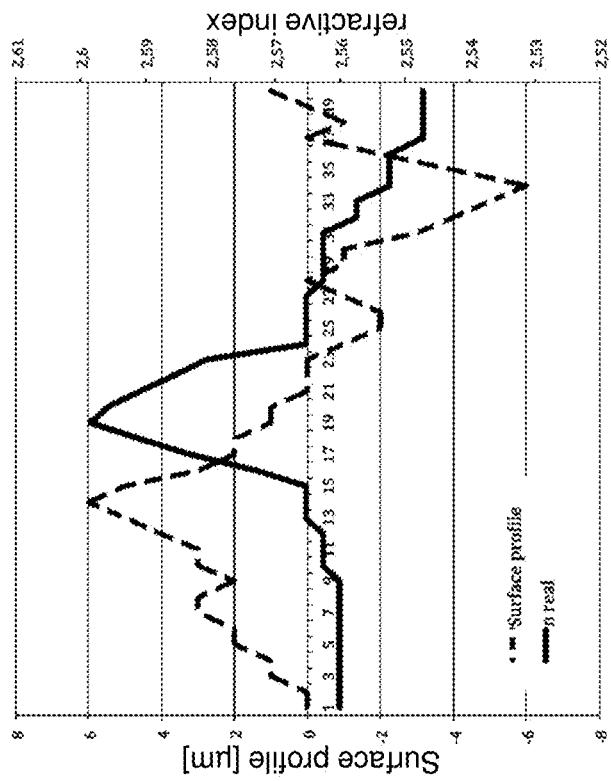

FIG. 34*b* shows illustrative deviations of the material to be lasered (surface profile and lateral refractive index progression) and laser focus position (no AF: no autofocus; surface profile is written into the material inversely amplified by the refractive index; a standard AF reverses this inversion, such that the surface profile is applied with n-fold amplification. nAF: takes account of the substrate refractive index or refractive index as a fixed factor, such that the surface profile is thus applied to the material 1:1. AAF: the desired advanced autofocus function can write an exactly horizontal plane into the material with knowledge of the average substrate refractive index and target depth).

Figure 35B:
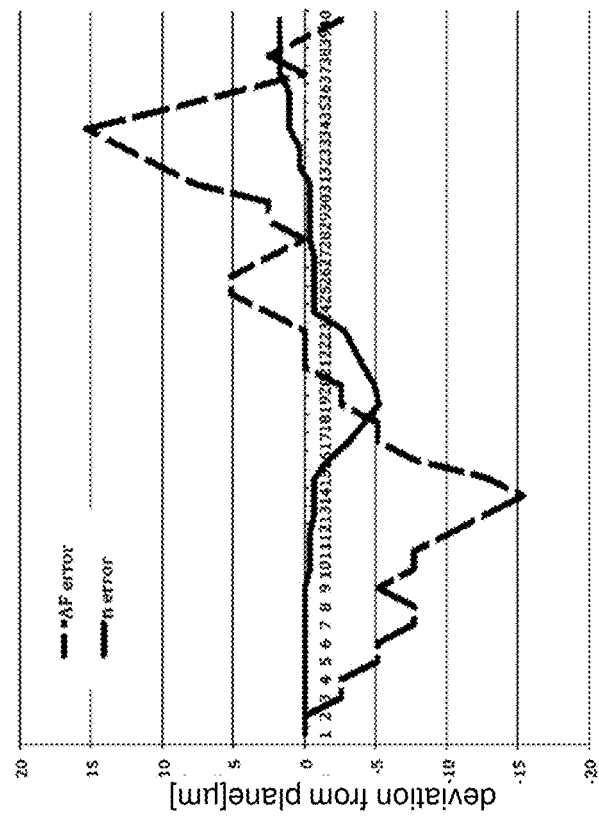
Figure 35A:
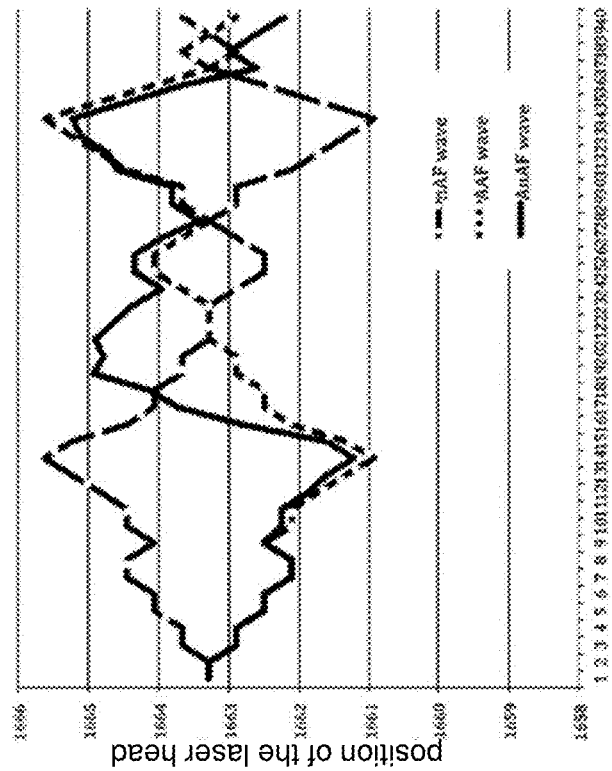

FIG. 35*a* shows, purely by way of example, various default positions of the laser focus. The values reported on the horizontal axis are in the unit μm. It is thus possible to determine the waveform as controlled input variable for the position of the laser head in various cases.

nAF (n-aware AF): to correct the autofocus guide parameter of the surface by the average substrate refractive index (n). It is thus possible to apply the surface deviation 1:1 to the volume. The wafer to be split off will thus theoretically have no variations in thickness (TTV). However, the topography and hence the poor planarity is maintained both for the wafer and the remaining ingot.

AAF (advanced AF): to correct the autofocus guide parameter of the surface with knowledge of the average substrate reflective index and the compensation plane of the surface. It is thus possible in the case of homogeneous samples with no deviations from the average refractive index to create a planar laser plane which prepares the semiconductor crystal in very planar form for further splits with an inexpensive polishing step. By contrast, the wafer split off, directly after the split, will be planar on one side but have higher thickness deviation.

AnAF (Advanced n-aware AF): to correct the autofocus guide parameter of the surface with knowledge of the local substrate reflective index and the compensation plane of the surface. It is thus possible, even in the case of inhomogeneous samples, to create a planar laser plane that prepares the semiconductor crystal in very planar form for further splits with an inexpensive polishing step.

The present invention thus relates to a method of generating modifications in a solid-state body, wherein the modifications define a crack progression region for progression of a crack to remove a solid-state component, especially a solid-state layer, from the solid-state body. The method of the invention preferably encompasses one or more of the following steps:

moving the solid-state body relative to a laser exposure device, successively generating a multitude of laser beams by means of the laser exposure device for generating at least one modification in each case, wherein the laser exposure device is continuously adjusted for defined focusing of the laser beams depending on a multitude of parameters, especially at least two parameters. Preferably, the method of the invention enables a planar microfocus for multiphoton material processing in volume.

FIG. 35*b* shows two progressions that represent profiles of different modification distributions.

Figure 36A:
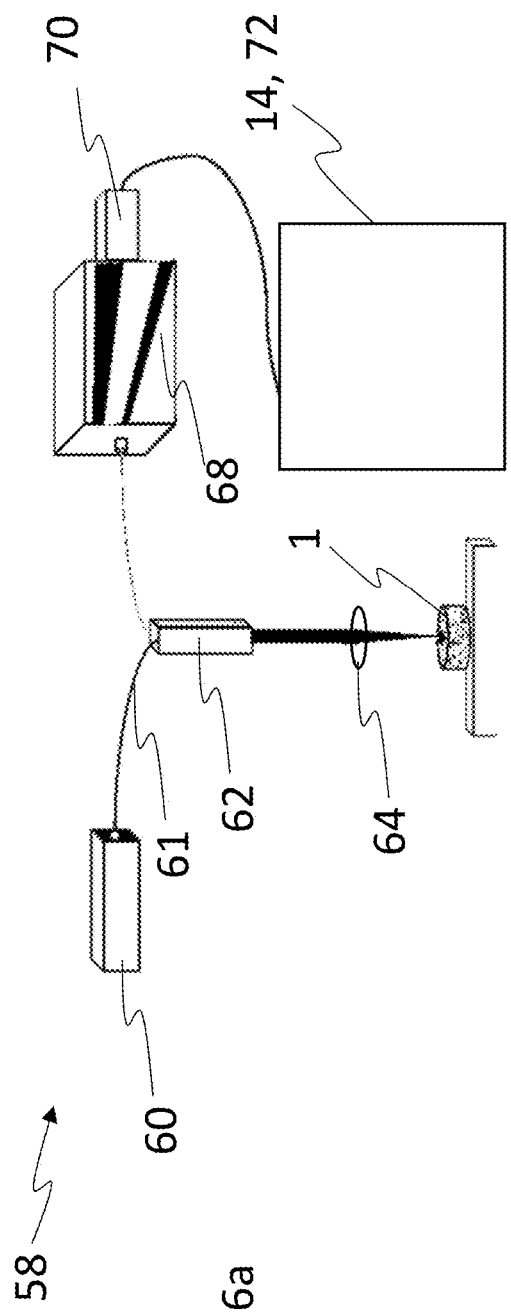

FIG. 36*a* shows a Raman instrument. The Raman instrument 58 shown here has a laser 60 for emitting radiation. The radiation is preferably supplied to an optical system by means of at least one optical fiber 61 for excitation and preferably focused, especially focused into the solid-state body, by means of this optical system, especially lens 64. This radiation is at least partly scattered, preferably with filtering of light components having the same wavelength as the radiation emitted by the laser, by means of a filter device or excitation filter 62. The other radiation components are then supplied to a spectrograph 68 and detected by means of a camera device, especially a CCD detector 70, and evaluated/processed by a control device 14, 72, especially a computer.

Atomic vibrations in the crystal are thus preferably induced by a preferably external or more preferably further laser. These vibrations are generated by light scattering at crystal atoms, which leads to observable scattered light, which has a photon energy altered by the magnitude of the vibration energy. In the case of multiple inducible vibrations, multiple peaks also occur in the spectrum of the scattered light. A spectrometer (grid spectrometer) can then be used to more closely examine the resultant Raman scattering spectrum (called Raman spectroscopy). In this method, the local conditions in the crystal are imposed on the individual Raman lines in terms of their shape and the degree of doping can be concluded by an analysis of the shape of the Raman line.

Figure 36B:
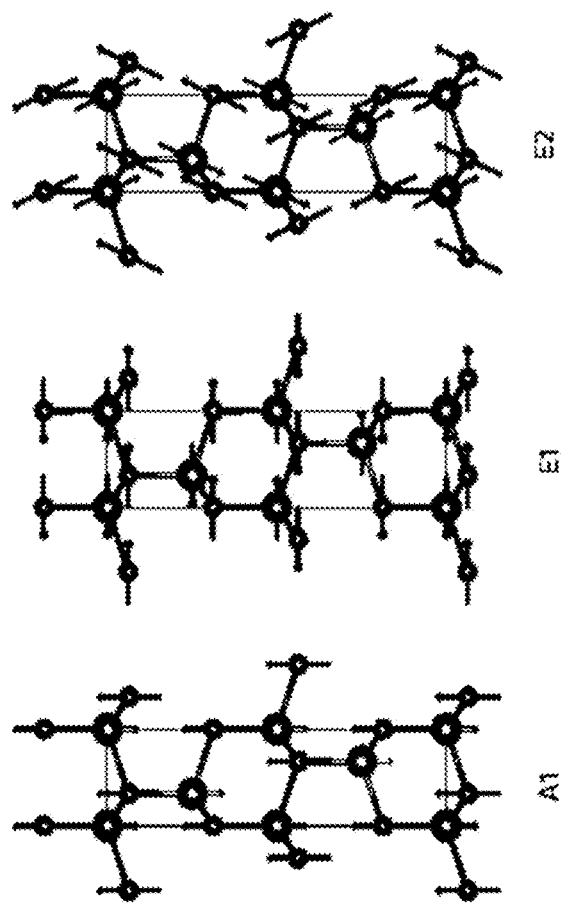

FIG. 36*b* shows the appearance of possible lattice vibrations in SiC, where these modes are defined by crystal symmetry and directions and can also be induced simultaneously. The views shown extend along the crystal axis A. Vibrations of the atoms are possible here only in particular directions, the directions being defined by the symmetry of the crystal.

Figure 37A:
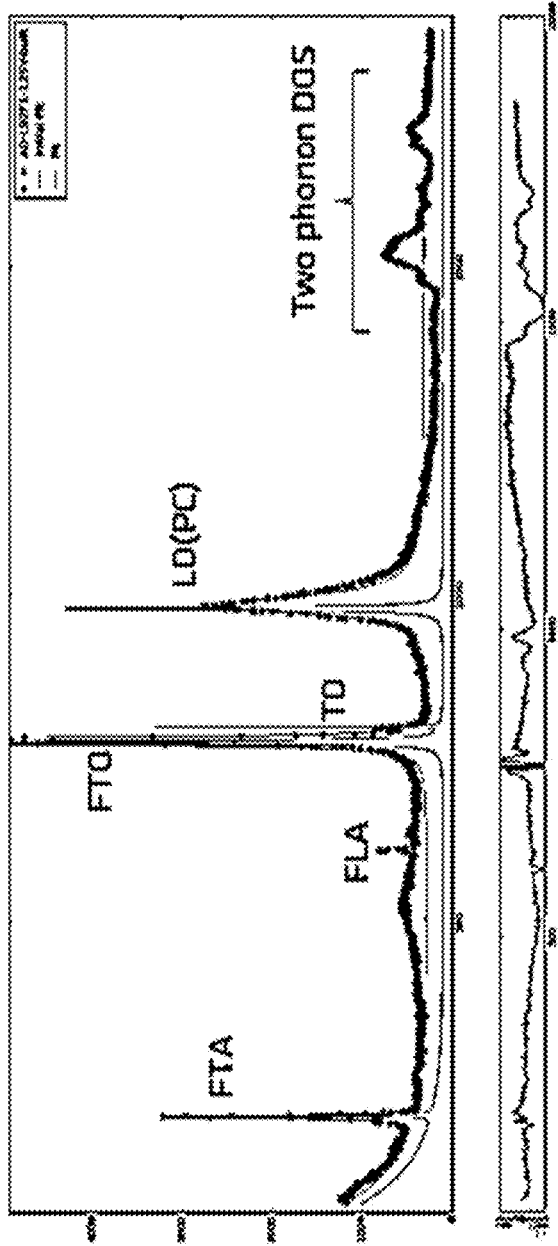

FIG. 37*a* shows a detail from a Raman plot of a nitrogen-doped 4H solid-state silicon carbide body (example spectrum for Raman on doped SiC). In this case, the shape of the LO(PC) mode is employed and fitted for measurement of the dopant concentration. Lower panel: fitting residual.

Figure 37B:
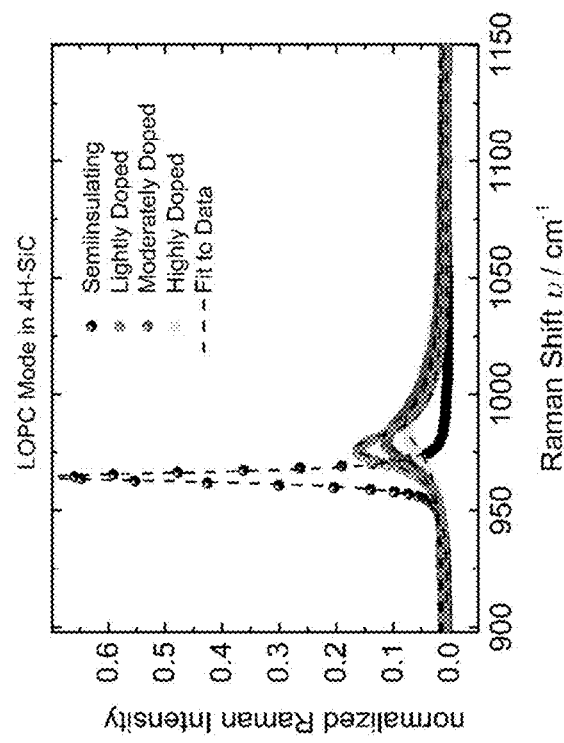

FIG. 37*b* shows a smaller detail from the Raman plot.

As shown, a direct measurement is found in order to determine the dopant concentration by Raman measurements from the measurement of the shape and subsequent fit to the LO(PC) mode.

The aim is thus generally, by adjustment of the laser parameters, to establish the optimal (smallest possible, shortest possible) crack progression in the material that always leads to successful separating as a result of a crack propagation, but otherwise minimizes or reduces all material losses (including in grinding steps).

Figure 38A:
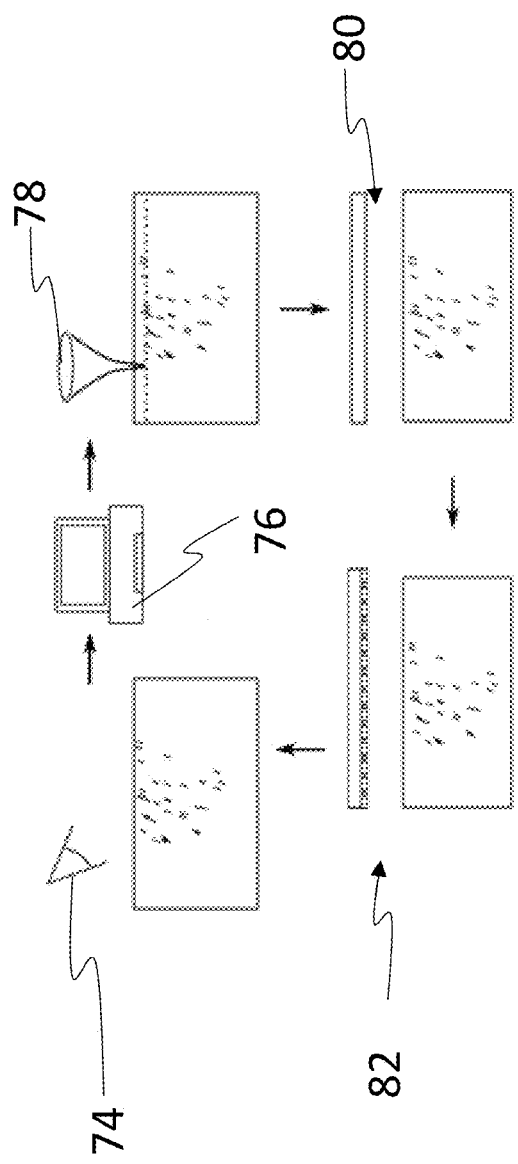
Figure 38B:
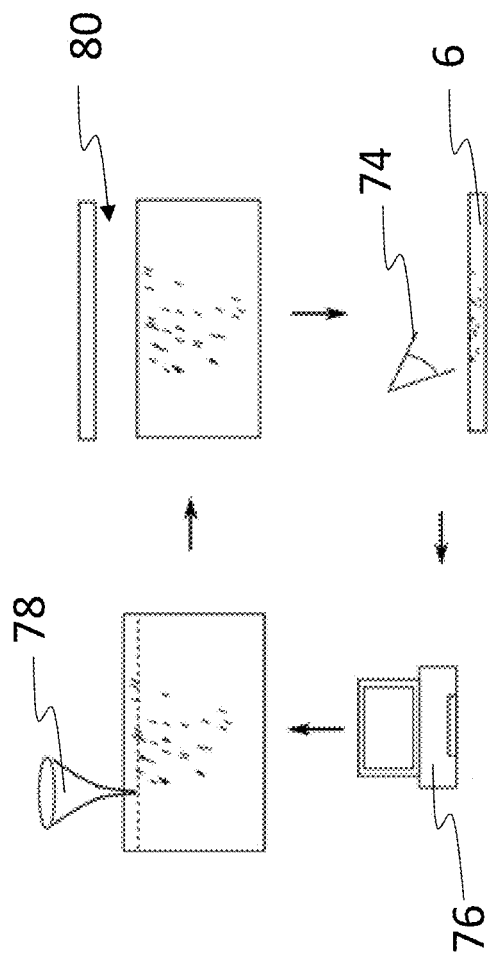

FIG. 38*a* and FIG. 38*b* show two ways of configuring the removal of individual wafers from the boule/ingot.

This is configured as a feed-forward loop in FIG. 38*a* and as a feedback loop in FIG. 38*b*.

In the feed-forward case, the distribution is characterized before the laser process and this is used to calculate a map, especially relief and/or energy map, or treatment instructions or parameter adjustments, especially in a location-dependent manner, for the laser process, especially the generation of modifications. Feed-forward is preferably performed on the ingot/boule.

Alternatively, as shown in FIG. 38b, a feedback loop may be implemented, in which the resultant wafer is characterized after each separation step and serves as a model for the next.

According to the material and doping, it is thus possible to undertake different adjustments during the laser process:

In the case of the material SiC, it is possible to undertake different adjustments of the laser parameters at different depths depending on the doping that occurs. Under the boundary conditions specified below, this can lead to the functions likewise specified below:

Depth 180 μm, pulse duration 3 ns, numerical aperture 0.4
Low doping: 7 μJ—21 mOhmcm
High doping: 8 μJ—16 mOhmcm
Depth 350 μm, pulse duration 3 ns, numerical aperture 0.4
Low doping: 9.5 μJ—21 mOhmcm
High doping: 12 μJ—16 mOhmcm
Formula for depth 180 μm:
E energy in μJ
E0 offset energy at lowest doping
K energy scaling factor
R measured doping level
B base doping level (21 mOhmcm)

$$E=E0+(B-R)*K$$

Here $K=1/(21-16)$ μJ/mOhmcm=0.2 μJ/mOhmcm
$E0=7$ μJ
$B=21$ mOhmcm
Example: measured doping level of 19 mOhmcm: E=7.4 μJ Formula for depth 350 μm:
E energy in μJ
E0 offset energy at lowest doping
K energy scaling factor
R measured doping level
B base doping level (21 mOhmcm)

$$E=E0+(B-R)*K$$

Figure 39:
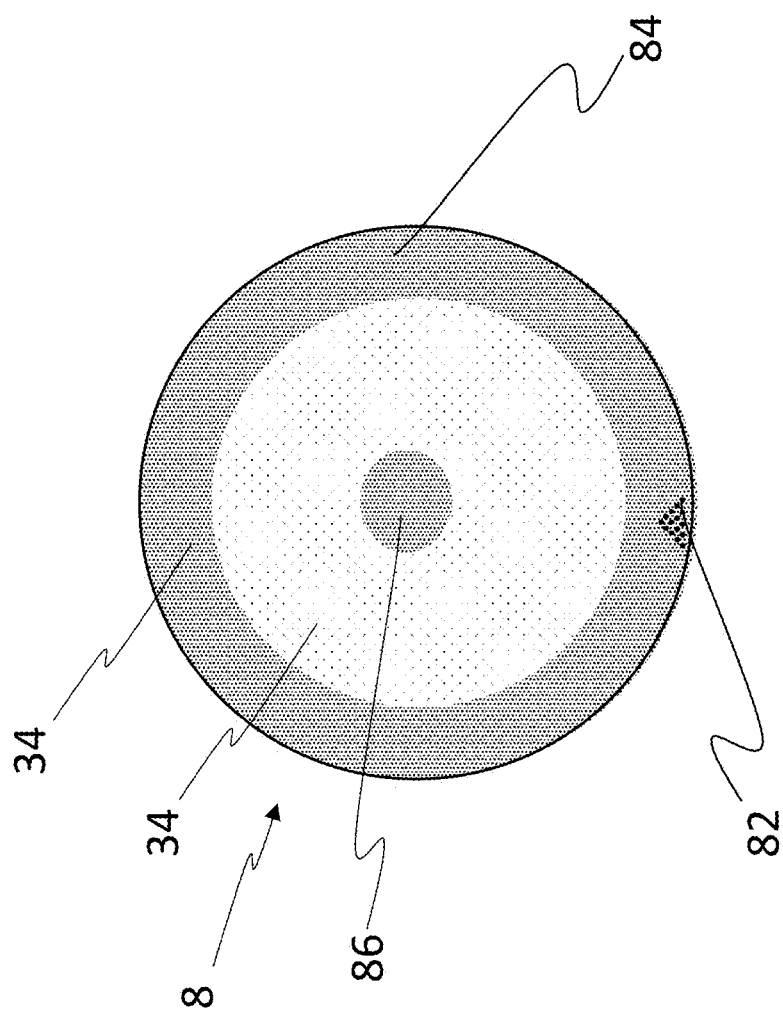

Here $K=2.5/(21-16)$μJ/mOhmcm=0.5 μJ/mOhmcm $E0=9.5$ μJ
$B=21$ mOhmcm
Example: measured doping level of 19 mOhmcm: E=10.5 μJ FIG. 39 shows a detachment plane 8 having regions with different defect concentrations 82, 84, 86 or concentrations or accumulations of modifications. It is conceivable here that a multitude of regions with different concentrations of modifications forms a detachment plane 8, and it is likewise conceivable that the modifications 34 in the detachment plane 8 are distributed essentially or exactly homogeneously over the area. The different concentrations of modifications may be of the same or different size in terms of area. Preferably, a first elevated concentration of modifications is a crack triggering concentration 82 which is preferably generated in the region of the edge or extending to the edge or adjacent to the edge. Additionally or alternatively, a crack progression concentration 84 may be formed in such a way that the crack that separates the solid-state layer 4 from the solid-state body 2 is controllable. Moreover, additionally or alternatively, a center concentration 86 that preferably enables a very planar surface in the region of the center of the solid-state body 2 may be generated. Preferably, the crack progression concentration 84 is in partly or completely annular or surrounding form and thus preferably encloses sections and more preferably the entirety of the center of the solid-state body 2 or of the solid-state layer 4. It is also conceivable that the crack progression concentration 84 decreases stepwise or in a constant or seamless manner proceeding from the edge of the solid-state body 2 and in the direction of the center of the solid-state body 2. It is additionally conceivable that the crack progression concentration 84 is in the form of bands and in homogeneous or essentially or exactly homogeneous form.

FIG. 40a shows, in schematic form, in the upper part of the image, a top view of a solid-state body 2 and, in the lower part of the image, a side view, especially a section illustration. The solid-state body 2 in this illustration is furnished with straight lines which bound the individual solid-state elements 40, especially carrier elements, for example computer chips or solar cells, arranged alongside one another. The lines here may describe, purely by way of example and for illustration purposes, the outer shape of the solid-state elements 40, and they need not, or need not necessarily, be apparent or present in the case of a real solid-state body 2. In addition, the solid-state body 2 in top view may have a different external form, especially with straight components.

In FIG. 40b, a multitude of defects 34 is apparent from the top view and from the side view. The modifications or defects 34 may, as shown in the top view for example, be distributed uniformly or be generated in increased or reduced numbers in particular regions. A high concentration of modifications or defects 34 as opposed to a low concentration of defects 34 enables, for example, defined crack triggering and/or simpler detachment of the solid-state layer 4 in the respective region. Preferably, in the region of a point in the solid-state body 2 where a crack is to be triggered, an elevated concentration of defects 34 is provided. In addition, defects 34 are preferably defined in an elevated concentration for control of the crack progression, in order to steer the crack propagation. Furthermore, additionally or alternatively, an elevated concentration of defects or modifications 34 relative to other regions of the first detachment plane 8 is preferably generated in the middle or at the center of the first detachment plane 8. It can be inferred from the side view that the detachment plane 8 is preferably formed by defects 34 generated in a plane.

Figure 41:
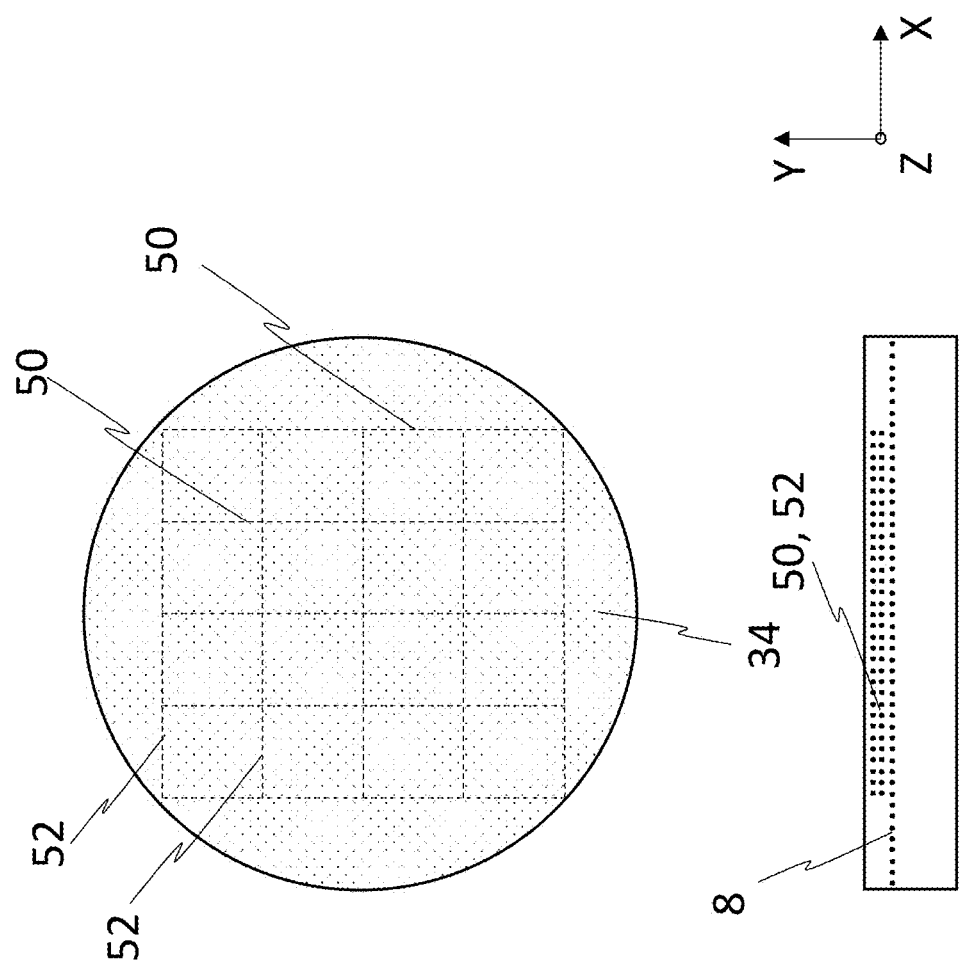

The top view in FIG. 41 shows, as well as the defects 34 that form the first detachment layer 8, further defects generated in second detachment planes 50 that are illustrated by means of dotted lines and extend in Z direction. Also shown are dotted lines oriented in X direction that likewise represent defects and lie in third detachment planes 52. The first detachment plane 8 is thus preferably in the X-Z plane, the second detachment plane 50 is preferably in the Y-Z plane, and the third detachment plane 52 is preferably in the X-Y plane. It can be inferred from the side view or section view in FIG. 4 that the defects, i.e. the defects for generating the first detachment layer 2 and the defects for generating the second detachment layer 50 and the third detachment layer 52, are spaced apart to different degrees relative to a planar surface of the solid-state body 2, especially relative to a surface of the solid-state body 2 that lies in an X-Z plane.

Figure 42B:
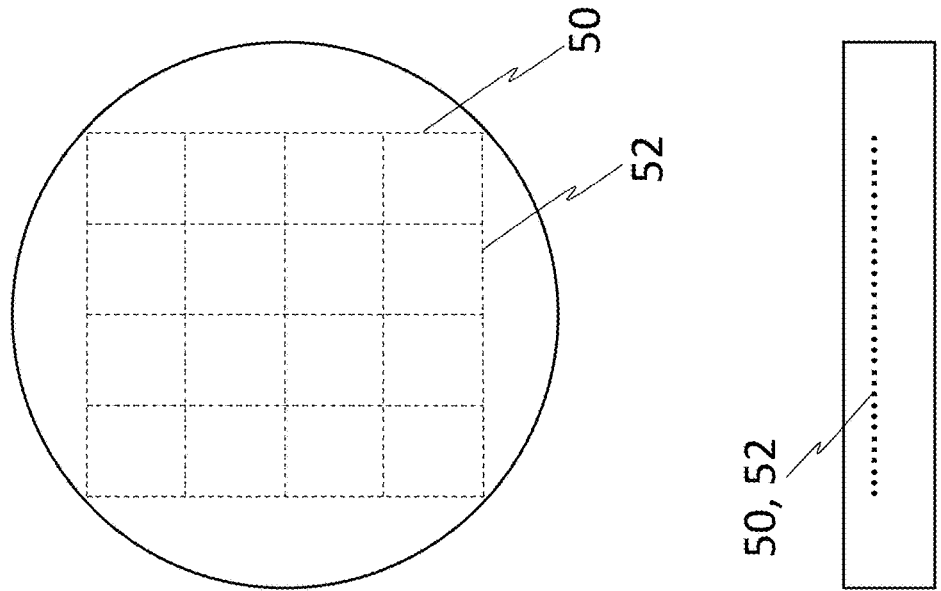
Figure 42A:
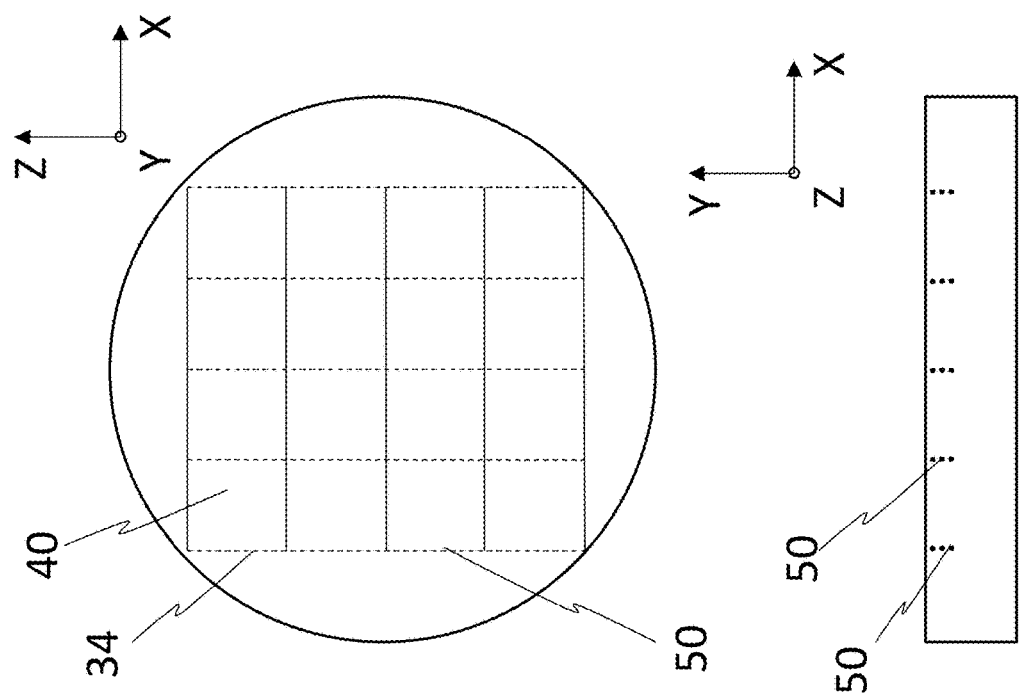

FIG. 42a shows a top view in which the defects 34 for generating the second detachment plane(s) 50 have already been generated. However, the defects 34 for forming the third detachment plane(s) 52 have not yet been generated. It is thus conceivable that the defects for generating the second and third detachment plane(s) 50, 52 are generated simultaneously, with a time delay or completely in succession.

Furthermore, it can be inferred from the side view or section illustration that the defects for generating the second detachment plane(s) 50 can be generated with different distances from a surface that extends in the X-Z plane.

It can be inferred from FIG. 42b that the defects for generating the first detachment layer 50 and the second detachment layer 52 can also be generated in their entirety with the same distance from a surface that extends in the X-Z plane.

Figure 43:
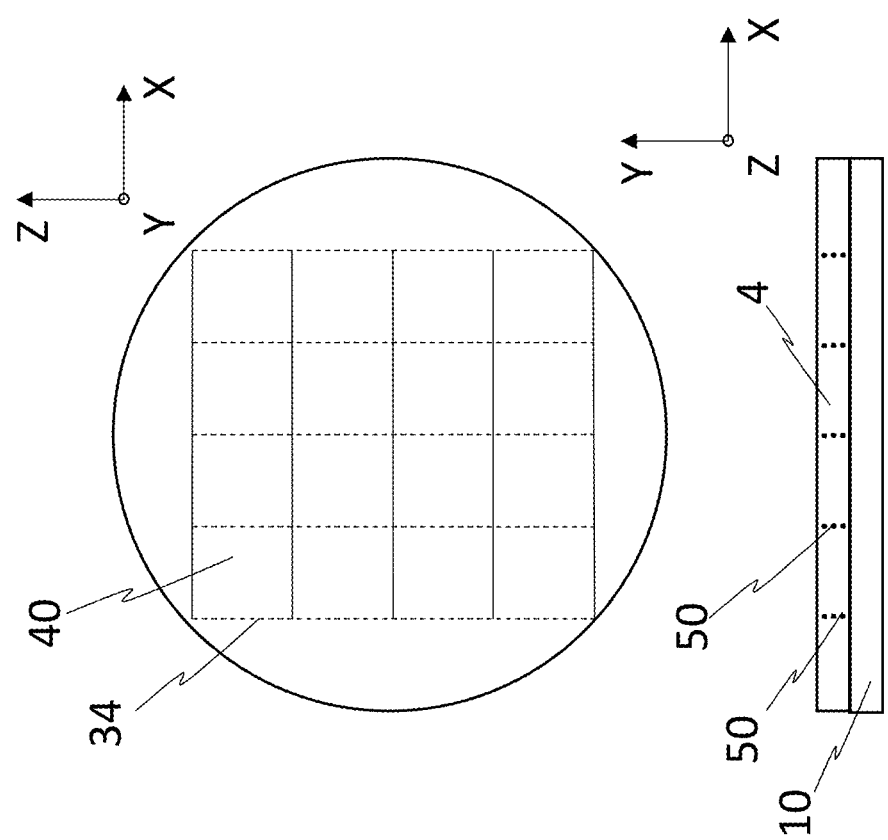

FIG. 43 shows an embodiment in which the solid-state layer 4 is disposed on the polymer layer 10. It is conceivable here that the defects for generating the second detachment layer 50 and the third detachment layer 52 have already been generated in the solid-state layer 4. In addition, it is alternatively conceivable that the defects for generating the second detachment layer 50 and the third detachment layer 52 are generated in the solid-state layer 4 only after the detachment of the solid-state layer 4 from the solid-state body 2.

Figure 44B:
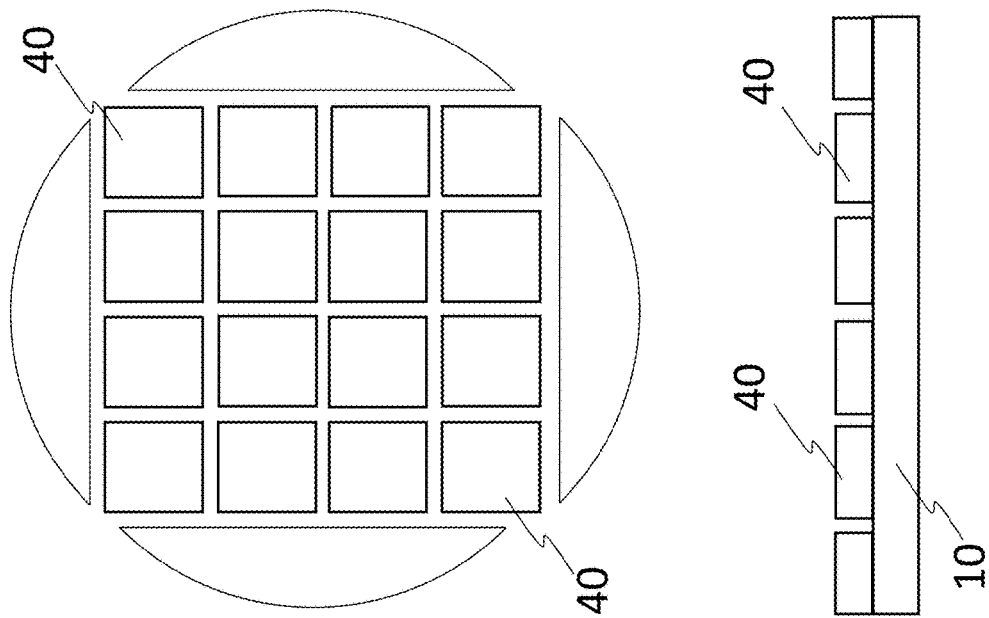
Figure 44A:
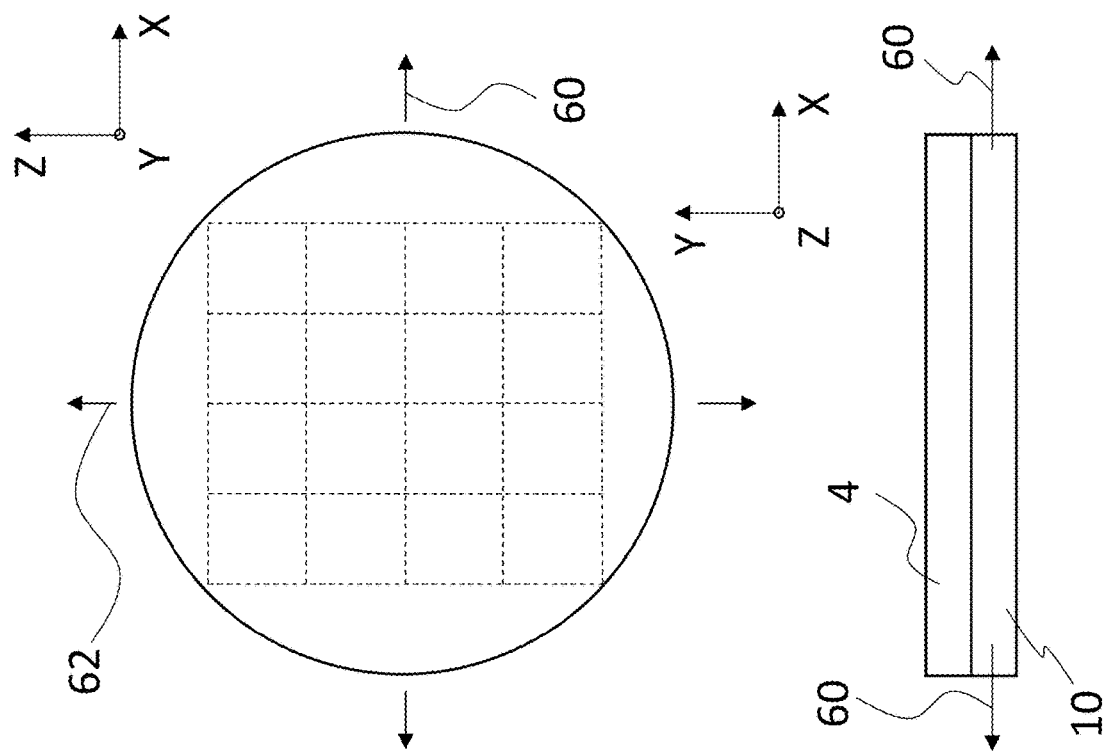

FIG. 44a shows an arrangement in which the solid-state layer 4 is disposed on the polymer layer 10 or the solid-state layer 4 is bonded, especially adhesive-bonded, to the polymer layer 10. The polymer layer 10 is deflected here in a first direction 60 and/or in a second direction 62 and/or bent around at least one axis. The deflection of the polymer layer 10 can be brought about by thermal effects and/or external application of force, especially expansion, compression and/or inflexion.

FIG. 44b shows a reaction to the deflection of a polymer layer 10 described with reference to FIG. 44a. There is detachment here of the individual solid-state elements 40 in the region of or along the second detachment plane 50 and/or the third detachment plane 52. The detachment here preferably corresponds to breaking-off or tearing-off of the individual solid-state elements 40 from one another.

FIG. 45a shows an apparatus for separating solid-state layers 1 (cf. FIG. 46) from a donor substrate. This apparatus preferably has a holding device 14 for fixing the donor substrate 2. There is a stress generation layer 4, especially consisting of or including a polymer material, disposed on the donor substrate 2. The surface of the stress generation layer 4 remote from the donor substrate 2, in the variant shown, comes into contact with a contact side of a pressurizing element 6 of a pressurizing device 8. The pressurizing device 8 here may, for example, include or be coupled to an electric or hydraulic or pneumatic or mechanical force generation device, especially an actuator, for generating a force for pressing the pressurizing element 6 against the stress generation layer 4. The pressurization is preferably adjustable by means of the force generation device. A temperature control device 26 preferably imparts thermal stress, especially cooling, to the stress generation layer 4. The thermal stress on the stress generation layer 4 here may be indirect or exclusively indirect, meaning that, for example, the temperature of the pressurizing element 6 is first adjusted, and this then adjusts the temperature of the stress generation layer 4. It is also conceivable that there is direct and indirect control of the temperature of the stress generation layer 4 with time. The temperature control device 26 is preferably a functional fluid 28, especially nitrogen in preferably liquid or nebulized form. In addition, the pressurizing element 6 can be pressed onto predetermined proportions of the stress generation layer 4 and, at the same time, the temperature of different predetermined proportions of the same stress generation layer 4 can be adjusted by the temperature control device 26.

The thermal stress results in contraction of the stress generation layer 4, which generates mechanical stresses in the donor substrate 2. The pressurizing device 8, simultaneously with the generation of stress, brings about pressurization of components of the stress generation layer 4 or of the complete stress generation layer 4 disposed between the pressurizing element 6 and the substrate 2.

The pressurizing device 8 thus counteracts force peaks that occur on attainment of the glass transition of the stress generation layer 4. In addition, the pressurizing device 8 preferably likewise reduces deflection of the components of the solid-state layer 1 that have been split off, which means that the wedge action that arises in the course of crack propagation occurs with a significantly smaller angle, which means that the crack runs in a much more stable manner in the predefined detachment plane (cf. FIG. 1b).

Reference sign D indicates the preferred direction of pressure application.

The illustration shown in FIG. 45b corresponds essentially to the illustration shown in FIG. 1a, wherein the donor substrate 2 has modifications 10 that have been generated by means of laser beams. The modifications 10 define a detachment region 12 for progression of a crack for separation of the solid-state layer 1 from the donor substrate 2.

FIG. 46 shows that the pressurizing element 6 may have one or more passage element(s) 18 or conductive element(s) 18 for conducting the functional fluid. In addition, this illustration shows a situation in which the pressurizing element 6 is used to limit the deflection movement of the solid-state layer components removed. The contact side 16 of the pressurizing element 6 is preferably spaced apart at a distance AS from the exposed surface of the stress generation layer 4 or from the detachment plane 12. The distance AS is preferably a fraction or less than a defined fraction of the shortest distance between the radial circumferential surface O and the axial center L. In addition, this embodiment, purely by way of example, has a guide device 30 for defining a direction of movement of the pressurizing device 8 in the event of deflection. Such guide devices may be provided in all the embodiments described herein.

FIG. 47a shows, in schematic form, that multiple pressurizing elements 6a, 6b, 6c of different configuration may be part of the pressurizing device 8. The pressurizing elements 6a, 6b, 6c shown here have different heights. When 6a is pressed onto the stress generation layer 4, there is thus greater compression of the stress generation layer 6 than when 6c is pressed on. Thus, there is a greater pressure in the region between 6a and the donor substrate 2 than between 6c and the donor substrate 2. In other words, a greater pressure is preferably built up in the center than in the edge region, and the reverse configuration is also possible. In this embodiment, the region 6b is pressed to the least degree, if at all, onto the donor substrate 4.

FIG. 47b shows, in schematic form, that pressurization is possible from the "thicker" side, where the layer is prevented from bending by a holding device 14 (e.g. vacuum vessel, or else by means of holding tape . . . ). The detachment region 12 here is preferably at a smaller distance from the processed layer in at least the majority of the removal steps effected in the division of a donor substrate 2 into a multitude of wafers than from a surface with which a pressurizing element is contacted. In this case, the processed surface 40 bounds the donor substrate 2 in longitudinal donor substrate direction on the one hand and the surface on which the pressurizing element is contacted bounds the donor substrate 2 in longitudinal donor substrate direction on the other hand. This ensures, in the case of at least partly completed devices on the wafer, that these are bent only within a limited scope, if at all. In addition, the necessity of pressurizing the surface of the device side is avoided.

FIG. 47c shows a variant in which the processed surface 40 is bonded to a transfer substrate or a wafer (technically transfer wafer) by means of a bonding layer or a bonding interface 42. The bonding layer or bonding interface 42 may be formed here, for example, by an adhesive layer, especially an adhesive tape, or by a phase-changing substance, especially a fluid, especially a liquid. If the bonding interface 42 is formed by a phase-changing substance, the phase-changing substance preferably has a freezing point at ambient pressure of lower than 20° C. or of lower than 10° C. or of lower than 5° C. or of 0° C. or of lower than −5° C. or of lower than −20° C. The phase-changing substance is preferably water, especially demineralized water (DM water). The bonding substrate 44 and/or the processed surface 40 are preferably wetted or moistened with the phase-changing substance, wherein the phase-changing substance is in a first state of matter. Subsequently, the processed surface 40 is placed onto or applied to, especially pressed onto, the bonding substrate 44. In addition, the temperature of the phase-changing substance is preferably adjusted to below the freezing point of the phase-changing substance, which results in conversion of the phase-changing substance from the first state of matter, especially liquid, to a second state of matter, especially solid. The cooling can be brought about here by the cooling which is effected to adjust the temperature of the receiving layer. Additionally or alternatively, it is possible that the phase-changing substance is adjusted to a temperature below its freezing point prior to the adjustment of temperature of the receiving layer. This is advantageous since this bonding interface can be reversibly produced and eliminated. In addition, more preferably, no toxic substances are required here.

FIG. 48a shows a working example in which the pressurizing device 8 includes multiple pressurizing elements 6a, 6b and 6c that are movable relative to one another. These pressurizing elements 6a, 6b, 6c may each be coupled via force transmitters 20, 22, 24 to one or more actuators for providing equal or different pressing forces. According to the invention, the individual pressurizing elements 6a, 6b, 6c may be deflected independently of one another, especially when the force acting on the respective pressurizing element 6a, 6b, 6c exceeds a threshold force or minimum force defined for the respective pressurizing element 6a, 6b, 6c.

FIG. 48b shows an embodiment in which the pressurizing element 6b is moved further into the stress generation layer 4 than the other pressurizing elements 6a and 6c.

FIG. 48c shows, purely by way of example, that the pressurizing device 8 can have a round contact side 16. The pressurizing elements 6a, 6b, 6c are formed here correspondingly. Alternatively, however, it is likewise possible in the context of the present invention that the contact side 16 may have a shape different from a round shape, especially a shape with one or more straight edges, especially a rectangular shape.

Figure 49:
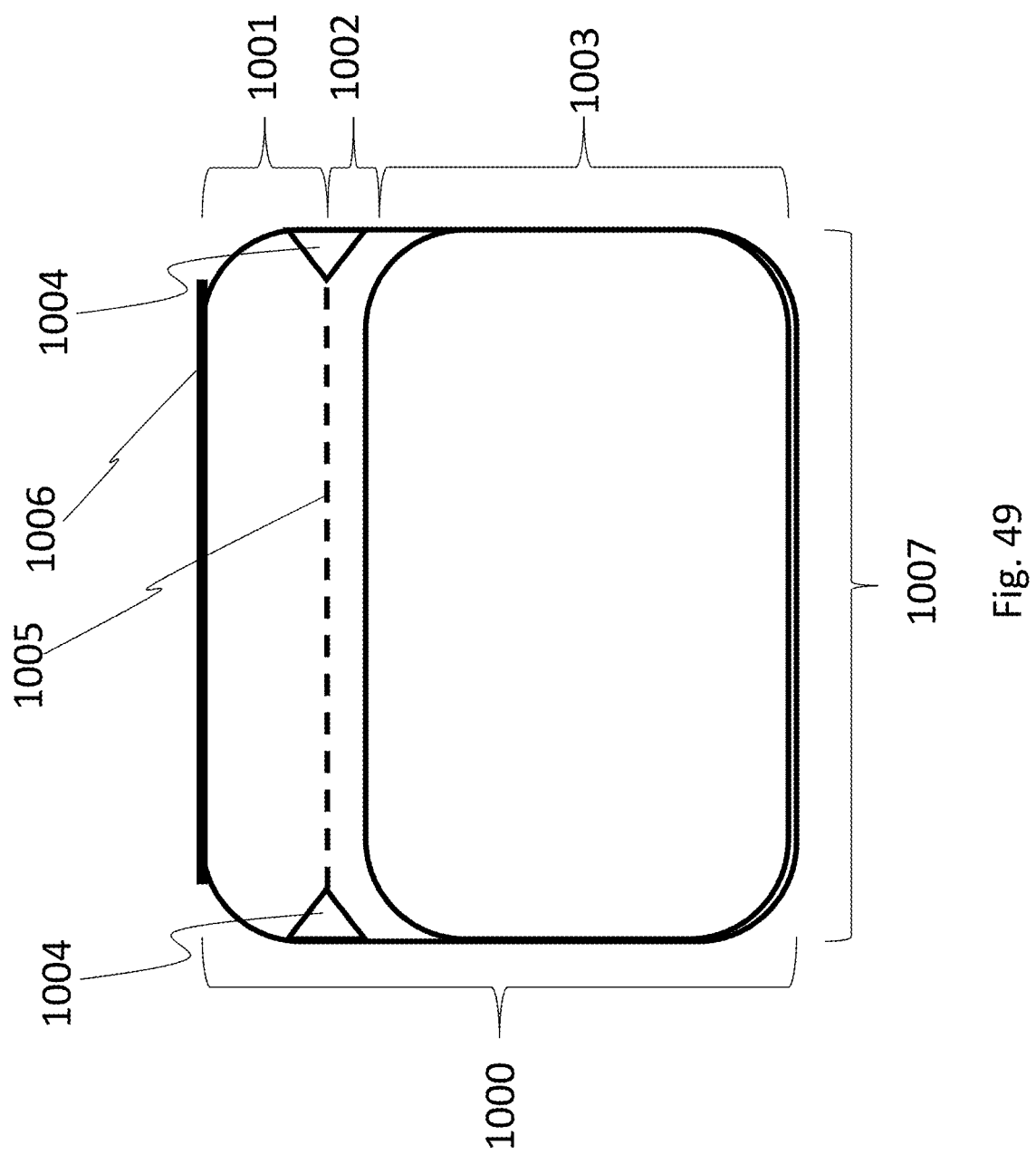

FIG. 49 shows a schematic cross-sectional illustration of a wafer 1000. This wafer 1000 is preferably divisible into at least or exactly two or more than two solid-state slices. The wafer 1000 may be referred to here as a thick wafer. The wafer 1000 was preferably separated from a solid-state body, especially ingot or boule, in a wafering process. The wafer 1000 is preferably divided in the course of a thinning treatment or in the course of a thinning step or multiple thinning steps.

Preferably in accordance with the invention, the present process thus encompasses one or more of the following steps:

providing or separating a solid-state slice 1001 or solid-state layer or a wafer, especially a thick wafer, applying or generating one or more further layers and/or disposing or generating electrical components 1006 on at least or exactly one surface of the wafer 1000, introducing modifications into the solid-state slice or solid-state layer or the wafer to form a detachment region 1005 or generating modifications within the solid-state slice or the solid-state layer or the wafer. The modifications are preferably generated or brought about here by laser beams. Performing an edge processing operation 1004, especially a material-removing step, on the circumferential surface of the solid-state slice or the solid-state layer or the wafer. The edge processing and/or the generation of modifications preferably precede the application of a metal layer. Preferably, the edge processing exposes a previously generated detachment region 1005 or reduces the distance of the detachment region from the outer circumferential face of the solid-state slice or solid-state layer or wafer. The solid-state slice or solid-state layer removed or the wafer removed preferably has a thickness less than the remaining residual thickness of the residual solid-state body. The thickness of the solid-state slice or solid-state layer or the wafer is preferably not more than 99% or not more than 95% or not more than 90% or not more than 85% or not more than 80% or not more than 75% or not more than 65% or not more than 55% of the thickness of the residual solid-state body (1002 plus 1003). The residual solid-state body is preferably used further by one or more surface processing methods, especially grinding, edge process or removing the edge, chemical-mechanical polishing and/or another arrangement or generation of electrical components on a processed surface. The diameter of the solid-state layer 1001 removed and the diameter of the processed residual solid-state body, especially after generation or arrangement of electrical components, is identical or only marginally different, especially different by less than 5% or less than 1% or less than 0.1% or less than 0.01%.

After the removal of the solid-state slice 1001 or solid-state layer or wafer, the surface of the residual solid-state body exposed by the removal is thus preferably treated in a material-removing manner, especially for surface treatment. The proportion 1002 is preferably removed here, especially by grinding or polishing. Further layers, especially at least one or more than one metal layer, and/or electrical components are disposed or generated or formed on the second solid-state layer 1003 that results from the material-removing processing operation.

Figure 50:
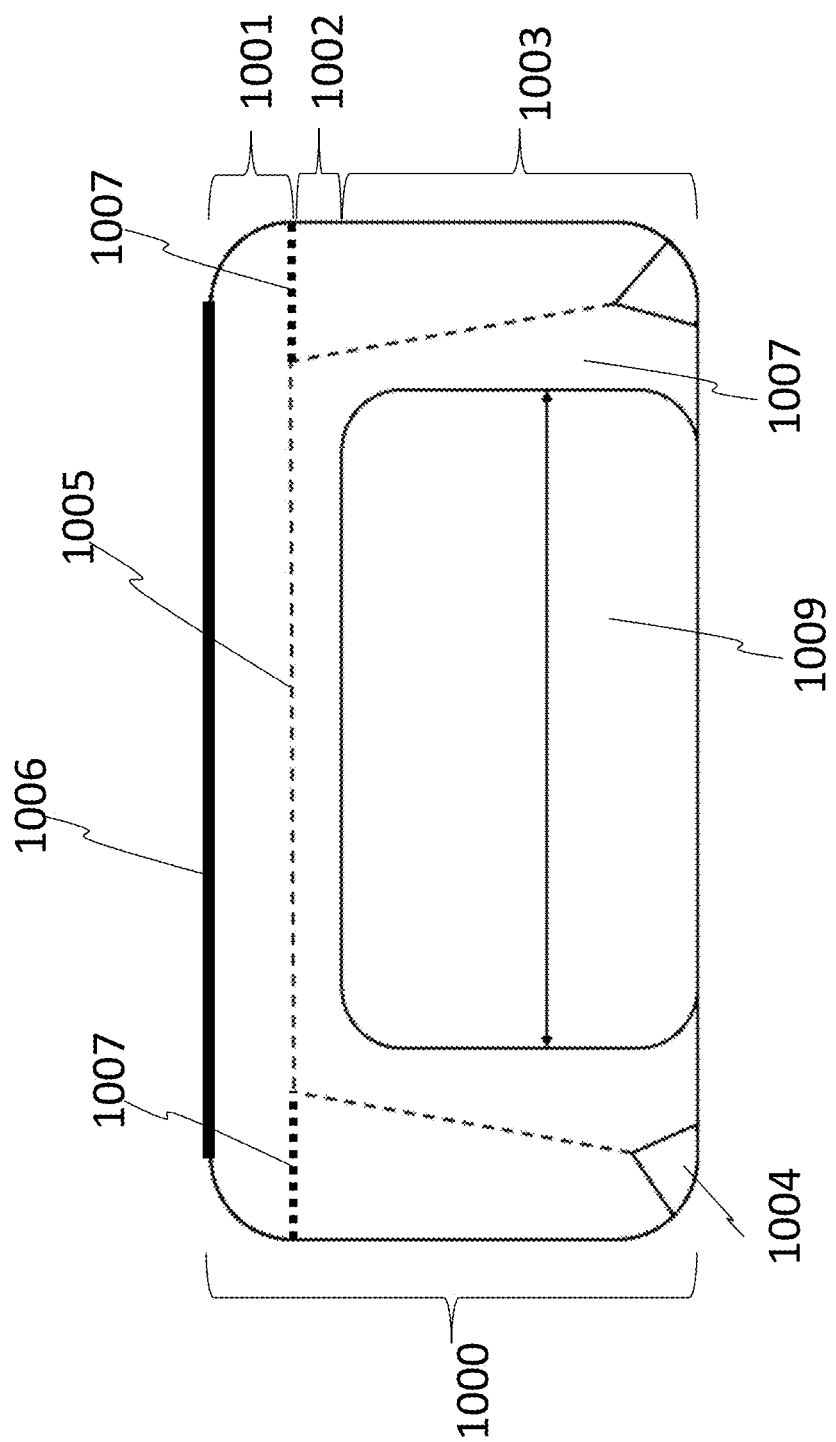

FIG. 50 shows a schematic cross-sectional illustration of a wafer 1000. This wafer 1000 is preferably divisible into at least or exactly two or more than two solid-state slices. The wafer 1000 may be referred to here as a thick wafer. The wafer 1000 was preferably separated from a solid-state body, especially ingot or boule, in a wafering process. The wafer 1000 is preferably divided in the course of a thinning treatment or in the course of a thinning step or multiple thinning steps.

Preferably in accordance with the invention, the present process thus encompasses one or more of the following steps:

providing or separating a solid-state slice 1001 or solid-state layer or a wafer, especially a thick wafer, applying or generating one or more further layers and/or disposing or generating electrical components 1006 on at least or exactly one surface of the wafer 1000, introducing modifications into the solid-state slice or solid-state layer or the wafer to form a detachment region 1005 or generating modifications within the solid-state slice or the solid-state layer or the wafer. The modifications are preferably generated or brought about here by laser beams. Performing an edge processing operation 1004, especially a material-removing step, on a surface of the solid-state slice or the solid-state layer or the wafer. The edge processing and/or the generation of modifications preferably precede the application of a metal layer. Preferably, the edge processing exposes a previously generated detachment region 1005 or reduces the distance of the detachment region from the surface of the solid-state slice or solid-state layer or wafer. The detachment region extends here in the form of a shell or pot or forms a 3D outline. Thus, in this embodiment, a second wafer or a second solid-state layer or solid-state slice is divided from a starting wafer 1000, wherein the starting wafer 1000 is thicker than the second solid-state slice or second solid-state layer 1009. The direction of the crack thus preferably changes during its propagation. It is possible here that the first solid-state layer 1001 is first separated from the residual solid-state body (1002 plus 1003). For this purpose, it is then possible to provide an edge processing operation to expose the modifications 1007. Alternatively, it is first possible to divide or split the residual solid-state body 1007 comprising the second solid-state layer 1003 from the wafer 1007. This is then preferably followed by the removing of the solid-state layer 1001 along the region 1007 drawn or along any modifications 1007 generated. The removal may thus be effected, for example, by means of splitting or by means of a material-removing method, especially sawing. The residual solid-state body 1007 is then preferably treated by means of one or more surface processing steps, especially in order to extract the second solid-state layer 1003. For example, it is possible in this way to use a starting wafer having a diameter of 150 mm to generate a first solid-state layer (with diameter 150 mm) and a second solid-state layer 1003 with diameter 100 mm. For example, it is possible in this way to use a starting wafer having a diameter of 200 mm to generate a first solid-state layer (with diameter 200 mm) and a second solid-state layer 1003 with diameter 150 mm. For example, it is possible in this way to use a starting wafer having a diameter of 300 mm to generate a first solid-state layer (with diameter 300 mm) and a second solid-state layer 1003 with diameter 200 mm.

The edge processing operation shown in FIGS. 49 and 50 can be brought about, for example, by means of a material-removing method or an etching method or a laser ablation method.

FIG. 51*a* shows a further example of the concept shown in FIG. 50. The modification plane 1005 or the detachment region 1005 is preferably in planar form here. The reference numeral 1004 here preferably constitutes a trench processing or trench generation operation. The trench generation may be brought about here, for example, by means of a material-removing method or an etching method or a laser ablation method. In addition, a region 1007 and/or modifications 1007 may be provided analogously to the embodiment of FIG. 50. In addition, one or more layers, especially composed of metal or including metal, and/or electrical components may be disposed or generated on a surface of the first solid-state layer 1001 and/or on a surface of the second solid-state layer 1003.

FIG. 51*b* shows an example in which two further wafers 1000*b*, 1000*c* are divided from the wafer 1000*a*. The solid-state layer 1001 is then preferably separated from the wafer 1000*a* and the solid-state layer 1003 is then preferably separated from the wafer 1000*b*. The wafer 1000*c* may likewise be used for further dividing-out. If a further wafer (not shown) is divided from the wafer 1000*c*, the solid-state layer 1010 may be removed. Alternatively, however, it is likewise conceivable that the wafer 1000*c* is used for generation of electrical components. Preferably, the electrical components are generated or disposed on the wafer or on the respective solid-state layer.

FIG. 51*c* shows a top view of a thick wafer 1000. This thick wafer 1000 serves to generate at least one first solid-state layer 1001 and a second solid-state layer 1003. For this purpose, the wafer 1000 preferably has a circumferential depression 1004, especially a trench. In addition, the thick wafer 1000 preferably has a first flat 1011 and/or a second flat 1012.

FIG. 51*d* shows a schematic section illustration of the wafer 1000 shown in FIG. 51*c*. In this illustration, it is apparent that the depression 1004 has a specific or defined shape.

Figure 52:
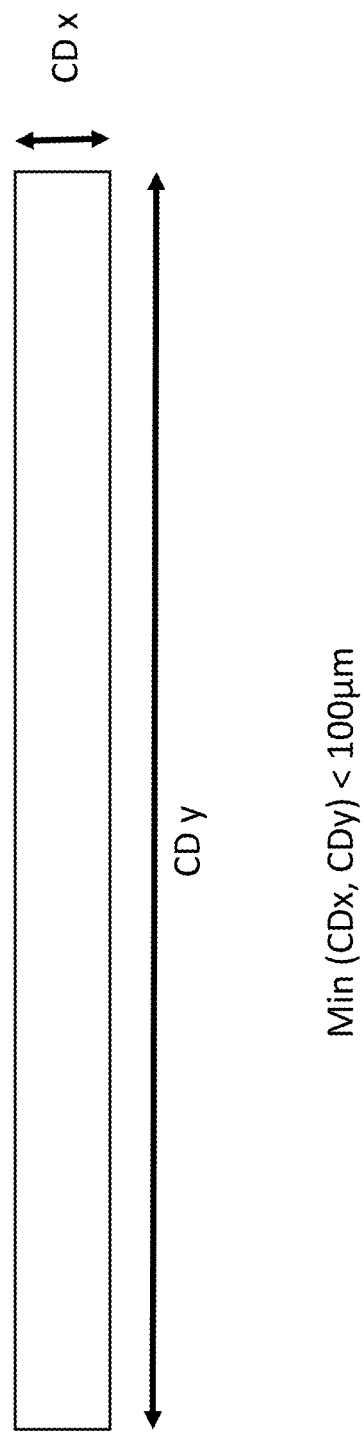

FIG. 52 illustrates, in schematic form, a coating of a solid-state layer, especially with one or more metal layers, and/or with one or more electrical components. The dimensions of the layer or structure, especially of the component(s), preferably follow the formula Min (CDx, CDy)<100 µm. CDx here means the critical extent in x direction, especially in breadth direction. CDy here means the critical extent in y direction, especially in depth direction. The modifications generated by means of laser beams can preferably also be effected after the generation of one or more layers and/or one or more structures when the condition Min (CDx, CDy)<100 µm per layer and/or structure is met. When the propagation of the structure (critical dimension—CD) in one direction is small enough, damage by the laser beam is avoided. The energy absorbed per unit area is then small enough to be released to the environment. Thus, the present invention provides a means of generating modifications within the solid-state body by means of laser beams at a time at which one or more layers and/or one or more structures have already been generated on the surface of the solid-state layer. The direction of incidence of the laser beams preferably runs into the solid-state body via the surface of the solid-state layer at which the layer(s) or the structure(s) is/are disposed or has/have been generated.

Figure 53:
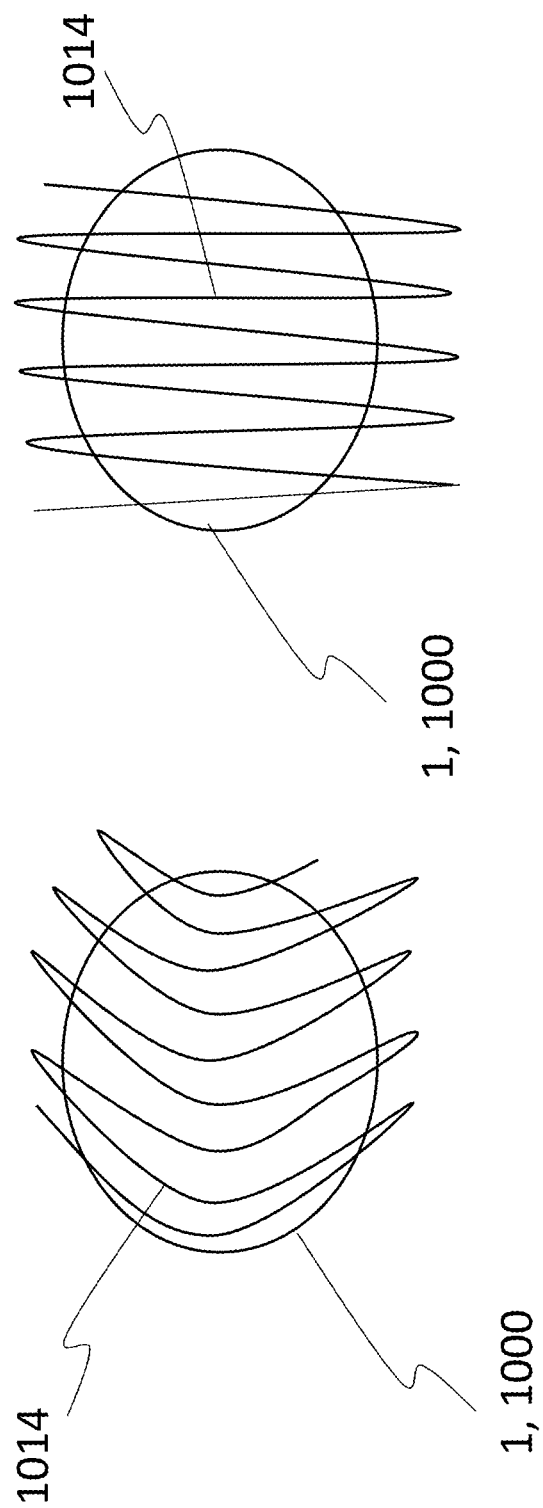

FIG. 53 shows two examples of the generation of the modifications in the solid-state body 1 in the form of curved linear designs, especially curved lines or non-straight lines or bent lines. The solid-state body and an optical element of the laser are moved relative to one another, preferably in accordance with the transport pathways 1014. The laser beams can thus be introduced into the solid-state body along the path components 1014 that cover the solid-state body. Thus, it is possible to generate linear designs, the shape of which preferably corresponds in sections to the design of the pathway 1014 in sections. In this embodiment, the modifications are therefore preferably generated by means of a nonlinear writing method.

The form of the pathway 1014 or of the writing progression here may preferably be a spiral or take the form of a spiral or be a form or forms derived from circular movements. Preferably, the writing progression or the pathway is chosen with such a design as to result, for example, in a parabolic zigzag. The effect of this solution is that there is predominantly or constantly continuous relative movement simultaneously in X and Y direction, or continuous traversing of a curve pathway. There is thus preferably no relative movement in just a first direction. Thus, preferably no division step or index step or offset step is brought about either. In addition, there is preferably no relative movement in a second direction at right angles to the first direction.

The donor substrate (or the solid-state body) preferably has crystal lattice planes inclined relative to a planar main surface. The main surface the donor substrate is preferably firstly bounded in longitudinal direction of the donor substrate, where a crystal lattice plane normal is inclined in a first direction relative to a main surface normal. In a preferred embodiment of the present invention, at least 20% or at least 40% or at least 50% or at least 70% or at least 90% of the longitudinal extent of one, individual or multiple or the majority of all linear designs or all linear designs or writing line(s) is inclined relative to the cutting line in an angle range between 0.05° and 87°, especially in an angle range between 3° or 5° and 60° and preferably between 10° and 50°, especially between 10° and 30°, such as between 12° and 20° or between 13° and 15°, or between 20° and 50°, especially between 25° and 40° or between 30° and 45° or between 28° and 35°. This solution is advantageous since the inclination is so great that a sufficient number of different crystal lattice planes are part of every further modification of the same linear design or writing line. The donor substrate here preferably consists of SiC or preferably includes SiC.

FIG. 54a shows an example in which, owing to an incidence barrier, the optical properties are locally different and, therefore, the distance of the focal point of the laser beam from the surface via which the laser radiation penetrates into the solid-state body is varied or locally varied or varied in direct dependence. The effect of this may be that the modifications are not generated in one plane or do not lie in a desired plane or do not describe a desired outline or form. The output can thus be reduced and the reworking expenditure increased. The incidence barriers may, for example, be implant regions and/or electrical assemblies and/or components of electrical assemblies and/or the solid-state body edge or wafer edge and/or one or more EPI layer(s), structuring (e.g. etched trenches) and/or other regular variations resulting from the chip design. Implant regions 1541 are preferably regions with high doping with foreign atoms, for example phosphorus, boron etc. These foreign atoms alter the optical properties—for example can bring about greater absorption, which can in turn prevent formation of cracks in the material. Reference numeral 1544 indicates crack propagation and reference numeral 1545 indicates crack propagation 1545 stopped or deflected in the region of the incidence barrier.

According to the invention, a step of detecting and/or analyzing incidence barriers may thus be provided, preferably with adjustment of energy depending on the incidence barrier detected or the incidence barriers. This solution is supported by the finding that any laterally inhomogeneous change in the optical properties will affect the energy threshold. The better the detectability and correctability of these changes, the more homogeneously the laser plane or modification plane or detachment plane or detachment region can be generated.

In FIG. 54b, reference numeral 1543 indicates a generation of modifications or laser plane without depth correction, and reference numeral 1542 indicates a generation of modifications or laser plane with depth correction.

Figure 55:
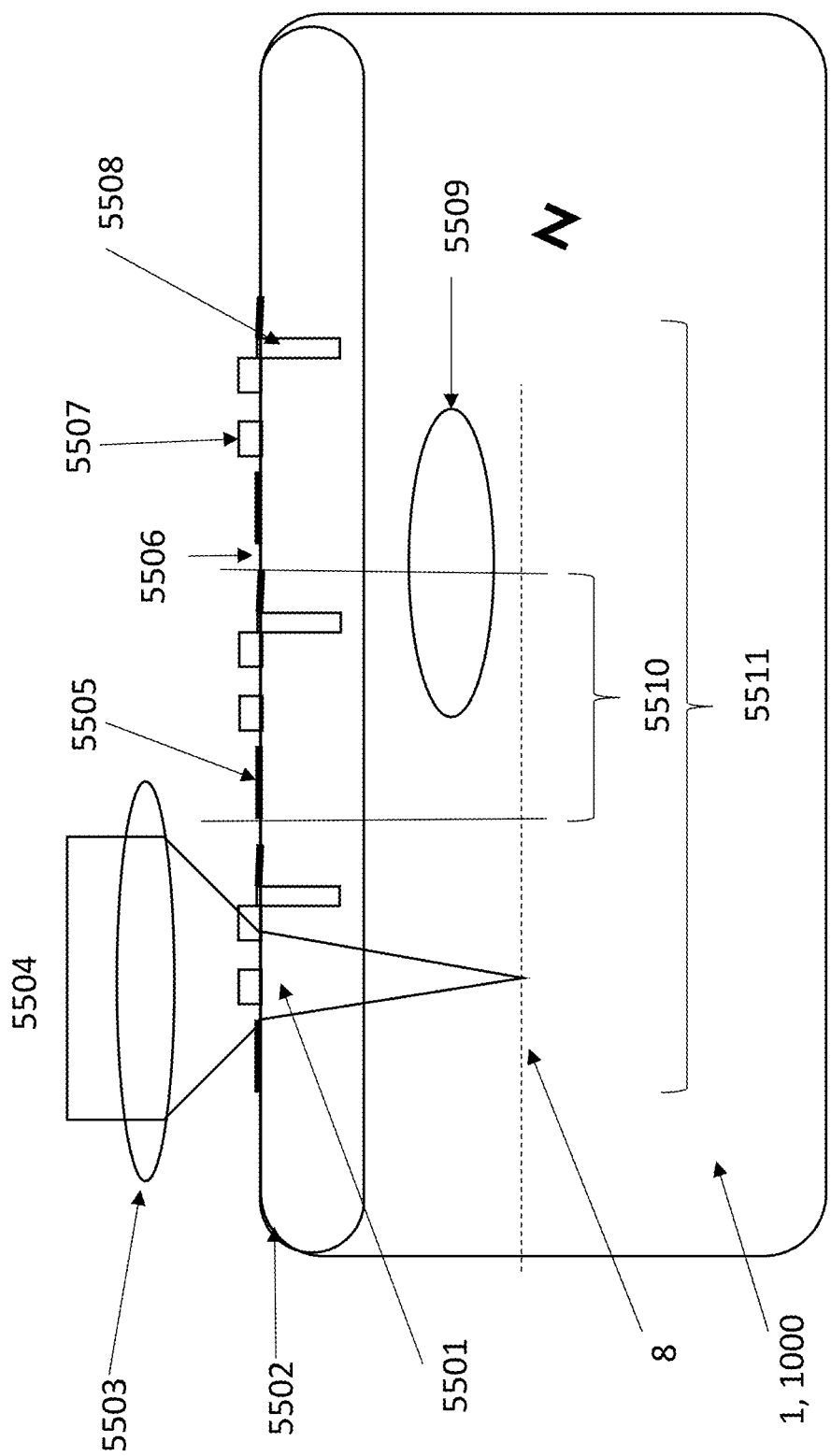

FIG. 55 shows a more detailed illustration of the relationship described with regard to FIGS. 54a and 54b. In this example, the energy is adjusted on the basis of multiple or alternating incidence barriers. The incidence barriers shown that alter the beam pathway 5501 of the laser beam 5504 after the lens 5503 in the solid-state body 1, 1000 or change the composite structure may include here, among others, for example, an EPI layer 5502, an implant region 5505, a dicing street 5506, metal structures 5507, etched trenches 5508, regions with high dopant concentrations 5509 and a chip 5510.

Figure 56:
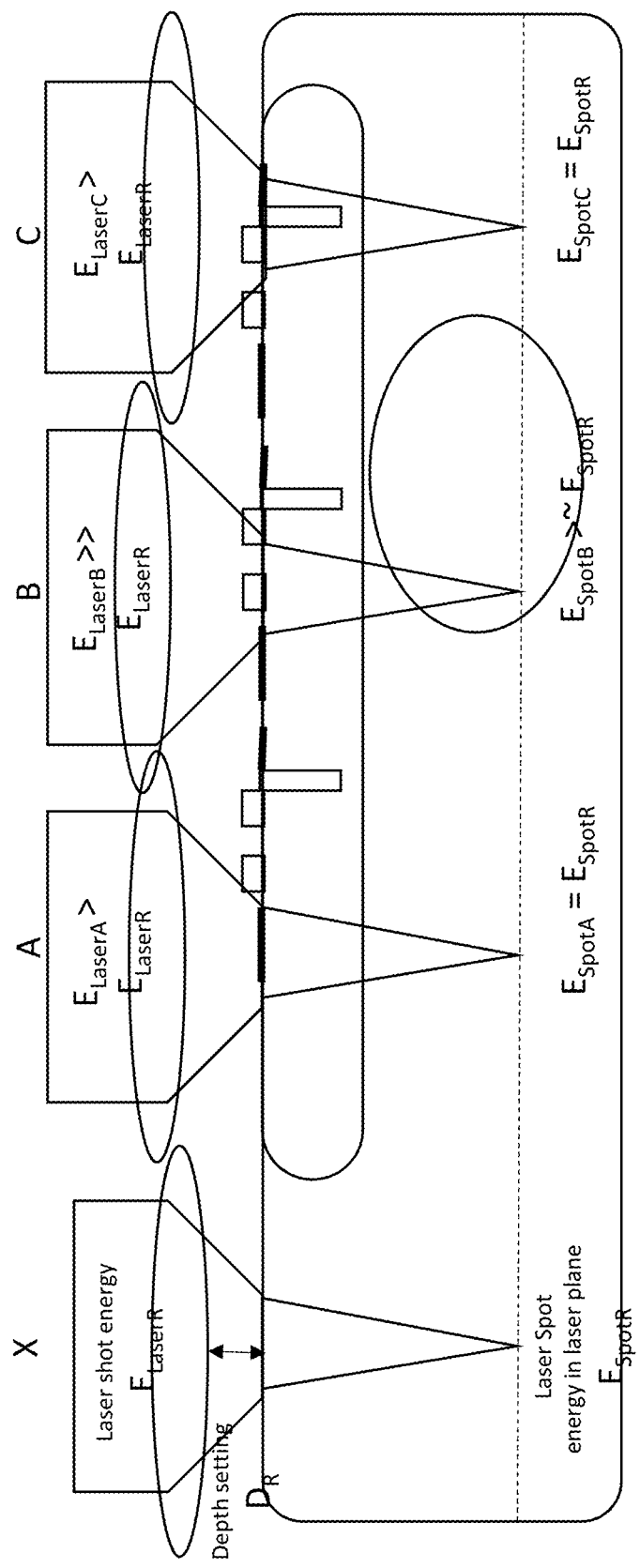

FIG. 56 shows a further diagram for illustration of the relationships already described with regard to FIGS. 54 and 55.

This diagram shows 4 different states (X, A, B, C). State X represents a reference state. The laser energy settings and the depth settings have been determined for a defined material.

In state A, owing to an EPI layer and an implant region in the light pathway, adjustments in the laser energy settings and the depth settings are required. This can be accomplished, for example, via a higher absorption and/or via a shifted optical constant n.

In state B, there is an implant region, an EPI layer and metal structures in the light pathway, which result in very large absorptions. In addition, moreover, there is a more highly doped zone in the light pathway, which results, for example, in greater absorption and a small offset of the optical constant n. As a result, adjustments of the laser energy settings and depth settings are required.

In state C, there is an implant region, an EPI layer, a metallic structure and etched trenches (which result in a shift in focus and large absorption) in the light pathway. As a result, adjustments of the laser energy settings and depth settings are required.

In general terms, it has been recognized in accordance with the invention in this regard that the formation of the laser modification is thus achieved by exceeding a laser energy threshold from which a phase transformation occurs. If the energy in the laser pulse is now increased, in the case of focusing, the threshold is exceeded at an earlier stage in the beam direction, which, regardless of the actual geometric focus position, leads to early occurrence of the phase transformation or material modification by the laser or laser radiation. This means that, in the case of constant processing with a laser pulse energy above the threshold, the position of the laser modification plane in the material will move closer to the material surface and will correspondingly be higher than defined via the optical focus.

It is also possible that further effects, for example the Kerr effect, which describes the intensity dependence of refractive index, or self-focusing caused by free charge carriers lead to an intensity-dependent shift in the height of the laser modification plane. These effects are deterministic and can be quantified and then correspondingly compensated via suitable methods with the aim of minimizing the differential between the defined position of the laser plane and the actual position of the laser plane.

For example, in the case of a processing depth of 400 μm in doped silicon carbide, an increase in the laser pulse energy by 10 μJ compared to the minimum threshold energy required has the effect that the modification plane moves about 20 μm closer to the solid-state surface.

Since this effect is measurable, in the case of creation of one or more relief maps and/or dopant maps and/or energy maps for adjustment of the laser focus relative to the workpiece surface, this effect can be compensated for by an interaction of the spatially resolved control of laser power with the relief map used.

Figure 57C:
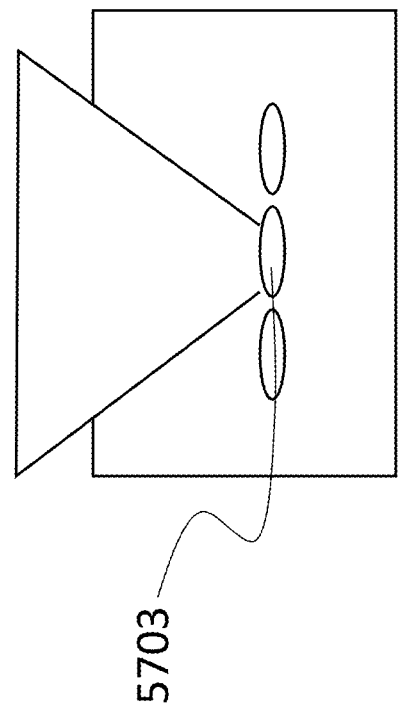
Figure 57B:
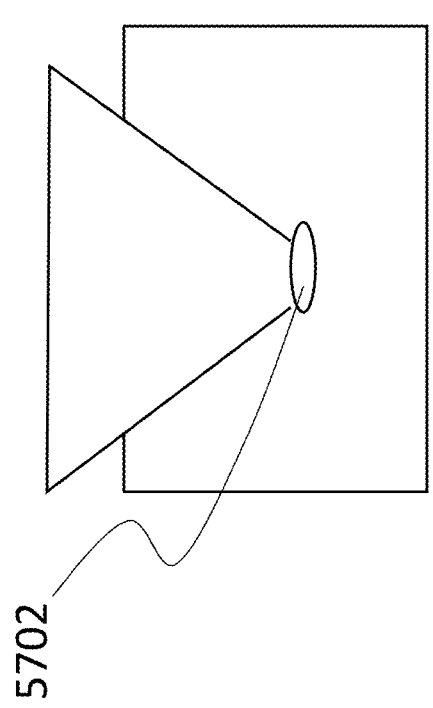
Figure 57A:
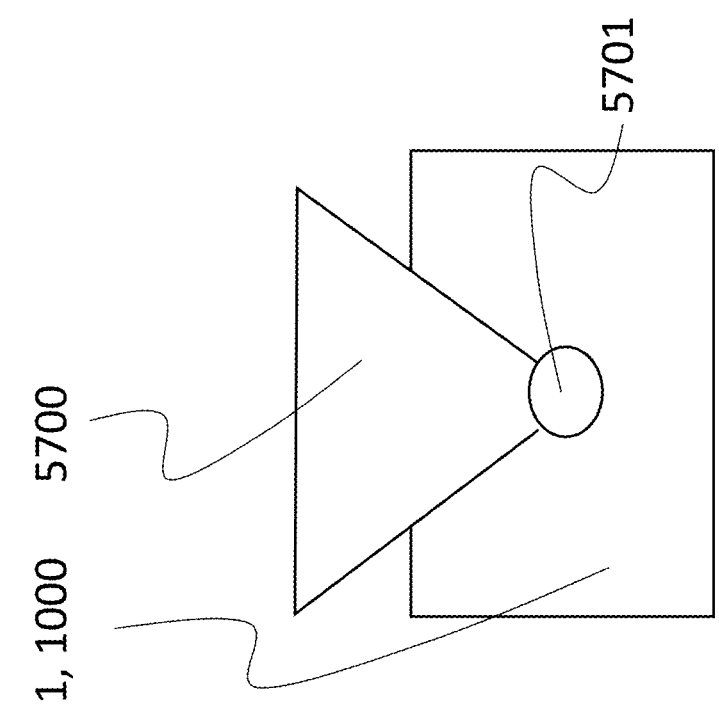

FIG. 57a shows an incident light cone 5700, which generates a focus 5700 in the solid-state body 1, 1000. What is shown here is a focus image of a lens through which a laser with a Gaussian beam profile passes.

FIG. 57b is a schematic illustration of a focus image 5702 of a lens through which a laser having a NON-Gaussian beam profile passes, for example after the beam has been modified by an SLM. A spatial light modulator (SLM) here is a spatial modulator for light and hence a device by means of which a spatial modulation can be imparted to light. By comparison with the Gaussian beam profile, the extent of the focal point in the Z direction is distinctly reduced or reducible.

FIG. 57c is a schematic illustration of a focus image 5703 of a lens through which a laser having a NON-Gaussian beam profile passes, for example after the beam has been modified by a diffractive optical element (DOE). The beam here is preferably divided by the DOE to form multiple foci. A DOE preferably serves to vary the diffraction of a laser beam by the spatial image of the focal point.

Diffractive optical elements (DOEs) act by diffraction on laser radiation. Structures on the size scale of the laser wavelength are used here. By means of numerical simulation of light diffraction at diffracting structures, an element is calculated, which can then be manufactured in greater unit counts. In general, the spatial distribution of the light in the laser beam profile is altered, either directly after the element or in the focal point after a focusing element. This means that, for example, a beam can be split into multiple beams, that a Gaussian beam intensity profile that typically occurs is converted to another form, or that the intensity distribution of the laser radiation at the focus is altered in a manner not achievable by conventional lenses, for example by the deliberate introduction or suppression of secondary maxima that are required for the desired laser interaction.

By contrast, a spatial light modulator (SLM) is a device for imparting spatial modulation to light.

Usually, an SLM modulates the intensity of a light beam, but it is also possible to simultaneously modulate the phase or else the phase and the intensity.

This spatial modulation is undertaken in the DOE by means of the structures in the element, but in the SLM by contrast by means of the individual pixels in the SLM. Particularly after imaging or focusing of an intensity- and phase-modulated beam, programmable intensity distributions are thus achievable at the focus. While a DOE thus has a static and reproducible effect on the laser beam, it is possible, for example, with the aid of an SLM, to dynamically switch the number of beams or else the laser beam profile used in a laser processing device. Dynamic adaptation in the course of the process is also possible, for example after feedback from simultaneous monitoring of the process progression.

According to the invention, the method proposed here includes the step of varying a beam property of the laser beams prior to penetration into the solid-state body, wherein the beam property is the intensity distribution at the focal point, wherein the variation or adjustment of the beam property is caused by at least one or exactly one spatial light modulator and/or by at least or exactly one DOE, wherein the spatial light modulator and/or the DOE is disposed in the beam path of the laser radiation between the solid-state body and the radiation source.

For elucidation of the mode of function of DOEs and spatial light modulators, reference is made to the following publication: Flexible beam shaping system for the next generation of process development in laser micromachining, LANE 2016, 9th International Conference on Photonic Technologies LANE 2016, Tobias Klerks, Stephan Eifel.

Laser beam intensity profiles that differ from the normally standard Gaussian form are referred to as non-Gaussian beam profiles and can be used to achieve a different processing result. For example, there is a conceivable line focus having a distinctly different extent in one dimension at right angles to the direction of beam propagation than in a second dimension. This enables sweeping of broader regions of the workpiece with the laser beam in the processing step. There is also a known "top-hat" profile that has a constant intensity in the center of the beam, which offers the advantage that there are no regions of different intensity at the focus in the processing operation, or at least only regions of the same intensity are above the laser processing threshold. This can serve, for example, to minimize grinding losses after the separation.

FIG. 58 shows what is called a front-side process. In this case, the laser beams are introduced into the solid-state body via a surface of the solid-state body closer to the detachment plane or modification plane to be generated than a further surface that bounds the solid-state body at an opposite end. This front-side process is advantageous since the laser depth (preferably <100 µm) is distinctly smaller compared to a back-side process (e.g. >250 µm or up to 400 µm or more) (cf. FIG. 59). This has the effect of lower laser beam energies, better depth control and better laser beam quality in the laser plane or in the detachment plane or in the region of the detachment plane. Moreover, there is no need to additionally process the back side of the solid-state body.

According to the invention, in the front-side process, the modifications are thus generated in the solid-state body before the generation of a metallic contact layer. In a further preferred embodiment, the generation of modifications may follow the polishing (5801) and/or precede the generation of an EPI layer (5802) or follow the generation of an EPI layer (5802) and/or precede the generation of an implant region (5803) in the solid-state body or follow the generation of an implant region (5803) and/or precede the generation or disposal of a first metal layer (5804). Depending on the properties of the first metal layer (5804), especially the size (cf. remarks relating to FIG. 52) and/or the composition, the front-side process, i.e. the introduction of laser beams into the solid-state body via a surface of the solid-state layer to be removed, may additionally or alternatively be conducted after the generation or disposal of the first metal layer (5804) and/or before the generation or disposal of a metallic contacting layer (5805).

Figure 59:
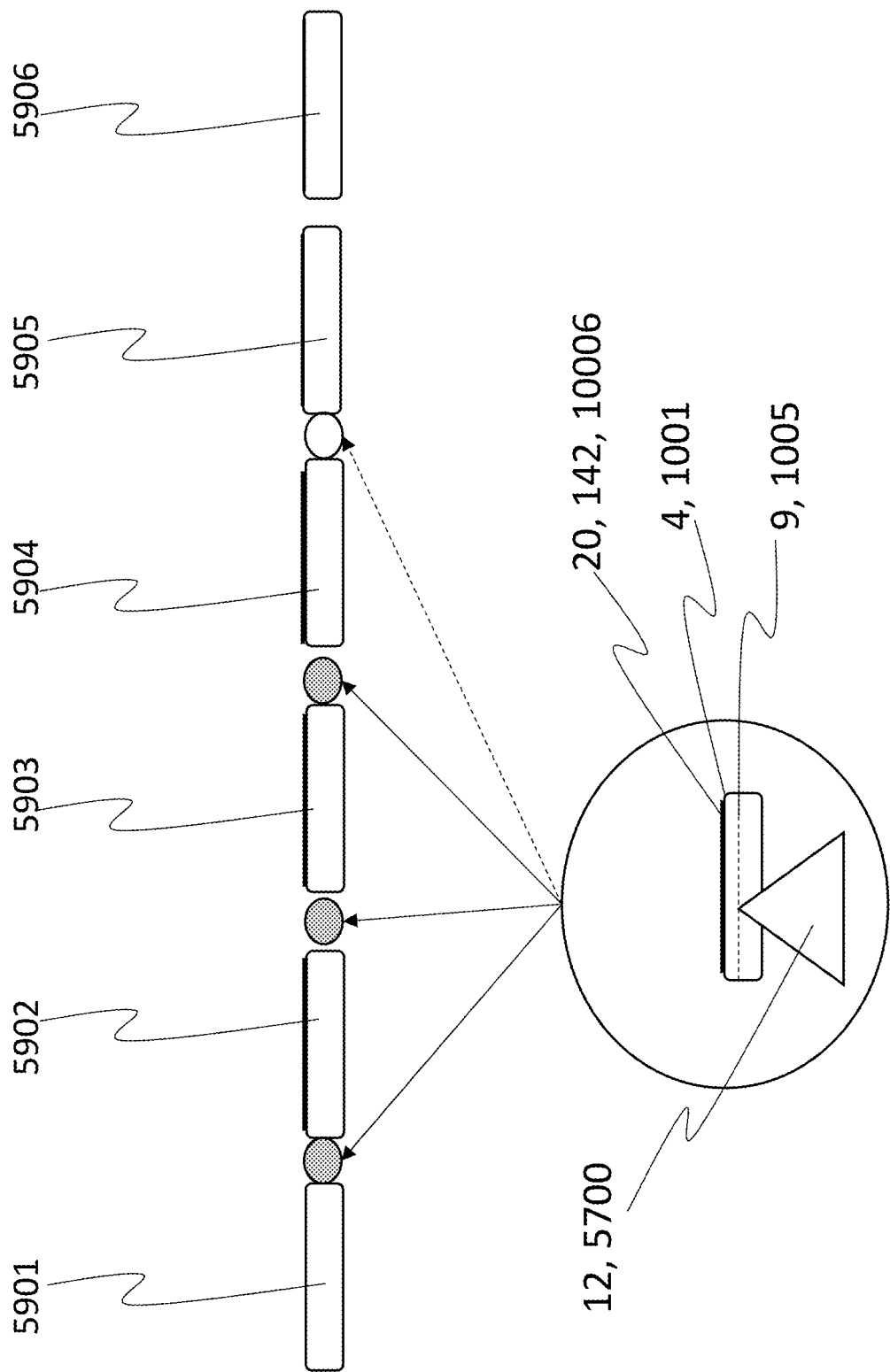

FIG. 59 shows what is called a back-side process. In this case, the laser beams are introduced into the solid-state body via a surface of the solid-state body further from a detachment plane or modification plane to be generated than a surface or main surface that bounds the solid-state body at an opposite end. This back-side process is advantageous since only slight adjustments, if any, to the chip design on the front side are required during the disposal or generation of components, especially electrical components, especially including metal or consisting of metal.

According to the invention, in the back-side process, the modifications are thus generated in the solid-state body before the generation of a metallic contact layer. In a further preferred embodiment, the generation of modifications may follow the polishing (5901) and/or precede the generation of an EPI layer (5902) or follow the generation of an EPI layer (5902) and/or precede the generation of an implant region (5903) in the solid-state body or follow the generation of an implant region (5903) and/or precede the generation or disposal of a first metal layer (5904). Depending on the properties of the first metal layer (5904), especially the size (cf. remarks relating to FIG. 52) and/or the composition, the back-side process, i.e. the introduction of laser beams into the solid-state body via a surface of the solid-state layer to be removed, may additionally or alternatively be conducted after the generation or disposal of the first metal layer (5904) and/or before the generation or disposal of a metallic contacting layer (5905).

This method is useful especially for the separation of solid-state layers from a solid-state body or donor substrate consisting of SiC or including SiC.

In addition, the modifications may be generated successively in at least one line or row, wherein the modifications 9 generated in a line or row are preferably generated at a separation X and with a height H in order that a crack that propagates between two successive modifications, especially a crack that propagates in crystal lattice direction, the direction of crack propagation of which is aligned at an angle W relative to the detachment plane, joins the two modifications together. The angle W here is preferably between 2° and 6°, especially 4°. Preferably, the crack propagates from a region below the center of a first modification toward a region above the center of a second modification. The essential relationship here is therefore that the size of the modification can/must be altered as a function of the separation of the modifications and the angle W.

It is also advantageous for the laser process to specifically design the polarization of the laser radiation used. In order to achieve minimum dependence on writing direction, the laser may be circular polarized, for example by using a lambda/4 plate after a linear polarized laser source.

However, it is particularly advantageous to use linear polarized light for processing. In the processing operation, an initial charge carrier density in the material is first generated by multiphoton absorption. The probability of the occurrence of multiphoton absorption in the material, especially in the case of crystals, is dependent on the position of the crystal axes relative to the direction of the electrical field of the laser radiation. This angular dependence of the multiphoton absorption can be utilized in order to conduct the laser process within the material particularly efficiently and make it very substantially uniform.

Moreover, this method may also include the step of generating a composite structure by arrangement or generation of layers and/or components 150 atop or above an initially exposed surface of the solid-state body 1, wherein the exposed surface is preferably part of the solid-state layer to be removed. More preferably, the modifications to form the detachment plane are generated prior to the generation of the composite structure.

To introduce the external force, it is possible, for example, analogously to the above-described methods, to dispose a receiving layer 140 on an exposed surface of the composite structure or solid-state body.

Thus, in the further laser method of the invention, lines are generated parallel to the direction of crack propagation (preferably called transverse lines) on SiC (but also other materials), in order first to define a plane for the preferred crack triggering (crack initialization) before longitudinal lines drive the cracks. The cracks here are initialized first in the transverse direction, then in the longitudinal direction, before a final step makes lines between the longitudinal lines from the second step in order to fully trigger the cracks. This enables shorter crack pathways, which minimizes the final surface roughness.

Example image for transverse lines (with the sawtooth) and crack triggering lines (on the wave crests of the sawtooth).

The present invention thus preferably relates to a method of separating at least one solid-state layer 2 from a donor substrate 1. The method preferably comprises at least the steps of: providing the donor substrate 1, wherein the donor substrate 1 has crystal lattice planes 6 inclined relative to a planar main surface 8, wherein the main surface 8 delimits the donor substrate 1 in longitudinal direction of the donor substrate 1 on one side, wherein a crystal lattice plane normal is inclined in a first direction relative to a main surface normal, providing at least one laser 29, introducing laser radiation 14 from the laser 29 into the interior of the solid-state body 1 via the main surface (8) to change the material properties of the solid-state body 1 in the region of at least one laser focus, wherein the laser focus is formed by laser beams from the laser emitted by the laser, wherein the change in the material property by changing the site of penetration of the laser radiation into the donor substrate 1 forms a linear design 103, wherein the changes in the material property are generated in at least one generation plane 4, wherein the crystal lattice planes 6 of the donor substrate 1 are in an inclined alignment relative to the generation plane 4, wherein the linear design 103 is inclined relative to a cutting line 10 that arises at the point of intersection between the generation plane 4 and the crystal lattice plane 6, wherein the changed material property results in tearing of the donor substrate 1 in the form of subcritical cracks, removing the solid-state layer 2 by introducing an external force into the donor substrate 1 to connect the subcritical cracks or changing so much material in the generation plane 4 by means of the laser radiation that the solid-state layer 2 becomes detached from the donor substrate 1 with connection of the subcritical cracks.

According to the invention, any method described here may additionally or alternatively include the step of introducing an external force into the solid-state body 1 to generate stresses in the solid-state body 1, the external force being sufficiently high that the stresses bring about crack propagation along the detachment plane 8.

According to the invention, any method described herein may additionally or alternatively include the step of generating a second group of modifications by means of laser beams to define at least one, especially more than one, second detachment plane. The first detachment plane and second detachment plane here are preferably aligned orthogonally to one another. In addition, the separation of the solid-state layer from the solid-state body is more preferably followed directly or indirectly by a step of dividing the solid-state layer separated from the solid-state body along the second detachment plane for individualization of solid-state elements.

According to the invention, any method described here may additionally or alternatively include the step of pressing at least one pressurizing element of a pressurizing device onto at least one predetermined proportion of the stress generation layer to press the stress generation layer against the surface. Preferably, the pressurizing element is pressed against the stress generation layer at least during the thermal stress on the stress generation layer and/or during the crack propagation.

Preferably, at least a removed proportion of the solid-state slice or solid-state layer is deflected owing to the stress generation layer or owing to the polymer layer in the direction of the pressurizing element and pressed against the pressurizing element. The pressurizing element here preferably limits the maximum deflection of the solid-state slice or the solid-state layer.

The present invention thus relates to a method of separating at least one solid-state layer 4 from at least one solid-state body 1. This method of the invention comprises the steps of:

generating a multitude of modifications 9 by means of laser beams within the solid-state body 1 to form a detachment plane 8, generating a composite structure by arranging or generating layers and/or components 150 on or above an initially exposed surface 5 of the solid-state body 1, where the exposed surface 5 is part of the solid-state layer 4 to be separated, introducing an external force into the solid-state body 1 to generate stresses in the solid-state body 1, wherein the external force is sufficiently strong that the stresses brings about crack propagation along the detachment plane 8, wherein the modifications to form the detachment plane 8 are generated prior to the generation of the composite structure.

The invention claimed is:

1. A method of separating a solid-state layer from a solid-state body, comprising:
   generating a plurality of modifications by laser beams within the solid-state body to form a detachment region, wherein the laser beams are adjustable as a function of at least two parameters;
   after generating the plurality of modifications, generating a composite structure by arranging or generating layers and/or components on or above an initially exposed surface of the solid-state body, wherein the exposed surface is part of the solid-state layer to be separated; and
   introducing an external force into the solid-state body to generate stresses in the solid-state body or generating an internal force in the solid-state body, wherein a strength of the external or internal force is sufficient for crack propagation to occur along the detachment region,
   wherein a first parameter of the at least two parameters is an average refractive index of a material of the solid-state body or a refractive index of the material of the solid-state body in a region of the solid-state body to be traversed to generate a defined modification by the laser beams,
   wherein a second parameter of the at least two parameters is a processing depth in the region of the solid-state body to be traversed to generate the defined modification by the laser beams.

2. The method of claim 1, wherein introducing the external force into the solid-state body comprises:
   arranging a receiving layer on an exposed surface of the composite structure or of the solid-state layer to be separated, wherein the receiving layer comprises a polymer material;
   subjecting the receiving layer to thermal stress for generation of stresses in the solid-state body, including cooling the receiving layer to a temperature below ambient temperature,
   wherein the cooling comprises subjecting the polymer material of the receiving layer to a glass transition,
   wherein the stresses cause a crack to propagate in the solid-state body along the detachment region,
   wherein the first solid-state layer separates from the solid-state body along the crack.

3. The method of claim 1, further comprising:
   disposing a diffractive optical element (DOE) in a pathway of the laser beams prior to penetration of the laser beams into the solid-state body, wherein the laser beams is split by the DOE into multiple light pathways for generation of multiple foci.

4. The method of claim 3, wherein the DOE brings about an image field curvature over a length of 200 µm of not more than 50 µm, not more than 30 µm, not more than 10 µm, not more than 5 µm, or not more than 3 µm.

5. The method of claim 3, wherein the DOE simultaneously generates 2 or more foci to change one or more material properties of the solid-state body.

6. The method of claim 1, further comprising:
   moving the solid-state body relative to a laser exposure device;
   successively generating the laser beams by the laser exposure device for generating at least one modification in each case; and
   adjusting the laser exposure device for defined focusing of the laser beams and/or for adjustment of laser energy, depending on at least one parameter.

7. The method of claim 1, wherein the laser beams penetrate into the solid-state body via a planar surface of the solid-state body, wherein at least one of the laser beams is inclined relative to the planar surface of the solid-state body such that the at least one laser beam enters the solid-state body at an angle other than 0° or 180° to a longitudinal axis of the solid-state body, wherein the at least one laser beam is focused to generate a modification in the solid-state body.

8. The method of claim 1, further comprising:
   removing material from the solid-state body proceeding from a surface extending in a circumferential direction of the solid-state body in a direction of a center of the solid-state body.

9. The method of claim 1, wherein the solid-state body has crystal lattice planes inclined relative to a planar main surface, wherein the planar main surface forms a boundary on one side in a longitudinal direction of the solid-state body, wherein a crystal lattice plane normal is inclined in a first direction relative to a main surface normal, wherein the modifications are a change in a material property of the solid-state body, wherein the change in the material property forms a linear design at least in sections in the solid-state body by changing a site of penetration of the laser beams, wherein the change in the material property is generated in a generation plane or in the detachment region, wherein the crystal lattice planes of the solid-state body are in an inclined alignment relative to the generation plane or the detachment region, wherein the linear design is inclined relative to a cutting line that arises at a point of intersection between the generation plane or the detachment region and the crystal lattice plane, wherein the changed material property results in tearing of the solid-state body in a form of subcritical cracks, wherein the external force introduced into the solid-state body connects the subcritical cracks such that the solid-state layer detaches from the solid-state body with connection of the subcritical cracks.

10. The method of claim 1, wherein the laser beams are generated with pulse lengths of less than 5 ns, and wherein the laser beams are generated with pulse energies between 100 nJ and 1 mJ.

11. The method of claim 1, wherein the detachment region describes at least a three-dimensional outline and/or wherein the detachment region is uneven within the solid-state body.

12. The method of claim 1, further comprising:
   determining the first parameter by spectral reflection; and/or
   determining the second parameter by determining topography using a confocal-chromatic distance sensor, wherein data for the first parameter and for the second parameter are provided in a data storage device and sent to a control device at least prior to the generation of the modifications, wherein the control device adjusts a laser exposure device that generates the laser beams as a function of a respective location of the modification to be produced, wherein the control device, for adjustment of the laser exposure device, processes distance data to give a distance parameter, wherein the distance parameter gives the distance of the respective location at which laser beams generate the respective modification by being introduced into the solid-state body at a time of generation of the modification from the laser exposure device, wherein the distance data are detected by a sensor device.

13. The method claim 12, wherein the laser exposure device is adjusted as a function of a determination of the first parameter and of the second parameter during the generation of the modification, by determining the refractive index and determining the topography.

14. The method of claim 1, further comprising:

generating a second group of modifications by additional laser beams to define a second detachment plane, wherein the detachment plane and the second detachment plane are in an orthogonal alignment relative to one another; and dividing the solid-state layer separated from the solid-state body along the second detachment plane to individualize solid-state elements.

15. The method of claim 1, further comprising:

pressing at least one pressurizing element of a pressurizing device against at least a predetermined proportion of a stress generation layer for pressing of the stress generation layer onto the surface of the solid-state body, wherein the pressurizing element is pressed against the stress generation layer at least during thermal stress on the stress generation layer and/or during crack propagation.

16. The method of claim 1, further comprising:

varying a beam property of the laser beams prior to penetration into the solid-state body, wherein the beam property is an intensity distribution at a focal point of the laser beams, wherein the beam property is varied by a spatial light modulator and/or by at least DOE, wherein the spatial light modulator and/or the DOE is disposed in a beam path of the laser beams between the solid-state body and a radiation source of the laser beams.

17. The method of claim 1, wherein the modifications in the solid-state body are generated prior to generation or arrangement of a metallic contact layer.

18. A method of separating a solid-state layer from a solid-state body, comprising:

generating a plurality of modifications by laser beams within the solid-state body to form a detachment region;

after generating the plurality of modifications, generating a composite structure by arranging or generating layers and/or components on or above an initially exposed surface of the solid-state body, wherein the exposed surface is part of the solid-state layer to be separated; and introducing an external force into the solid-state body to generate stresses in the solid-state body or generating an internal force in the solid-state body, wherein a strength of the external or internal force is sufficient for crack propagation to occur along the detachment region, wherein introducing the external force into the solid-state body comprises:

arranging a receiving layer on an exposed surface of the composite structure or of the solid-state layer to be separated, wherein the receiving layer comprises a polymer material;

subjecting the receiving layer to thermal stress for generation of stresses in the solid-state body, including cooling the receiving layer to a temperature below ambient temperature, wherein the cooling comprises subjecting the polymer material of the receiving layer to a glass transition, wherein the stresses cause a crack to propagate in the solid-state body along the detachment region, wherein the first solid-state layer separates from the solid-state body along the crack.

* * * * *